US009985211B2

(12) United States Patent
Blouin et al.

(10) Patent No.: US 9,985,211 B2
(45) Date of Patent: May 29, 2018

(54) CONJUGATED POLYMERS

(71) Applicant: MERCK PATENT GMBH, Darmstadt (DE)

(72) Inventors: Nicolas Blouin, Southampton (GB); Agnieszka Pron, Southampton (GB); Graham Morse, Southampton (GB); Lana Nanson, Southampton (GB); Michal Krompiec, Southampton (GB); Stephane Berny, Bristol (GB)

(73) Assignee: MERCK PATENT GMBH, Darmstadt (DE)

( * ) Notice: Subject to any disclaimer, the term of this patent is extended or adjusted under 35 U.S.C. 154(b) by 0 days. days.

(21) Appl. No.: 14/900,482

(22) PCT Filed: Jun. 3, 2014

(86) PCT No.: PCT/EP2014/001492

§ 371 (c)(1),
(2) Date: Dec. 21, 2015

(87) PCT Pub. No.: WO2014/202184

PCT Pub. Date: Dec. 24, 2014

(65) Prior Publication Data

US 2016/0155946 A1 Jun. 2, 2016

(30) Foreign Application Priority Data

Jun. 21, 2013 (EP) .................................... 13003190

(51) Int. Cl.

| | |
|---|---|
| ***H01L 51/00*** | (2006.01) |
| ***H01B 1/12*** | (2006.01) |
| ***C08G 61/12*** | (2006.01) |
| *H01L 51/42* | (2006.01) |
| *H01L 51/05* | (2006.01) |
| *H01L 51/50* | (2006.01) |

(52) U.S. Cl.

CPC ........ *H01L 51/0036* (2013.01); *C08G 61/126* (2013.01); *H01B 1/127* (2013.01); *H01B 1/128* (2013.01); *H01L 51/0035* (2013.01); *H01L 51/0043* (2013.01); *H01L 51/0094* (2013.01); *C08G 61/123* (2013.01); *C08G 61/124* (2013.01); *C08G 2261/12* (2013.01); *C08G 2261/149* (2013.01); *C08G 2261/1412* (2013.01); *C08G 2261/1424* (2013.01); *C08G 2261/1426* (2013.01); *C08G 2261/18* (2013.01); *C08G 2261/3223* (2013.01); *C08G 2261/3243* (2013.01); *C08G 2261/3246* (2013.01); *C08G 2261/344* (2013.01); *C08G 2261/364* (2013.01); *C08G 2261/411* (2013.01); *C08G 2261/91* (2013.01); *H01L 51/0047* (2013.01); *H01L 51/0558* (2013.01); *H01L 51/0579* (2013.01); *H01L 51/424* (2013.01); *H01L 51/4253* (2013.01); *H01L 51/5012* (2013.01); *H01L 51/5056* (2013.01); *H01L 51/5072* (2013.01); *H01L 51/5088* (2013.01); *H01L 51/5092* (2013.01); *H01L 51/5096* (2013.01); *Y02E 10/549* (2013.01)

(58) Field of Classification Search

CPC ... H01L 51/0036; H01L 51/00; C07D 417/02; C07D 419/02

USPC ........ 252/500; 528/216, 257, 255, 289, 377, 528/380, 94; 526/257; 548/126; 549/4

See application file for complete search history.

(56) References Cited

U.S. PATENT DOCUMENTS

| | | | |
|---|---|---|---|
| 8,883,954 | B2 | 11/2014 | Byrne et al. |
| 2012/0149189 | A1 | 6/2012 | Basim et al. |
| 2014/0061538 | A1 | 3/2014 | Blouin |

FOREIGN PATENT DOCUMENTS

| | | | | |
|---|---|---|---|---|
| WO | 2012149189 A2 | | 11/2012 | |
| WO | 2012156022 A1 | | 11/2012 | |
| WO | WO 2016066241 A1 | * | 5/2016 | ........... C07D 513/04 |

OTHER PUBLICATIONS

STN Reg. No. 171559-14-1, Dec. 20, 1995.*

International Search Report dated Nov. 10, 2014 issued in corresponding application PCT/EP2014/001492 (pp. 1-3).

E. H. Morkved, et al., "Preparations and Template Cyclotetramerisations of 2, 1, 3-Benzothia(selena)diazole-5,6-dicarbonit riles", Acta Chemica Scandinavica, Munksgaard, vol. 49 (Jan. 1995) pp. 658-662.

S. Jinjun, et al., "Linear and star-shaped pyrazine-containing acene dicarboximides with high electron-affinity", Organic & Biomolecular Chemistry, vol. 10, No. 35 (Jul. 2012) pp. 7045-7052.

L. Hairong, et al., "New donor-[pi]-acceptor sensitizers containing 5H-[1,2,5] thiadiazolo [3,4-f]isoindole-5,7(6H)-dione and 6H-pyrrolo[3,4-g]quinoxaline-6,8(7H)-dione units", Chemical Communications, vol. 49, No. 24 (Jan. 2013) pp. 2409-2411.

L. Hairong, et al., "A high voltage solar cell using a donor-acceptor conjugated polymer based on pyrrolo[3,4-f]-2,1,3-benzothiadiazole-5,7-dione", Journal of Materials Chemistry, vol. 2, No. 42 (Sep. 2014) pp. 17925-17933.

(Continued)

*Primary Examiner* — Douglas J McGinty

(74) *Attorney, Agent, or Firm* — Millen, White, Zelano and Branigan, P.C.

(57) ABSTRACT

The invention relates to novel conjugated polymers containing one or more [1,2,5]Thiadiazolo[3,4-e]isoindole-5,7-dione (TID) repeating units, to methods for their preparation and educts or intermediates used therein, to polymer blends, mixtures and formulations containing them, to the use of the polymers, polymer blends, mixtures and formulations as organic semiconductors in, or for the preparation of, organic electronic (OE) devices, especially organic photovoltaic (OPV) devices and organic photodetectors (OPD), and to OE, OPV and OPD devices comprising, or being prepared from, these polymers, polymer blends, mixtures or formulations.

6 Claims, No Drawings

(56) References Cited

OTHER PUBLICATIONS

A. C. Grimsdale, et al., "Synthesis of Light-Emitting Conjugated Polymers for Applications in Electroluminescent Devices", Chemical Reviews, American Chemical Society, vol. 109 (Feb. 2009) pp. 897-1091.
Summary of Office Action in corresponding JP Appln. 2016-520305 dated Feb. 6, 2018.

* cited by examiner

CONJUGATED POLYMERS

TECHNICAL FIELD

The invention relates to novel conjugated polymers containing one or more [1,2,5]thiadiazolo[3,4-e]isoindole-5,7-dione (TID) repeating units, to methods for their preparation and educts or intermediates used therein, to polymer blends, mixtures and formulations containing them, to the use of the polymers, polymer blends, mixtures and formulations as organic semiconductors in, or for the preparation of, organic electronic (OE) devices, especially organic photovoltaic (OPV) devices and organic photodetectors (OPD), and to OE, OPV and OPD devices comprising, or being prepared from, these polymers, polymer blends, mixtures or formulations.

BACKGROUND

In recent years, there has been development of organic semiconducting (OSC) materials in order to produce more versatile, lower cost electronic devices. Such materials find application in a wide range of devices or apparatus, including organic field effect transistors (OFETs), organic light emitting diodes (OLEDs), organic photodetectors (OPDs), organic photovoltaic (OPV) cells, sensors, memory elements and logic circuits to name just a few. The organic semiconducting materials are typically present in the electronic device in the form of a thin layer, for example of between 50 and 300 nm thickness.

One particular area of importance is organic photovoltaics (OPV). Conjugated polymers have found use in OPVs as they allow devices to be manufactured by solution-processing techniques such as spin casting, dip coating or ink jet printing. Solution processing can be carried out cheaper and on a larger scale compared to the evaporative techniques used to make inorganic thin film devices. Currently, polymer based photovoltaic devices are achieving efficiencies above 8%.

However, the polymers for use in OPV or OPD devices that have been disclosed in prior art still leave room for further improvements, like a lower bandgap, better processability especially from solution, higher OPV cell efficiency, and higher stability.

Thus there is still a need for organic semiconducting (OSC) polymers which are easy to synthesize, especially by methods suitable for mass production, show good structural organization and film-forming properties, exhibit good electronic properties, especially a high charge carrier mobility, a good processibility, especially a high solubility in organic solvents, and high stability in air. Especially for use in OPV cells, there is a need for OSC materials having a low bandgap, which enable improved light harvesting by the photoactive layer and can lead to higher cell efficiencies, compared to the polymers from prior art.

It was an aim of the present invention to provide compounds for use as organic semiconducting materials that are easy to synthesize, especially by methods suitable for mass production, which show especially good processibility, high stability, good solubility in organic solvents, high charge carrier mobility, and a low bandgap. Another aim of the invention was to extend the pool of OSC materials available to the expert. Other aims of the present invention are immediately evident to the expert from the following detailed description.

The inventors of the present invention have found that one or more of the above aims can be achieved by providing conjugated polymers comprising [1,2,5]thiadiazolo[3,4-e]isoindole-5,7-dione (TID) repeating units as electron acceptor units, and one or more electron donor units, wherein these copolymers are random copolymers.

Surprisingly it was found that random donor-acceptor copolymers comprising such TID units provide several advantages. For example, they have an increased solubility profile in common organic solvents (and especially non-chlorinated solvents) leading to better processability, and exhibit a good solid state organisation leading to efficient charge transport. The incorporation of further electron acceptor units in addition to the TID units in the polymer backbone can lead to increased light absorption. WO 2012/149189 A2 discloses copolymers comprising TID units, but does not disclose random copolymers as disclosed and claimed hereinafter.

SUMMARY

The invention relates to a conjugated polymer comprising one or more divalent units of formula T (hereinafter referred to as "TID units")

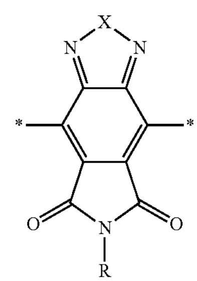

T wherein

X is S, O, Se or NR,

R denotes H or straight-chain, branched or cyclic alkyl with 1 to 30 C atoms, in which one or more $CH_2$ groups are optionally replaced by —O—, —S—, —C(═O)—, —C(═S)—, —C(═O)—O—, —O—C(═O)—, —$NR^0$—, —$SiR^0R^{00}$—, —CF—, —$CHR^0$═$CR^{00}$—, —$CY^1$═$CY^2$— or —C≡C— in such a manner that O and/or S atoms are not linked directly to one another, and in which one or more H atoms are optionally replaced by F, Cl, Br, I or CN, or denotes aryl or heteroaryl with 5 to 15 ring atoms, which is mono- or polycyclic and unsubstituted or substituted, preferably by halogen or by one or more of the aforementioned alkyl or cyclic alkyl groups, $Y^1$ and $Y^2$ are independently of each other H, F, Cl or CN, $R^0$ and $R^{00}$ are independently of each other H or optionally substituted $C_{1-40}$ carbyl or hydrocarbyl, and preferably denote H or alkyl with 1 to 24 C-atoms, optionally one or more distinct units having electron donor properties (hereinafter referred to as "donor units"), optionally one or more distinct units having electron acceptor properties (hereinafter referred to as "acceptor units" or "additional acceptor units"), one or more distinct units (hereinafter referred to as "spacer units") which are located between each of said TID units, optional donor units and optional acceptor units, thereby preventing that said TID units, optional donor units and acceptor units are directly connected to each other in the polymer chain, said optional donor units, optional acceptor units and spacer units being different from the TID units, and being selected from arylene and heteroarylene groups that are optionally substituted, wherein the polymer is a random copolymer formed by co-polymerising at least three different monomers comprising units selected from said TID units, optional donor units, optional acceptor units and spacer units.

The TID units are preferably acting as acceptor units in the conjugated copolymer.

The spacer units are selected such that they are not acting as electron acceptor towards the donor units, and such that they are acting as electron donor towards the TID units and the additional acceptor units. A preferred spacer unit is for example thiophene-2,5-diyl or dithiophene-2,5'-diyl, wherein the thiophene rings are optionally substituted in 3- and/or 4-position by a group R as defined in formula T.

The spacer units can be introduced into the copolymer for example by copolymerising monomers that comprise a TID unit flanked by one, two or more spacer units with reactive groups attached thereto, or by copolymerising monomers that essentially consist of one or more spacer units with reactive groups attached thereto.

A preferred conjugated polymer comprises one or more TID units as acceptor units, one or more spacer units, and one or more donor units, wherein the polymer is a random copolymer of said TID units, spacer units and donor units.

Another preferred conjugated polymer comprises one or more TID units as acceptor units, one or more spacer units, one or more additional acceptor units, and optionally one or more donor units, wherein the polymer is a random copolymer of said TID units, spacer units, optional donor units and additional acceptor units.

Another preferred conjugated polymer comprises one or more TID units, one or more spacer units, optionally one or more donor units, and optionally one or more additional acceptor units, wherein the polymer is a random copolymer of said TID units, spacer units, optional donor units and optional acceptor units, and wherein in the polymer chain each TID unit, optional donor unit and optional acceptor unit is connected on each side to at least one spacer unit (i.e. each TID unit, donor unit and acceptor unit is sandwiched by at least two spacer units) as exemplarily illustrated below:

-spacer-TID/donor/acceptor-spacer-

Another preferred conjugated polymer comprises one or more TID units, one or more spacer units, optionally one or more donor units, and optionally one or more acceptor units, wherein the polymer is a random copolymer of said TID units, spacer units, optional donor units and optional acceptor units, wherein in the polymer chain each TID unit, optional donor unit and optional acceptor unit is connected on each side to at least one spacer unit, and wherein in the polymer chain at least one of the TID units, optional donor units and optional acceptor units is connected on at least one side to at least two spacer units (i.e. at least one TID unit, donor unit and acceptor unit is sandwiched by a total of more than two spacer units) as exemplarily illustrated below:

-spacer-spacer-TID/donor/acceptor-spacer-

Another preferred conjugated polymer comprises one or more TID units as acceptor units, one or more spacer units, one or more donor units, and optionally one or more additional acceptor units, wherein the polymer is a random copolymer of said TID units, spacer units, donor units and optional acceptor units, and wherein the polymer comprises at least one additional acceptor unit, or the polymer comprises at least one TID unit that is separated from a neighbored TID, donor or acceptor unit by two or more spacer units.

The invention further relates to a monomer containing a unit of formula T and further containing one or more reactive groups which can be reacted to form a conjugated polymer as described above and below.

The invention further relates to the use of the polymer according to the present invention as electron donor or p-type semiconductor.

The invention further relates to the use of the polymer according to the present invention as electron donor component in a semiconducting material, polymer blend, device or component of a device.

The invention further relates to a mixture or polymer blend comprising one or more polymers according to the present invention and one or more additional compounds which are preferably selected from compounds having one or more of a semiconducting, charge transport, hole transport, electron transport, hole blocking, electron blocking, electrically conducting, photoconducting and light emitting property.

The invention further relates to a mixture or polymer blend comprising one or more polymers according to the present invention as electron donor component, and further comprising one or more compounds or polymers having electron acceptor properties.

The invention further relates to a mixture or polymer blend comprising one or more polymers according to the present invention and one or more n-type organic semiconducting compounds or polymers, preferably selected from fullerenes or substituted fullerenes.

The invention further relates to the use of a polymer, polymer blend or mixture of the present invention as semiconducting, charge transport, electrically conducting, photoconducting or light emitting material, or in an optical, electrooptical, electronic, electroluminescent or photoluminescent device, or in a component of such a device or in an assembly comprising such a device or component.

The invention further relates to a semiconducting, charge transport, electrically conducting, photoconducting or light emitting material, which comprises a polymer, polymer blend or mixture according to the present invention.

The invention further relates to a formulation comprising one or more polymers, polymer blends or mixtures according to the present invention and one or more solvents, preferably selected from organic solvents.

The invention further relates to an optical, electrooptical, electronic, electroluminescent or photoluminescent device, or a component thereof, or an assembly comprising it, which is prepared using a formulation according to the present invention.

The invention further relates to an optical, electrooptical, electronic, electroluminescent or photoluminescent device, or a component thereof, or an assembly comprising it, which comprises a polymer, polymer blend or mixture, or comprises a semiconducting, charge transport, electrically conducting, photoconducting or light emitting material, according to the present invention.

The optical, electrooptical, electronic, electroluminescent and photoluminescent device includes, without limitation, organic field effect transistors (OFET), organic thin film transistors (OTFT), organic light emitting diodes (OLED), organic light emitting transistors (OLET), organic photovoltaic devices (OPV), organic photodetectors (OPD), organic solar cells, dye-sensitized solar cells (DSSC), perovskite-based solar cells, laser diodes, Schottky diodes, photoconductors and photodetectors.

Preferred devices are OFETs, OTFTs, OPVs, OPDs and OLEDs, in particular bulk heterojunction (BHJ) OPVs or inverted BHJ OPVs.

Further preferred is the use of a compound, composition or polymer blend according to the present invention as dye in a DSSC or a perovskite-based solar cells, and a DSSC or perovskite-based solar cells comprising a compound, composition or polymer blend according to the present invention.

The component of the above devices includes, without limitation, charge injection layers, charge transport layers, interlayers, planarising layers, antistatic films, polymer electrolyte membranes (PEM), conducting substrates and conducting patterns.

The assembly comprising such a device or component includes, without limitation, integrated circuits (IC), radio frequency identification (RFID) tags or security markings or security devices containg them, flat panel displays or backlights thereof, electrophotographic devices, electrophotographic recording devices, organic memory devices, sensor devices, biosensors and biochips.

In addition the polymers, polymer blends, mixtures and formulations of the present invention can be used as electrode materials in batteries and in components or devices for detecting and discriminating DNA sequences.

The invention further relates to a bulk heterojunction which comprises, or is being formed from, a mixture comprising one or more polymers according to the present invention and one or more n-type organic semiconducting compounds that are preferably selected from fullerenes or substituted fullerenes. The invention further relates to a bulk heterojunction (BHJ) OPV device or inverted BHJ OPV device, comprising such a bulk heterojunction.

DETAILED DESCRIPTION

The polymers of the present invention are easy to synthesize and exhibit advantageous properties. They show good processability for the device manufacture process, high solubility in organic solvents, and are especially suitable for large scale production using solution processing methods. At the same time, the co-polymers derived from monomers of the present invention and electron donor monomers show low bandgaps, high charge carrier mobilities, high external quantum efficiencies in BHJ solar cells, good morphology when used in p/n-type blends e.g. with fullerenes, high oxidative stability, a long lifetime in electronic devices, and are promising materials for organic electronic OE devices, especially for OPV devices with high power conversion efficiency.

The units of formula T are especially suitable as (electron) acceptor unit in both n-type and p-type semiconducting compounds, polymers or copolymers, in particular copolymers containing both donor and acceptor units, and for the preparation of blends of p-type and n-type semiconductors which are suitable for use in BHJ photovoltaic devices.

Besides, the polymers of the present invention show the following advantageous properties:

i) The random nature of the polymer backbone leads to improved entropy of solution, especially in non-halogenated solvents, resulting in improved polymer solubility.

ii) Additional electron accepting units ($A^1$, $A^2$) in the polymer backbone provides LUMO energy level fine tuning, thus reducing the energy loss in the electron transfer process between the polymer and the n-type material (i.e. fullerene, graphene, metal oxide) in the active layer.

iii) Additional electron donoring units ($D^1$, $D^2$) in the polymer backbone provides HOMO energy level fine tuning, thus reducing the energy loss in the electron transfer process between the polymer and the n-type material (i.e. fullerene, graphene, metal oxide) in the active layer and allowing better control of the polymer stability in ambient conditions, especially towards oxygen and moisture.

iv) Spacer units ($Sp^{1-3}$) provide additional disorder, flexibility and freedom of rotation in the polymer backbone, leading to improved entropy of solution, especially in non-halogenated solvents, while maintaining sufficient structural order in the polymer backbone, resulting in improved polymer solubility.

v) Spacer units ($Sp^{1-3}$) which possess more than one solubilising group, enable higher polymer solubility in non-halogenated solvents due to the increased number of solubilising groups per repeat unit.

vi) The spacer units ($Sp^{1-3}$), which can each be composed of one or more aryl or heteroaryl unit, provide additional LUMO energy level fine tuning, thus reducing the energy loss in the electron transfer process between the polymer and the n-type material (i.e. fullerene, graphene, metal oxide) in the active layer.

vii) The spacer ($Sp^{1-3}$) units, which can each be composed of one or more aryl or heteroaryl unit, provide additional HOMO energy level fine tuning, thus allowing better control of the polymer band-gap leading to increased photon harvesting and allowing better control of the polymer stability in ambient conditions, especially towards oxygen and moisture.

The synthesis of the unit of formula T, its functional derivatives, compounds, homopolymers, and copolymers can be achieved based on methods that are known to the skilled person and described in the literature, as will be further illustrated herein.

As used herein, the term "polymer" will be understood to mean a molecule of high relative molecular mass, the structure of which essentially comprises the multiple repetition of units derived, actually or conceptually, from molecules of low relative molecular mass (*Pure Appl. Chem.*, 1996, 68, 2291). The term "oligomer" will be understood to mean a molecule of intermediate relative molecular mass, the structure of which essentially comprises a small plurality of units derived, actually or conceptually, from molecules of lower relative molecular mass (*Pure Appl. Chem.*, 1996, 68, 2291). In a preferred meaning as used herein present invention a polymer will be understood to mean a compound having >1, i.e. at least 2 repeat units, preferably ≥5 repeat units, and an oligomer will be understood to mean a compound with >1 and <10, preferably <5, repeat units.

Further, as used herein, the term "polymer" will be understood to mean a molecule that encompasses a backbone (also referred to as "main chain") of one or more distinct types of repeat units (the smallest constitutional unit of the molecule) and is inclusive of the commonly known terms "oligomer", "copolymer", "homopolymer", "random polymer" and the like. Further, it will be understood that the term polymer is inclusive of, in addition to the polymer itself, residues from initiators, catalysts and other elements attendant to the synthesis of such a polymer, where such residues are understood as not being covalently incorporated thereto. Further, such residues and other elements, while normally removed during post polymerization purification processes, are typically mixed or co-mingled with the polymer such that they generally remain with the polymer when it is transferred between vessels or between solvents or dispersion media.

As used herein, in a formula showing a polymer or a repeat unit, like for example a unit of formula T or a polymer of formula III or IV, or their subformulae, an asterisk (*) will be understood to mean a chemical linkage to an adjacent unit or to a terminal group in the polymer backbone. In a ring, like for example a benzene or thiophene ring, an asterisk (*) will be understood to mean a C atom that is fused to an adjacent ring.

As used herein, the terms "repeat unit", "repeating unit" and "monomeric unit" are used interchangeably and will be understood to mean the constitutional repeating unit (CRU), which is the smallest constitutional unit the repetition of which constitutes a regular macromolecule, a regular oligomer molecule, a regular block or a regular chain (*Pure Appl. Chem.,* 1996, 68, 2291). As further used herein, the term "unit" will be understood to mean a structural unit which can be a repeating unit on its own, or can together with other units form a constitutional repeating unit.

As used herein, a "terminal group" will be understood to mean a group that terminates a polymer backbone. The expression "in terminal position in the backbone" will be understood to mean a divalent unit or repeat unit that is linked at one side to such a terminal group and at the other side to another repeat unit. Such terminal groups include endcap groups, or reactive groups that are attached to a monomer forming the polymer backbone which did not participate in the polymerisation reaction, like for example a group having the meaning of $R^5$ or $R^6$ as defined below.

As used herein, the term "endcap group" will be understood to mean a group that is attached to, or replacing, a terminal group of the polymer backbone. The endcap group can be introduced into the polymer by an endcapping process. Endcapping can be carried out for example by reacting the terminal groups of the polymer backbone with a monofunctional compound ("endcapper") like for example an alkyl- or arylhalide, an alkyl- or arylstannane or an alkyl- or arylboronate. The endcapper can be added for example after the polymerisation reaction. Alternatively the endcapper can be added in situ to the reaction mixture before or during the polymerisation reaction. In situ addition of an endcapper can also be used to terminate the polymerisation reaction and thus control the molecular weight of the forming polymer. Typical endcap groups are for example H, phenyl and lower alkyl.

As used herein, the term "small molecule" will be understood to mean a monomeric compound which typically does not contain a reactive group by which it can be reacted to form a polymer, and which is designated to be used in monomeric form. In contrast thereto, the term "monomer" unless stated otherwise will be understood to mean a monomeric compound that carries one or more reactive functional groups by which it can be reacted to form a polymer.

As used herein, the terms "donor" or "donating" and "acceptor" or "accepting" will be understood to mean an electron donor or electron acceptor, respectively. "Electron donor" will be understood to mean a chemical entity that donates electrons to another compound or another group of atoms of a compound. "Electron acceptor" will be understood to mean a chemical entity that accepts electrons transferred to it from another compound or another group of atoms of a compound. See also International Union of Pure and Applied Chemistry, Compendium of Chemical Technology, Gold Book, Version 2.3.2, 19. August 2012, pages 477 and 480.

As used herein, the term "n-type" or "n-type semiconductor" will be understood to mean an extrinsic semiconductor in which the conduction electron density is in excess of the mobile hole density, and the term "p-type" or "p-type semiconductor" will be understood to mean an extrinsic semiconductor in which mobile hole density is in excess of the conduction electron density (see also, J. Thewlis, *Concise Dictionary of Physics*, Pergamon Press, Oxford, 1973).

As used herein, the term "leaving group" will be understood to mean an atom or group (which may be charged or uncharged) that becomes detached from an atom in what is considered to be the residual or main part of the molecule taking part in a specified reaction (see also *Pure Appl. Chem.,* 1994, 66, 1134).

As used herein, the term "conjugated" will be understood to mean a compound (for example a polymer) that contains mainly C atoms with $sp^2$-hybridisation (or optionally also sp-hybridisation), and wherein these C atoms may also be replaced by hetero atoms. In the simplest case this is for example a compound with alternating C—C single and double (or triple) bonds, but is also inclusive of compounds with aromatic units like for example 1,4-phenylene. The term "mainly" in this connection will be understood to mean that a compound with naturally (spontaneously) occurring defects, or with defects included by design, which may lead to interruption of the conjugation, is still regarded as a conjugated compound.

As used herein, unless stated otherwise the molecular weight is given as the number average molecular weight $M_n$ or weight average molecular weight $M_W$, which is determined by gel permeation chromatography (GPC) against polystyrene standards in eluent solvents such as tetrahydrofuran, trichloromethane (TCM, chloroform), chlorobenzene or 1,2,4-trichlorobenzene. Unless stated otherwise, 1,2,4-trichlorobenzene is used as solvent. The degree of polymerization, also referred to as total number of repeat units, n, will be understood to mean the number average degree of polymerization given as $n=M_n/M_U$, wherein $M_n$ is the number average molecular weight and $M_U$ is the molecular weight of the single repeat unit, see J. M. G. Cowie, *Polymers: Chemistry & Physics of Modern Materials*, Blackie, Glasgow, 1991.

As used herein, the term "carbyl group" will be understood to mean denotes any monovalent or multivalent organic radical moiety which comprises at least one carbon atom either without any non-carbon atoms (like for example —C≡C—), or optionally combined with at least one non-carbon atom such as N, O, S, P, Si, Se, As, Te or Ge (for example carbonyl etc.). The term "hydrocarbyl group" will be understood to mean a carbyl group that does additionally contain one or more H atoms and optionally contains one or more hetero atoms like for example N, O, S, B, P, Si, Se, As, Te or Ge.

As used herein, the term "hetero atom" will be understood to mean an atom in an organic compound that is not a H- or C-atom, and preferably will be understood to mean N, O, S, B, P, Si, Se, As, Te or Ge.

A carbyl or hydrocarbyl group comprising a chain of three or more C atoms may be straight-chain, branched and/or cyclic, and may include spiro-connected and/or fused rings.

Preferred carbyl and hydrocarbyl groups include alkyl, alkoxy, alkylcarbonyl, alkoxycarbonyl, alkylcarbonyloxy and alkoxycarbonyloxy, each of which is optionally substituted and has 1 to 40, preferably 1 to 25, very preferably 1 to 18 C atoms, furthermore optionally substituted aryl or aryloxy having 6 to 40, preferably 6 to 25 C atoms, furthermore alkylaryloxy, arylcarbonyl, aryloxycarbonyl, arylcarbonyloxy and aryloxycarbonyloxy, each of which is optionally substituted and has 6 to 40, preferably 7 to 40 C atoms, wherein all these groups do optionally contain one or more hetero atoms, preferably selected from N, O, S, B, P, Si, Se, As, Te and Ge.

Further preferred carbyl and hydrocarbyl group include for example: a $C_1$-$C_{40}$ alkyl group, a $C_1$-$C_{40}$ fluoroalkyl group, a $C_1$-$C_{40}$ alkoxy or oxaalkyl group, a $C_2$-$C_{40}$ alkenyl group, a $C_2$-$C_{40}$ alkynyl group, a $C_3$-$C_{40}$ allyl group, a $C_4$-$C_{40}$ alkyldienyl group, a $C_4$-$C_{40}$ polyenyl group, a $C_2$-$C_{40}$ ketone group, a $C_2$-$C_{40}$ ester group, a $C_6$-$C_{18}$ aryl group, a $C_6$-$C_{40}$ alkylaryl group, a $C_6$-$C_{40}$ arylalkyl group, a $C_4$-$C_{40}$ cycloalkyl group, a $C_4$-$C_{40}$ cycloalkenyl group, and the like. Preferred among the foregoing groups are a $C_1$-$C_{20}$ alkyl group, a $C_1$-$C_{20}$ fluoroalkyl group, a $C_2$-$C_{20}$ alkenyl group, a $C_2$-$C_{20}$ alkynyl group, a $C_3$-$C_{20}$ allyl group, a $C_4$-$C_{20}$ alkyldienyl group, a $C_2$-$C_{20}$ ketone group, a $C_2$-$C_{20}$ ester group, a $C_6$-$C_{12}$ aryl group, and a $C_4$-$C_{20}$ polyenyl group, respectively.

Also included are combinations of groups having carbon atoms and groups having hetero atoms, like e.g. an alkynyl group, preferably ethynyl, that is substituted with a silyl group, preferably a trialkylsilyl group.

The carbyl or hydrocarbyl group may be an acyclic group or a cyclic group. Where the carbyl or hydrocarbyl group is an acyclic group, it may be straight-chain or branched. Where the carbyl or hydrocarbyl group is a cyclic group, it may be a non-aromatic carbocyclic or heterocyclic group, or an aryl or heteroaryl group.

A non-aromatic carbocyclic group as referred to above and below is saturated or unsaturated and preferably has 4 to 30 ring C atoms. A non-aromatic heterocyclic group as referred to above and below preferably has 4 to 30 ring C atoms, wherein one or more of the C ring atoms are optionally replaced by a hetero atom, preferably selected from N, O, S, Si and Se, or by a —S(O)— or —$S(O)_2$— group. The non-aromatic carbo- and heterocyclic groups are mono- or polycyclic, may also contain fused rings, preferably contain 1, 2, 3 or 4 fused or unfused rings, and are optionally substituted with one or more groups L, wherein L is selected from halogen, —CN, —NC, —NCO, —NCS, —OCN, —SCN, —C(═O)$NR^0R^{00}$, —C(═O)$X^0$, —C(═O)$R^0$, —$NH_2$, —$NR^0R^{00}$, —SH, —$SR^0$, —$SO_3H$, —$SO_2R^0$, —OH, —$NO_2$, —$CF_3$, —$SF_5$, optionally substituted silyl, or carbyl or hydrocarbyl with 1 to 40 C atoms that is optionally substituted and optionally comprises one or more hetero atoms, and is preferably alkyl, alkoxy, thioalkyl, alkylcarbonyl, alkoxycarbonyl or alkoxycarbonyloxy with 1 to 20 C atoms that is optionally fluorinated, $X^0$ is halogen, preferably F, Cl or Br, and $R^0$, $R^{00}$ have the meanings given above and below, and preferably denote H or alkyl with 1 to 20 C atoms.

Preferred substituents L are selected from halogen, most preferably F, or alkyl, alkoxy, oxaalkyl, thioalkyl, fluoroalkyl and fluoroalkoxy with 1 to 16 C atoms, or alkenyl or alkynyl with 2 to 20 C atoms.

Preferred non-aromatic carbocyclic or heterocyclic groups are tetrahydrofuran, indane, pyran, pyrrolidine, piperidine, cyclopentane, cyclohexane, cycloheptane, cyclopentanone, cyclohexanone, dihydro-furan-2-one, tetrahydro-pyran-2-one and oxepan-2-one.

An aryl group as referred to above and below preferably has 4 to 30 ring C atoms, is mono- or polycyclic and may also contain fused rings, preferably contains 1, 2, 3 or 4 fused or unfused rings, and is optionally substituted with one or more groups L as defined above.

A heteroaryl group as referred to above and below preferably has 4 to 30 ring C atoms, wherein one or more of the C ring atoms are replaced by a hetero atom, preferably selected from N, O, S, Si and Se, is mono- or polycyclic and may also contain fused rings, preferably contains 1, 2, 3 or 4 fused or unfused rings, and is optionally substituted with one or more groups L as defined above.

As used herein, “arylene” will be understood to mean a divalent aryl group, and “heteroarylene” will be understood to mean a divalent heteroaryl group, including all preferred meanings of aryl and heteroaryl as given above and below.

Preferred aryl and heteroaryl groups are phenyl in which, in addition, one or more CH groups may be replaced by N, naphthalene, thiophene, selenophene, thienothiophene, dithienothiophene, fluorene and oxazole, all of which can be unsubstituted, mono- or polysubstituted with L as defined above. Very preferred rings are selected from pyrrole, preferably N-pyrrole, furan, pyridine, preferably 2- or 3-pyridine, pyrimidine, pyridazine, pyrazine, triazole, tetrazole, pyrazole, imidazole, isothiazole, thiazole, thiadiazole, isoxazole, oxazole, oxadiazole, thiophene, preferably 2-thiophene, selenophene, preferably 2-selenophene, thieno[3,2-b]thiophene, thieno[2,3-b]thiophene, furo[3,2-b]furan, furo[2,3-b]furan, seleno[3,2-b]selenophene, seleno[2,3-b]selenophene, thieno[3,2-b]selenophene, thieno[3,2-b]furan, indole, isoindole, benzo[b]furan, benzo[b]thiophene, benzo[1,2-b;4,5-b']dithiophene, benzo[2,1-b;3,4-b']dithiophene, quinole, 2-methylquinole, isoquinole, quinoxaline, quinazoline, benzotriazole, benzimidazole, benzothiazole, benzisothiazole, benzisoxazole, benzoxadiazole, benzoxazole, benzothiadiazole, 4H-cyclopenta[2,1-b;3,4-b']dithiophene, 7H-3,4-dithia-7-sila-cyclopenta[a]pentalene, all of which can be unsubstituted, mono- or polysubstituted with L as defined above. Further examples of aryl and heteroaryl groups are those selected from the groups shown hereinafter.

An alkyl group or an alkoxy group, i.e., where the terminal $CH_2$ group is replaced by —O—, can be straight-chain or branched. It is preferably a straight-chain, has 2, 3, 4, 5, 6, 7, 8, 10, 12, 14, 16, 18, 20 or 24 carbon atoms and accordingly is preferably ethyl, propyl, butyl, pentyl, hexyl, heptyl, octyl, decyl, dodecyl, tetradecyl, hexadecyl, octadecyl or didecyl, ethoxy, propoxy, butoxy, pentoxy, hexoxy, heptoxy, octoxy, decoxy, dodecoxy, tetradecoxy, hexadecoxy, octadecoxy or didecoxy, furthermore methyl, nonyl, undecyl, tridecyl, pentadecyl, nonoxy, undecoxy or tridecoxy, for example.

An alkenyl group, wherein one or more $CH_2$ groups are replaced by —CH═CH— can be straight-chain or branched. It is preferably straight-chain, has 2 to 10 C atoms and accordingly is preferably vinyl, prop-1-, or prop-2-enyl, but-1-, 2- or but-3-enyl, pent-1-, 2-, 3- or pent-4-enyl, hex-1-, 2-, 3-, 4- or hex-5-enyl, hept-1-, 2-, 3-, 4-, 5- or hept-6-enyl, oct-1-, 2-, 3-, 4-, 5-, 6- or oct-7-enyl, non-1-, 2-, 3-, 4-, 5-, 6-, 7- or non-8-enyl, dec-1-, 2-, 3-, 4-, 5-, 6-, 7-, 8- or dec-9-enyl.

Especially preferred alkenyl groups are $C_2$-$C_7$-1E-alkenyl, $C_4$-$C_7$-3E-alkenyl, $C_5$-$C_7$-4-alkenyl, $C_6$-$C_7$-5-alkenyl and $C_7$-6-alkenyl, in particular $C_2$-$C_7$-1E-alkenyl, $C_4$-$C_7$-3E-alkenyl and $C_5$-$C_7$-4-alkenyl. Examples for particularly preferred alkenyl groups are vinyl, 1E-propenyl, 1E-butenyl, 1E-pentenyl, 1E-hexenyl, 1E-heptenyl, 3-butenyl, 3E-pentenyl, 3E-hexenyl, 3E-heptenyl, 4-pentenyl, 4Z-hexenyl, 4E-hexenyl, 4Z-heptenyl, 5-hexenyl, 6-heptenyl and the like. Groups having up to 5 C atoms are generally preferred.

An oxaalkyl group, i.e. where one $CH_2$ group is replaced by —O—, is preferably straight-chain 2-oxapropyl (=methoxymethyl), 2-(=ethoxymethyl) or 3-oxabutyl (=2-methoxyethyl), 2-, 3-, or 4-oxapentyl, 2-, 3-, 4-, or 5-oxahexyl, 2-, 3-, 4-, 5-, or 6-oxaheptyl, 2-, 3-, 4-, 5-, 6- or 7-oxaoctyl, 2-, 3-, 4-, 5-, 6-, 7- or 8-oxanonyl or 2-, 3-, 4-, 5-, 6-, 7-, 8- or 9-oxadecyl, for example. Oxaalkyl, i.e. where one $CH_2$ group is replaced by —O—, is preferably straight-chain 2-oxapropyl (=methoxymethyl), 2-(=ethoxymethyl) or 3-oxabutyl (=2-methoxyethyl), 2-, 3-, or 4-oxapentyl, 2-, 3-, 4-, or 5-oxahexyl, 2-, 3-, 4-, 5-, or 6-oxaheptyl, 2-, 3-, 4-, 5-, 6- or 7-oxaoctyl, 2-, 3-, 4-, 5-, 6-, 7- or 8-oxanonyl or 2-, 3-, 4-, 5-, 6-, 7-, 8- or 9-oxadecyl, for example.

In an alkyl group wherein one $CH_2$ group is replaced by —O— and one $CH_2$ group is replaced by —C(O)—, these radicals are preferably neighboured. Accordingly these radicals together form a carbonyloxy group —C(O)—O— or an oxycarbonyl group —O—C(O)—. Preferably this group is straight-chain and has 2 to 6 C atoms. It is accordingly preferably acetyloxy, propionyloxy, butyryloxy, pentanoyloxy, hexanoyloxy, acetyloxymethyl, propionyloxymethyl, butyryloxymethyl, pentanoyloxymethyl, 2-acetyloxyethyl, 2-propionyloxyethyl, 2-butyryloxyethyl, 3-acetyloxypropyl, 3-propionyloxypropyl, 4-acetyloxybutyl, methoxycarbonyl, ethoxycarbonyl, propoxycarbonyl, butoxycarbonyl, pentoxycarbonyl, methoxycarbonylmethyl, ethoxycarbonylmethyl, propoxycarbonylmethyl, butoxycarbonylmethyl, 2-(methoxycarbonyl)ethyl, 2-(ethoxycarbonyl)ethyl, 2-(propoxycarbonyl)ethyl, 3-(methoxycarbonyl)propyl, 3-(ethoxycarbonyl)propyl, 4-(methoxycarbonyl)-butyl.

An alkyl group wherein two or more $CH_2$ groups are replaced by —O— and/or —C(O)O— can be straight-chain or branched. It is preferably straight-chain and has 3 to 12 C atoms. Accordingly it is preferably bis-carboxy-methyl, 2,2-bis-carboxy-ethyl, 3,3-bis-carboxy-propyl, 4,4-bis-carboxy-butyl, 5,5-bis-carboxy-pentyl, 6,6-bis-carboxy-hexyl, 7,7-bis-carboxy-heptyl, 8,8-bis-carboxy-octyl, 9,9-bis-carboxy-nonyl, 10,10-bis-carboxy-decyl, bis-(methoxycarbonyl)-methyl, 2,2-bis-(methoxycarbonyl)-ethyl, 3,3-bis-(methoxycarbonyl)-propyl, 4,4-bis-(methoxycarbonyl)-butyl, 5,5-bis-(methoxycarbonyl)-pentyl, 6,6-bis-(methoxycarbonyl)-hexyl, 7,7-bis-(methoxycarbonyl)-heptyl, 8,8-bis-(methoxycarbonyl)-octyl, bis-(ethoxycarbonyl)-methyl, 2,2-bis-(ethoxycarbonyl)-ethyl, 3,3-bis-(ethoxycarbonyl)-propyl, 4,4-bis-(ethoxycarbonyl)-butyl, 5,5-bis-(ethoxycarbonyl)-hexyl.

A thioalkyl group, i.e where one $CH_2$ group is replaced by —S—, is preferably straight-chain thiomethyl (—$SCH_3$), 1-thioethyl (—$SCH_2CH_3$), 1-thiopropyl (=—$SCH_2CH_2CH_3$), 1-(thiobutyl), 1-(thiopentyl), 1-(thiohexyl), 1-(thioheptyl), 1-(thiooctyl), 1-(thiononyl), 1-(thiodecyl), 1-(thioundecyl) or 1-(thiododecyl), wherein preferably the $CH_2$ group adjacent to the $sp^2$ hybridised vinyl carbon atom is replaced.

A fluoroalkyl group is preferably perfluoroalkyl $C_iF_{2i+1}$, wherein i is an integer from 1 to 15, in particular $CF_3$, $C_2F_5$, $C_3F_7$, $C_4F_9$, $C_5F_{11}$, $C_6F_{13}$, $C_7F_{15}$ or $C_8F_{17}$, very preferably $C_6F_{13}$, or partially fluorinated alkyl, in particular 1,1-difluoroalkyl, all of which are straight-chain or branched.

Alkyl, alkoxy, alkenyl, oxaalkyl, thioalkyl, carbonyl and carbonyloxy groups can be achiral or chiral groups. Particularly preferred chiral groups are 2-butyl (=1-methylpropyl), 2-methylbutyl, 2-methylpentyl, 2-ethylhexyl, 2-butylhexyl, 2-ethyloctyl, 2-butyloctly, 2-hexyloctyl, 2-ethyldecyl, 2-butyldecyl, 2-hexyldecyl, 2-octyldecyl, 2-ethyldodecyl, 2-butyldodecyl, 2-hexyldodecyl, 2-octyldodecyl, 2-decyldodecyl, 2-propylpentyl, 3-methylpentyl, 3-ethylpentyl, 3-ethylheptyl, 3-butylheptyl, 3-ethylnonyl, 3-butylnonyl, 3-hexylnonyl, 3-ethylundecyl, 3-butylundecyl, 3-hexylundecyl, 3-octylundecyl, 4-ethylhexyl, 4-ethyloctyl, 4-butyloctyl, 4-ethyldecyl, 4-butyldecyl, 4-hexyldecyl, 4-ethyldodecyl, 4-butyldodecyl, 4-hexyldodecyl, 4-octyldodecyl, in particular 2-methylbutyl, 2-methylbutoxy, 2-methylpentoxy, 3-methyl-pentoxy, 2-ethyl-hexoxy, 2-butyloctoxyo, 2-hexyldecoxy, 2-octyldodecoxy, 1-methylhexoxy, 2-octyloxy, 2-oxa-3-methylbutyl, 3-oxa-4-methylpentyl, 4-methylhexyl, 2-hexyl, 2-octyl, 2-nonyl, 2-decyl, 2-dodecyl, 6-methoxy-octoxy, 6-methyloctoxy, 6-methyloctanoyloxy, 5-methylheptyloxy-carbonyl, 2-methylbutyryloxy, 3-methylvaleroyloxy, 4-methylhexanoyloxy, 2-chloro-propionyloxy, 2-chloro-3-methylbutyryloxy, 2-chloro-4-methyl-valeryloxy, 2-chloro-3-methylvaleryloxy, 2-methyl-3-oxapentyl, 2-methyl-3-oxa-hexyl, 1-methoxypropyl-2-oxy, 1-ethoxypropyl-2-oxy, 1-propoxypropyl-2-oxy, 1-butoxypropyl-2-oxy, 2-fluorooctyloxy, 2-fluorodecyloxy, 1,1,1-trifluoro-2-octyloxy, 1,1,1-trifluoro-2-octyl, 2-fluoromethyloctyloxy for example. Very preferred are 2-ethylhexyl, 2-butylhexyl, 2-ethyloctyl, 2-butyloctly, 2-hexyloctyl, 2-ethyldecyl, 2-butyldecyl, 2-hexyldecyl, 2-octyldecyl, 2-ethyldodecyl, 2-butyldodecyl, 2-hexyldodecyl, 2-octyldodecyl, 2-decyldodecyl, 3-ethylheptyl, 3-butylheptyl, 3-ethylnonyl, 3-butylnonyl, 3-hexylnonyl, 3-ethylundecyl, 3-butylundecyl, 3-hexylundecyl, 3-octylundecyl, 4-ethyloctyl, 4-butyloctyl, 4-ethyldecyl, 4-butyldecyl, 4-hexyldecyl, 4-ethyldodecyl, 4-butyldodecyl, 4-hexyldodecyl, 4-octyldodecyl, 2-hexyl, 2-octyl, 2-octyloxy, 1,1,1-trifluoro-2-hexyl, 1,1,1-trifluoro-2-octyl and 1,1,1-trifluoro-2-octyloxy.

Preferred achiral branched groups are isopropyl, isobutyl (=methylpropyl), isopentyl (=3-methylbutyl), tert. butyl, isopropoxy, 2-methyl-propoxy and 3-methylbutoxy.

In a preferred embodiment, the alkyl groups are independently of each other selected from primary, secondary or tertiary alkyl or alkoxy with 1 to 30 C atoms, wherein one or more H atoms are optionally replaced by F, or aryl, aryloxy, heteroaryl or heteroaryloxy that is optionally alkylated or alkoxylated and has 4 to 30 ring atoms. Very preferred groups of this type are selected from the group consisting of the following formulae

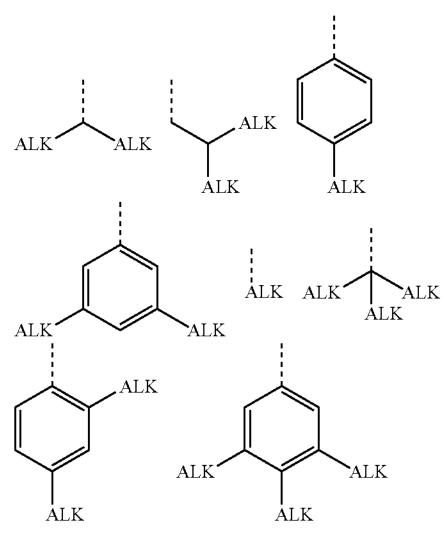

wherein "ALK" denotes optionally fluorinated, preferably linear, alkyl or alkoxy with 1 to 20, preferably 1 to 12 C-atoms, in case of tertiary groups very preferably 1 to 9 C atoms, and the dashed line denotes the link to the ring to which these groups are attached. Especially preferred among these groups are those wherein all ALK subgroups are identical.

—$CY^{11}$═$CY^{12}$— is preferably —CH═CH—, —CF═CF— or —CH═C(CN)—.

As used herein, "halogen" includes F, Cl, Br or I, preferably F, Cl or Br.

As used herein, —CO—, —C(═O)— and —C(O)— will be understood to mean a carbonyl group, i.e. a group having the structure

Preferred TID units of formula T are those of formula Ta:

T1

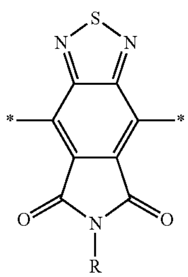

wherein R is as defined in formula T.

Preferably R in formula T and T1 denotes straight-chain, branched or cyclic alkyl with 1 to 50, preferably 1 to 30, C atoms that is optionally fluorinated.

In another preferred embodiment R denotes a straight-chain, branched or cyclic alkyl group with 1 to 50, preferably 2 to 50, very preferably 2 to 30, more preferably 2 to 24, most preferably 2 to 16 C atoms, in which one or more $CH_2$ or $CH_3$ groups are replaced by a cationic or anionic group.

The cationic group is preferably selected from the group consisting of phosphonium, sulfonium, ammonium, uronium, thiouronium, guanidinium or heterocyclic cations such as imidazolium, pyridinium, pyrrolidinium, triazolium, morpholinium or piperidinium cation.

Preferred cationic groups are selected from the group consisting of tetraalkylammonium, tetraalkylphosphonium, N-alkylpyridinium, N,N-dialkylpyrrolidinium, 1,3-dialkylimidazolium, wherein "alkyl" preferably denotes a straight-chain or branched alkyl group with 1 to 12 C atoms.

Further preferred cationic groups are selected from the group consisting of the following formulae

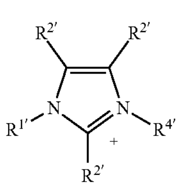

imidazolium

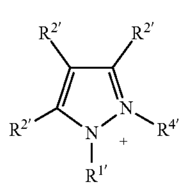

1H-pyrazolium

-continued

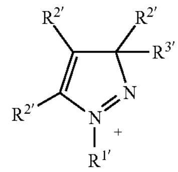

3H-pyrazolium

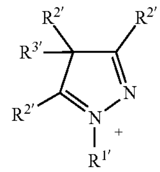

4H-pyrazolium

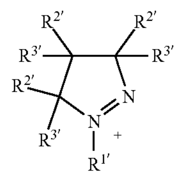

1-pyrazolinium

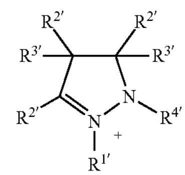

2-pyrazolinium

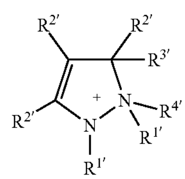

3-pyrazolinium

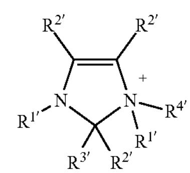

2-3,dihydroimidazolinium

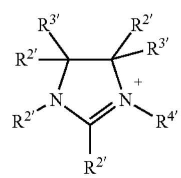

4-5,dihydroimidazolinium

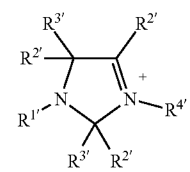

2-5,dihydroimidazolinium

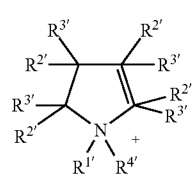

pyrrolidinium

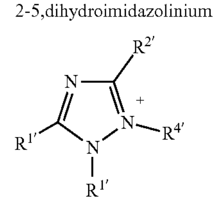

1,2,4-triazolium

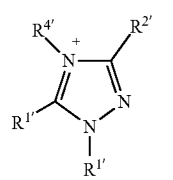

1,2,4-triazolium

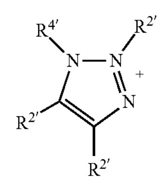

1,2,3-triazolium

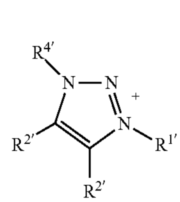

1,2,3-triazolium

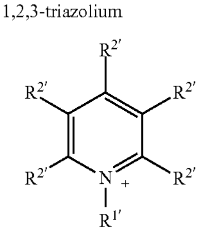

pyridinium

-continued

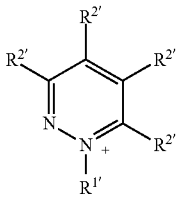, pyridazinium

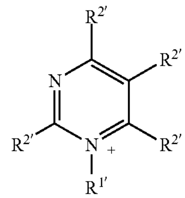, pyrimidinium

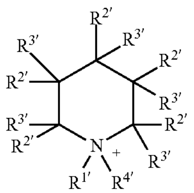, piperidinium

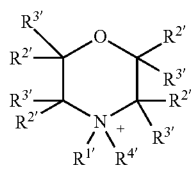, morpholinium

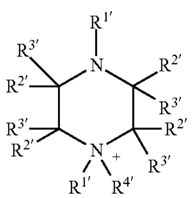, piperazinium

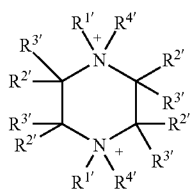, piperazinium

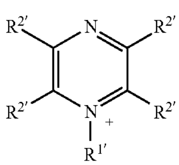

pyrazinium

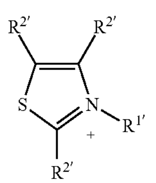

thiazolium

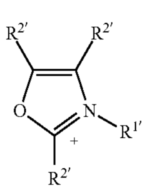, oxazolium

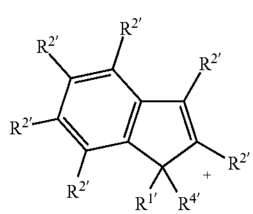, indolium

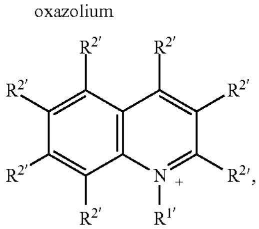

quinolinium

-continued

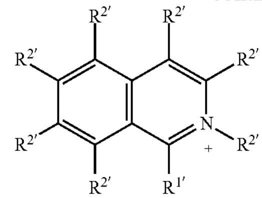, isoquinolinium

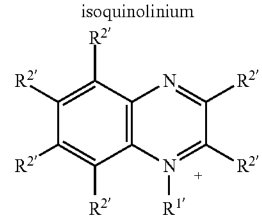

or quinoxalinium

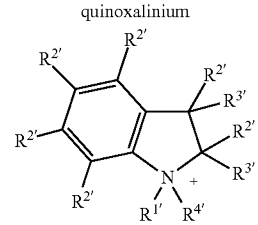

indolinium wherein $R^{1'}$, $R^{2'}$, $R^{3'}$ and $R^{4'}$ denote, independently of each other, H, a straight-chain or branched alkyl group with 1 to 12 C atoms or non-aromatic carbo- or heterocyclic group or an aryl or heteroaryl group, each of the aforementioned groups having 3 to 20, preferably 5 to 15, ring atoms, being mono- or polycyclic, and optionally being substituted by one or more identical or different substituents $R^S$ as defined below, or denote a link to the group R.

In the above cationic groups of the above-mentioned formulae any one of the groups $R^{1'}$, $R^{2'}$, $R^{3'}$ and $R^{4'}$ (if they replace a $CH_3$ group) can denote a link to the group $R^1$, or two neighbored groups $R^{1'}$, $R^{2'}$, $R^{3'}$ or $R^{4'}$ (if they replace a $CH_2$ group) can denote a link to the group R.

The anionic group is preferably selected from the group consisting of borate, imide, phosphate, sulfonate, sulfate, succinate, naphthenate or carboxylate, very preferably from phosphate, sulfonate or carboxylate.

Preferably the conjugated polymer comprises one or more TID units T that are selected of formula T or T1, optionally one or more distinct donor units $D^1$ or $D^2$ that are selected from arylene and heteroarylene groups that are optionally substituted and are different from T, optionally one or more distinct acceptor units $A^1$ or $A^2$ that are selected from arylene and heteroarylene groups that are optionally substituted and are different from T, $D^1$ and $D^2$, one or more distinct spacer units $Sp^1$, $Sp^2$ or $Sp^3$ that are selected from arylene and heteroarylene groups that are optionally substituted and are different from T, $D^1$, $D^2$, $A^1$ and $A^2$, wherein each unit T, $D^1$, $D^2$, $A^1$, $A^2$ is connected on each side to at least one spacer unit $Sp^1$, $Sp^2$ or $Sp^3$, thereby forming a triad -Sp-T-Sp-, -Sp-D-Sp- or -Sp-A-Sp-, respectively, wherein Sp is $Sp^1$, $Sp^2$ or $Sp^3$, D is $D^1$ or $D^2$, and A is $A^1$ or $A^2$, and wherein the polymer is a random copolymer formed by the units T and $Sp^1$, and optionally one or more of the units $D^1$, $D^2$, $Sp^2$, $Sp^3$, $A^1$ and $A^2$.

Preferably the conjugated polymer comprises at least one acceptor unit $A^1$ or $A^2$, in addition to the unit T acting as acceptor unit.

Further preferably the conjugated polymer comprises at least one unit T that is separated from a neighbored donor unit $D^1$ or $D^2$ and/or from a neighbored acceptor unit $A^1$ or $A^2$ by two or more spacer units.

Preferably the units $A^1$, $A^2$, $D^1$, $D^2$, $Sp^1$, $Sp^2$ and $Sp^3$ denote, on each occurrence identically or differently, and independently of each other, arylene or heteroarylene that is different from T, preferably has 5 to 30 ring atoms, and is optionally substituted, preferably by one or more groups $R^S$, wherein $R^S$ is on each occurrence identically or differently F, Br, Cl, —CN, —NC, —NCO, —NCS, —OCN, —SCN, —C(O)$NR^0R^{00}$, —C(O)$X^0$, —C(O)$R^0$, —C(O)O$R^0$, —$NH_2$, —$NR^0R^{00}$, —SH, —$SR^0$, —$SO_3H$, —$SO_2R^0$, —OH, —$NO_2$, —$CF_3$, —$SF_5$, optionally substituted silyl, carbyl or hydrocarbyl with 1 to 40 C atoms that is optionally substituted and optionally comprises one or more hetero atoms, $R^0$ and $R^{00}$ are independently of each other H or optionally substituted $C_{1-40}$ carbyl or hydrocarbyl, and preferably denote H or alkyl with 1 to 12 C-atoms, $X^0$ is halogen, preferably F, Cl or Br, $R^S$ preferably denotes, on each occurrence identically or differently, H, straight-chain, branched or cyclic alkyl with 1 to 30 C atoms, in which one or more $CH_2$ groups are optionally replaced by —O—, —S—, —C(O)—, —C(S)—, —C(O)—O—, —O—C(O)—, —$NR^0$—, —$SiR^0R^{00}$—, —$CF_2$—, —$CHR^0$=$CR^{00}$—, —$CY^1$=$CY^2$— or —C≡C— in such a manner that O and/or S atoms are not linked directly to one another, and in which one or more H atoms are optionally replaced by F, Cl, Br, I or CN, or denotes aryl, heteroaryl, aryloxy or heteroaryloxy with 4 to 20 ring atoms which is optionally substituted, preferably by halogen or by one or more of the aforementioned alkyl or cyclic alkyl groups.

Preferably the donor units, like $D^1$ and $D^2$, are selected from the group consisting of the following formulae (D1)

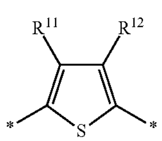

(D2)

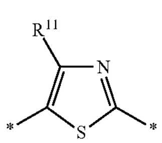

(D3)

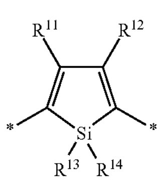

-continued (D4)

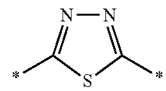

(D5)

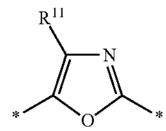

(D6)

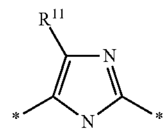

(D7)

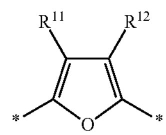

(D8)

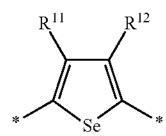

(D9)

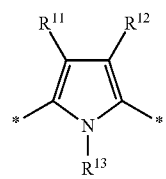

(D10)

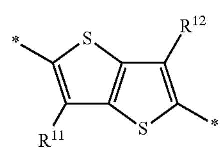

(D11)

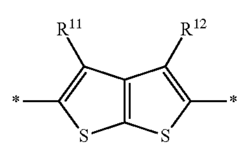

(D12)

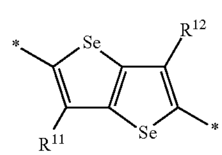

(D13)

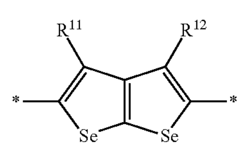

(D14)

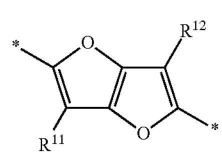

-continued
(D15)
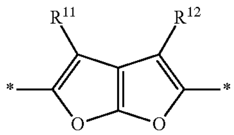
(D16)
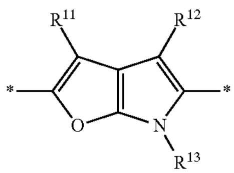
(D17)
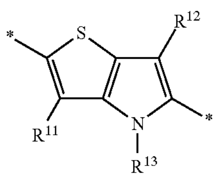
(D18)
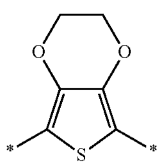
(D19)
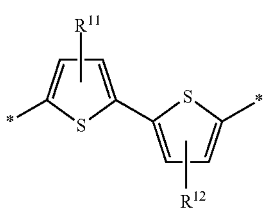
(D20)
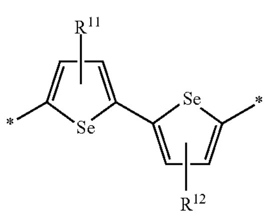
(D21)
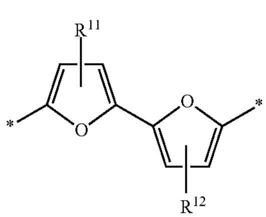
(D22)
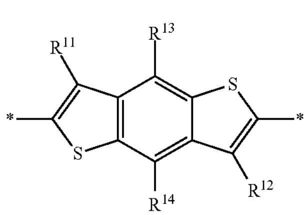
-continued
(D23)
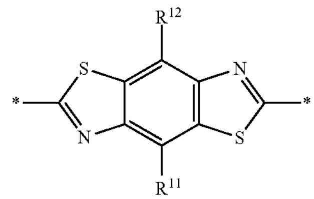
(D24)
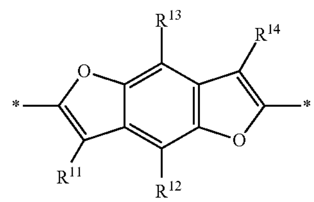
(D25)
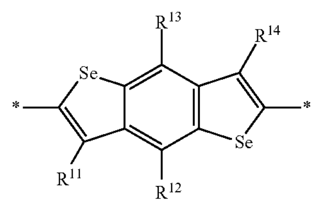
(D26)
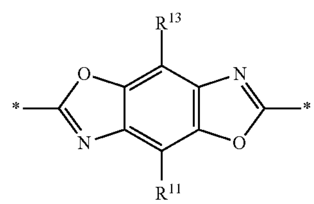
(D27)
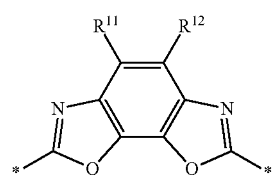
(D28)
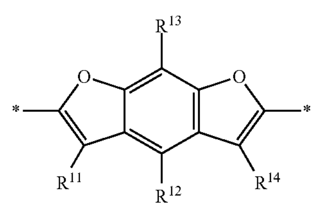
(D29)
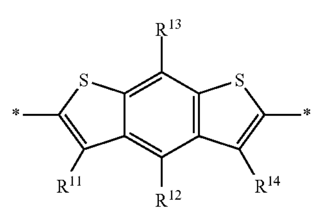
(D30)
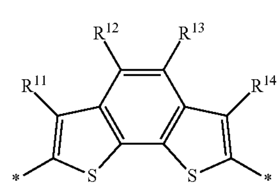

-continued
(D31)
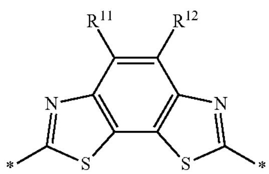
(D32)
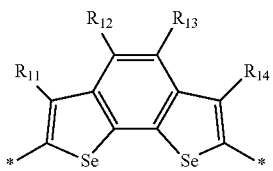
(D33)
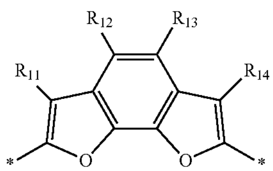
(D34)
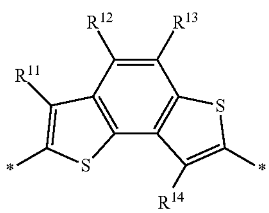
(D35)
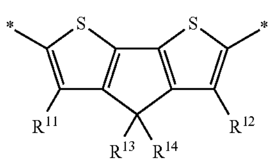
(D36)
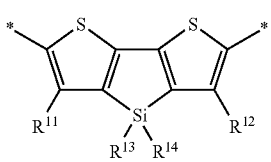
(D37)
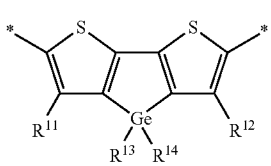
(D38)
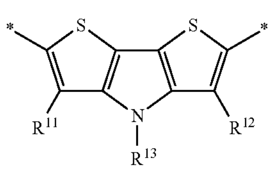
(D39)
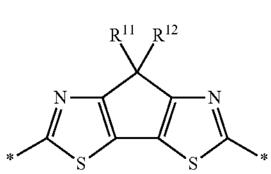
-continued
(D40)
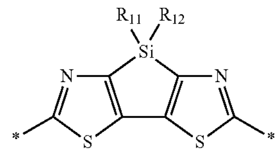
(D41)
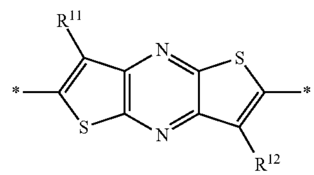
(D42)
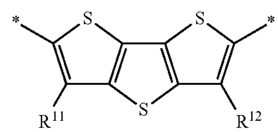
(D43)
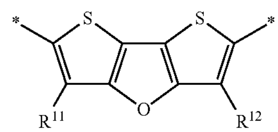
(D44)
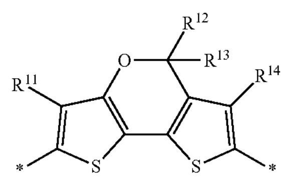
(D45)
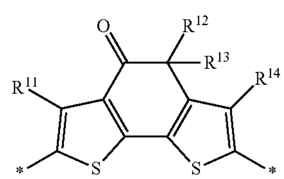
(D46)
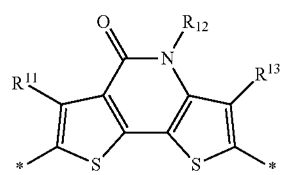
(D47)
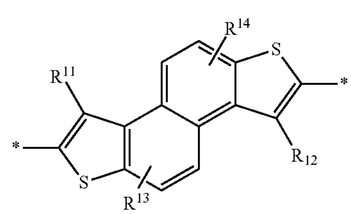
(D48)
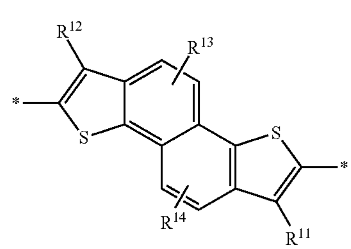

-continued
(D49)
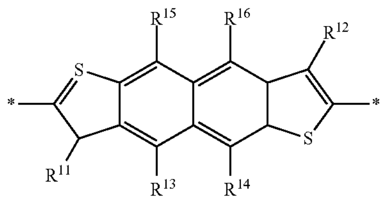
(D50)
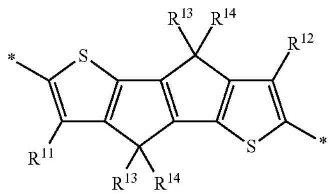
(D51)
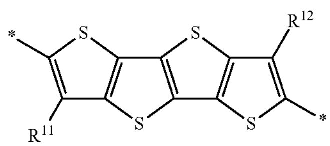
(D52)
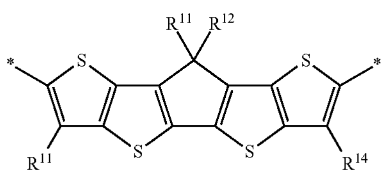
(D53)
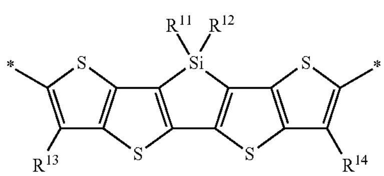
(D54)
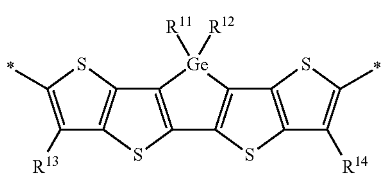
(D55)
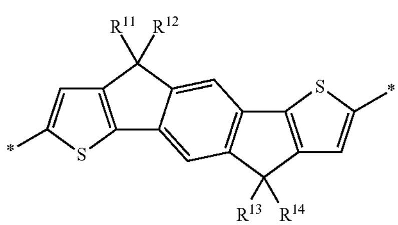
(D56)
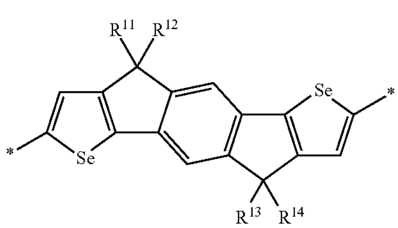
-continued
(D57)
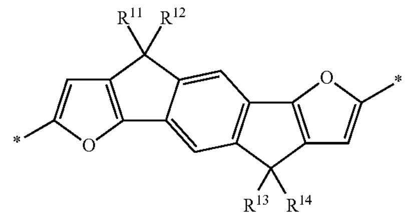
(D58)
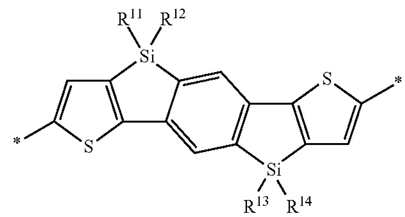
(D59)
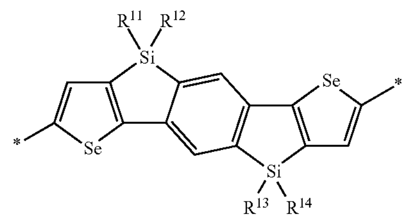
(D60)
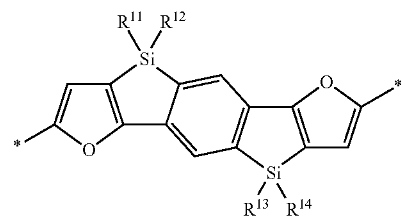
(D61)
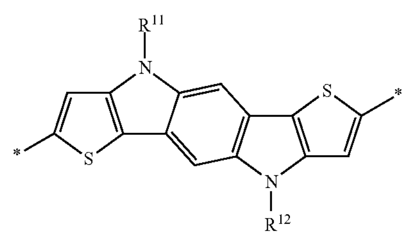
(D62)
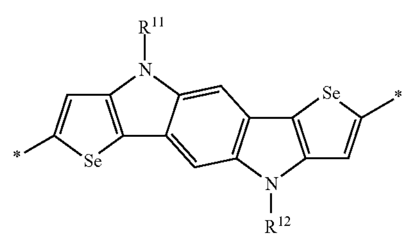
(D63)
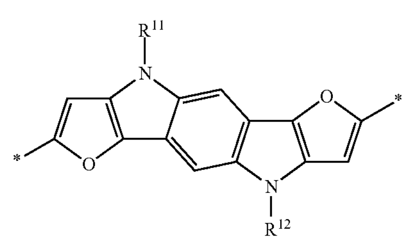

-continued
(D64)
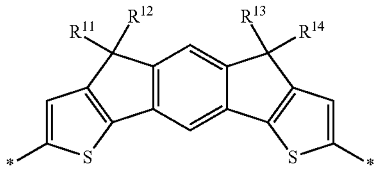
(D65)
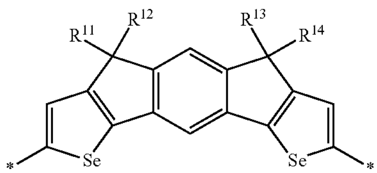
(D66)
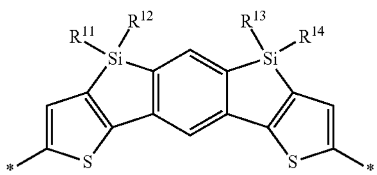
(D67)
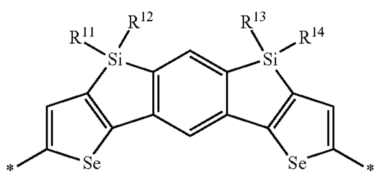
(D68)
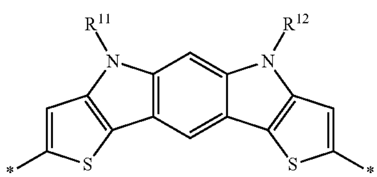
(D69)
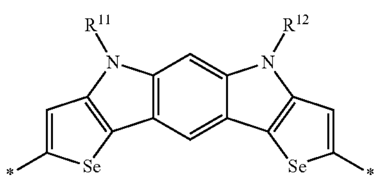
(D70)
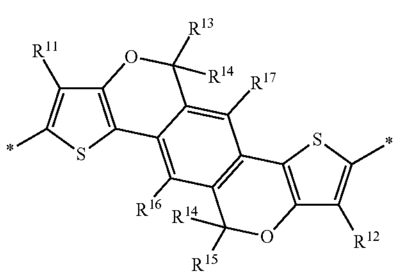
(D71)
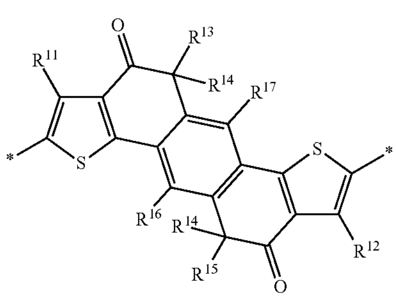
-continued
(D72)
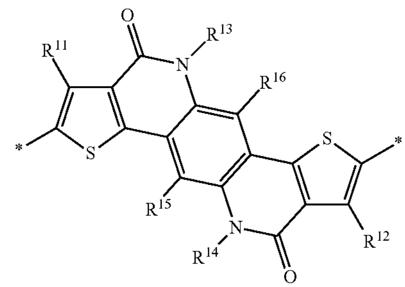
(D73)
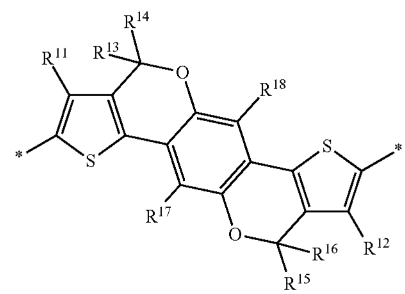
(D74)
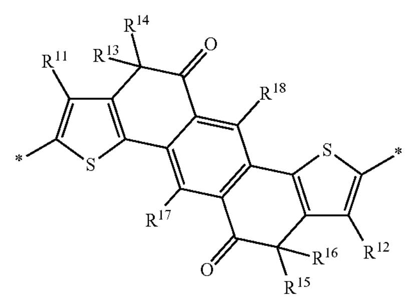
(D75)
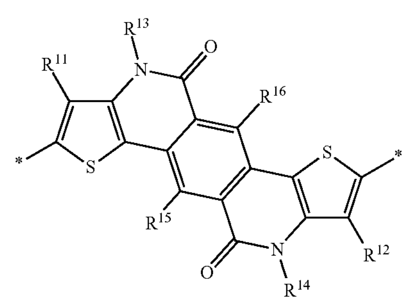
(D76)
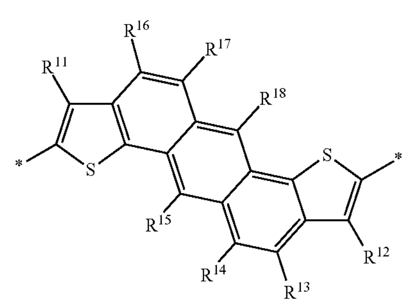

-continued
(D77)
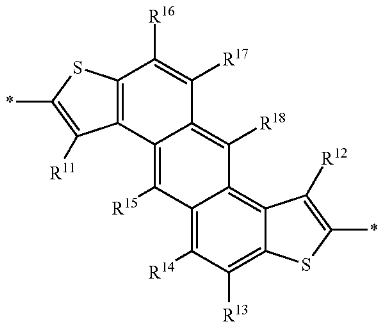
(D78)
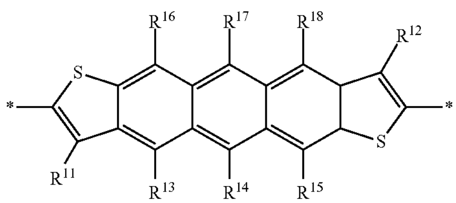
(D79)
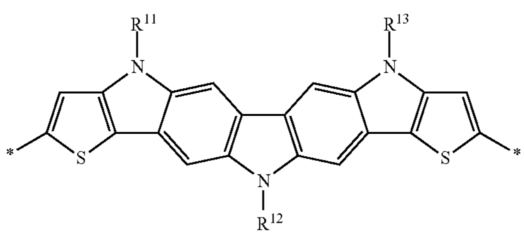
(D80)
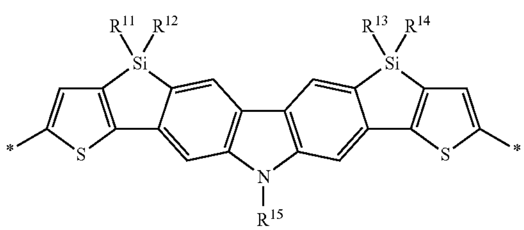
(D81)
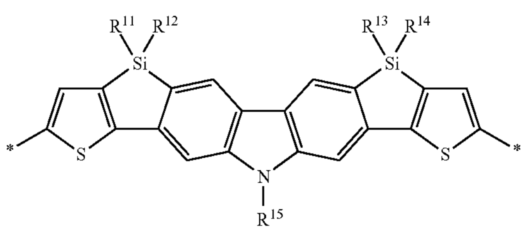
(D82)
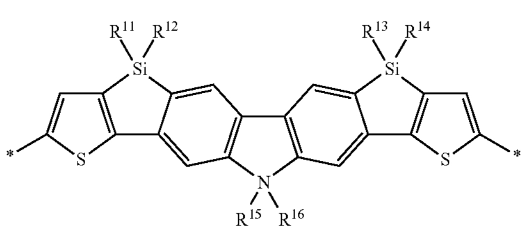
-continued
(D83)
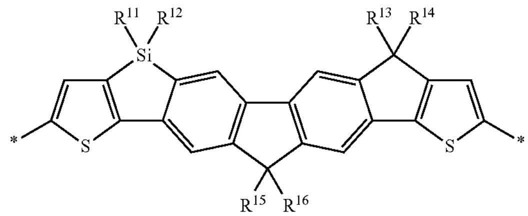
(D84)
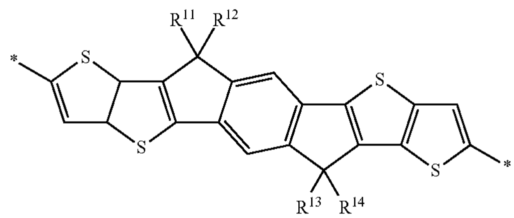
(D85)
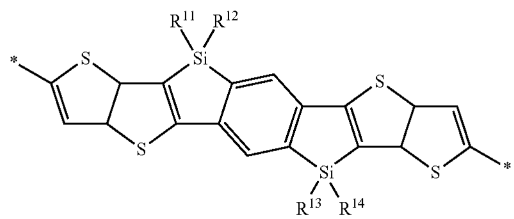
(D86)
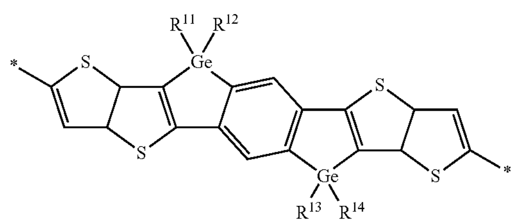
(D87)
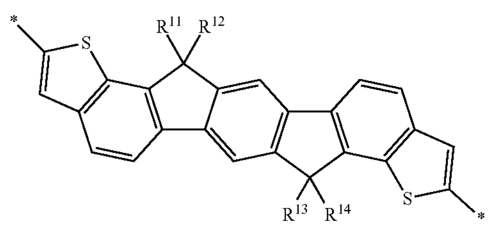
(D88)
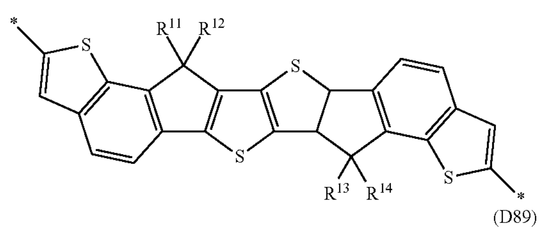
(D89)
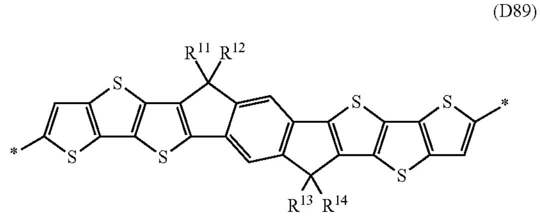

-continued
(D90)
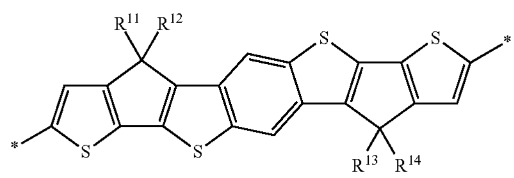
(D91)
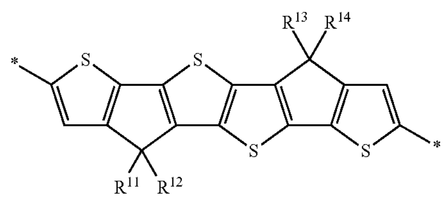
(D92)
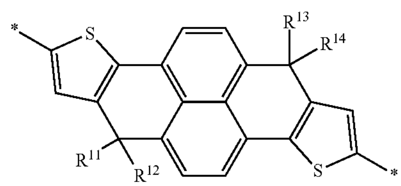
(D93)
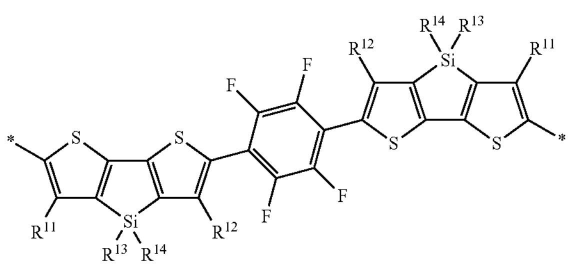
(D94)
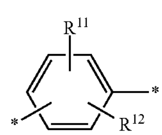
(D95)
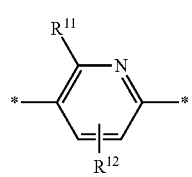
(D96)
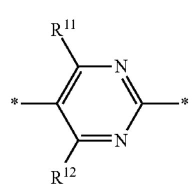
(D97)
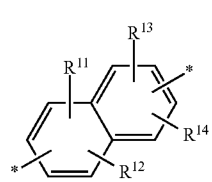
-continued
(D98)
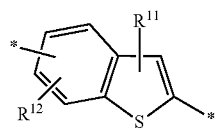
(D99)
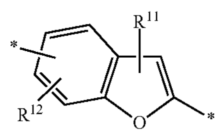
(D100)
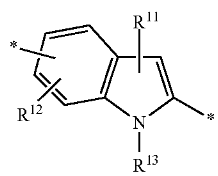
(D101)
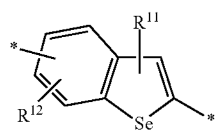
(D102)
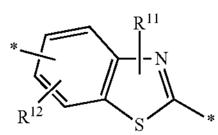
(D103)
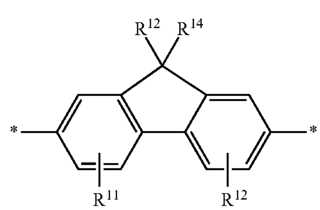
(D104)
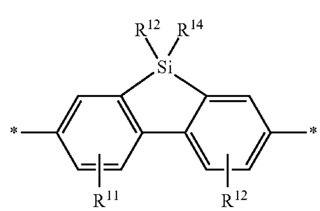
(D105)
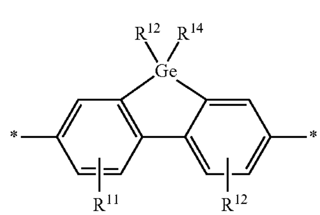
(D106)
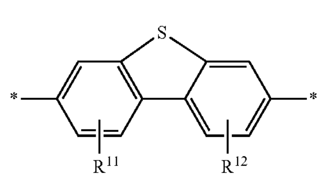

-continued
(D107)
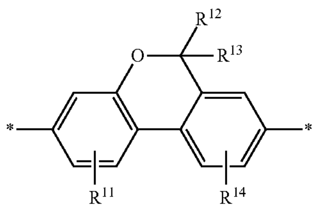
(D108)
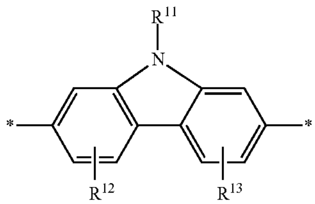
(D109)
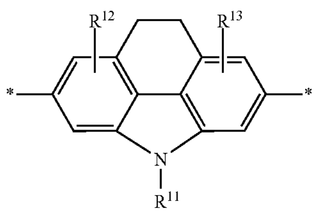
(D110)
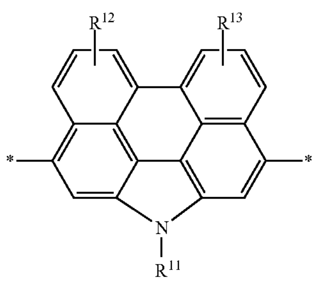
(D111)
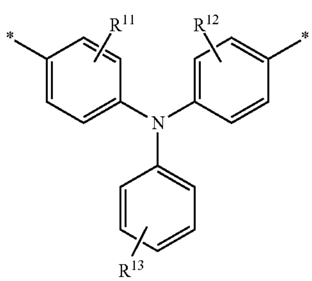
(D112)
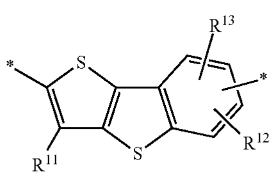
(D113)
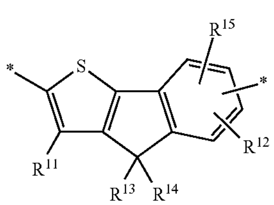
-continued
(D114)
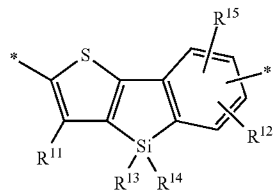
(D115)
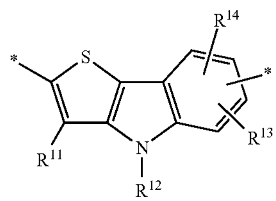
(D116)
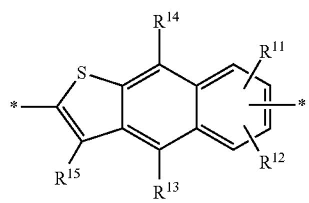
(D117)
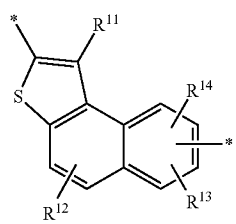
(D118)
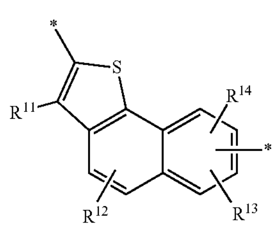
(D119)
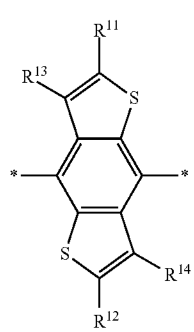

-continued
(D120)
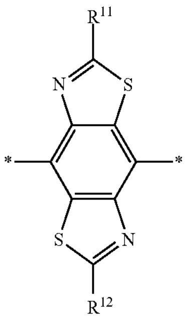
(D121)
*
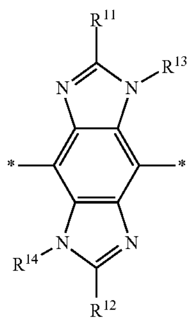
(D122)
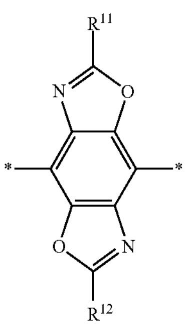
(D123)
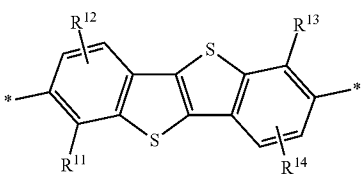
(D124)
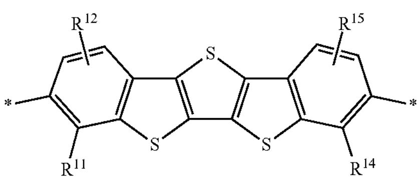
(D125)
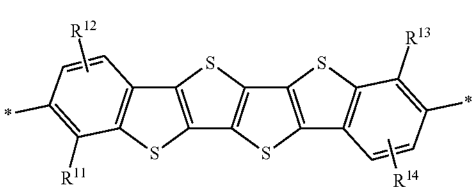
-continued
(D126)
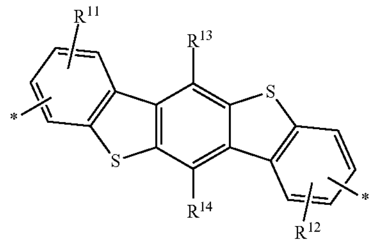
(D127)
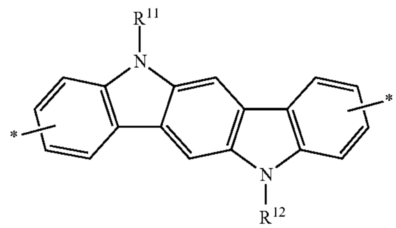
(D128)
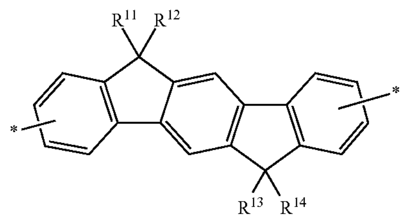
(D129)
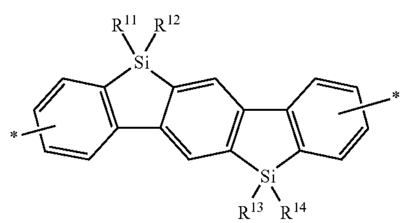
(D130)
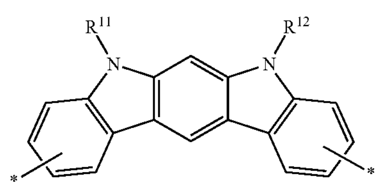
(D131)
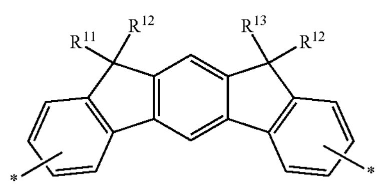
(D132)
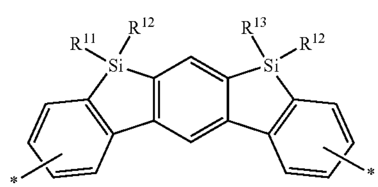

-continued
(D133)
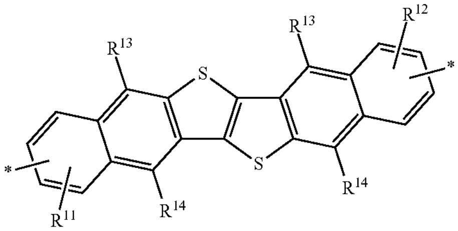
(D134)
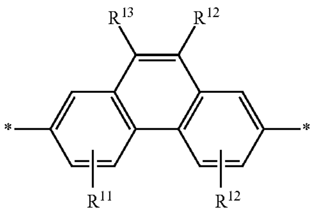
(D135)
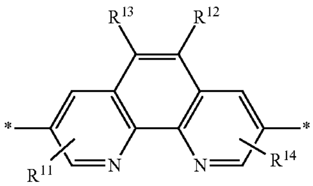
(D136)
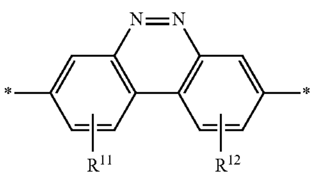
(D137)
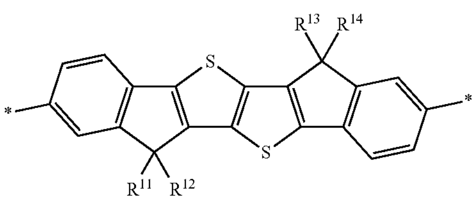
(D138)
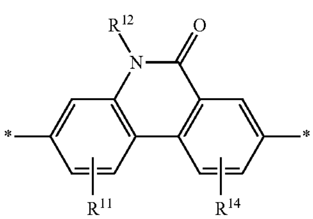
(D139)
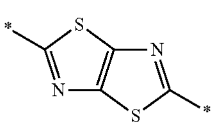
(D140)
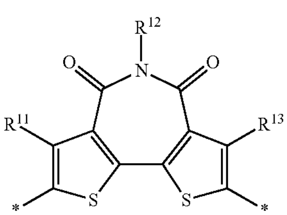
-continued
(D141)
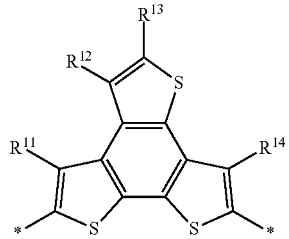
wherein $R^{11}$, $R^{12}$, $R^{13}$, $R^{14}$, $R^{15}$, $R^{16}$, $R^{17}$ and $R^{18}$ independently of each other denote H or have one of the meanings of $R^S$ as defined above and below.
Preferably the acceptor units, like $A^1$ and $A^2$, are selected from the group consisting of the following formulae
(A1)
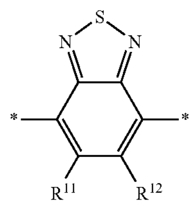
(A2)
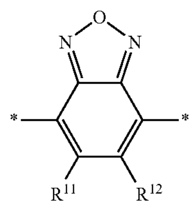
(A3)
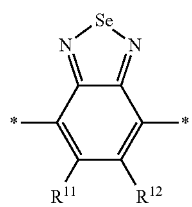
(A4)
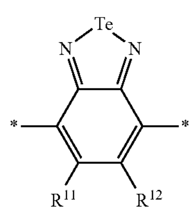
(A5)
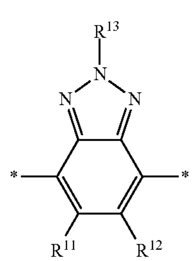

-continued
(A6)
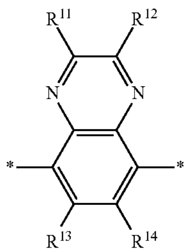
(A7)
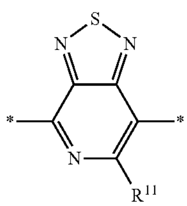
(A8)
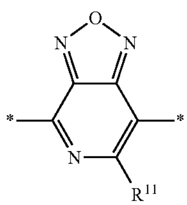
(A9)
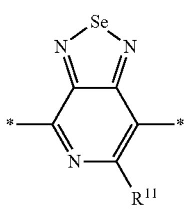
(A10)
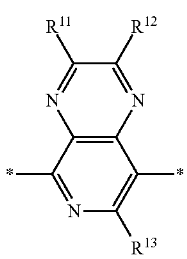
(A11)
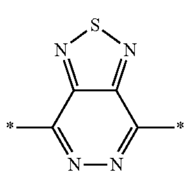
(A12)
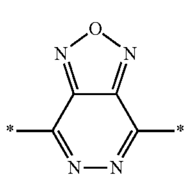
-continued
(A13)
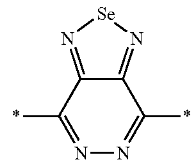
(A14)
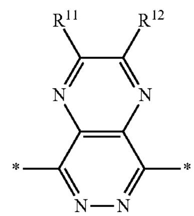
(A15)
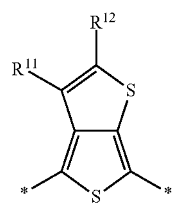
(A16)
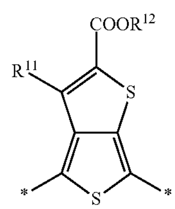
(A17)
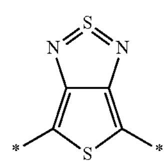
(A18)
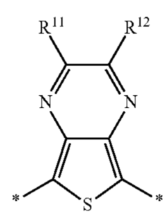
(A19)
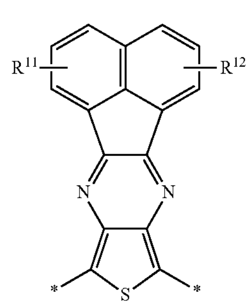

-continued
(A20)
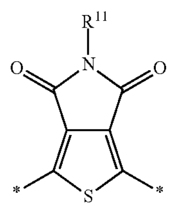
(A21)
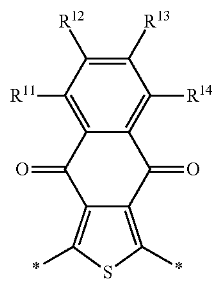
(A22)
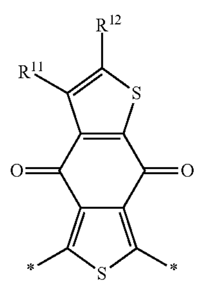
(A23)
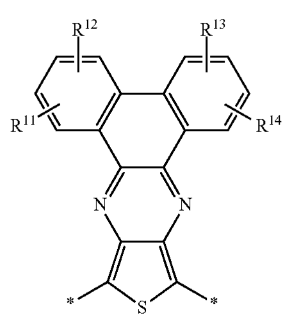
(A24)
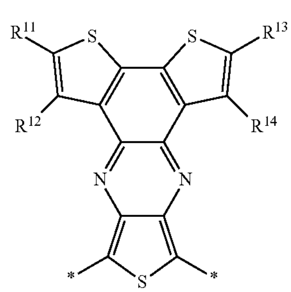
-continued
(A25)
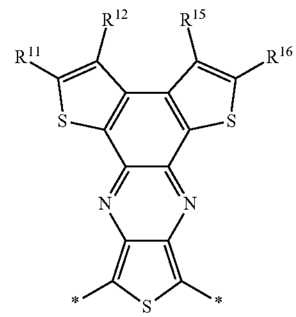
(A26)
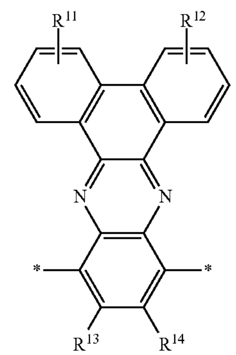
(A27)
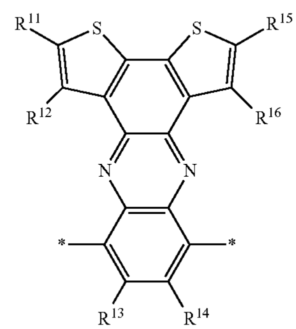
(A28)
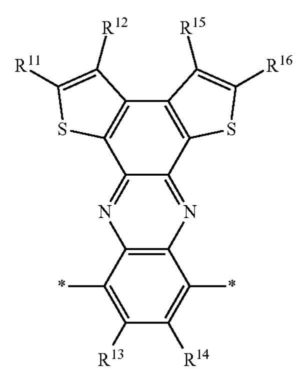
(A29)
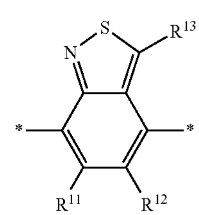

-continued
(A30)
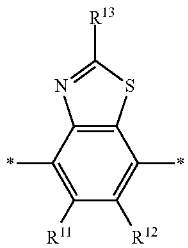
(A31)
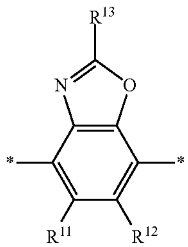
(A32)
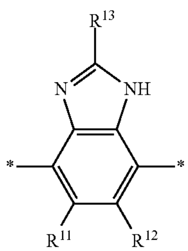
(A33)
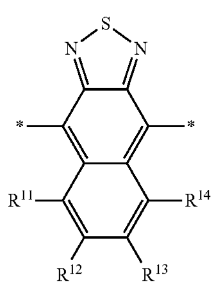
(A34)
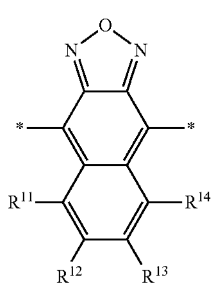
(A35)
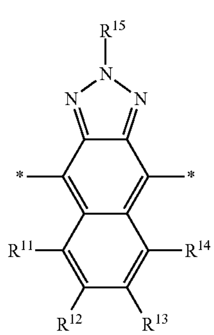
-continued
(A36)
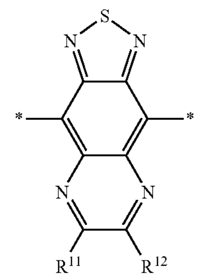
(A37)
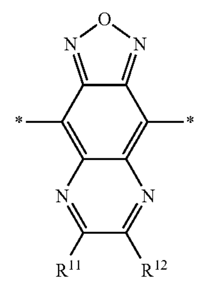
(A38)
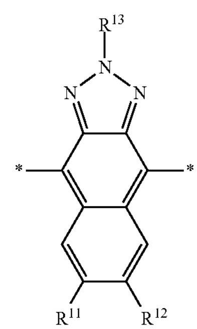
(A39)
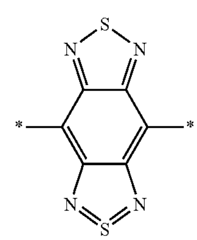
(A40)
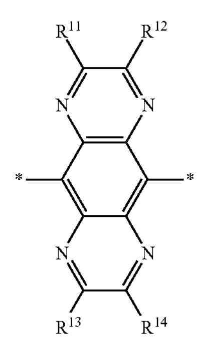
(A41)
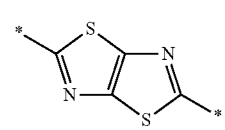

-continued
(A42)
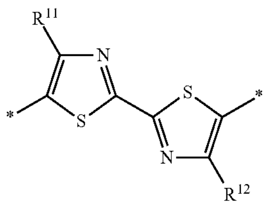
(A43)
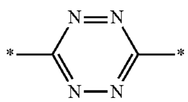
(A44)
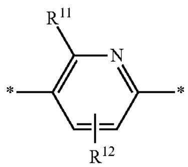
(A45)
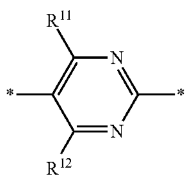
(A46)
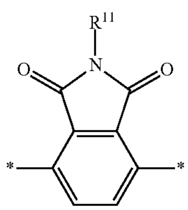
(A47)
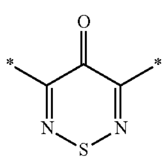
(A48)
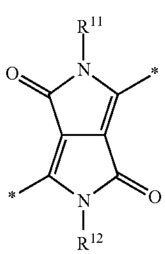
(A49)
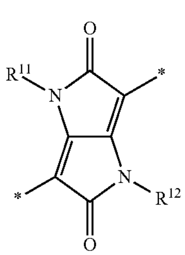
-continued
(A50)
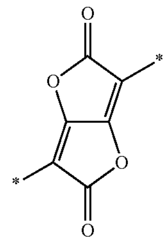
(A51)
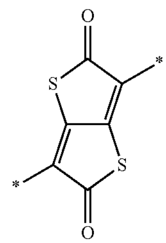
(A52)
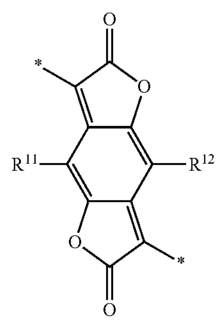
(A53)
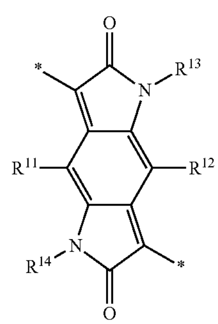
(A54)
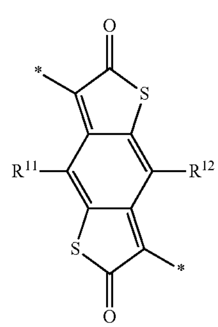

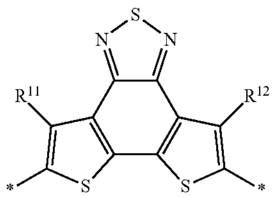
(A55)
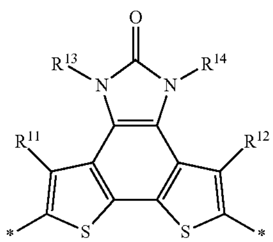
(A56)
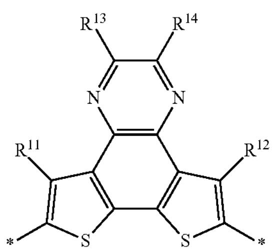
(A57)
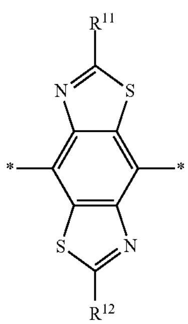
(A58)
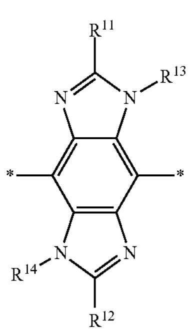
(A59)
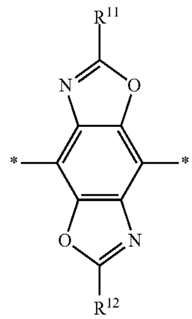
(A60)
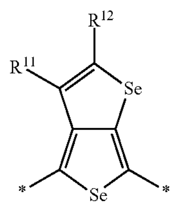
(A61)
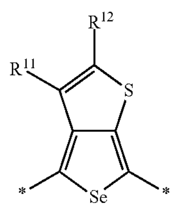
(A62)
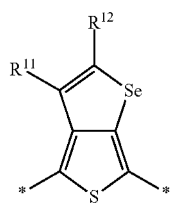
(A63)
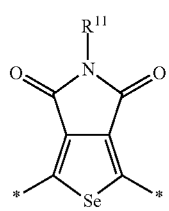
(A64)
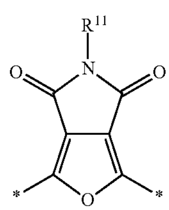
(A65)
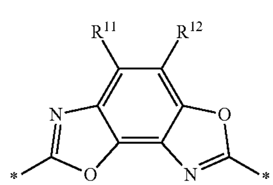
(A66)

-continued
(A67)
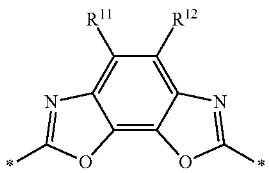
(A68)
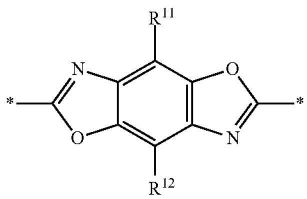
(A69)
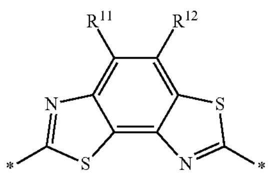
(A70)
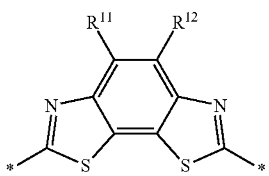
(A71)
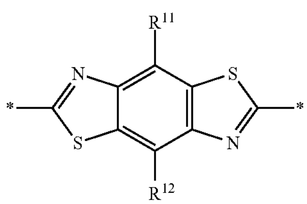
(A72)
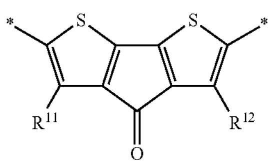
(A73)
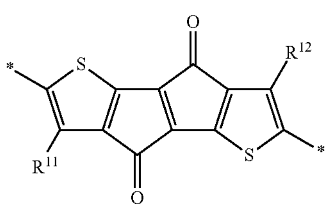
(A74)
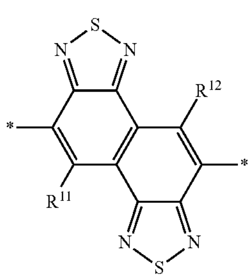
-continued
(A75)
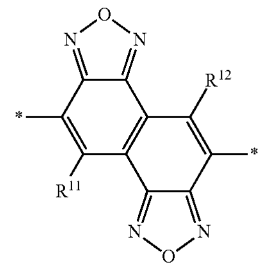
(A76)
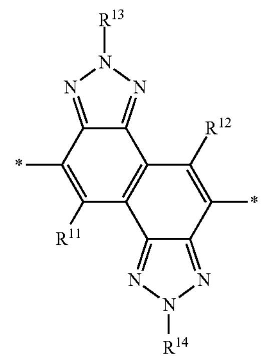
(A77)
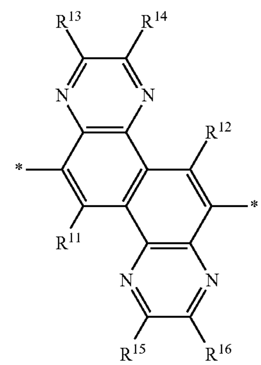
(A78)
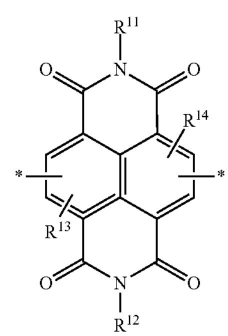
(A79)
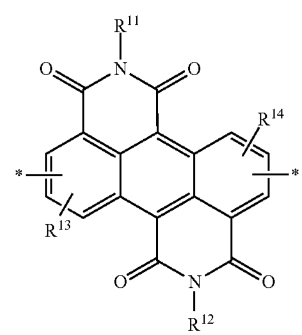

-continued
(A80)
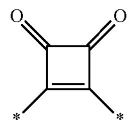
(A81)
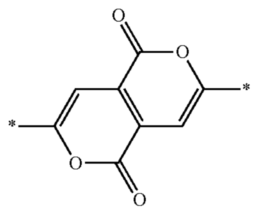
(A82)
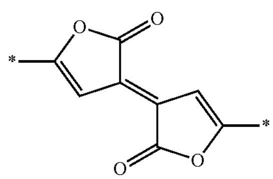
(A83)
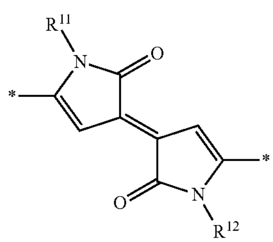
(A84)
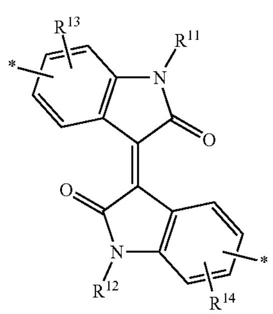
(A85)
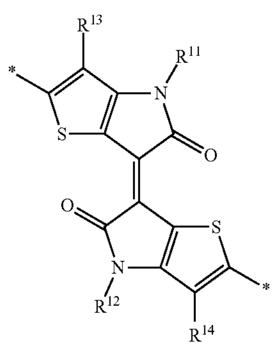
-continued
(A86)
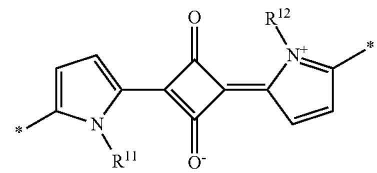
(A87)
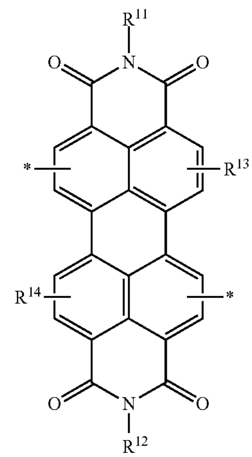
(A88)
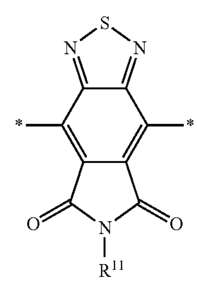
(A89)
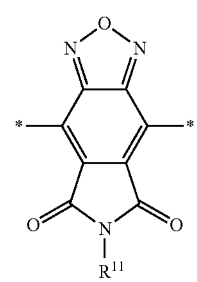
(A90)
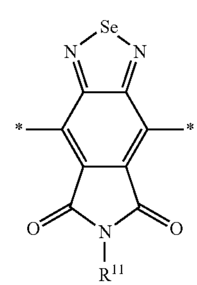

-continued
(A91)
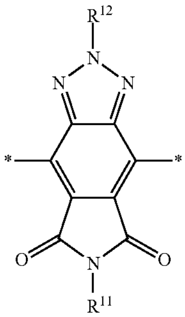
(A92)
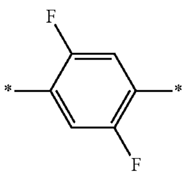
(A93)
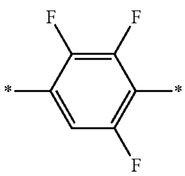
(A94)
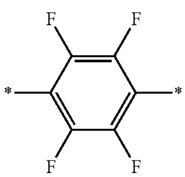
(A95)
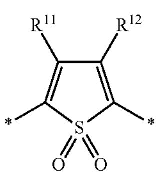
(A96)
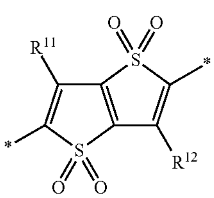
(A97)
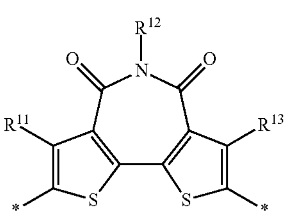
wherein $R^{11}$, $R^{12}$, $R^{13}$, $R^{14}$, $R^{15}$ and $R^{16}$ independently of each other denote H or have one of the meanings of $R^S$ as defined above and below.
Preferably the spacer units, like Sp, $Sp^1$, $Sp^2$ and $Sp^3$, are selected from the group consisting of the following formulae
Sp1
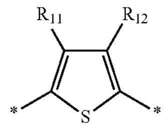
Sp2
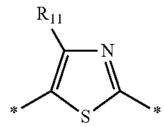
Sp3
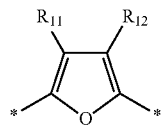
Sp4
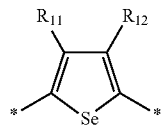
Sp5
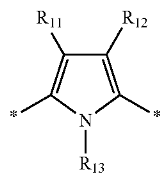
Sp6
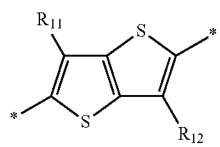
Sp7
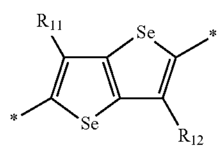
Sp8
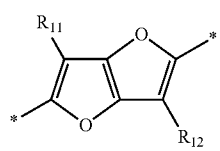
Sp9
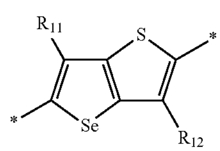
Sp10
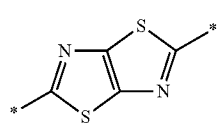

-continued
Sp11
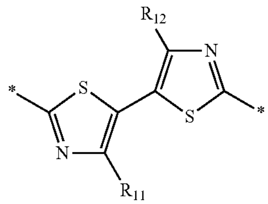
Sp12
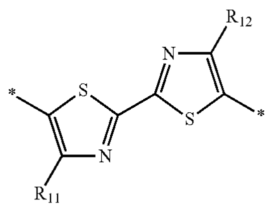
Sp13
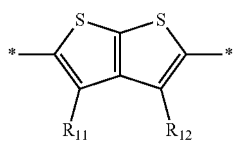
-continued
Sp14
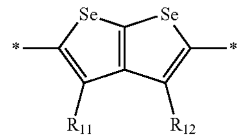
Sp15
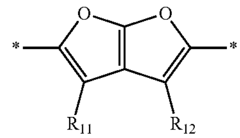
Sp16
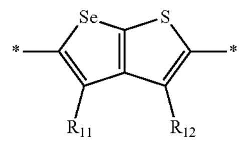
wherein $R^{11}$ and $R^{12}$ independently of each other denote H or have one of the meanings of $R^5$ as defined above and below.
Preferably the conjugated polymer is selected from the following formulae
I
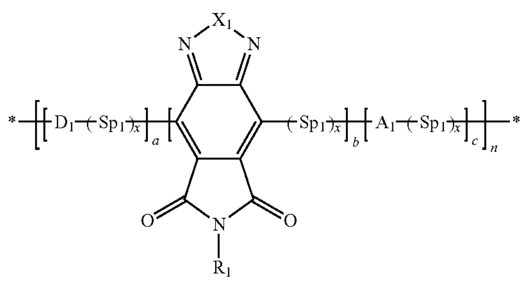
II
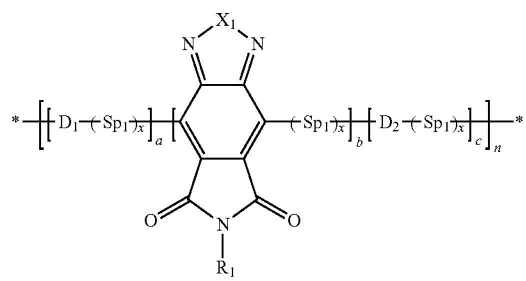
III
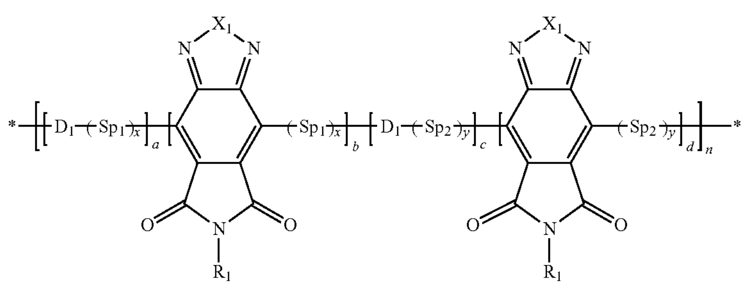
IV
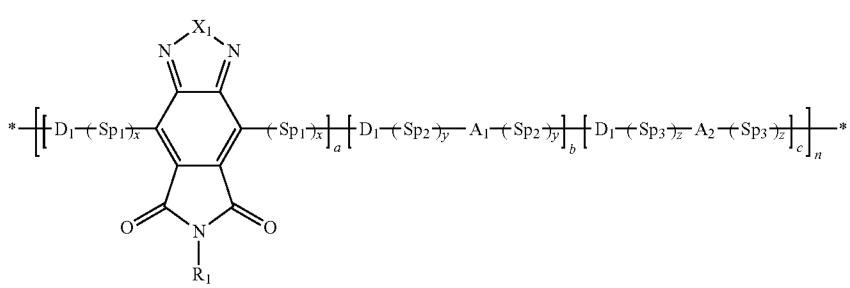

-continued

V

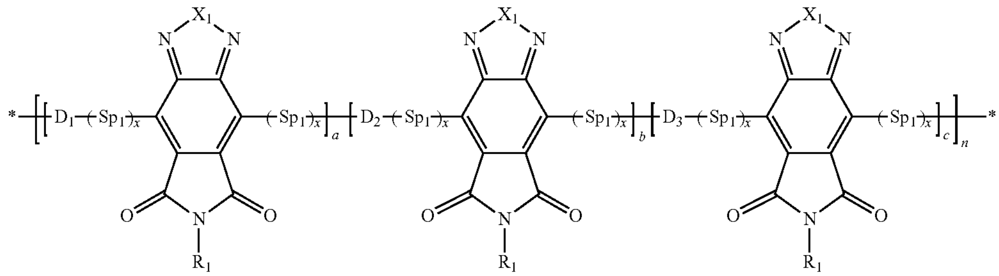

VI

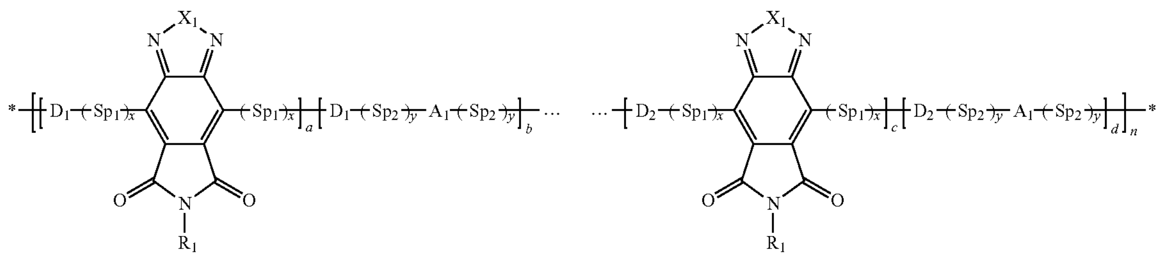

VII

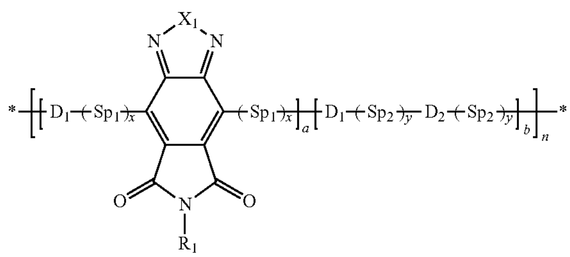

VIII

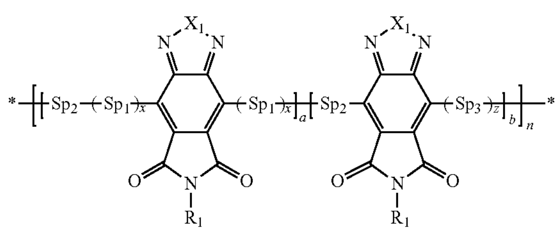

wherein $A^1$, $A^2$, $D^1$, $D^2$, $Sp^1$, $Sp^2$, $Sp^3$ are as defined above, $X^1$ has one of the meanings of X given in formula T, x, y and z are independently of each other 0, 1 or 2, a, b, d and d denote the molar fractions of the respective unit in the polymer, and are each, independently of one another, ≥0 and <1, with at least two of a, b, c and d being >0, and a+b+c+d=1, n is an integer >1.

Especially preferred are polymers of formula I, III, IV, V, VI and VIII, in particular polymers of formula IV, V, and VI.

Further preferred is a conjugated polymer according to the present invention, very preferably selected of formula I-VIII, wherein the donor units, $D^1$ and $D^2$ are selected from formulae D1, D10, D19, D22, D25, D35, D36, D37, D44, D84, D93, D94, D103, D108, D111, D137, D139, D140 or D141 wherein at least one of $R^{11}$, $R^{12}$, $R^{13}$ and $R^{14}$ is different from H, and/or the acceptor units, $A^1$ and $A^2$ are selected from formulae A1, A2, A3, A20, A41, A48, A74, A85 or A94 wherein at least one of $R^{11}$, $R^{12}$, $R^{13}$ and $R^{14}$ is different from H, and/or the spacer units, $Sp^1$, $Sp^2$ and $Sp^3$ are selected from formula Sp1, Sp4, Sp6, wherein preferably one of $R^{11}$ and $R^{12}$ is H or both $R^{11}$ and $R^{12}$ are H.

Very preferably the conjugated polymer is selected from the following subformulae Ia
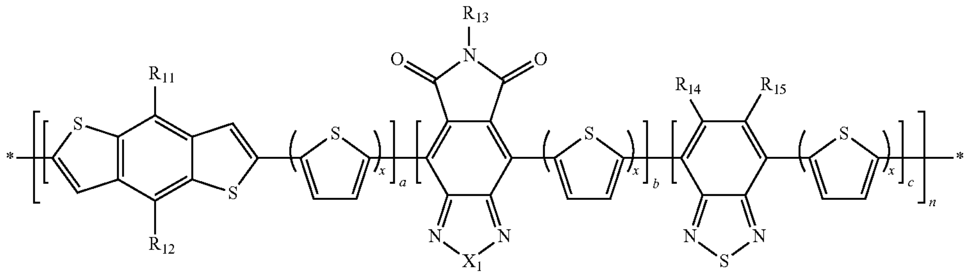
Ib
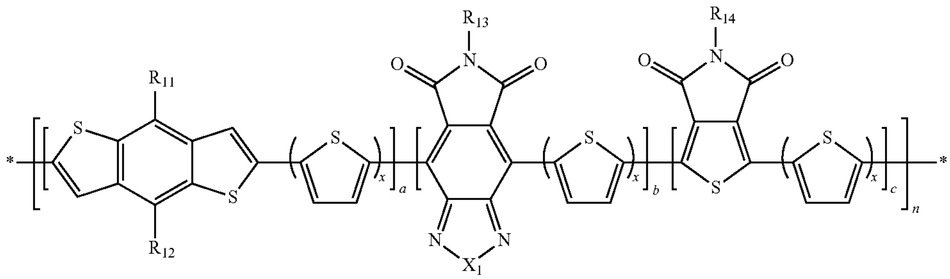
Ic
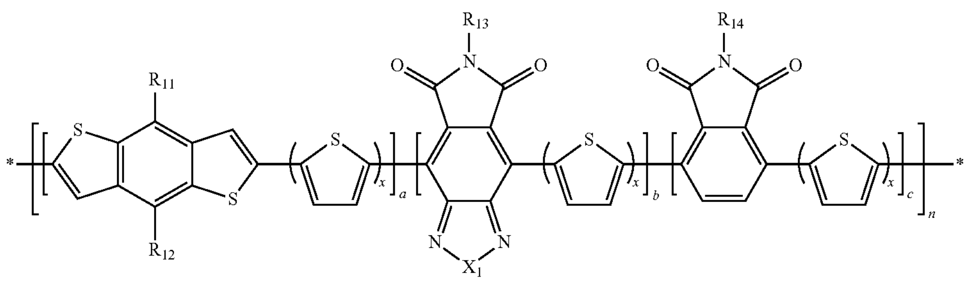
Id
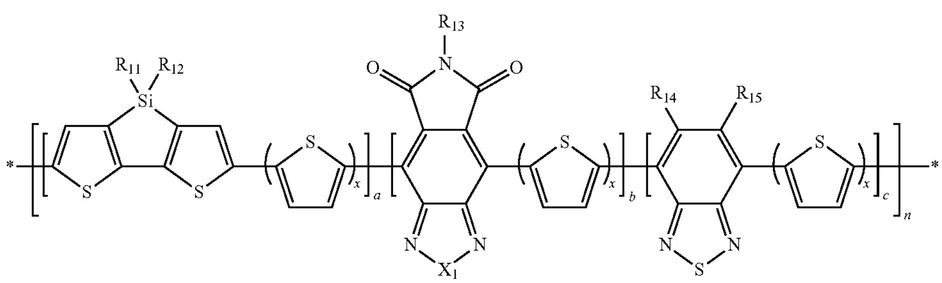
Ie
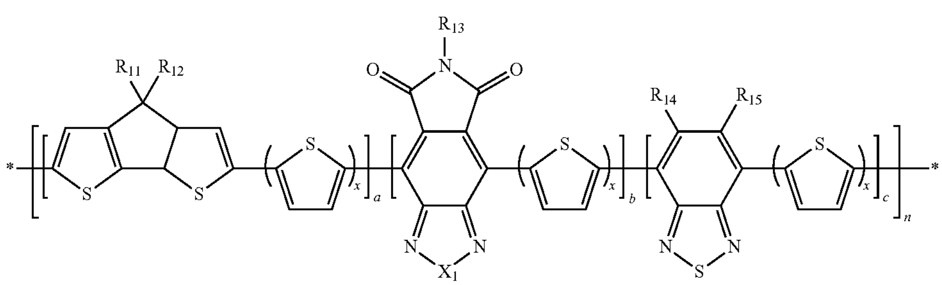

-continued
If
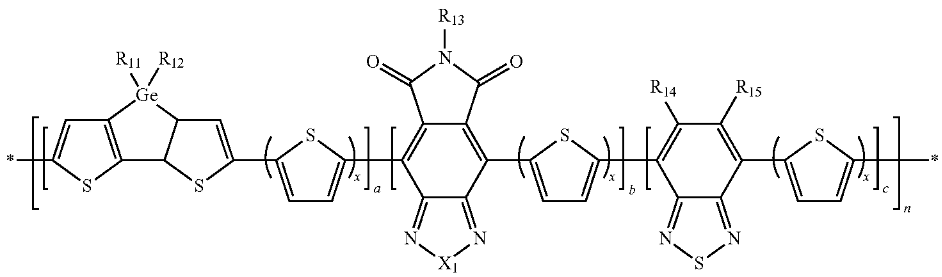
Ig
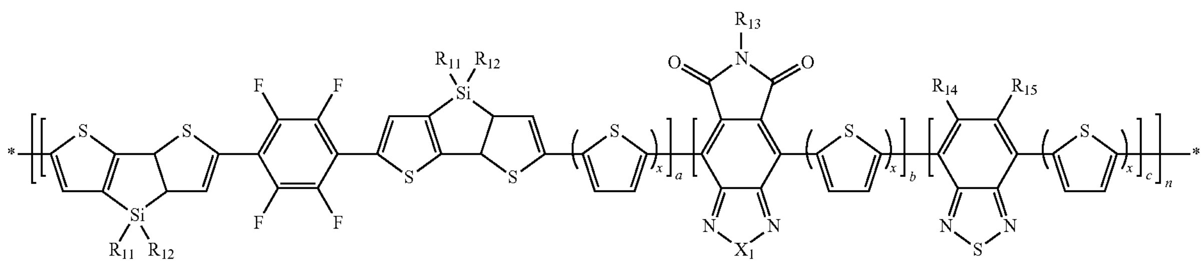
Ih
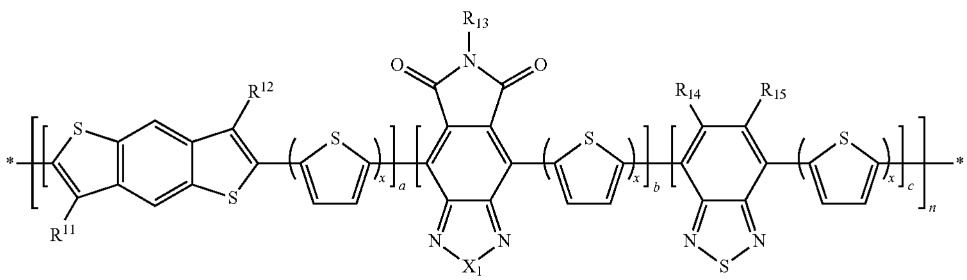
Ii
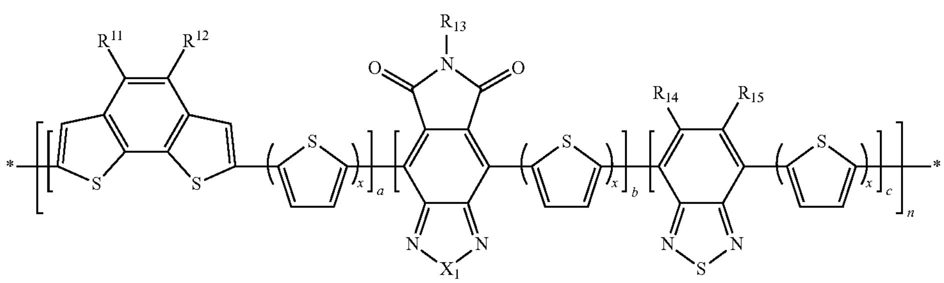
Ij
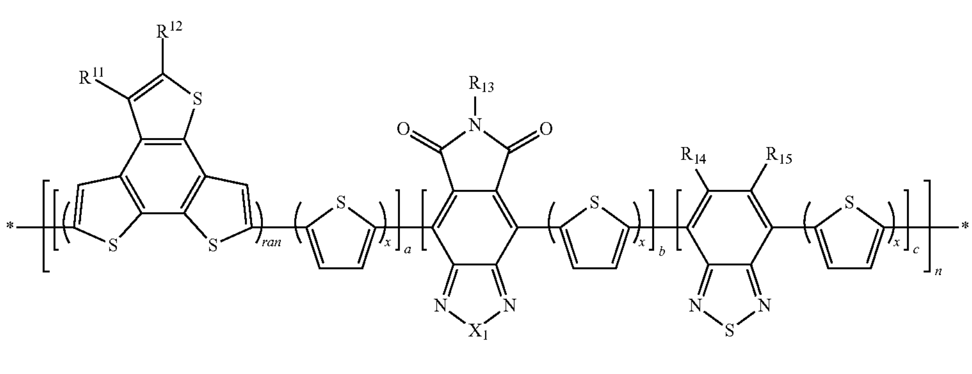

-continued
Ik
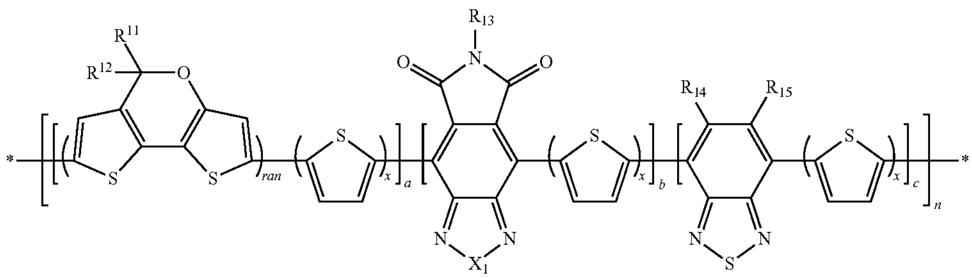
IIa
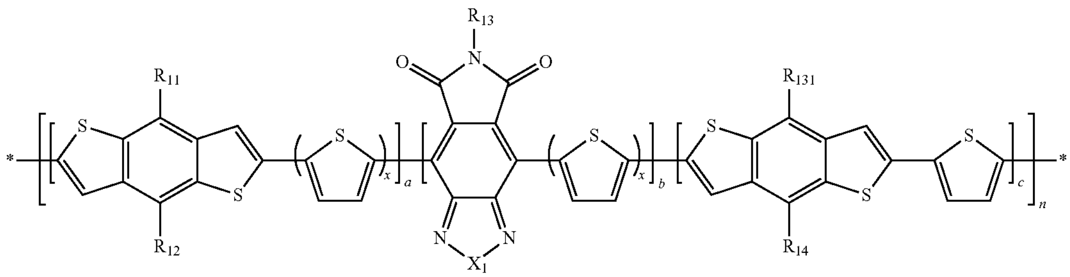
IIb
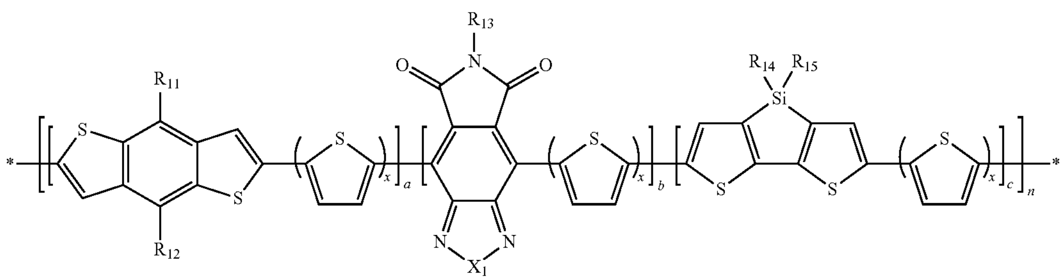
IIc
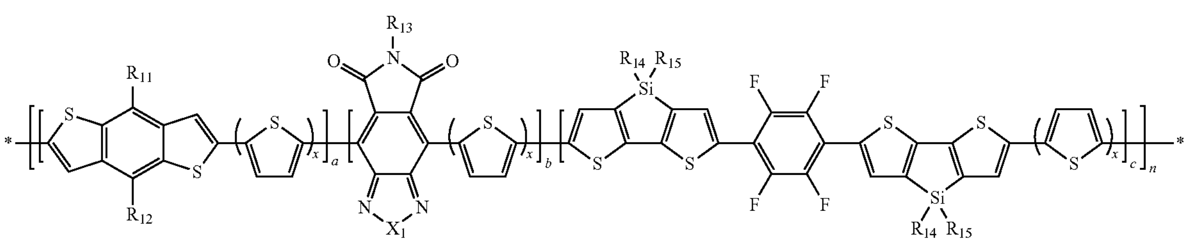
IId
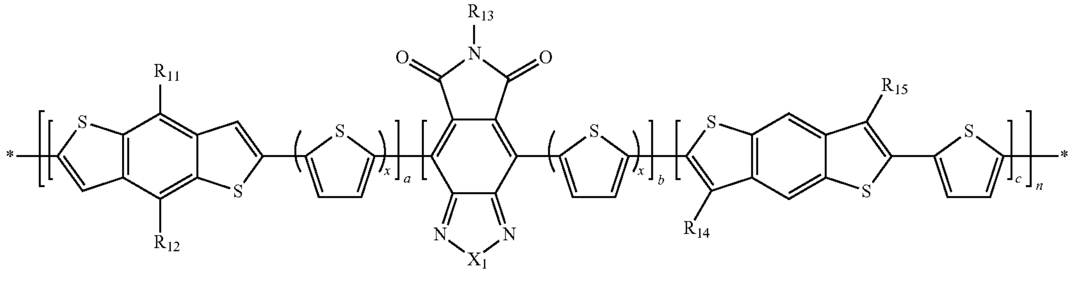

-continued
IIe
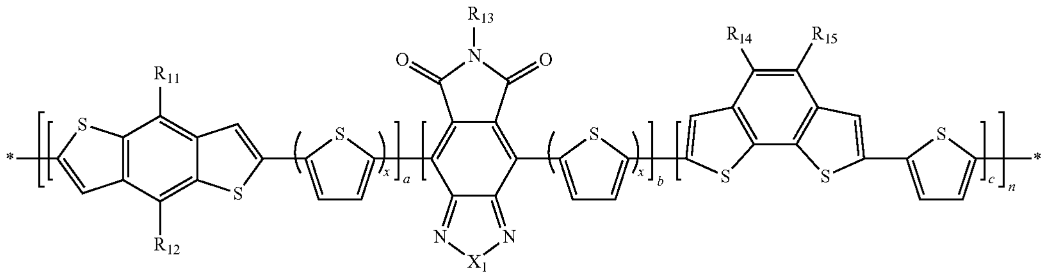
IIf
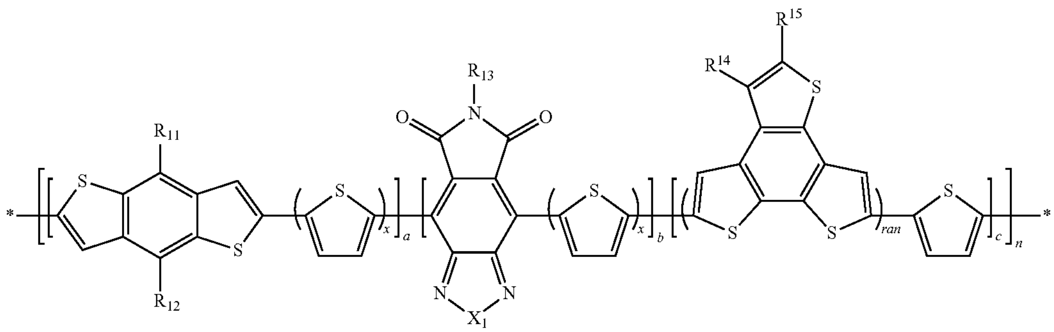
IIg
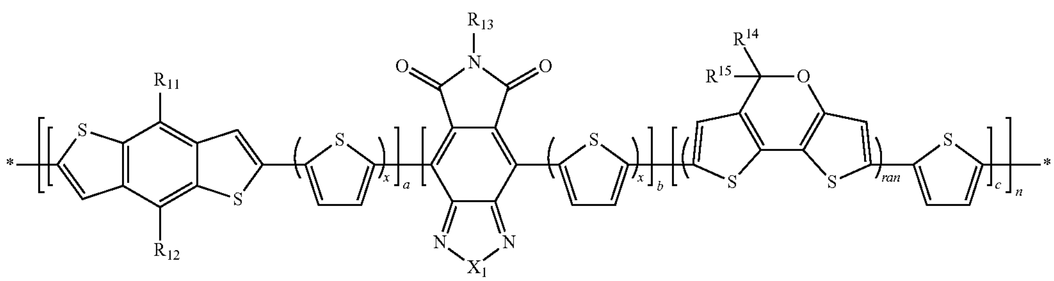
IIh
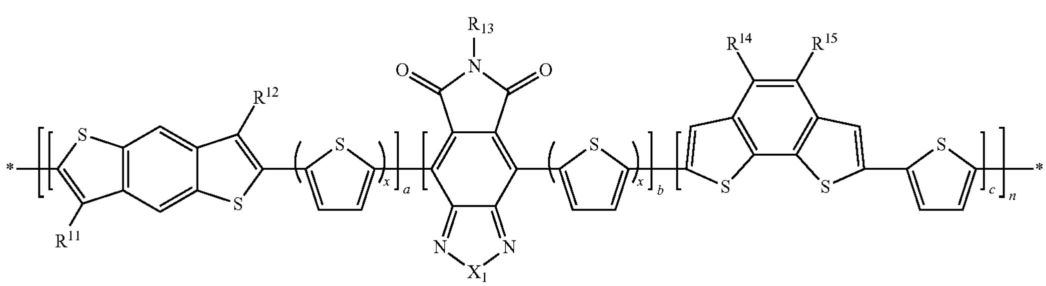
IIi
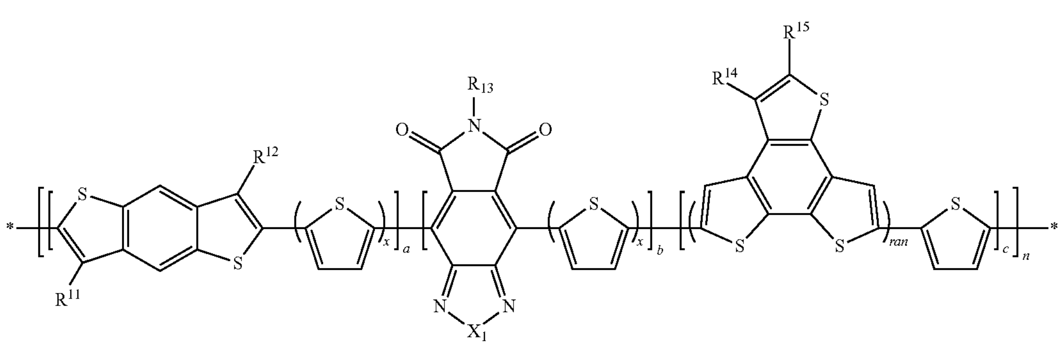

-continued
IIj
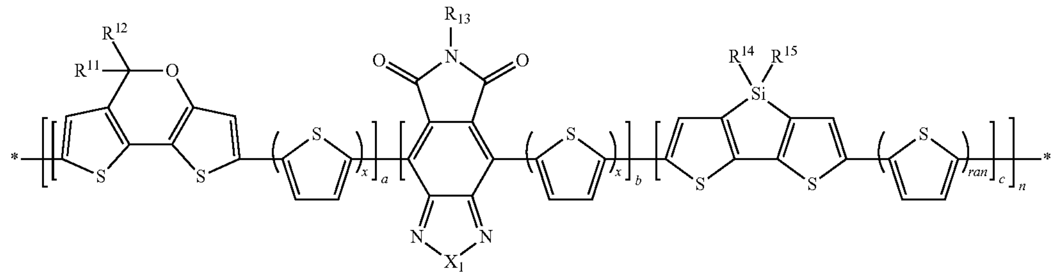
IIIa
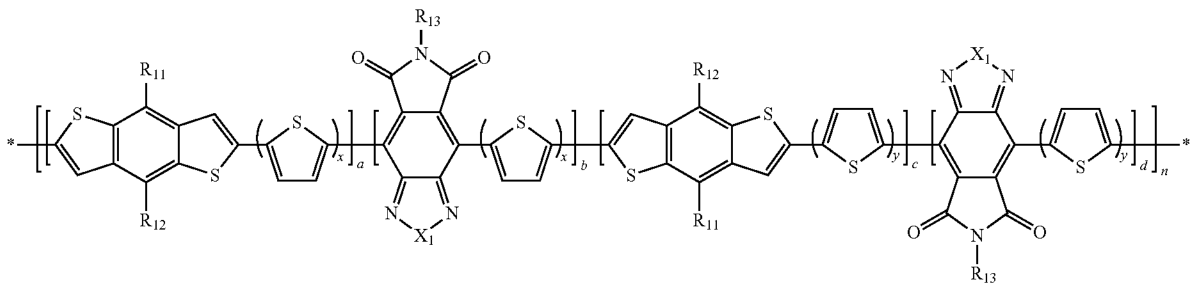
IIIb
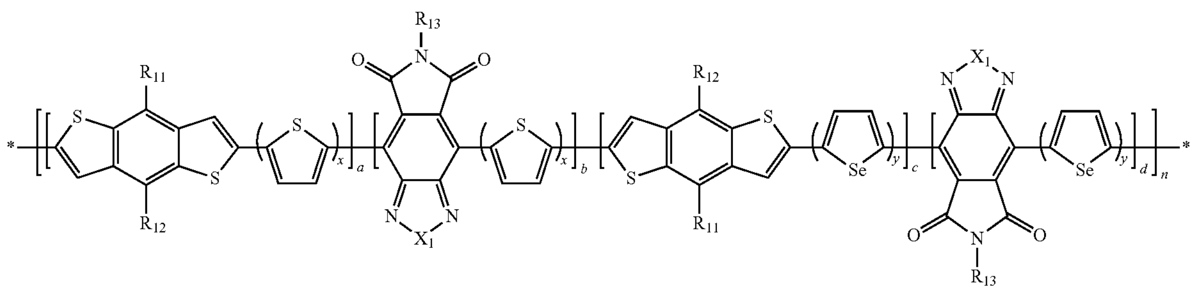
IIIc
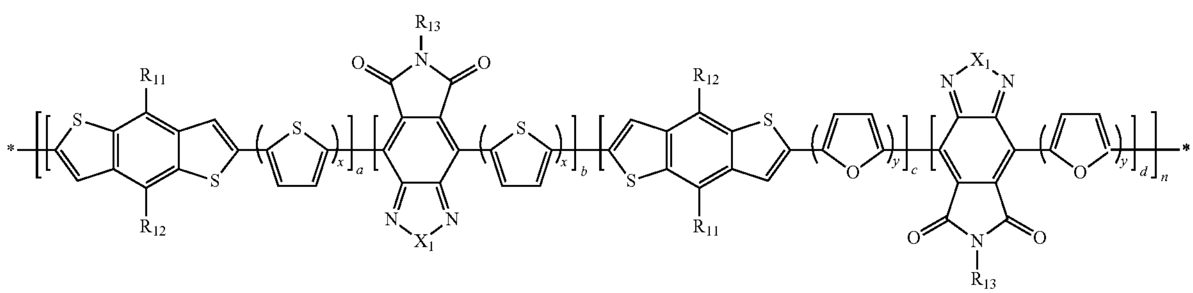
IIId
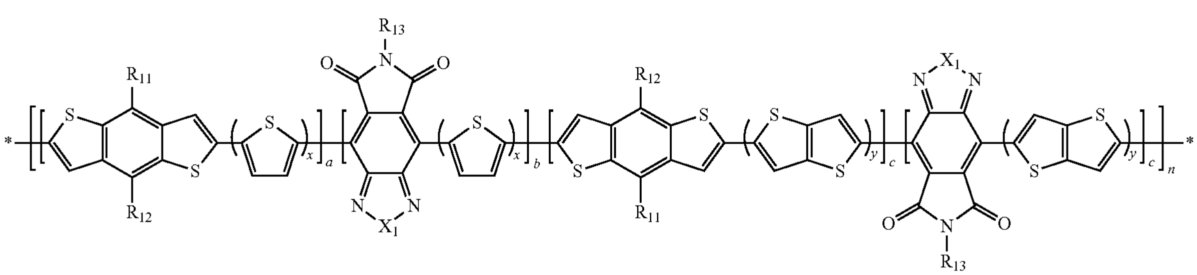

-continued
IIIe
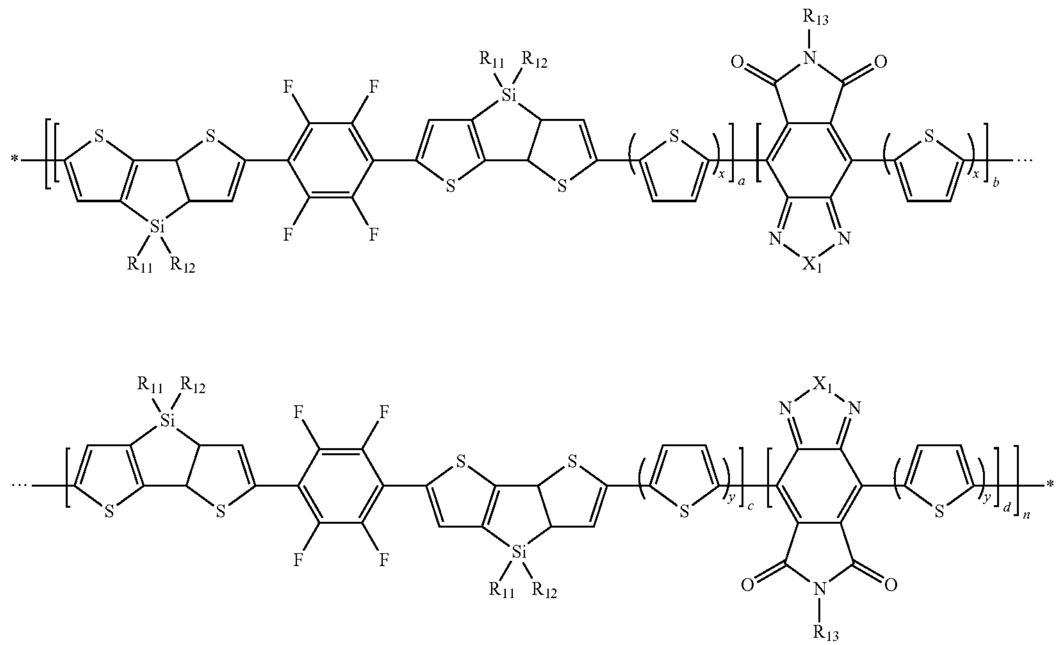
IIIf
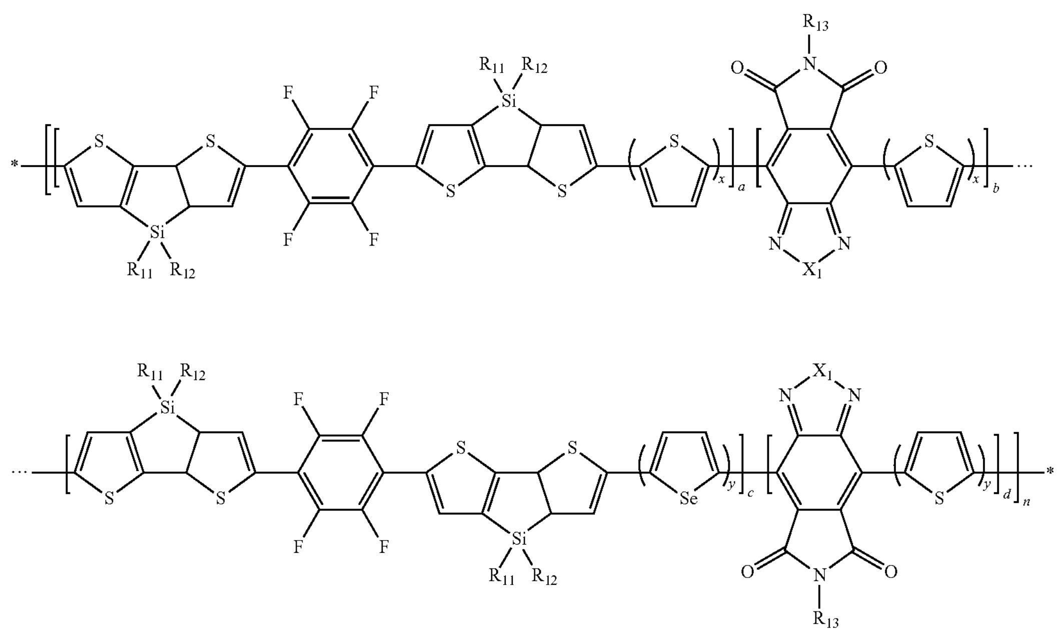
IVa
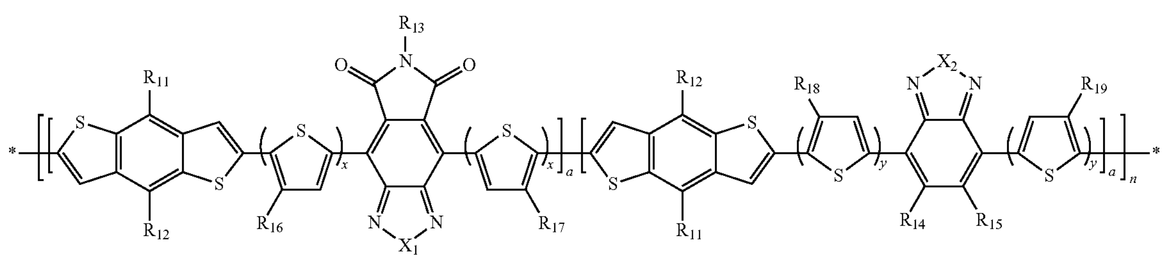

-continued
IVb
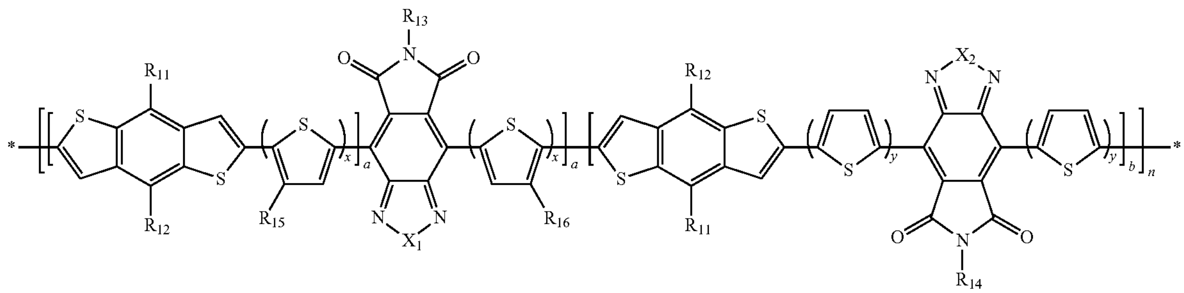
IVc
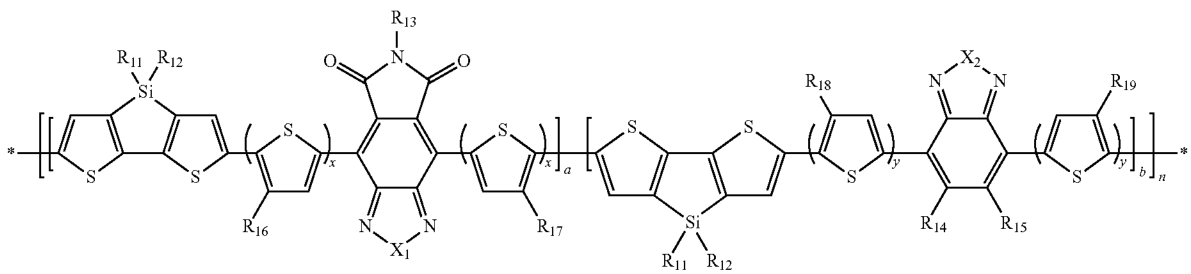
IVd
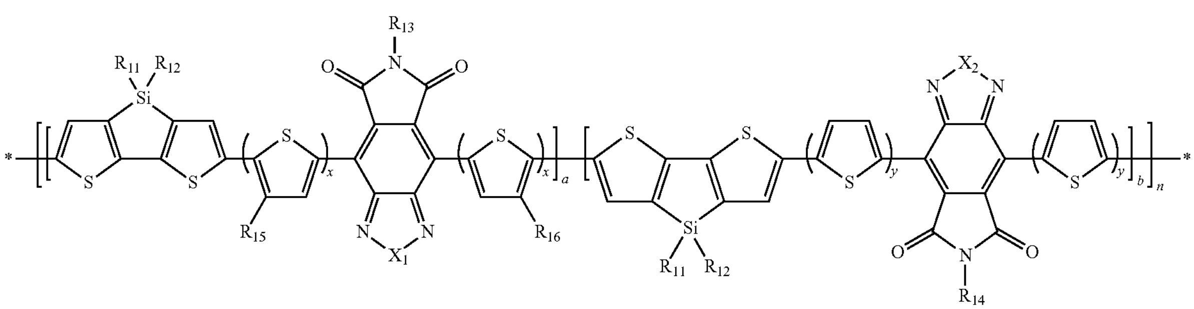
IVe
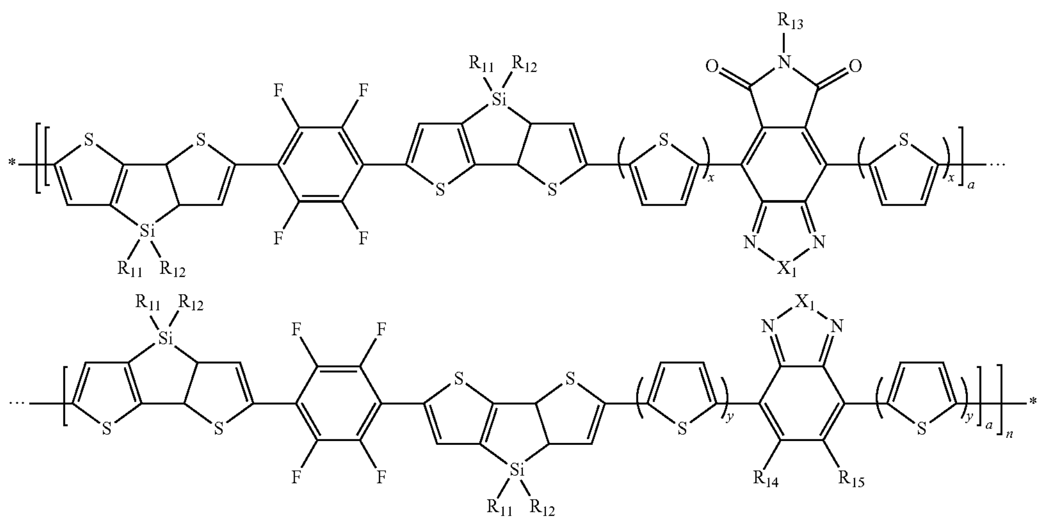

-continued
IVf
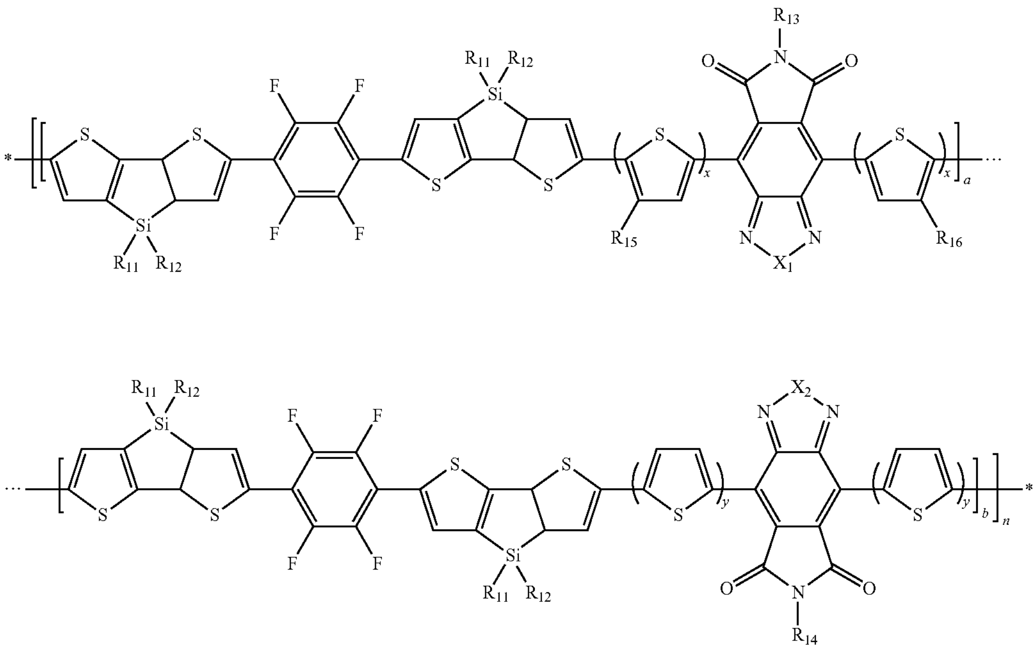
IVg
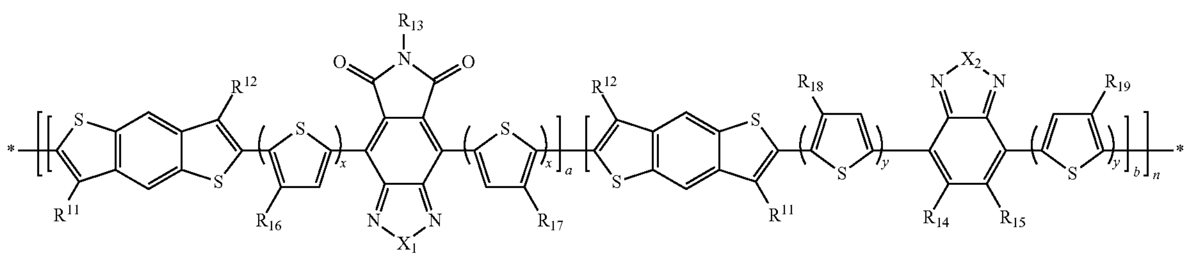
IVh
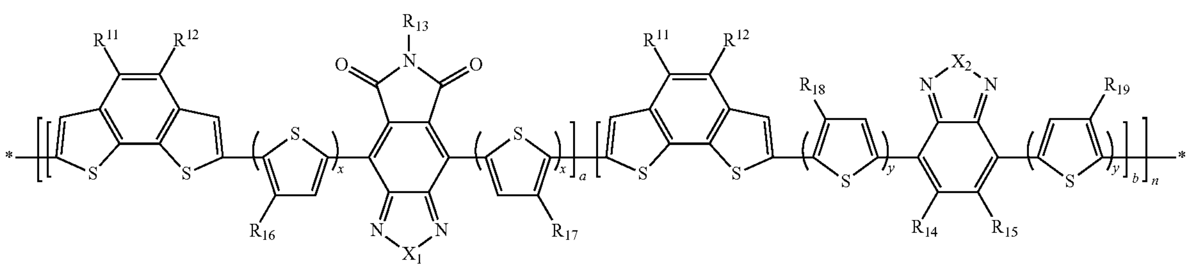
IVi
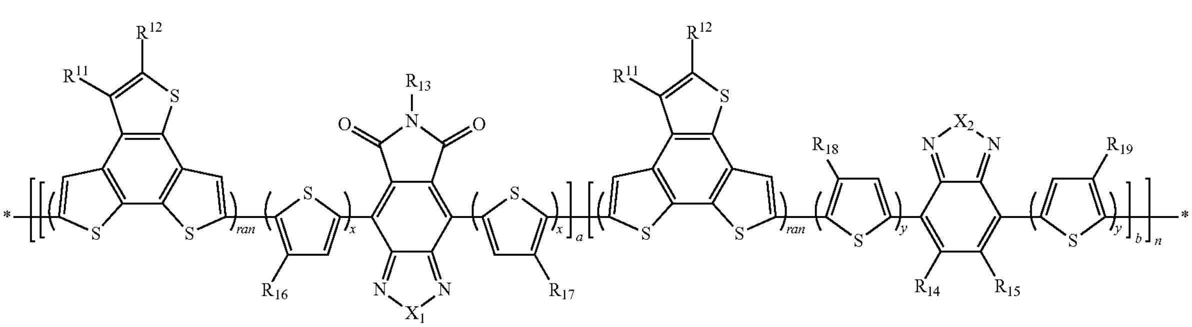

-continued
IVj
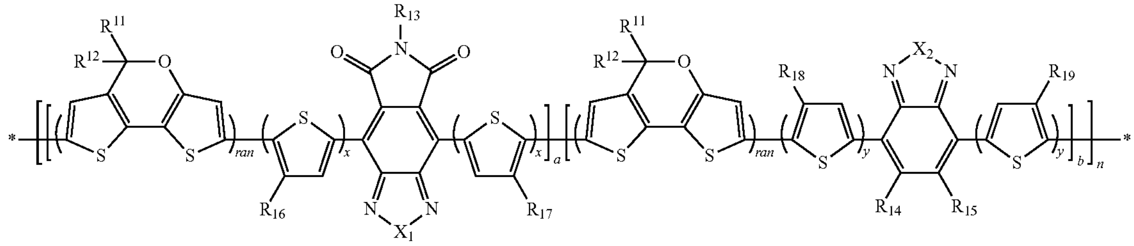
IVk
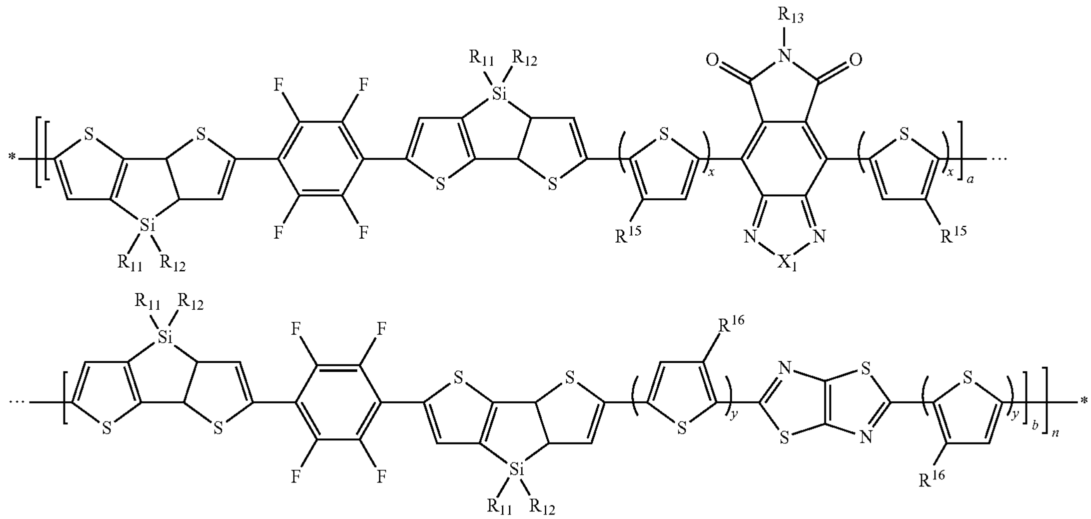
IVm
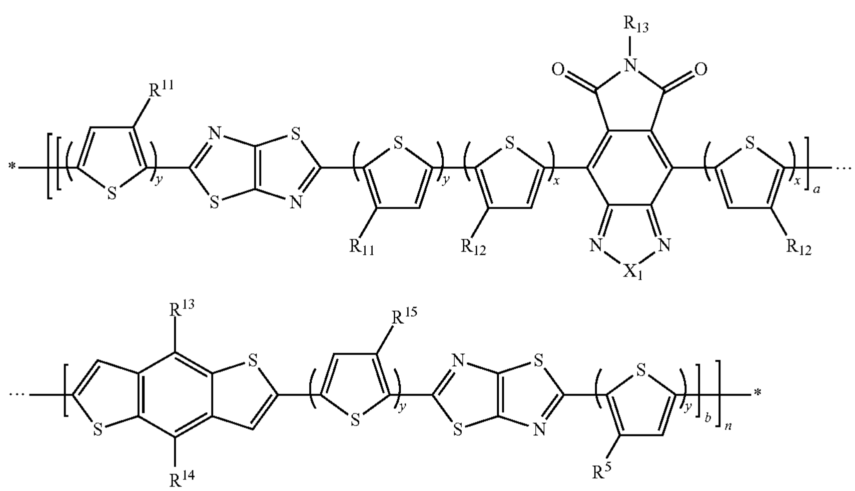
IVn
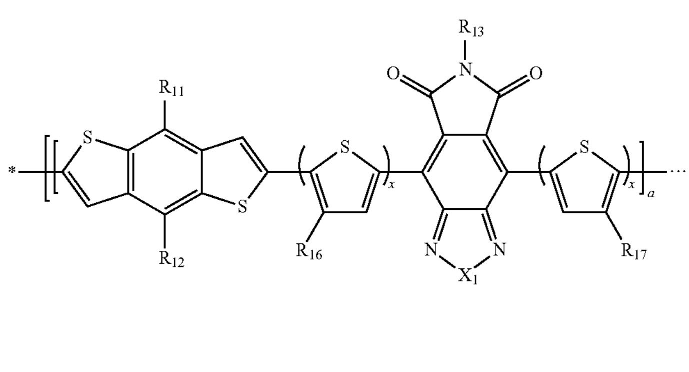

-continued
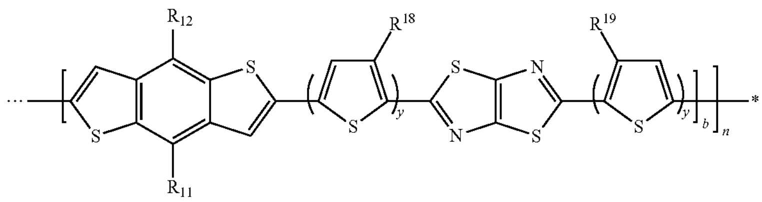
IVo
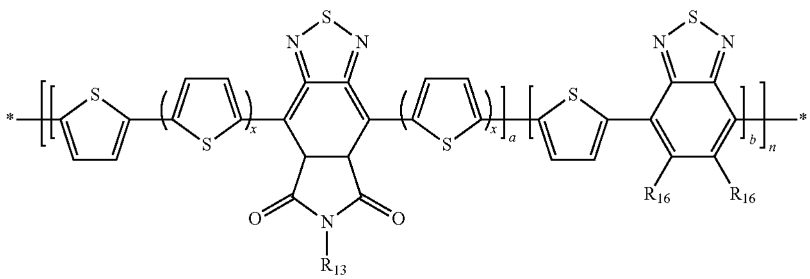
Va
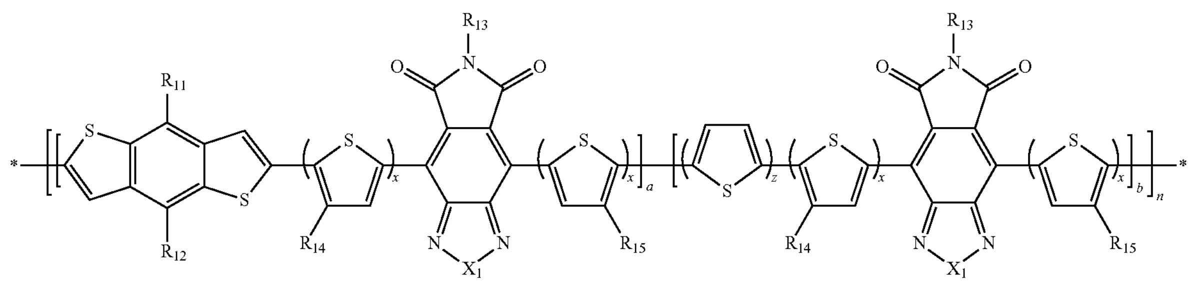
Vb
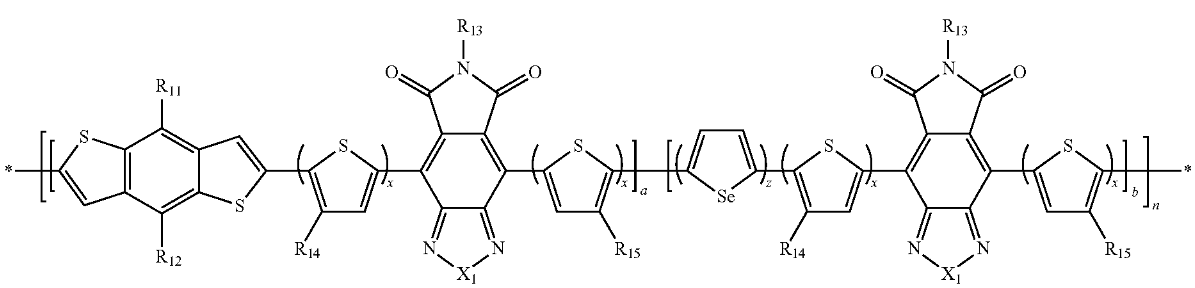
Vc
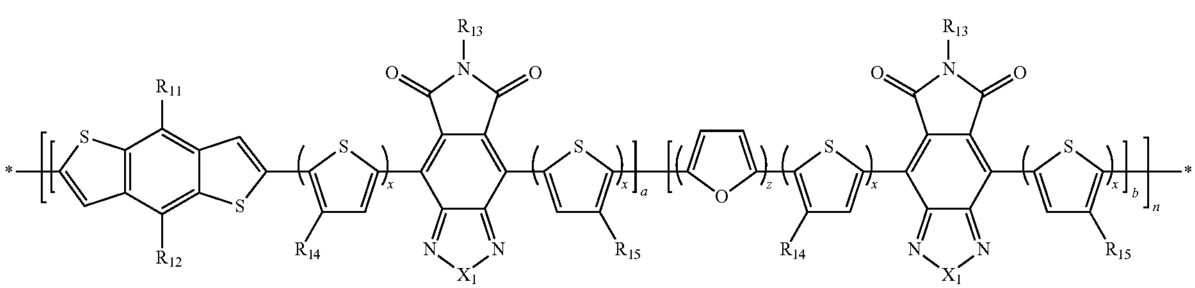

-continued
Vd
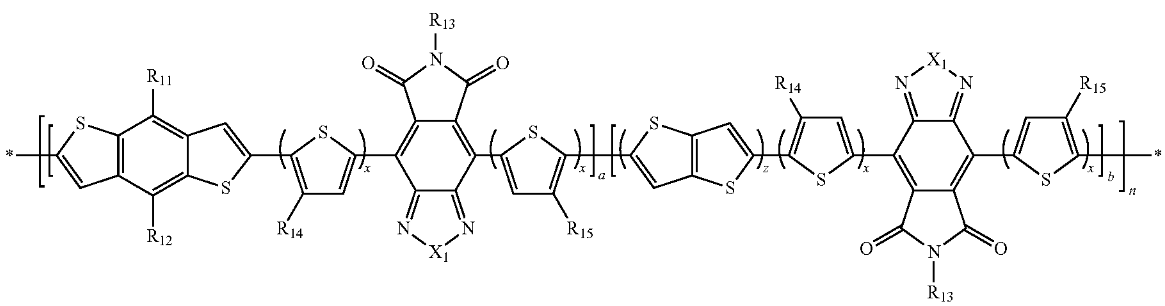
Ve
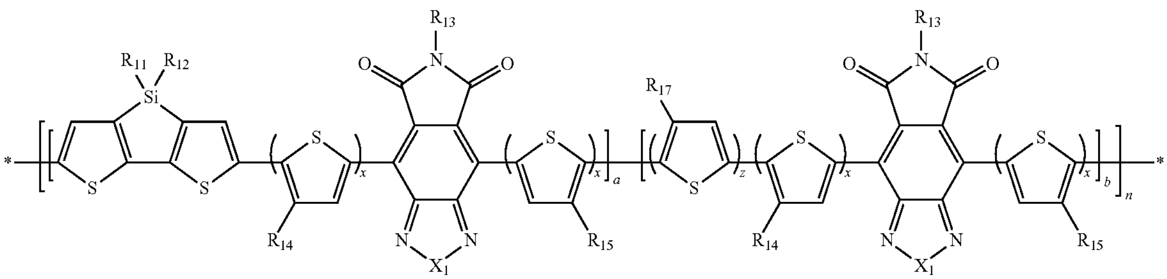
Vf
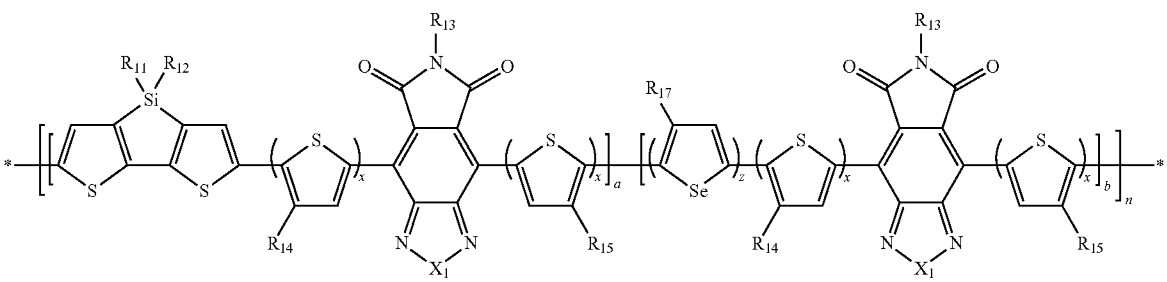
Vg
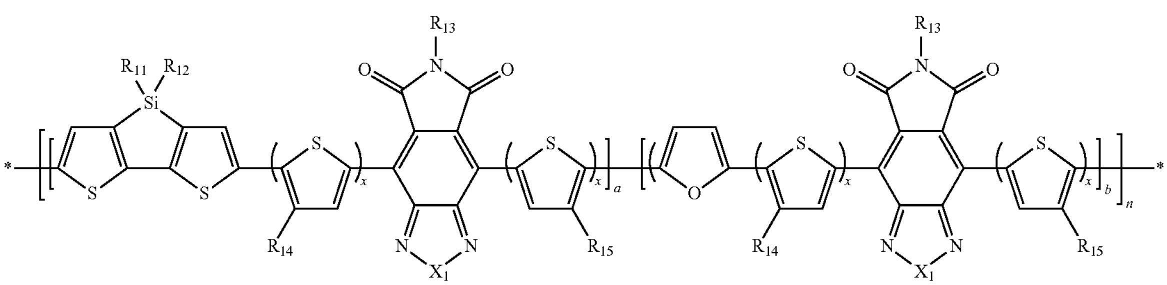
Vh
Vh
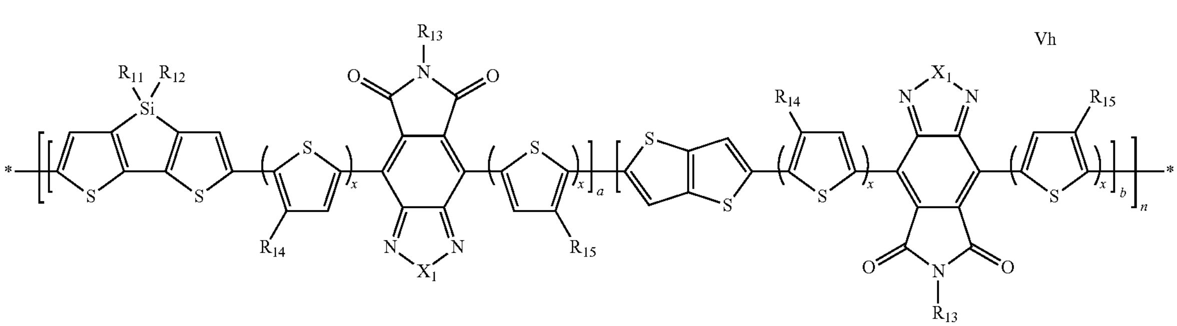

-continued
Vi
Vi
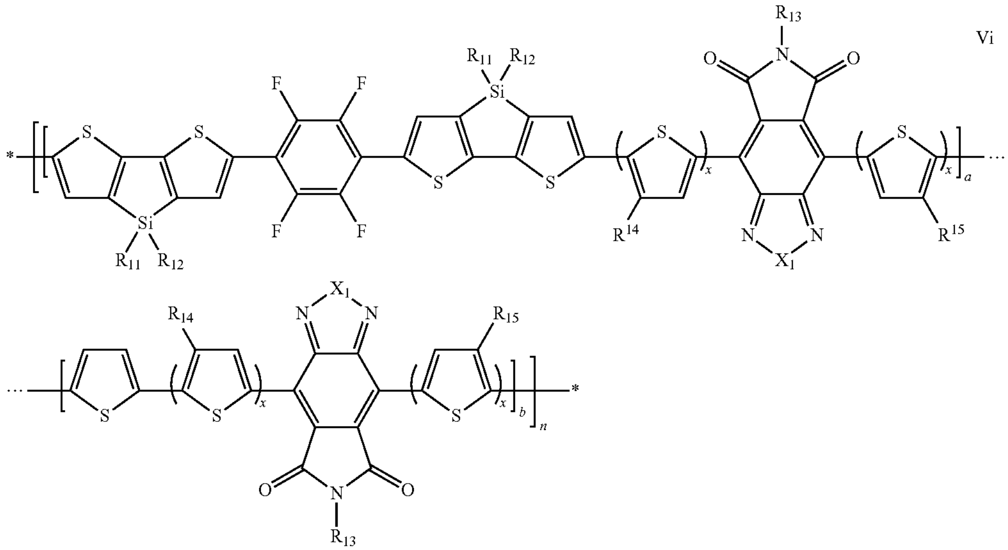
Vk
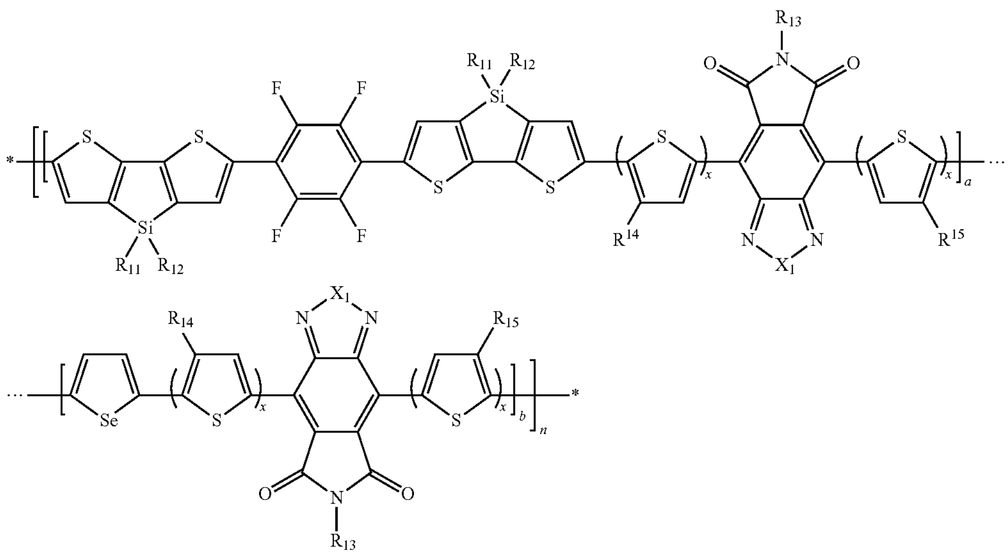
Vm
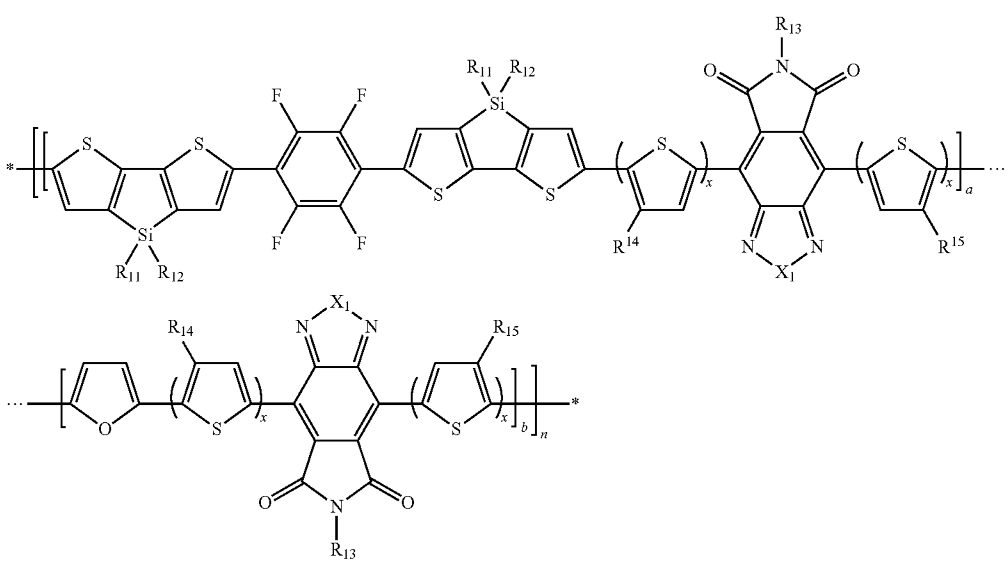

-continued
Vn
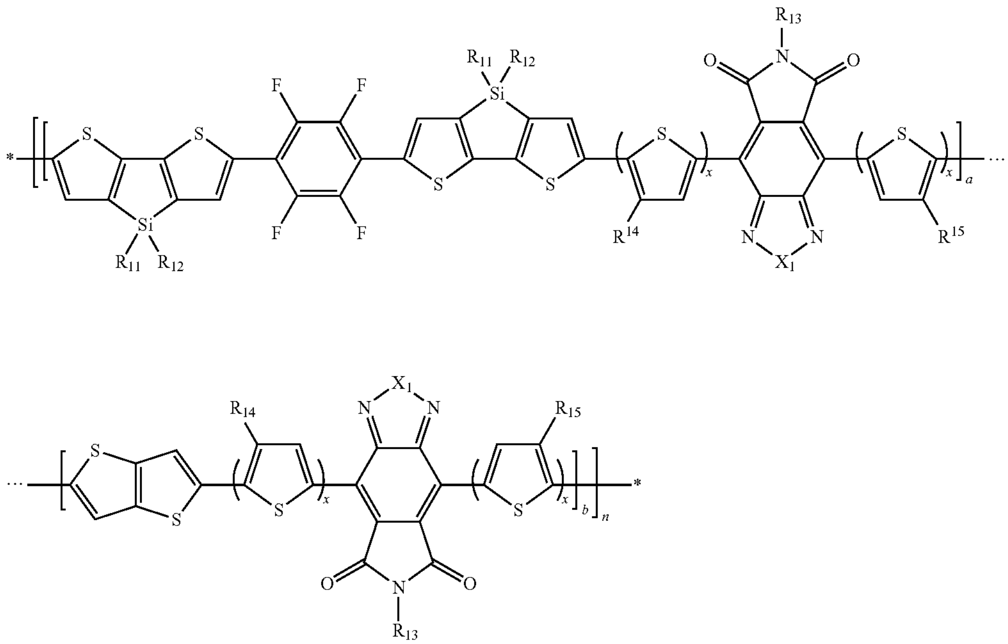
Vo
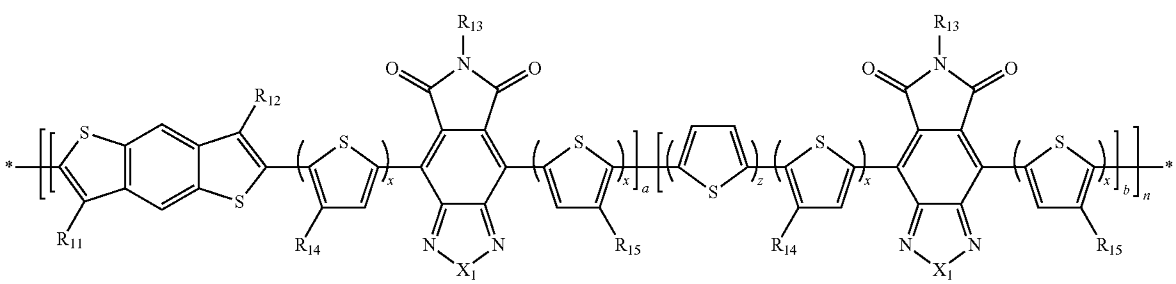
Vp
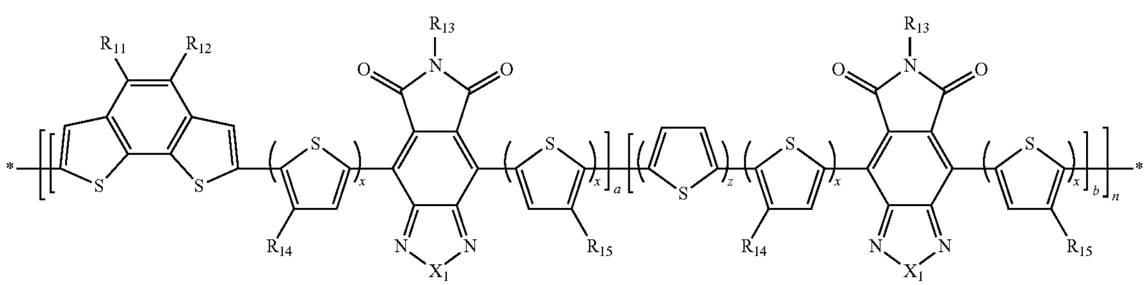
Vq
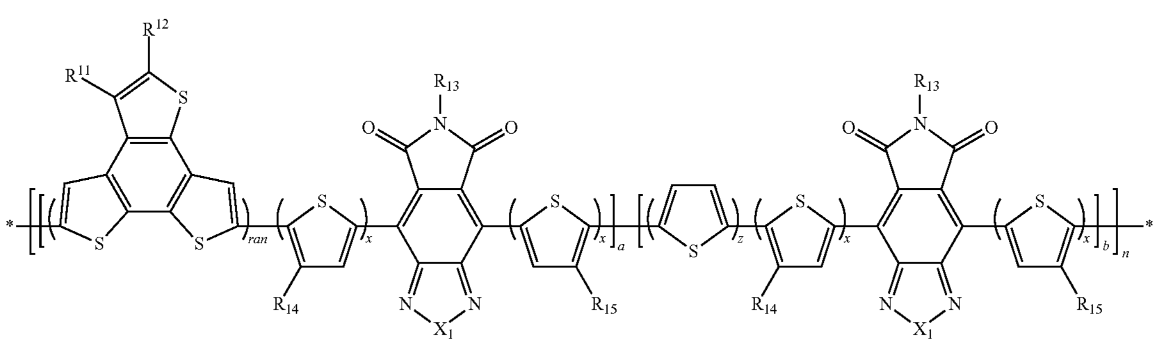

-continued
Vr
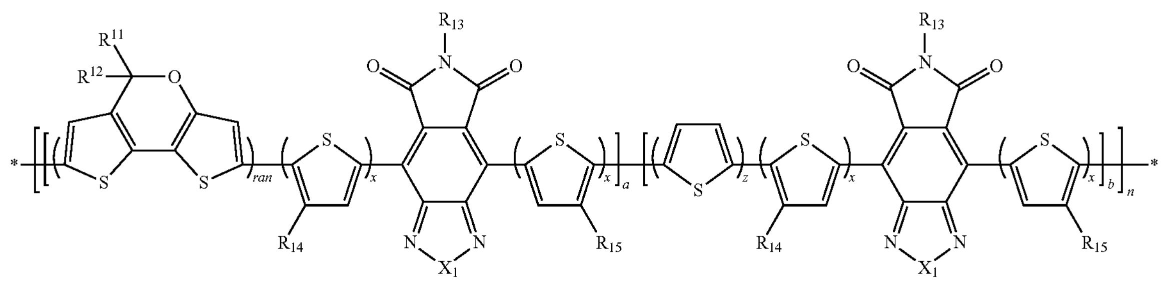
Vs
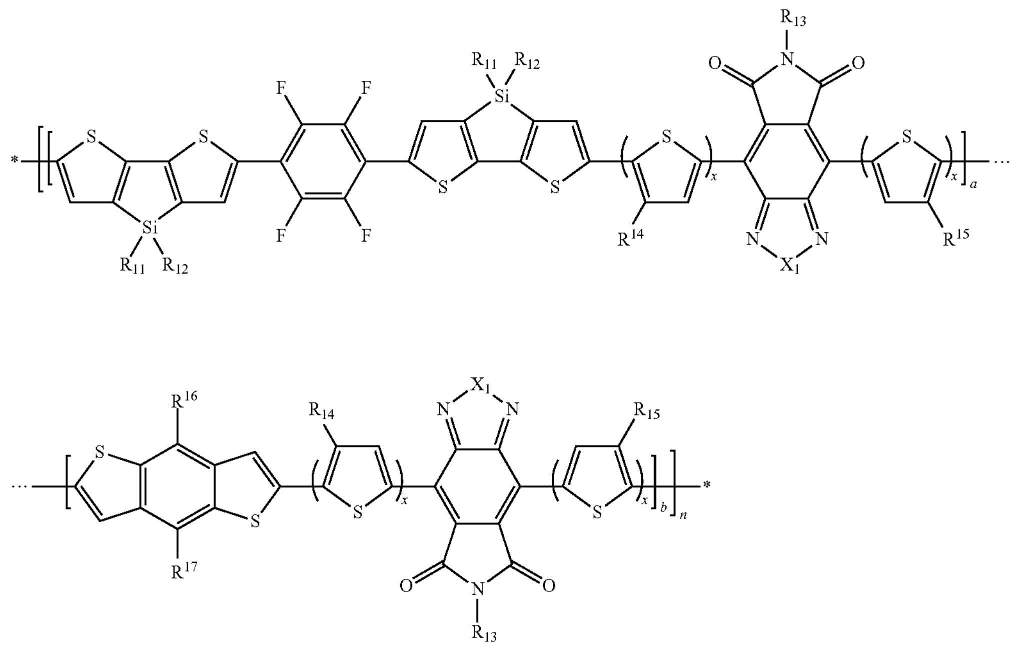
Vv
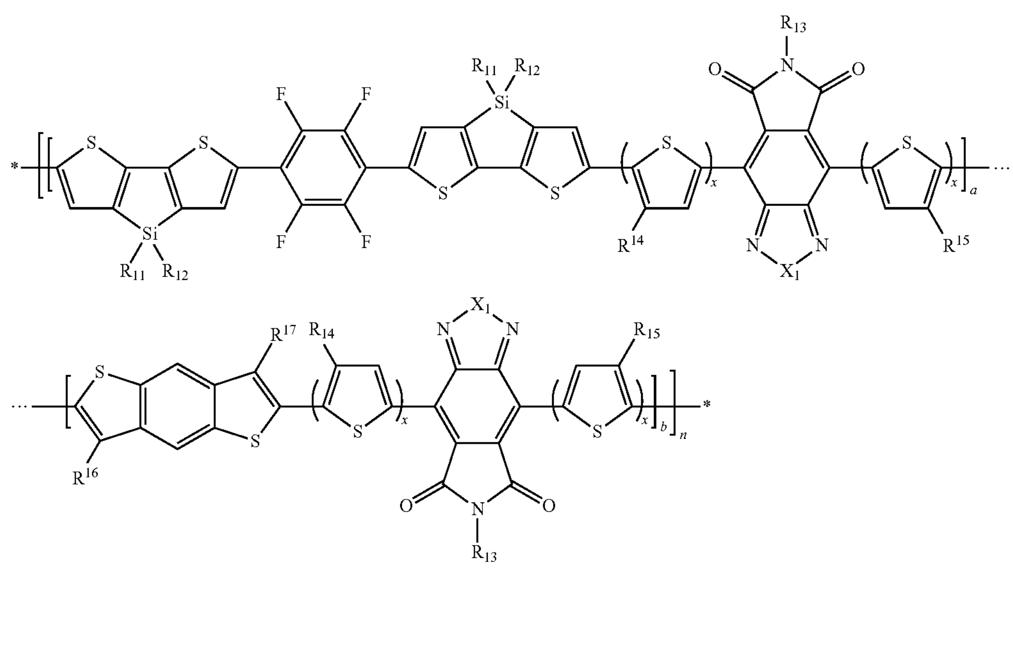

-continued
VIa
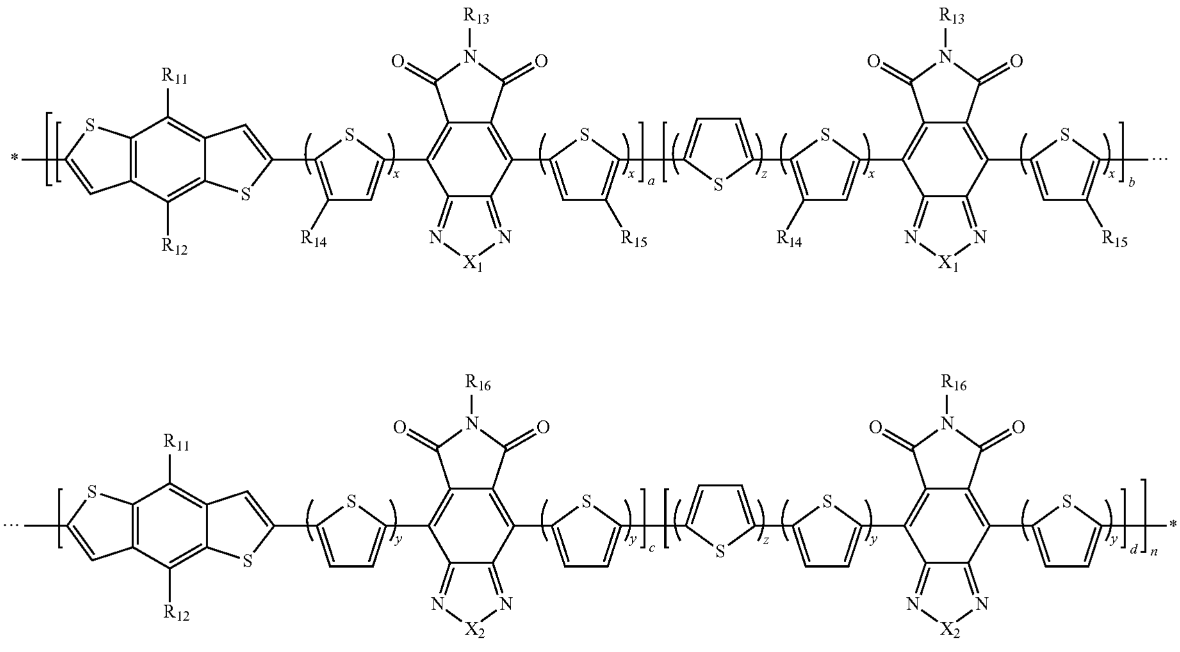
VIb
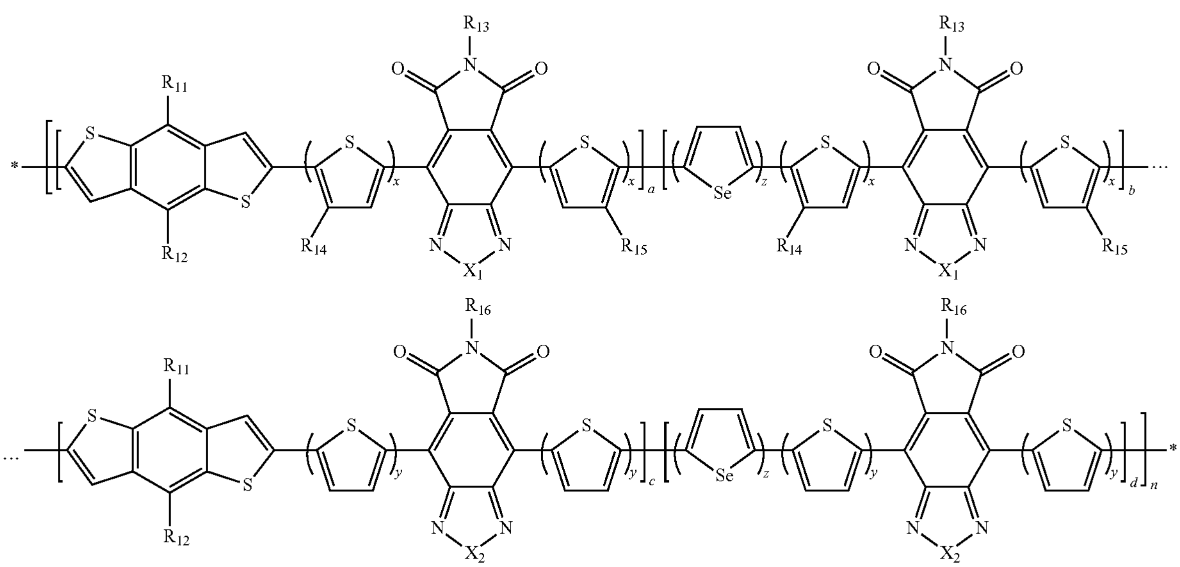
VIc
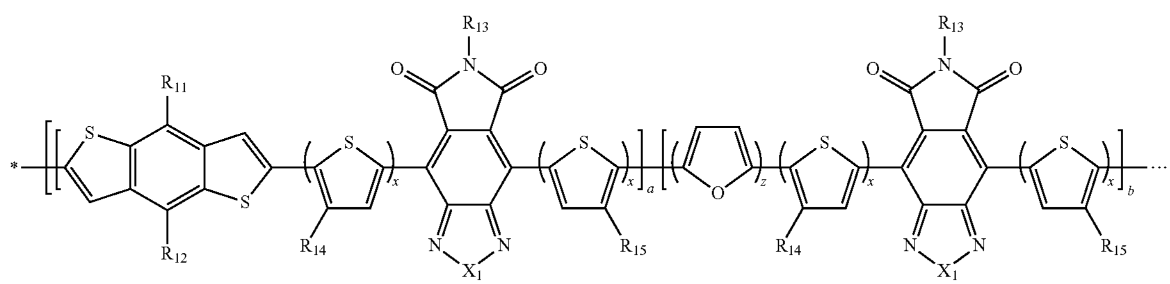

-continued
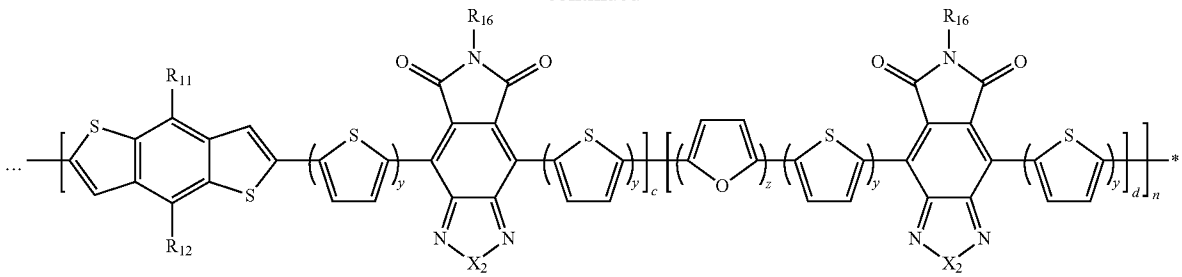
VId
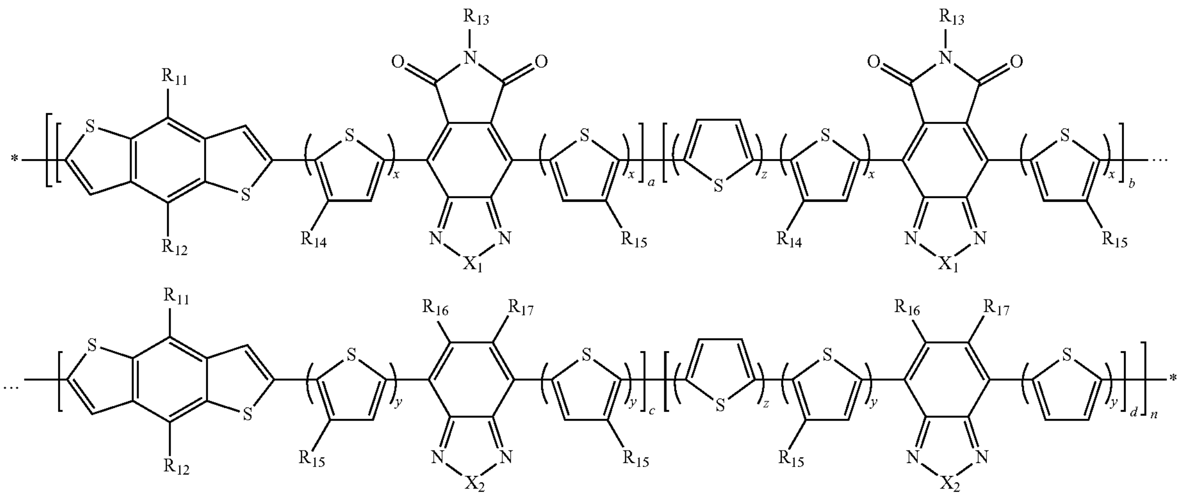
VIIa
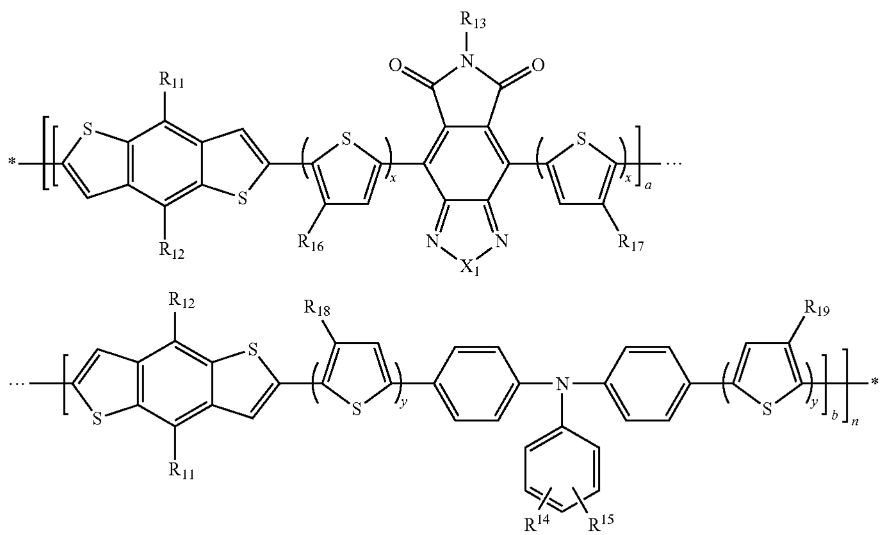
VIIb
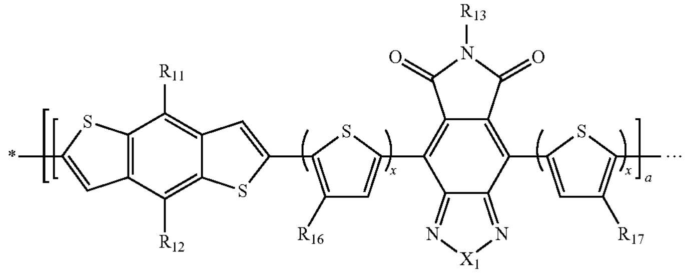

-continued
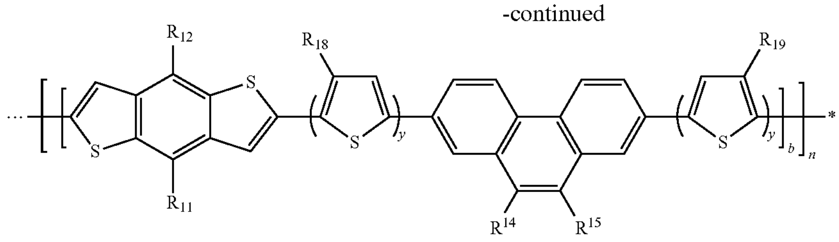
VIIc
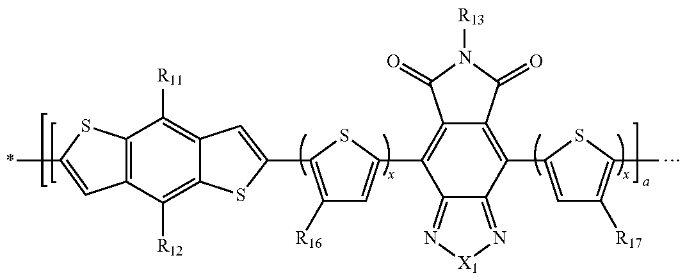
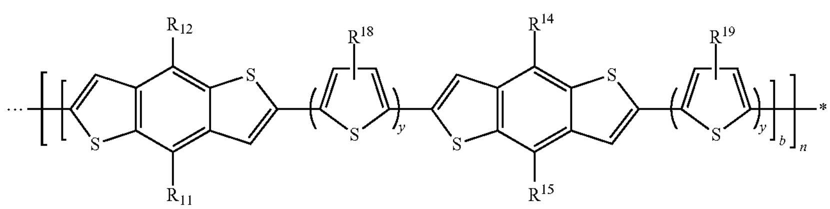
VIId
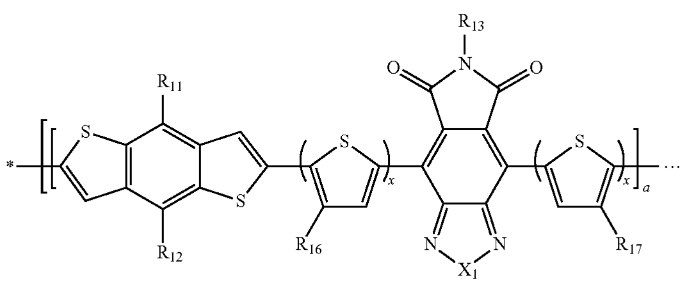
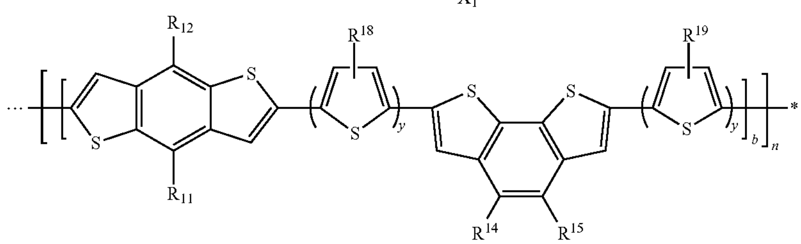
VIIIa
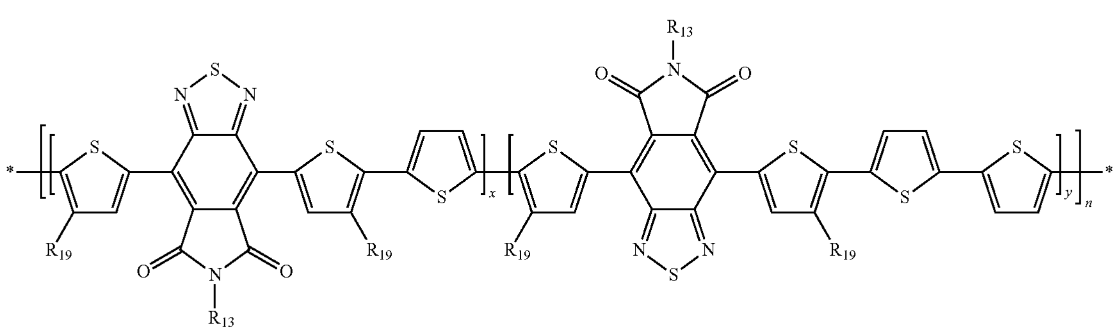

wherein $A^1$, $A^2$, $D^1$, $D^2$, $Sp^1$, $Sp^2$, $Sp^3$ $X^1$, a, b, c, d, x, y and n are as defined above, and $R^{11}$, $R^{12}$, $R^{13}$, $R^{14}$, $R^{15}$ $R^{16}$, $R^{17}$, $R^{18}$ and $R^{19}$ independently of each other denote H or have one of the meanings of $R^S$ as defined above and below.

Preferred polymers are those of formula Ia, IIIa, IVa, IVo, Va, Vs, VId and VIIIa. Very preferred polymers are those of formula IVa, IVo, Va, and Vs especially those wherein $X^1$ is S, x is 1, y is 1, $R^{11}$, $R^{12}$ and $R^{13}$ denote straight-chain or branched alkyl with 1 to 30 C atoms that is optionally fluorinated, $R^{14}$ and $R^{15}$ in formula Va and Vs denote H, and $R^{14}$ and $R^{15}$ in formula Xa and XIa denote alkoxy with 1 to 20 C atoms.

Further preferred are copolymers that comprise a repeating unit of the following formula:

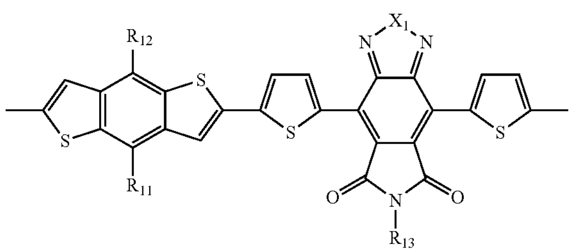

wherein $X^1$ is S, and $R^{11}$, $R^{12}$ and $R^{13}$ denote straight-chain or branched alkyl with 1 to 30 C atoms that is optionally fluorinated.

In the conjugated polymer according to the present invention, the total number of repeating units n is preferably from 2 to 10,000. The total number of repeating units n is preferably ≥5, very preferably ≥10, most preferably ≥50, and preferably ≤500, very preferably ≤1,000, most preferably ≤2,000, including any combination of the aforementioned lower and upper limits of n.

Further preferred is conjugated polymer according to the present invention selected of formula P $R^5$-chain-$R^6$ P wherein "chain" denotes a polymer chain selected of formulae I-XI and their subformulae Ia-XIa, and $R^5$ and $R^6$ have independently of each other one of the meanings of $R^S$ as defined above, or denote, independently of each other, H, F, Br, Cl, I, —$CH_2$Cl, —CHO, —CR'═CR"$_2$, —SiR'R"R'", —SiR'X'X", —SiR'R"X', —SnR'R"R'", —BR'R", —B(OR')(OR"), —$B(OH)_2$, —O—$SO_2$—R', —C≡CH, —C≡C—SiR'$_3$, —ZnX' or an endcap group, X' and X" denote halogen, R', R" and R'" have independently of each other one of the meanings of $R^0$ given in formula T, and preferably denote alkyl with 1 to 12 C atoms, and two of R', R" and R'" may also form a ring together with the hetero atom to which they are attached.

Preferred endcap groups $R^5$ and $R^6$ are H, $C_{1-20}$ alkyl, or optionally substituted $C_{6-12}$ aryl or $C_{2-10}$ heteroaryl, very preferably H or phenyl.

The conjugated polymer can be prepared for example by copolymerising three or more monomers selected from the following formulae in an aryl-aryl coupling reaction $R^7$—U—$R^8$ MI $R^7$-Sp-$R^8$ MII $R^7$—$(Sp)_x$-U—$(Sp)_y$-$R^8$ MIII wherein U denotes a unit of formula T or T1, an acceptor unit $A^1$ or $A^2$, or a donor unit $D^1$ or $D^2$ as defined above, and at least one of the monomers is of formula MI or MIII wherein U denotes a unit of formula T or T1, Sp denotes a spacer unit $Sp^1$, $Sp^2$ or $Sp^3$ as defined above, x and y are independently of each other 0, 1 or 2, and $R^7$ and $R^8$ are, independently of each other, selected from the group consisting of H which is preferably an activated C—H bond, Cl, Br, I, O-tosylate, O-triflate, O-mesylate, O-nonaflate, —$SiMe_2$F, —$SiMeF_2$, —O—$SO_2Z^1$, —$B(OZ^2)_2$, —$CZ^3$═$C(Z^3)_2$, —C≡CH, —C≡C$Si(Z^1)_3$, —Zn$X^0$ and —$Sn(Z^4)_3$, wherein $X^0$ is halogen, preferably Cl, Br or I, $Z^{1-4}$ are selected from the group consisting of alkyl, preferably $C_{1-10}$ alkyl and aryl, preferably $C_{6-12}$ aryl, each being optionally substituted, and two groups $Z^2$ may also form a cyclic group.

Preferred monomers of formula MI and MIII are selected from the following subformulae $R^7$-T-$R^8$ MIa $R^7$-$D^1$-$R^8$ MIb $R^7$-$A^1$-$R^8$ MIc $R^7$-Sp-T-Sp-$R^8$ MIIIa $R^7$-Sp-$D^1$-Sp-$R^8$ MIIIb $R^7$-Sp-$A^1$-Sp-$R^8$ MIIIc wherein T is a unit of formula T or T1, and $A^1$, $D^1$, Sp, $R^7$ and $R^8$ are, on each occurrence identically or differently, as defined in formula MI.

The monomers of formula MI, MII and MIII and their subformulae can be co-polymerised with each other and/or with other suitable co-monomers.

In a first preferred embodiment, the polymers of the present invention are prepared by co-polymerising at least one monomer selected from formulae MIa and MIIIa $R^7$-T-$R^8$ MIa $R^7$-Sp-T-Sp-$R^8$ MIIIa with at least one monomer of formula MII $R^7$-Sp-$R^8$ MII and with at least one monomer selected from formulae MIb and MIIIb $R^7$-$D^1$-$R^8$ MIb $R^7$-Sp-$D^1$-Sp-$R^8$ MIIIb in an aryl-aryl-coupling reaction.

In a second preferred embodiment, the polymers of the present invention are prepared by co-polymerising at least one monomer selected from formulae MIa and MIIIa $R^7$-T-$R^8$ MIa $R^7$-Sp-T-Sp-$R^8$ MIIIa or at least one monomer selected from formulae MIa and MIIIa and at least one monomer of formula MIc $R^7$-$A^1$-$R^8$ MIc with at least one monomer selected of formula MII $R^7$-$Sp^1$-$R^8$ MII wherein totally at least three different monomers are reacted, in an aryl-aryl coupling reaction.

In a third preferred embodiment, the polymers of the present invention are prepared by co-polymerising at least two monomers selected from formulae MIa and MIIIa $R^7$-T-$R^8$ MIa $R^7$-Sp-T-Sp-$R^8$ MIIIa or at least one monomer selected from formulae MIa and MIIIa and at least one monomer of formula MIc $R^7$-$A^1$-$R^8$ MIc with at least one monomer selected from formulae MIb and MIIIb $R^7$-$D^1$-$R^8$ MIb $R^7$-Sp-$D^1$-Sp-$R^8$ MIIIb in an aryl-aryl-coupling reaction.

In a fourth preferred embodiment, the polymers of the present invention are prepared by co-polymerising at least one monomer selected from formulae MIa and MIIIa $R^7$-T-$R^8$ MIa $R^7$-Sp-T-Sp-$R^8$ MIIIa with at least two monomers selected from formulae MIb and MIIIb $R^7$-$D^1$-$R^8$ MIb $R^7$-Sp-$D^1$-Sp-$R^8$ MIIIb in an aryl-aryl-coupling reaction.

In a fifth preferred embodiment, the polymers of the present invention are prepared by co-polymerising at least two monomers selected from formulae MIa and MIIIa $R^7$-T-$R^8$ MIa $R^7$-Sp-T-Sp-$R^8$ MIIIa or at least one monomer selected from formulae MIa and MIIIa and at least one monomer of formula MIc $R^7$-$A^1$-$R^8$ MIc with at least two monomers selected from formulae MIb and MIIIb $R^7$-$D^1$-$R^8$ MIb $R^7$-Sp-$D^1$-Sp-$R^8$ MIIIb in an aryl-aryl-coupling reaction.

In a sixth preferred embodiment, the polymers of the present invention are prepared by co-polymerising at least one monomer selected from formula MIIIa $R^7$-Sp-T-Sp-$R^8$ MIIIa with at least two monomers selected from formulae MIb and MIc $R^7$-$D^1$-$R^8$ MIb $R^7$-$A^1$-$R^8$ MIc in an aryl-aryl-coupling reaction.

Further preferred are repeating units, monomers and polymers of formula T, T1, I-XI, Ia-XIa, P, MI, MII and MIII selected from the following list of preferred embodiments:

X and $X^1$ are S,

X and $X^1$ are Se,

X and $X^1$ are O,

X and $X^1$ are NR, n is at least 5, preferably at least 10, very preferably at least 50, and up to 2,000, preferably up to 500.

the weight average molecular weight $M_w$ is at least 5,000, preferably at least 8,000, very preferably at least 15,000, and preferably up to 500,000, very preferably up to 300,000, R denotes straight-chain or branched alkyl with 1 to 30 C atoms that is optionally fluorinated, all groups $R^S$ denote H, at least one group $R^S$ is different from H, R, $R^S$, $R^{11}$, $R^{12}$, $R^{13}$, $R^{14}$, $R^{15}$ $R^{16}$ $R^{17}$, $R^{18}$ and $R^{19}$ are selected, on each occurrence identically or differently, from the group consisting of primary alkyl with 1 to 30 C atoms, secondary alkyl with 3 to 30 C atoms, and tertiary alkyl with 4 to 30 C atoms, wherein in all these groups one or more H atoms are optionally replaced by F, $R^S$, $R^{11}$, $R^{12}$, $R^{13}$, $R^{14}$, $R^{15}$ $R^{16}$ $R^{17}$, $R^{18}$ and $R^{19}$ are selected, on each occurrence identically or differently, from the group consisting of aryl and heteroaryl, each of which is optionally fluorinated, alkylated or alkoxylated and has 4 to 30 ring atoms, $R^S$, $R^{11}$, $R^{12}$, $R^{13}$, $R^{14}$, $R^{15}$ $R^{16}$ $R^{17}$, $R^{18}$ and $R^{19}$ are selected, on each occurrence identically or differently, from the group consisting of primary alkoxy or sulfanylalkyl with 1 to 30 C atoms, secondary alkoxy or sulfanylalkyl with 3 to 30 C atoms, and tertiary alkoxy or sulfanylalkyl with 4 to 30 C atoms, wherein in all these groups one or more H atoms are optionally replaced by F, $R^S$, $R^{11}$, $R^{12}$, $R^{13}$, $R^{14}$, $R^{15}$ $R^{16}$ $R^{17}$, $R^{18}$ and $R^{19}$ are selected, on each occurrence identically or differently, from the group consisting of aryloxy and heteroaryloxy, each of which is optionally alkylated or alkoxylated and has 4 to 30 ring atoms, $R^S$, $R^{11}$, $R^{12}$, $R^{13}$, $R^{14}$, $R^{15}$ $R^{16}$ $R^{17}$, $R^{18}$ and $R^{19}$ are selected, on each occurrence identically or differently, from the group consisting of alkylcarbonyl, alkoxycarbonyl and alkylcarbonyloxy, all of which are straight-chain or branched, are optionally fluorinated, and have from 1 to 30 C atoms, $R^0$ and $R^{00}$ are selected from H or $C_1$-$C_{12}$-alkyl, $R^5$ and $R^6$ are independently of each other selected from H, halogen, —$CH_2Cl$, —CHO, —CH═$CH_2$—SiR'R"R'", —SnR'R"R'", —BR'R", —B(OR')(OR"), —$B(OH)_2$, P-Sp, $C_1$-$C_{20}$-alkyl, $C_1$-$C_{20}$-alkoxy, $C_2$-$C_{20}$-alkenyl, $C_1$-$C_{20}$-fluoroalkyl and optionally substituted aryl or heteroaryl, preferably phenyl, $R^7$ and $R^8$ are independently of each other selected from the group consisting of an activated C—H bond, Cl, Br, I, O-tosylate, O-triflate, O-mesylate, O-nonaflate, —$SiMe_2F$, —$SiMeF_2$, —O—$SO_2Z^1$, —$B(OZ^2)_2$, —$CZ^3$═$C(Z^4)_2$, —C≡CH, C≡$CSi(Z^1)_3$, —$ZnX^0$ and —$Sn(Z^4)_3$, wherein $X^0$ is halogen, $Z^{1-4}$ are selected from the group consisting of alkyl, preferably $C_{1-10}$ alkyl and aryl, preferably $C_{6-12}$ aryl, each being optionally substituted, and two groups $Z^2$ may also form a cyclic group.

The polymer according to the present invention can be synthesized according to or in analogy to methods that are known to the skilled person and are described in the literature. Other methods of preparation can be taken from the examples.

For example, the polymers can be suitably prepared by aryl-aryl coupling reactions, such as Yamamoto coupling, C—H activation coupling, Suzuki coupling, Stille coupling, Sonogashira coupling, Heck coupling or Buchwald coupling. Suzuki coupling, Stille coupling and Yamamoto coupling are especially preferred. The monomers which are polymerised to form the repeat units of the polymers can be prepared according to methods which are known to the person skilled in the art.

Preferably the polymer is prepared from monomers selected from formulae MI, MII and MIII as described above.

Another aspect of the invention is a process for preparing a polymer by coupling one or more identical or different monomers selected from formula MI, MII and MIII with each other and/or with one or more co-monomers in a polymerisation reaction, preferably in an aryl-aryl coupling reaction.

Preferred aryl-aryl coupling and polymerisation methods used in the processes described above and below are Yamamoto coupling, Kumada coupling, Negishi coupling, Suzuki coupling, Stille coupling, Sonogashira coupling, Heck coupling, C—H activation coupling, Ullmann coupling or Buchwald coupling. Especially preferred are Suzuki coupling, Negishi coupling, Stille coupling and Yamamoto coupling. Suzuki coupling is described for example in WO 00/53656 A1. Negishi coupling is described for example in *J. Chem. Soc., Chem. Commun.,* 1977, 683-684. Yamamoto coupling is described in for example in T. Yamamoto et al., *Prog. Polym. Sci.,* 1993, 17, 1153-1205, or WO 2004/022626 A1. Stille coupling is described for example in Z. Bao et al., *J. Am. Chem. Soc.,* 1995, 117, 12426-12435. C—H activation is described for example for example in M. Leclerc et al, *Angew. Chem. Int. Ed.* 2012, 51, 2068-2071. For example, when using Yamamoto coupling, monomers having two reactive halide groups are preferably used. When using Suzuki coupling, monomers having two reactive boronic acid or boronic acid ester groups or two reactive halide groups are preferably used. When using Stille coupling, monomers having two reactive stannane groups or two reactive halide groups are preferably used. When using Negishi coupling, monomers having two reactive organozinc groups or two reactive halide groups are preferably used. When synthesizing a linear polymer by C—H activation polymerisation, preferably a monomer as described above is used wherein at least one reactive group is a activated hydrogen bond.

Preferred catalysts, especially for Suzuki, Negishi or Stille coupling, are selected from Pd(0) complexes or Pd(II) salts. Preferred Pd(0) complexes are those bearing at least one phosphine ligand such as $Pd(Ph_3P)_4$. Another preferred phosphine ligand is tris(ortho-tolyl)phosphine, i.e. $Pd(o\text{-}Tol_3P)_4$. Preferred Pd(II) salts include palladium acetate, i.e. $Pd(OAc)_2$ or trans-di(p-acetato)-bis[o-(di-o-tolylphosphino) benzyl]dipalladium(II). Alternatively the Pd(0) complex can be prepared by mixing a Pd(0) dibenzylideneacetone complex, for example tris(dibenzyl-ideneacetone)dipalladium (0), bis(dibenzylideneacetone)palladium(0), or Pd(II) salts e.g. palladium acetate, with a phosphine ligand, for example triphenylphosphine, tris(ortho-tolyl)phosphine, tris(o-methoxyphenyl)phosphine or tri(tert-butyl)phosphine. Suzuki polymerisation is performed in the presence of a base, for example sodium carbonate, potassium carbonate, cesium carbonated, lithium hydroxide, potassium phosphate or an organic base such as tetraethylammonium carbonate or tetraethylammonium hydroxide. Yamamoto polymerisation employs a Ni(0) complex, for example bis(1,5-cyclooctadienyl) nickel(0).

Suzuki, Stille or C—H activation coupling polymerisation may be used to prepare homopolymers as well as statistical, alternating and block random copolymers. Statistical, random block copolymers or block copolymers can be prepared for example from the above monomers, wherein one of the reactive groups is halogen and the other reactive group is a C—H activated bond, boronic acid, boronic acid derivative group or and alkylstannane. The synthesis of statistical, alternating and block copolymers is described in detail for example in WO 03/048225 A2 or WO 2005/014688 A2.

As alternatives to halogen as described above, leaving groups of formula $—O—SO_2Z^1$ can be used wherein $Z^1$ is as defined above. Particular examples of such leaving groups are tosylate, mesylate and triflate.

The generic preparation of the TID units of formula T and T1 and the corresponding monomers has been described for example in WO 2012/149189 A2 and in *Chem. Comm.* 2013, 49, 2409-2411.

Suitable and preferred methods for preparing a random polymer according to the present invention are illustrated in Schemes 1-4 below, wherein $A^1$, $A^2$, D, $D^2$, $Sp^1$, $Sp^2$ and $Sp^3$ are as defined above, and $RG^1$ and $RG^2$ denote a reactive group, preferably having one of the meanings of $R^7$ and $R^8$ in formulae MI, MII and MIII, very preferably selected from C—H activated bond, Cl, Br, I, $—B(OZ^2)_2$ and $—Sn(Z^4)_3$ as defined in formula IVa.

Preferably $RG^1$ and $RG^2$ are complementary to each other in a polycondensation reaction such as Suzuki coupling, Stille coupling, Sonogashira coupling, Heck coupling, Negishi coupling or C—H activation coupling.

Very preferably RG, $R^7$ and $R^8$ are selected from of a first set of reactive groups consisting of —Cl, —Br, —I, O-tosylate, O-triflate, O-mesylate and O-nonaflate and a second set of reactive groups consisting of an C—H activated bond, —SiR'R"F, —SiR'R"OR'", —SiR'F₂, —B(OR')(OR"), —CR'═CHR", —C≡CH, —ZnX', —MgX' and —Sn-R'R"R'". wherein X' and X" denote halogen, R', R" and R'" have independently of each other one of the meanings of $R^0$ given in formula I, and preferably denote alkyl with 1 to 12 C atoms, and two of R', R" and R'" may also form a ring together with the hetero atom to which they are attached.

Scheme 1: Generic Co-Polymerisation of TID Co-Polymers Composed of Multiple Electron Accepting Units Reaction Type A

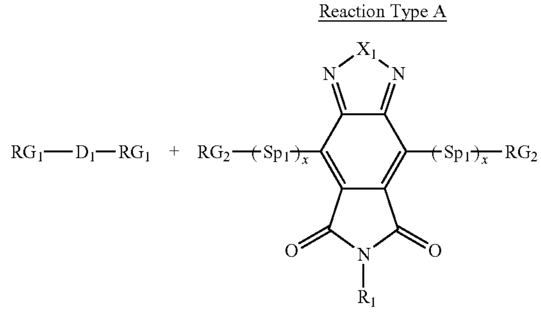

-continued
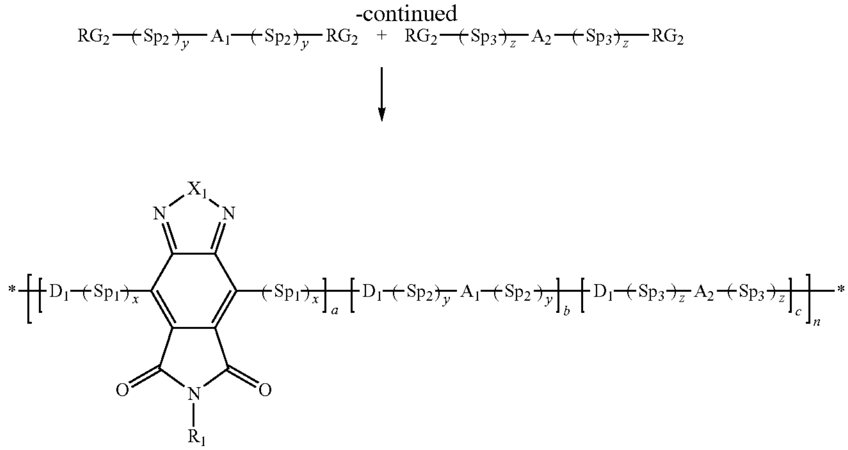
Reaction Type B
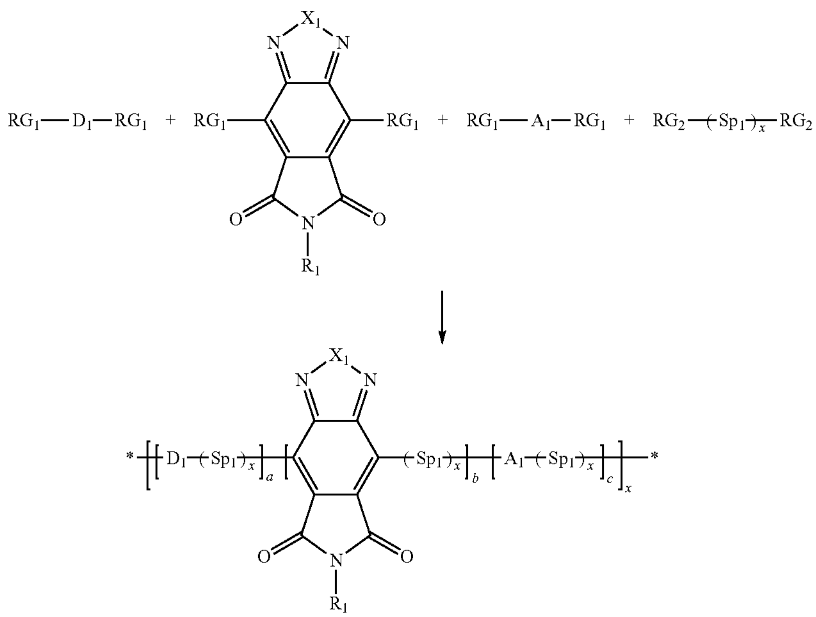
Scheme 2: Generic Co-Polymerisation of TID Co-Polymers Composed of Multiple Electron Donating Units
Reaction Type A
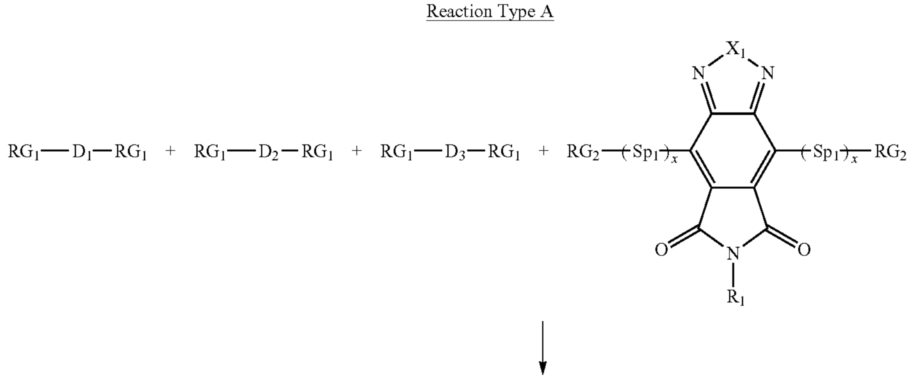

-continued
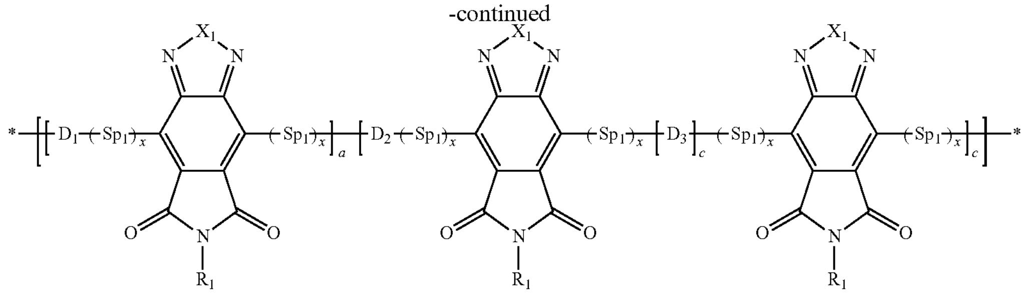
Reaction Type B
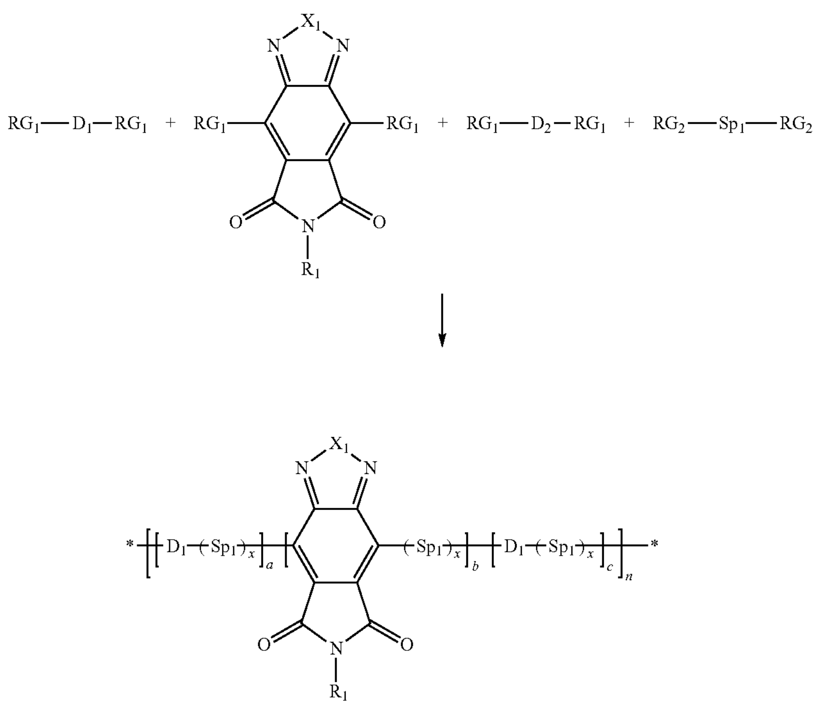
Reaction Type C
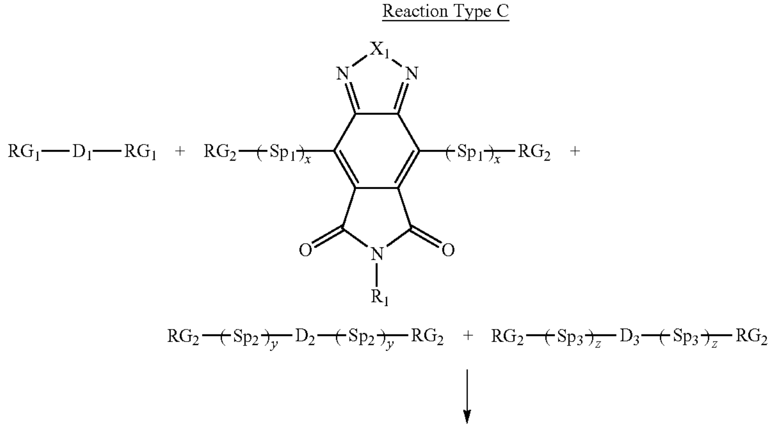

-continued
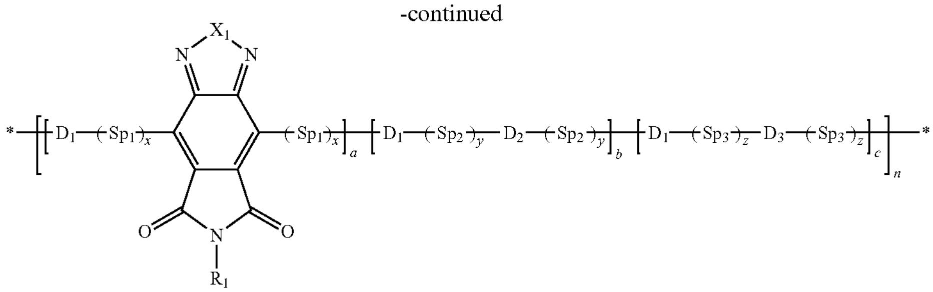
Scheme 3: Generic co-polymerisation of TID co-polymers composed of multiple electron donating and accepting units
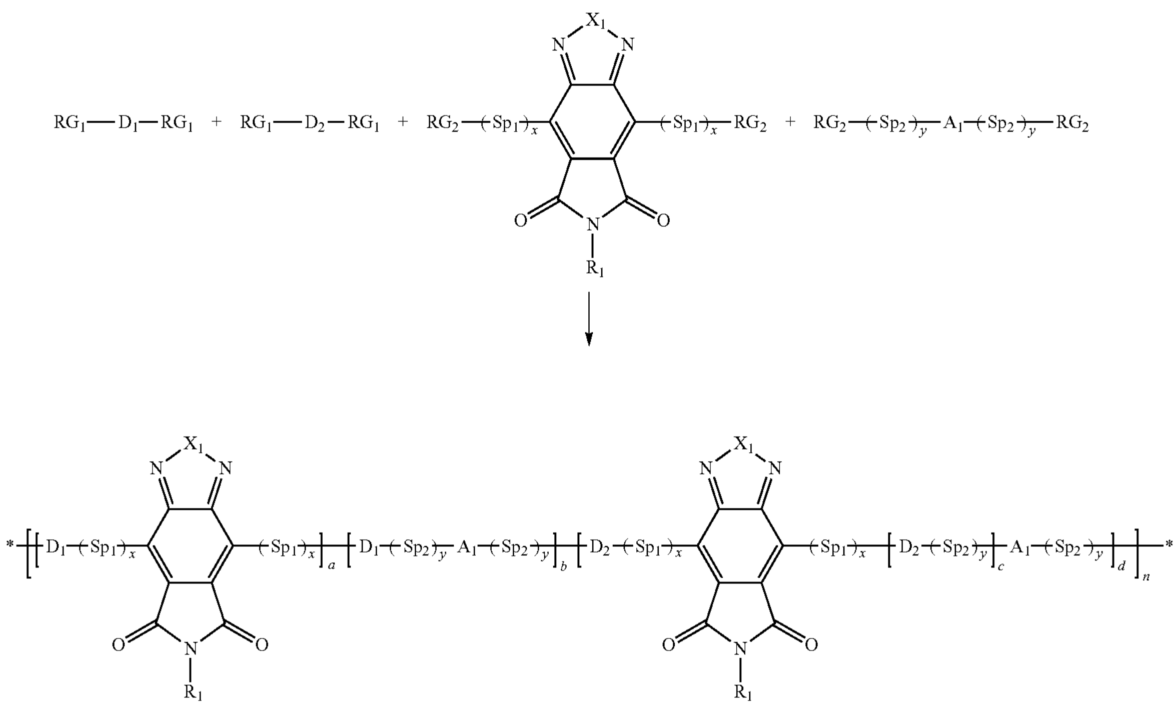
Scheme 4: Generic co-polymerisation of TID co-polymers composed of multiple spacers
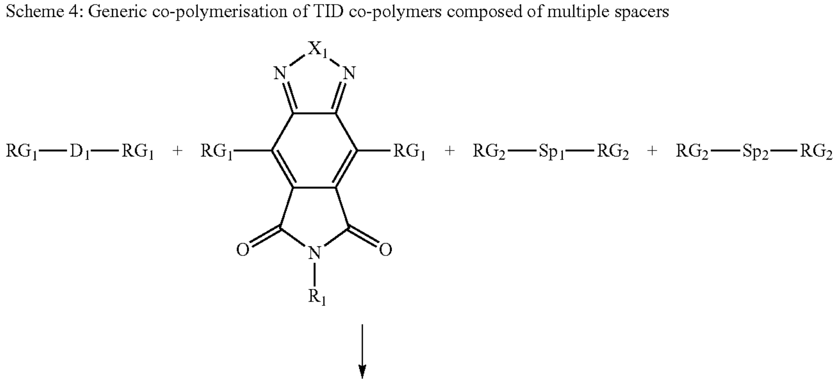

-continued

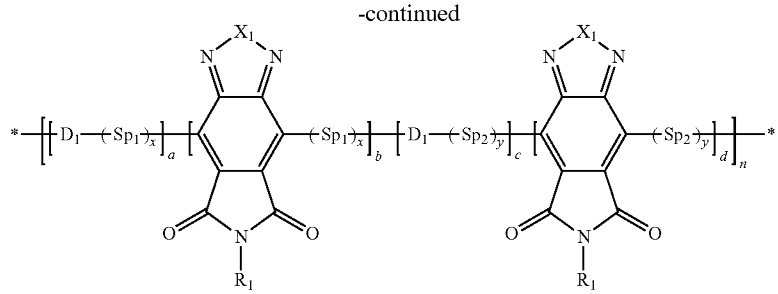

The novel methods of preparing a polymer as described above and below, and the novel monomers used therein, are further aspects of the invention.

The polymer according to the present invention can also be used in mixtures or polymer blends, for example together with monomeric compounds or together with other polymers having charge-transport, semiconducting, electrically conducting, photoconducting and/or light-emitting semiconducting properties, or for example with polymers having hole blocking, electron blocking properties for use as interlayers, charge blocking layers, charge transporting layer in OLED devices, OPV devices or pervorskite based solar cells. Thus, another aspect of the invention relates to a polymer blend comprising one or more polymers according to the present invention and one or more further polymers having one or more of the above-mentioned properties. These blends can be prepared by conventional methods that are described in prior art and known to the skilled person. Typically the polymers are mixed with each other or dissolved in suitable solvents and the solutions combined.

Another aspect of the invention relates to a formulation comprising one or more polymers, polymer blends or mixtures as described above and below and one or more organic solvents.

Preferred solvents are aliphatic hydrocarbons, chlorinated hydrocarbons, aromatic hydrocarbons, ketones, ethers and mixtures thereof. Additional solvents which can be used include 1,2,4-trimethylbenzene, 1,2,3,4-tetramethyl benzene, pentylbenzene, mesitylene, cumene, cymene, cyclohexylbenzene, diethylbenzene, tetralin, decalin, 2,6-lutidine, 2-fluoro-m-xylene, 3-fluoro-o-xylene, 2-chlorobenzotrifluoride, N,N-dimethylformamide, 2-chloro-6-fluorotoluene, 2-fluoroanisole, anisole, 2,3-dimethylpyrazine, 4-fluoroanisole, 3-fluoroanisole, 3-trifluoro-methylanisole, 2-methylanisole, phenetol, 4-methylanisole, 3-methylanisole, 4-fluoro-3-methylanisole, 2-fluorobenzonitrile, 4-fluoroveratrol, 2,6-dimethylanisole, 3-fluorobenzo-nitrile, 2,5-dimethylanisole, 2,4-dimethylanisole, benzonitrile, 3,5-dimethyl-anisole, N,N-dimethylaniline, ethyl benzoate, 1-fluoro-3,5-dimethoxy-benzene, 1-methylnaphthalene, N-methylpyrrolidinone, 3-fluorobenzo-trifluoride, benzotrifluoride, dioxane, trifluoromethoxy-benzene, 4-fluorobenzotrifluoride, 3-fluoropyridine, toluene, 2-fluoro-toluene, 2-fluorobenzotrifluoride, 3-fluorotoluene, 4-isopropylbiphenyl, phenyl ether, pyridine, 4-fluorotoluene, 2,5-difluorotoluene, 1-chloro-2,4-difluorobenzene, 2-fluoropyridine, 3-chlorofluoro-benzene, 1-chloro-2,5-difluorobenzene, 4-chlorofluorobenzene, chloro-benzene, o-dichlorobenzene, 2-chlorofluorobenzene, p-xylene, m-xylene, o-xylene or mixture of o-, m-, and p-isomers. Solvents with relatively low polarity are generally preferred. For inkjet printing solvents and solvent mixtures with high boiling temperatures are preferred. For spin coating alkylated benzenes like xylene and toluene are preferred.

Examples of especially preferred solvents include, without limitation, dichloromethane, trichloromethane, tetrachloromethane, chlorobenzene, o-dichlorobenzene, 1,2,4-trichlorobenzene, 1,2-dichloroethane, 1,1,1-trichloroethane, 1,1,2,2-tetrachloroethane, 1,8-diiodooctane, 1-chloronaphthalene, 1,8-octane-dithiol, anisole, 2,5-di-methylanisole, 2,4-dimethylanisole, toluene, o-xylene, m-xylene, p-xylene, mixture of o-, m-, and p-xylene isomers, 1,2,4-trimethylbenzene, mesitylene, cyclohexane, 1-methylnaphthalene, 2-methylnaphthalene, 1,2-dimethylnaphthalene, tetraline, decaline, indane, 1-methyl-4-(1-methylethenyl)-cyclohexene (d-Limonene), 6,6-dimethyl-2-methylenebicyclo[3.1.1] heptanes (β-pinene), methyl benzoate, ethyl benzoate, nitrobenzene, benzaldehyde, tetrahydrofuran, 1,4-dioxane, 1,3-dioxane, morpholine, acetone, methylethylketone, ethyl acetate, n-butyl acetate, N,N-dimethylformamide, dimethylacetamide, dimethylsulfoxide and/or mixtures thereof.

The concentration of the polymers in the solution is preferably 0.1 to 10% by weight, more preferably 0.5 to 5% by weight. Optionally, the solution also comprises one or more binders to adjust the rheological properties, as described for example in WO 2005/055248 A1.

After the appropriate mixing and ageing, solutions are evaluated as one of the following categories: complete solution, borderline solution or insoluble. The contour line is drawn to outline the solubility parameter-hydrogen bonding limits dividing solubility and insolubility. 'Complete' solvents falling within the solubility area can be chosen from literature values such as published in "Crowley, J. D., Teague, G. S. Jr and Lowe, J. W. Jr., *Journal of Paint Technology,* 1966, 38 (496), 296". Solvent blends may also be used and can be identified as described in "Solvents, W. H. Ellis, Federation of Societies for Coatings Technology, p 9-10, 1986". Such a procedure may lead to a blend of 'non' solvents that will dissolve both the polymers of the present invention, although it is desirable to have at least one true solvent in a blend.

The polymer according to the present invention can also be used in patterned OSC layers in the devices as described above and below. For applications in modern microelectronics it is generally desirable to generate small structures or patterns to reduce cost (more devices/unit area), and power consumption. Patterning of thin layers comprising a polymer according to the present invention can be carried out for example by photolithography, electron beam lithography or laser patterning.

For use as thin layers in electronic or electrooptical devices the polymers, polymer blends or formulations of the present invention may be deposited by any suitable method. Liquid coating of devices is more desirable than vacuum deposition techniques. Solution deposition methods are especially preferred. The formulations of the present invention enable the use of a number of liquid coating techniques. Preferred deposition techniques include, without limitation, dip coating, spin coating, ink jet printing, nozzle printing, letter-press printing, screen printing, gravure printing, doctor blade coating, roller printing, reverse-roller printing, offset lithography printing, dry offset lithography printing, flexographic printing, web printing, spray coating, curtain coating, brush coating, slot dye coating or pad printing.

Ink jet printing is particularly preferred when high resolution layers and devices needs to be prepared. Selected formulations of the present invention may be applied to prefabricated device substrates by ink jet printing or microdispensing. Preferably industrial piezoelectric print heads such as but not limited to those supplied by Aprion, Hitachi-Koki, InkJet Technology, On Target Technology, Picojet, Spectra, Trident, Xaar may be used to apply the organic semiconductor layer to a substrate. Additionally semi-industrial heads such as those manufactured by Brother, Epson, Konica, Seiko Instruments Toshiba TEC or single nozzle microdispensers such as those produced by Microdrop and Microfab may be used.

In order to be applied by ink jet printing or microdispensing, the polymers should be first dissolved in a suitable solvent. Solvents must fulfil the requirements stated above and must not have any detrimental effect on the chosen print head. Additionally, solvents should have boiling points >100° C., preferably >140° C. and more preferably >150° C. in order to prevent operability problems caused by the solution drying out inside the print head. Apart from the solvents mentioned above, suitable solvents include substituted and non-substituted xylene derivatives, di-$C_{1-2}$-alkyl formamide, substituted and non-substituted anisoles and other phenol-ether derivatives, substituted heterocycles such as substituted pyridines, pyrazines, pyrimidines, pyrrolidinones, substituted and non-substituted N,N-di-$C_{1-2}$-alkylanilines and other fluorinated or chlorinated aromatics.

A preferred solvent for depositing a polymer according to the present invention by ink jet printing comprises a benzene derivative which has a benzene ring substituted by one or more substituents wherein the total number of carbon atoms among the one or more substituents is at least three. For example, the benzene derivative may be substituted with a propyl group or three methyl groups, in either case there being at least three carbon atoms in total. Such a solvent enables an ink jet fluid to be formed comprising the solvent with the compound or polymer, which reduces or prevents clogging of the jets and separation of the components during spraying. The solvent(s) may include those selected from the following list of examples: dodecylbenzene, 1-methyl-4-tert-butylbenzene, terpineol, limonene, isodurene, terpinolene, cymene, diethylbenzene. The solvent may be a solvent mixture, that is a combination of two or more solvents, each solvent preferably having a boiling point >100° C., more preferably >140° C. Such solvent(s) also enhance film formation in the layer deposited and reduce defects in the layer.

The ink jet fluid (that is mixture of solvent, binder and semiconducting compound) preferably has a viscosity at 20° C. of 1-100 mPa·s, more preferably 1-50 mPa·s and most preferably 1-30 mPa·s.

The polymers, polymer blends, mixtures and formulations according to the present invention can additionally comprise one or more further components or additives selected for example from surface-active compounds, lubricating agents, wetting agents, dispersing agents, hydrophobing agents, adhesive agents, flow improvers, defoaming agents, deaerators, diluents which may be reactive or non-reactive, auxiliaries, colourants, dyes or pigments, sensitizers, stabilizers, nanoparticles or inhibitors.

The polymers, polymer blends and mixtures according to the present invention are useful as charge transport, semiconducting, electrically conducting, photoconducting or light emitting material in optical, electrooptical, electronic, electroluminescent or photoluminescent components or devices. In these devices, a polymer, polymer blend or mixture of the present invention is typically applied as a thin layer or film.

Thus, the present invention also provides the use of the polymer, polymer blend, mixture or layer in an electronic device. The formulation may be used as a high mobility semiconducting material in various devices and apparatus. The formulation may be used, for example, in the form of a semiconducting layer or film. Accordingly, in another aspect, the present invention provides a semiconducting layer for use in an electronic device, the layer comprising a polymer, mixture or polymer blend according to the invention. The layer or film may be less than about 30 microns. For various electronic device applications, the thickness may be less than about 1 micron thick. The layer may be deposited, for example on a part of an electronic device, by any of the aforementioned solution coating or printing techniques.

The invention additionally provides an electronic device comprising a polymer, polymer blend, mixture or organic semiconducting layer according to the present invention. Especially preferred devices are OFETs, TFTs, ICs, logic circuits, capacitors, RFID tags, OLEDs, OLETs, OPEDs, OPVs, OPDs, solar cells, laser diodes, photoconductors, photodetectors, electrophotographic devices, electrophotographic recording devices, organic memory devices, sensor devices, charge injection layers, Schottky diodes, planarising layers, antistatic films, conducting substrates and conducting patterns.

Especially preferred electronic device are OFETs, OLEDs, OPV and OPD devices, in particular bulk heterojunction (BHJ) OPV devices. In an OFET, for example, the active semiconductor channel between the drain and source may comprise the layer of the invention. As another example, in an OLED device, the charge (hole or electron) injection or transport layer may comprise the layer of the invention.

For use in OPV or OPD devices the polymer according to the present invention is preferably used in a formulation that comprises or contains, more preferably consists essentially of, very preferably exclusively of, one or more p-type (electron donor) semiconductor and one or more n-type (electron acceptor) semiconductor. The p-type semiconductor is constituted of a least one polymer according to the present invention. The n-type semiconductor can be an inorganic material such as zinc oxide ($ZnO_x$), zinc tin oxide (ZTO), titanium oxide ($TiO_x$), molybdenum oxide ($MoO_x$), nickel oxide ($NiO_x$), or cadmium selenide (CdSe), or an organic material such as graphene or a fullerene, a conjugated polymer or substituted fullerene, for example a (6,6)-phenyl-butyric acid methyl ester derivatized methano $C_{60}$ fullerene, also known as "PCBM-$C_{60}$" or "$C_{60}$PCBM", as disclosed for example in *Science* 1995, 270, 1789 and having the structure shown below, or structural analogous compounds with e.g. a $C_{70}$ fullerene group or an organic polymer (see for example Coakley, K. M. and McGehee, M. D. *Chem. Mater.* 2004, 16, 4533).

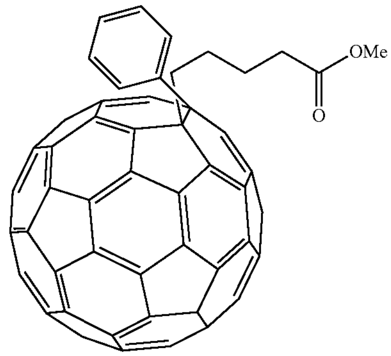

PCBM-$C_{60}$

Preferably the polymer according to the present invention is blended with an n-type semiconductor such as a fullerene or substituted fullerene of formula XII to form the active layer in an OPV or OPD device wherein,

XII

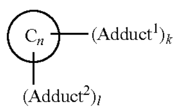

$C_n$ denotes a fullerene composed of n carbon atoms, optionally with one or more atoms trapped inside, Adduct[1] is a primary adduct appended to the fullerene $C_n$ with any connectivity, Adduct[2] is a secondary adduct, or a combination of secondary adducts, appended to the fullerene $C_n$ with any connectivity, k is an integer ≥1, and I is 0, an integer ≥1, or a non-integer >0.

In the formula XII and its subformulae, k preferably denotes 1, 2, 3 or, 4, very preferably 1 or 2.

The fullerene $C_n$ in formula XII and its subformulae may be composed of any number n of carbon atoms Preferably, in the compounds of formula XII and its subformulae the number of carbon atoms n of which the fullerene $C_n$ is composed is 60, 70, 76, 78, 82, 84, 90, 94 or 96, very preferably 60 or 70.

The fullerene $C_n$ in formula XII and its subformulae is preferably selected from carbon based fullerenes, endohedral fullerenes, or mixtures thereof, very preferably from carbon based fullerenes.

Suitable and preferred carbon based fullerenes include, without limitation, $(C_{60\text{-}Ih})$[5,6]fullerene, $(C_{70\text{-}D5h})$[5,6]fullerene, $(C_{76\text{-}D2*})$[5,6]fullerene, $(C_{84\text{-}D2*})$[5,6]fullerene, $(C_{84\text{-}D2d})$[5,6]fullerene, or a mixture of two or more of the aforementioned carbon based fullerenes.

The endohedral fullerenes are preferably metallofullerenes. Suitable and preferred metallofullerenes include, without limitation, $La@C_{60}$, $La@C_{82}$, $Y@C_{82}$, $Sc_3N@C_{80}$, $Y_3N@C_{80}$, $Sc_3C_2@C_{80}$ or a mixture of two or more of the aforementioned metallofullerenes.

Preferably the fullerene $C_n$ is substituted at a [6,6] and/or [5,6] bond, preferably substituted on at least one [6,6] bond.

Primary and secondary adduct, named "Adduct" in formula XII and its subformulae, is preferably selected from the following formulae

S-1

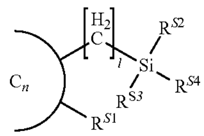

S-2

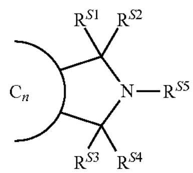

S-3

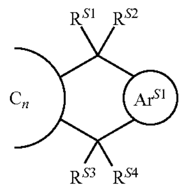

S-4

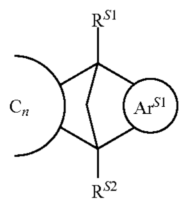

S-4

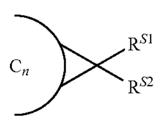

S-5

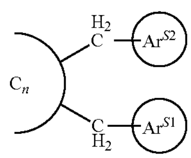

S-6

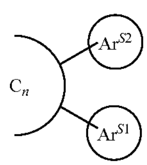

S-7

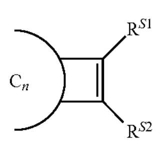

S-8

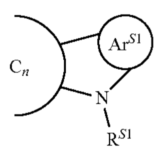

-continued

S-9

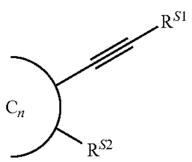

S-10

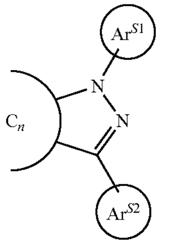

S-11

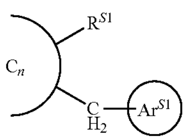

wherein $Ar^{S1}$, $Ar^{S2}$ denote, independently of each other, an aryl or heteroaryl group with 5 to 20, preferably 5 to 15, ring atoms, which is mono- or polycyclic, and which is optionally substituted by one or more identical or different substituents having one of the meanings of $R^S$ as defined above and below, $R^{S1}$, $R^{S2}$, $R^{S3}$, $R^{S4}$ and $R^{S5}$ independently of each other denote H, CN or have one of the meanings of $R^S$ as defined above and below.

Preferred compounds of formula XII are selected from the following subformulae:

XIIa

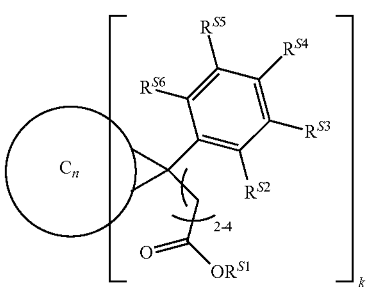

XIIb

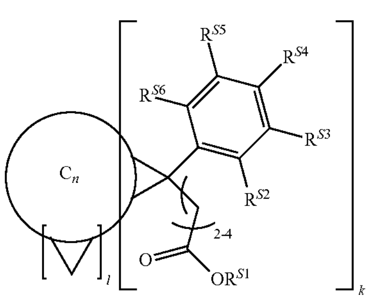

-continued

XIIc

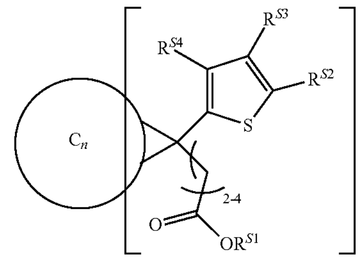

XIId

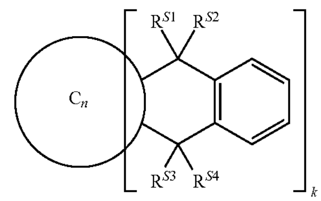

XIIe

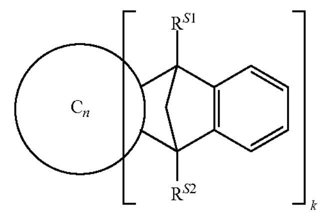

XIIf

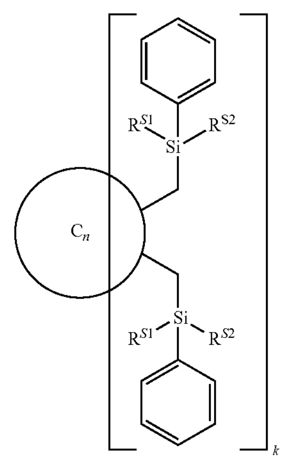

XIIg

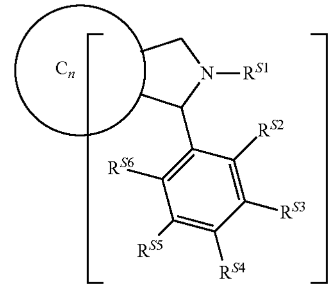

-continued

F-I8

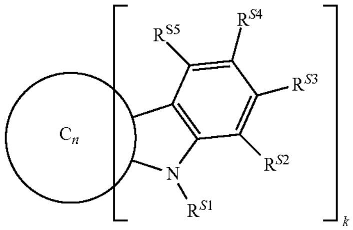

wherein $R^{S1}$, $R^{S2}$, $R^{S3}$, $R^{S4}$ $R^{S5}$ and $R^{S6}$ independently of each other denote H or have one of the meanings of $R^S$ as defined above and below.

Also preferably the polymer according to the present invention is blended with other type of n-type semiconductor such as graphene, a metal oxide, like for example, ZnOx, TiOx, ZTO, MoOx, NiOx, quantum dots, like for example, CdSe or CdS, or a conjugated polymer, like for example a polynaphthalenediimide or polyperylenediimide as described, for example, in WO2013142841 A1 to form the active layer in an OPV or OPD device.

The device preferably further comprises a first transparent or semi-transparent electrode on a transparent or semi-transparent substrate on one side of the active layer, and a second metallic or semi-transparent electrode on the other side of the active layer.

Preferably, the active layer according to the present invention is further blended with additional organic and inorganic compounds to enhance the device properties. For example, metal particles such as Au or Ag nanoparticules or Au or Ag nanoprism for enhancements in light harvesting due to near-field effects (i.e. plasmonic effect) as described, for example in *Adv. Mater.* 2013, 25 (17), 2385-2396 and Adv. Ener. Mater. 10.1002/aenm.201400206, a molecular dopant such as 2,3,5,6-tetrafluoro-7,7,8,8-tetracyanoquinodimethane for enhancement in photoconductivity as described, for example in *Adv. Mater.* 2013, 25(48), 7038-7044, or a stabilising agent consisting of a UV absorption agent and/or anti-radical agent and/or antioxidant agent such as 2-hydroxybenzophenone, 2-hydroxyphenylbenzotriazole, oxalic acid anilides, hydroxyphenyl triazines, merocyanines, hindered phenol, N-aryl-thiomorpholine, N-aryl-thiomorpholine-1-oxide, N-aryl-thiomorpholine-1,1-dioxide, N-aryl-thiazolidine, N-aryl-thiazolidine-1-oxide, N-aryl-thiazolidine-1,1-dioxide and 1,4-diazabicyclo[2.2.2]octane as described, for example, in WO2012095796 A1 and in WO2013021971 A1.

The device preferably may further comprise a UV to visible photo-conversion layer such as described, for example, in *J. Mater. Chem.* 2011, 21, 12331 or a NIR to visible or IR to NIR photo-conversion layer such as described, for example, in *J. Appl. Phys.* 2013, 113, 124509.

Further preferably the OPV or OPD device comprises, between the active layer and the first or second electrode, one or more additional buffer layers acting as hole transporting layer and/or electron blocking layer, which comprise a material such as metal oxides, like for example, ZTO, $MoO_x$, $NiO_x$ a doped conjugated polymer, like for example PEDOT:PSS and polypyrrole-polystyrene sulfonate (PPy:PSS), a conjugated polymer, like for example polytriarylamine (PTAA), an organic compound, like for example substituted triaryl amine derivatives such as N,N'-diphenyl-N,N'-bis(1-naphthyl)(1,1'-biphenyl)-4,4'diamine (NPB), N,N'-diphenyl-N,N'-(3-methylphenyl)-1,1'-biphenyl-4,4'-diamine (TPD), graphene based materials, like for example, graphene oxide and graphene quantum dots or alternatively as hole blocking layer and/or electron transporting layer, which comprise a material such as metal oxide, like for example, $ZnO_x$, $TiO_x$, AZO (aluminium doped zinc oxide), a salt, like for example LiF, NaF, CsF, a conjugated polymer electrolyte, like for example poly[3-(6-trimethylammoniumhexyl)thiophene], poly(9,9-bis(2-ethylhexyl)-fluorene]-b-poly[3-(6-trimethylammoniumhexyl)thiophene], or poly[(9,9-bis(3"-(N,N-dimethylamino)propyl)-2,7-fluorene)-alt-2,7-(9,9 dioctylfluorene)], a polymer, like for example poly(ethyleneimine) or crosslinked N-containing compound derivatives or an organic compound, like for example tris(8-quinolinolato)-aluminium(III) ($Alq_3$), phenanthroline derivative or $C_{60}$ or $C_{70}$ based fullerenes, like for example, as described in *Adv. Energy Mater.* 2012, 2, 82-86.

In a blend or mixture of a polymer according to the present invention with a fullerene or modified fullerene, the ratio polymer:fullerene is preferably from 5:1 to 1:5 by weight, more preferably from 2:1 to 1:3 by weight, most preferably 1:1 to 1:2 by weight. A polymeric binder may also be included, from 5 to 95% by weight. Examples of binder include polystyrene (PS), polypropylene (PP) and polymethylmethacrylate (PMMA).

To produce thin layers in BHJ OPV devices the polymers, polymer blends or mixtures of the present invention may be deposited by any suitable method. Liquid coating of devices is more desirable than vacuum deposition techniques. Solution deposition methods are especially preferred. The formulations of the present invention enable the use of a number of liquid coating techniques. Preferred deposition techniques include, without limitation, dip coating, spin coating, ink jet printing, nozzle printing, letter-press printing, screen printing, gravure printing, doctor blade coating, roller printing, reverse-roller printing, offset lithography printing, dry offset lithography printing, flexographic printing, web printing, spray coating, curtain coating, brush coating, slot dye coating or pad printing. For the fabrication of OPV devices and modules area printing method compatible with flexible substrates are preferred, for example slot dye coating, spray coating and the like.

Suitable solutions or formulations containing a blend or mixture of a polymer according to the present invention with a fullerene or modified fullerene like PCBM are preferably prepared. In the preparation of such a formulation, suitable solvents are preferably selected to ensure full dissolution of both component, p-type and n-type and take into account the boundary conditions (for example rheological properties) introduced by the chosen printing method.

Organic solvent are generally used for this purpose. Typical solvents can be aromatic solvents, halogenated solvents or chlorinated solvents, including chlorinated aromatic solvents. Examples include, but are not limited to dichloromethane, trichloromethane, tetrachloromethane, chlorobenzene, o-dichlorobenzene, 1,2,4-trichlorobenzene, 1,2-dichloroethane, 1,1,1-trichloroethane, 1,1,2,2-tetrachloroethane, 1,8-diiodooctane, 1-chloronaphthalene, 1,8-octane-dithiol, anisole, 2,5-di-methylanisole, 2,4-dimethylanisole, toluene, o-xylene, m-xylene, p-xylene, mixture of xylene o-, m-, and p-isomers, 1,2,4-trimethylbenzene, mesitylene, cyclohexane, 1-methylnaphthalene, 2-methylnaphthalene, 1,2-dimethylnaphthalene, tetraline, decaline, indane, 1-methyl-4-(1-methylethenyl)-cyclohexene (d-Limonene), 6,6-dimethyl-2-methylenebicyclo[3.1.1]heptanes (β-pinene), methyl benzoate, ethyl benzoate, nitrobenzene, benzaldehyde, tetrahydrofuran, 1,4-dioxane, 1,3-dioxane, morpholine, acetone, methylethylketone, ethyl acetate, n-butyl acetate, N,N-dimethylformamide, dimethylacetamide, dimethylsulfoxide and/or mixtures thereof.

The OPV device can for example be of any type known from the literature (see e.g. Waldauf et al., *Appl. Phys. Lett.,* 2006, 89, 233517).

A first preferred OPV device according to the invention comprises the following layers (in the sequence from bottom to top):

optionally a substrate, a high work function electrode, preferably comprising a metal oxide, like for example ITO and FTO, serving as anode, an optional conducting polymer layer or hole transport layer, preferably comprising an organic polymer or polymer blend, for example PEDOT:PSS (poly(3,4-ethylenedioxythiophene): poly(styrene-sulfonate), substituted triaryl amine derivatives, for example, TBD (N,N'-dyphenyl-N—N'-bis(3-methylphenyl)-1,1'biphenyl-4,4'-diamine) or NBD (N,N'-dyphenyl-N—N'-bis(1-napthylphenyl)-1,1'biphenyl-4,4'-diamine), a layer, also referred to as "active layer", comprising of at least one p-type and at least one n-type organic semiconductor, which can exist for example as a p-type/n-type bilayer or as distinct p-type and n-type layers, or as blend or p-type and n-type semiconductor, forming a BHJ, optionally a layer having electron transport properties, for example comprising LiF, $TiO_x$, $ZnO_x$, PFN, a poly (ethyleneimine) or crosslinked nitrogen containing compound derivatives or a phenanthroline derivatives a low work function electrode, preferably comprising a metal like for example aluminum, serving as cathode, wherein at least one of the electrodes, preferably the anode, is transparent to visible and/or NIR light, and wherein at least one p-type semiconductor is a polymer according to the present invention.

A second preferred OPV device according to the invention is an inverted OPV device and comprises the following layers (in the sequence from bottom to top):

optionally a substrate, a high work function metal or metal oxide electrode, comprising for example ITO and FTO, serving as cathode, a layer having hole blocking properties, preferably comprising a metal oxide like $TiO_x$ or $ZnO_x$, or comprising an organic compound such as polymer like poly(ethyleneimine) or crosslinked nitrogen containing compound derivatives or phenanthroline derivatives, an active layer comprising at least one p-type and at least one n-type organic semiconductor, situated between the electrodes, which can exist for example as a p-type/n-type bilayer or as distinct p-type and n-type layers, or as blend or p-type and n-type semiconductor, forming a BHJ, an optional conducting polymer layer or hole transport layer, preferably comprising an organic polymer or polymer blend, for example of PEDOT:PSS or substituted triaryl amine derivatives, for example, TBD or NBD, an electrode comprising a high work function metal like for example silver, serving as anode, wherein at least one of the electrodes, preferably the cathode, is transparent to visible and/or NIR light, and wherein at least one p-type semiconductor is a polymer according to the present invention.

In the OPV devices of the present invention the p-type and n-type semiconductor materials are preferably selected from the materials, like the polymer/fullerene systems or polymer/polymer systems, as described above When the active layer is deposited on the substrate, it forms a BHJ that phase separates at nanoscale level. For discussion on nanoscale phase separation see Dennler et al, *Proceedings of the IEEE,* 2005, 93 (8), 1429 or Hoppe et al, *Adv. Func. Mater,* 2004, 14(10), 1005. An optional annealing step may be then necessary to optimize blend morpohology and consequently OPV device performance.

Another method to optimize device performance is to prepare formulations for the fabrication of OPV(BHJ) devices that may include high boiling point additives to promote phase separation in the right way. 1,8-Octanedithiol, 1,8-dilodooctane, nitrobenzene, 1-chloronaphthalene, N,N-dimethylformamide, dimethylacetamide, dimethylsulfoxide and other additives have been used to obtain high-efficiency solar cells. Examples are disclosed in J. Peet, et al, *Nat. Maier.,* 2007, 6, 497 or Fréchet et al. *J. Am. Chem. Soc.,* 2010, 132, 7595-7597.

The polymers, polymer blends, mixtures and layers of the present invention are also suitable for use in an OFET as the semiconducting channel. Accordingly, the invention also provides an OFET comprising a gate electrode, an insulating (or gate insulator) layer, a source electrode, a drain electrode and an organic semiconducting channel connecting the source and drain electrodes, wherein the organic semiconducting channel comprises a polymer, polymer blend, mixture or organic semiconducting layer according to the present invention. Other features of the OFET are well known to those skilled in the art.

OFETs where an OSC material is arranged as a thin film between a gate dielectric and a drain and a source electrode, are generally known, and are described for example in U.S. Pat. No. 5,892,244, U.S. Pat. No. 5,998,804, U.S. Pat. No. 6,723,394 and in the references cited in the background section. Due to the advantages, like low cost production using the solubility properties of the compounds according to the invention and thus the processibility of large surfaces, preferred applications of these FETs are such as integrated circuitry, TFT displays and security applications.

The gate, source and drain electrodes and the insulating and semiconducting layer in the OFET device may be arranged in any sequence, provided that the source and drain electrode are separated from the gate electrode by the insulating layer, the gate electrode and the semiconductor layer both contact the insulating layer, and the source electrode and the drain electrode both contact the semiconducting layer.

An OFET device according to the present invention preferably comprises:

a source electrode, a drain electrode, a gate electrode, a semiconducting layer, one or more gate insulator layers, optionally a substrate.

wherein the semiconductor layer preferably comprises a polymer, polymer blend or mixture according to the present invention.

The OFET device can be a top gate device or a bottom gate device. Suitable structures and manufacturing methods of an OFET device are known to the skilled in the art and are described in the literature, for example in US 2007/0102696 A1.

The gate insulator layer preferably comprises a fluoropolymer, like e.g. the commercially available Cytop 809M® or Cytop 107M® (from Asahi Glass). Preferably the gate insulator layer is deposited, e.g. by spin-coating, doctor blading, wire bar coating, spray or dip coating or other known methods, from a formulation comprising an insulator material and one or more solvents with one or more fluoro atoms (fluorosolvents), preferably a perfluorosolvent. A suitable perfluorosolvent is e.g. FC75® (available from Acros, catalogue number 12380). Other suitable fluoropolymers and fluorosolvents are known in prior art, like for example the perfluoropolymers Teflon ARD 1600 or 2400 (from DuPont) or Fluoropel® (from Cytonix) or the perfluorosolvent FC 43® (Acros, No. 12377). Especially preferred are organic dielectric materials having a low permittivity (or dielectric contant) from 1.0 to 5.0, very preferably from 1.8 to 4.0 ("low k materials"), as disclosed for example in US 2007/0102696 A1 or U.S. Pat. No. 7,095,044.

In security applications, OFETs and other devices with semiconducting materials according to the present invention, like transistors or diodes, can be used for RFID tags or security markings to authenticate and prevent counterfeiting of documents of value like banknotes, credit cards or ID cards, national ID documents, licenses or any product with monetry value, like stamps, tickets, shares, cheques etc.

Alternatively, the polymers, polymer blends and mixtures according to the invention can be used in OLEDs, e.g. as the active display material in a flat panel display applications, or as backlight of a flat panel display like e.g. a liquid crystal display. Common OLEDs are realized using multilayer structures. An emission layer is generally sandwiched between one or more electron-transport and/or hole-transport layers. By applying an electric voltage electrons and holes as charge carriers move towards the emissive layer where their recombination leads to the excitation and hence luminescence of the lumophor units contained in the emission layer.

The polymers, polymer blends and mixtures according to the invention can be employed in one or more of a buffer layer, electron or hole transport layer, electron or hole blocking layer and emissive layer, corresponding to their electrical and/or optical properties. Furthermore their use within the emissive layer is especially advantageous, if the compounds, materials and films according to the invention show electroluminescent properties themselves or comprise electroluminescent groups or compounds. The selection, characterization as well as the processing of suitable monomeric, oligomeric and polymeric compounds or materials for the use in OLEDs is generally known by a person skilled in the art, see, e.g., Müller et al, *Synth. Metals,* 2000, 111-112, 31-34, Alcala, *J. Appl. Phys.,* 2000, 88, 7124-7128 and the literature cited therein.

According to another use, the polymers, polymer blends and mixtures according to this invention, especially those showing photoluminescent properties, may be employed as materials of light sources, e.g. in display devices, as described in EP 0 889 350 A1 or by C. Weder et al., *Science,* 1998, 279, 835-837.

A further aspect of the invention relates to both the oxidised and reduced form of a polymer according to this invention. Either loss or gain of electrons results in formation of a highly delocalised ionic form, which is of high conductivity. This can occur on exposure to common dopants. Suitable dopants and methods of doping are known to those skilled in the art, e.g. from EP 0 528 662, U.S. Pat. No. 5,198,153 or WO 96/21659.

The doping process typically implies treatment of the semiconductor material with an oxidating or reducing agent in a redox reaction to form delocalised ionic centres in the material, with the corresponding counterions derived from the applied dopants. Suitable doping methods comprise for example exposure to a doping vapor in the atmospheric pressure or at a reduced pressure, electrochemical doping in a solution containing a dopant, bringing a dopant into contact with the semiconductor material to be thermally diffused, and ion-implantantion of the dopant into the semiconductor material.

When electrons are used as carriers, suitable dopants are for example halogens (e.g., $I_2$, $Cl_2$, $Br_2$, ICl, $ICl_3$, IBr and IF), Lewis acids (e.g., $PF_5$, $AsF_5$, $SbF_5$, $BF_3$, $BCl_3$, $SbCl_5$, $BBr_3$ and $SO_3$), protonic acids, organic acids, or amino acids (e.g., HF, HCl, $HNO_3$, $H_2SO_4$, $HClO_4$, $FSO_3H$ and $ClSO_3H$), transition metal compounds (e.g., $FeCl_3$, FeOCl, $Fe(ClO_4)_3$, $Fe(4\text{-}CH_3C_6H_4SO_3)_3$, $TiCl_4$, $ZrCl_4$, $HfCl_4$, $NbF_5$, $NbCl_5$, $TaCl_5$, $MoF_5$, $MoCl_5$, $WF_5$, $WCl_6$, $UF_6$ and $LnCl_3$ (wherein Ln is a lanthanoid), anions (e.g., $Cl^-$, $Br^-$, $I^-$, $I_3^-$, $HSO_4^-$, $SO_4^{2-}$, $NO_3^-$, $ClO_4^-$, $BF_4^-$, $PF_6^-$, $AsF_6^-$, $SbF_6^-$, $FeCl_4^-$, $Fe(CN)_6^{3-}$, and anions of various sulfonic acids, such as aryl-$SO_3^-$). When holes are used as carriers, examples of dopants are cations (e.g., $H^+$, $Li^+$, $Na^+$, $K^+$, $Rb^+$ and $Cs^+$), alkali metals (e.g., Li, Na, K, Rb, and Cs), alkaline-earth metals (e.g., Ca, Sr, and Ba), $O_2$, $XeOF_4$, $(NO_2^+)$ $(SbF_6^-)$, $(NO_2^+)$ $(SbCl_6^-)$, $(NO_2^+)$ $(BF_4^-)$, $AgClO_4$, $H_2IrCl_6$, $La(NO_3)_3.6H_2O$, $FSO_2OOSO_2F$, Eu, acetylcholine, $R_4N^+$, (R is an alkyl group), $R_4P^+$ (R is an alkyl group), $R_6As^+$ (R is an alkyl group), and $R_3S^+$ (R is an alkyl group).

The conducting form of a polymer of the present invention can be used as an organic "metal" in applications including, but not limited to, charge injection layers and ITO planarising layers in OLED applications, films for flat panel displays and touch screens, antistatic films, printed conductive substrates, patterns or tracts in electronic applications such as printed circuit boards and condensers.

The polymers, polymer blends and mixtures according to the present invention may also be suitable for use in organic plasmon-emitting diodes (OPEDs), as described for example in Koller et al., *Nat. Photonics,* 2008, 2, 684.

According to another use, the polymers according to the present invention can be used alone or together with other materials in or as alignment layers in LCD or OLED devices, as described for example in US 2003/0021913. The use of charge transport polymers according to the present invention can increase the electrical conductivity of the alignment layer. When used in an LCD, this increased electrical conductivity can reduce adverse residual dc effects in the switchable LCD cell and suppress image sticking or, for example in ferroelectric LCDs, reduce the residual charge produced by the switching of the spontaneous polarisation charge of the ferroelectric LCs. When used in an OLED device comprising a light emitting material provided onto the alignment layer, this increased electrical conductivity can enhance the electroluminescence of the light emitting material. The polymers according to the present invention having mesogenic or liquid crystalline properties can form oriented anisotropic films as described above, which are especially useful as alignment layers to induce or enhance alignment in a liquid crystal medium provided onto said anisotropic film. The polymers according to the present invention may also be combined with photoisomerisable compounds and/or chromophores for use in or as photoalignment layers, as described in US 2003/0021913 A1.

According to another use the polymers, polymer blends and mixtures according to the present invention, especially their water-soluble derivatives (for example with polar or ionic side groups) or ionically doped forms, can be employed as chemical sensors or materials for detecting and discriminating DNA sequences. Such uses are described for example in L. Chen, D. W. McBranch, H. Wang, R. Helgeson, F. Wudl and D. G. Whitten, *Proc. Natl. Acad. Sci. U.S.A.,* 1999, 96, 12287; D. Wang, X. Gong, P. S. Heeger, F. Rininsland, G. C. Bazan and A. J. Heeger, *Proc. Natl. Acad. ScL U.S.A.,* 2002, 99, 49; N. DiCesare, M. R. Pinot, K. S. Schanze and J. R. Lakowicz, *Langmuir,* 2002, 18, 7785; D. T. McQuade, A. E. Pullen, T. M. Swager, *Chem. Rev.,* 2000, 100, 2537.

Unless the context clearly indicates otherwise, as used herein plural forms of the terms herein are to be construed as including the singular form and vice versa.

Throughout the description and claims of this specification, the words "comprise" and "contain" and variations of the words, for example "comprising" and "comprises", mean "including but not limited to", and are not intended to (and do not) exclude other components.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

Above and below, unless stated otherwise percentages are percent by weight and temperatures are given in degrees Celsius. The values of the dielectric constant ∈ ("permittivity") refer to values taken at 20° C. and 1,000 Hz.

The invention will now be described in more detail by reference to the following examples, which are illustrative only and do not limit the scope of the invention.

EXAMPLES 5,7-Bis(5-bromo-4-alkyl-2-thienyl)thieno[3,4-b]thiadiazole is prepared as described, for example, in Macromolecules 2013, 46, 3391. Unless specified otherwise, the 5,7-bis(5-bromo-2-thienyl)thieno[3,4-b]thiadiazole precursors are prepared as described, for example, in *J. Polymer Sci. A: Polymer Chem.* 2010, 48, 2743. Unless specified otherwise, the bis-(5-bromo-thiophen-2-yl)-6-(alkyl)-[1,2,5]thiadiazolo[3,4-e]isoindole-5,7-dione monomers are prepared from aminoalkyl precursors as described, for example, in WO 2012/149189 A2. Unless specified otherwise, the 4,8-dibromo-6-(alkyl)-[1,2,5]thiadiazolo[3,4-e]isoindole-5,7-dione monomers are prepared from alkyl bromide precursors as described, for example, in *Chem. Comm.* 2013, 49, 2409-2411.

Example 1—Polymer 1

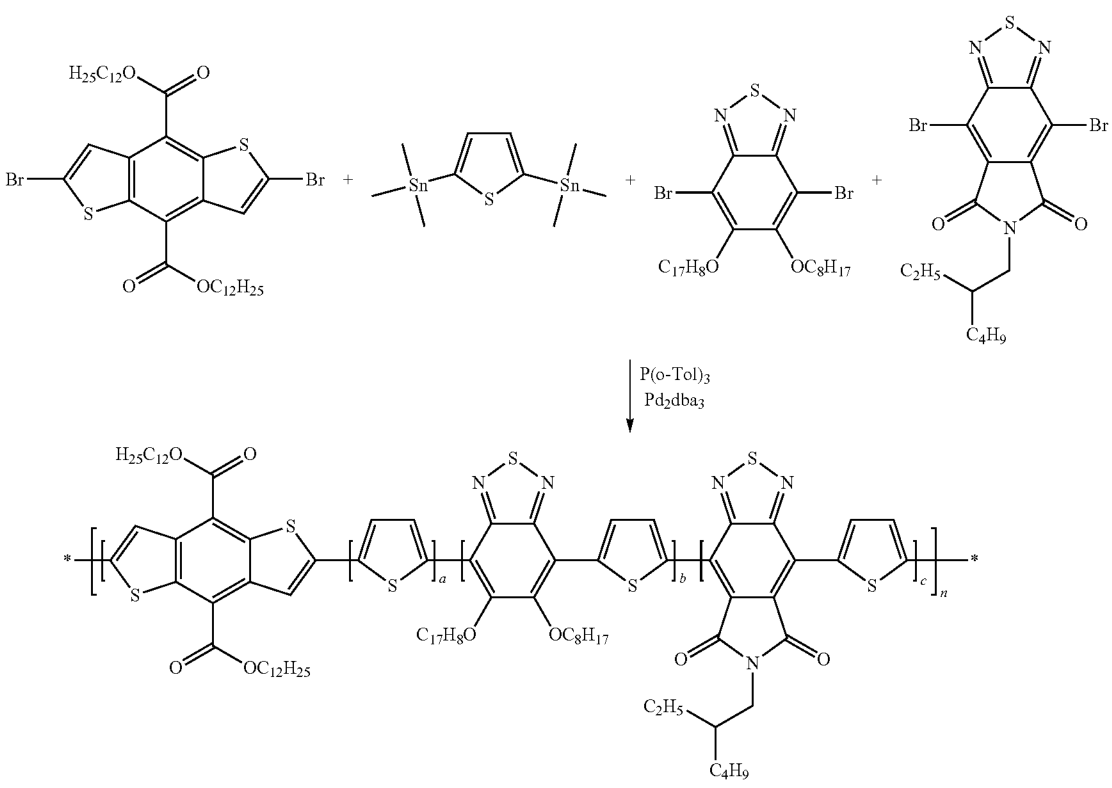

To a 20 $cm^3$ microwave vial is added 2,6-dibromo-benzo[1,2-b;4,5-b']dithiophene-4,8-dicarboxylic acid didodecyl ester (309.1 mg; 0.4000 mmol; 1.000 eq.), 2,5-bis-trimethylstannanyl-thiophene (327.8 mg; 0.8000 mmol; 2.000 eq.), 4,7-dibromo-5,6-bis-octyloxy-benzo[1,2,5]thiadiazole (165.1 mg; 0.3000 mmol; 0.7500 eq.), 4,8-dibromo-6-(2-ethyl-hexyl)-[1,2,5]thiadiazolo[3,4-e]isoindole-5,7-dione (47.5 mg; 0.100 mmol; 0.250 eq.), tris(dibenzylideneacetone)dipalladium(0) (14.7 mg; 0.0160 mmol; 0.0400 eq.) and tri-o-tolyl-phosphine (19.5 mg; 0.0640 mmol; 0.160 eq.). The vessel is evacuated and nitrogen purged three times and degassed chlorobenzene (5.00 $cm^3$) is added before the reaction mixture is degassed further for 5 minutes. The reaction mixture is heated in microwave reactor (Initator, Biotage) sequentially at 140° C. (60 seconds), 160° C. (60 seconds) and 170° C. (1800 seconds). Immediately after completion of the polymerisation reaction, the reaction mixture is allowed to cool to 65° C. and bromobenzene (0.084 $cm^3$; 0.80 mmol; 2.0 eq.) is added, and the reaction mixture heated back to 170° C. (600 seconds). Immediately after completion of the first end-capping reaction, the reaction mixture is allowed to cool to 65° C. and tributyl-phenyl-stannane (0.40 $cm^3$; 1.2 mmol; 3.0 eq.) is added and the reaction mixture heated back to 170° C. (600 seconds). Immediately after completion of the second end-capping reaction, the reaction mixture is allowed to cool to 65° C. and precipitated into stirred methanol (100 $cm^3$). The polymer is collected by filtration and washed with methanol (2×100 $cm^3$) to give a solid. The polymer is subjected to sequential Soxhlet extraction with acetone, petroleum ether (40-60° C.), cyclohexane and chloroform. Methanol (200 $cm^3$) is added to the chloroform fraction (150 $cm^3$) and the resulting precipitate is collected by filtration and dried in vacuo to give a black solid (375 mg). GPC (50° C., chlorobenzene): $M_n$=17.6 kg·mol$^{-1}$; $M_w$=47.5 kg·mol$^{-1}$; PDI=2.69.

Example 2—Polymer 2

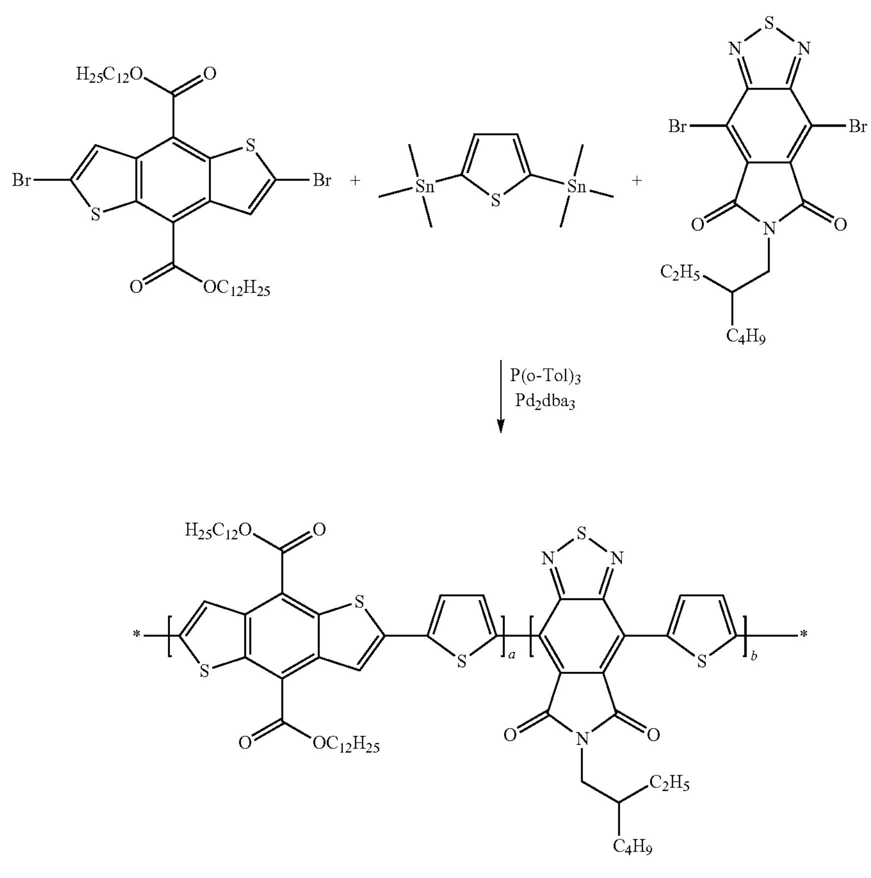

To a 5 $cm^3$ microwave vial is added 2,6-dibromo-benzo[1,2-b;4,5-b]dithiophene-4,8-dicarboxylic acid didodecyl ester (193.2 mg; 0.2500 mmol; 1.000 eq.), 2,5-bis-trimethylstannanyl-thiophene (204.9 mg; 0.5000 mmol; 2.000 eq.), 4,8-dibromo-6-(2-ethyl-hexyl)-[1,2,5]thiadiazolo[3,4-e]isoindole-5,7-dione (118.8 mg; 0.2500 mmol; 1.000 eq.), tris(dibenzylideneacetone)dipalladium(0) (9.2 mg; 0.0100 mmol; 0.040 eq.) and tri-o-tolyl-phosphine (12.2 mg; 0.0400 mmol; 0.160 eq.). The vessel is evacuated and nitrogen purged three times and degassed chlorobenzene (2.1 $cm^3$) is added before the reaction mixture is degassed further for 5 minutes. The reaction mixture is heated in microwave reactor (Initator, Biotage) sequentially at 140° C. (60 seconds), 160° C. (60 seconds) and 175° C. (1800 seconds). Immediately after completion of the reaction, the reaction mixture is allowed to cool to 65° C. and precipitated into stirred methanol (100 $cm^3$). The polymer is collected by filtration and washed with methanol (2×100 $cm^3$) to give a solid. The polymer is subjected to sequential Soxhlet extraction with acetone, petroleum ether (40-60° C.), cyclohexane and chloroform. Methanol (200 $cm^3$) is added to the chloroform fraction (150 $cm^3$) and the resulting precipitate is collected by filtration and dried in vacuo to give a black solid (178 mg, Yield: 65%). GPC (50° C., chlorobenzene): $M_n$=24.3 kg·mol$^{-1}$; $M_w$=107.5 kg·mol$^{-1}$; PDI=4.43.

Example 3—Polymer 3

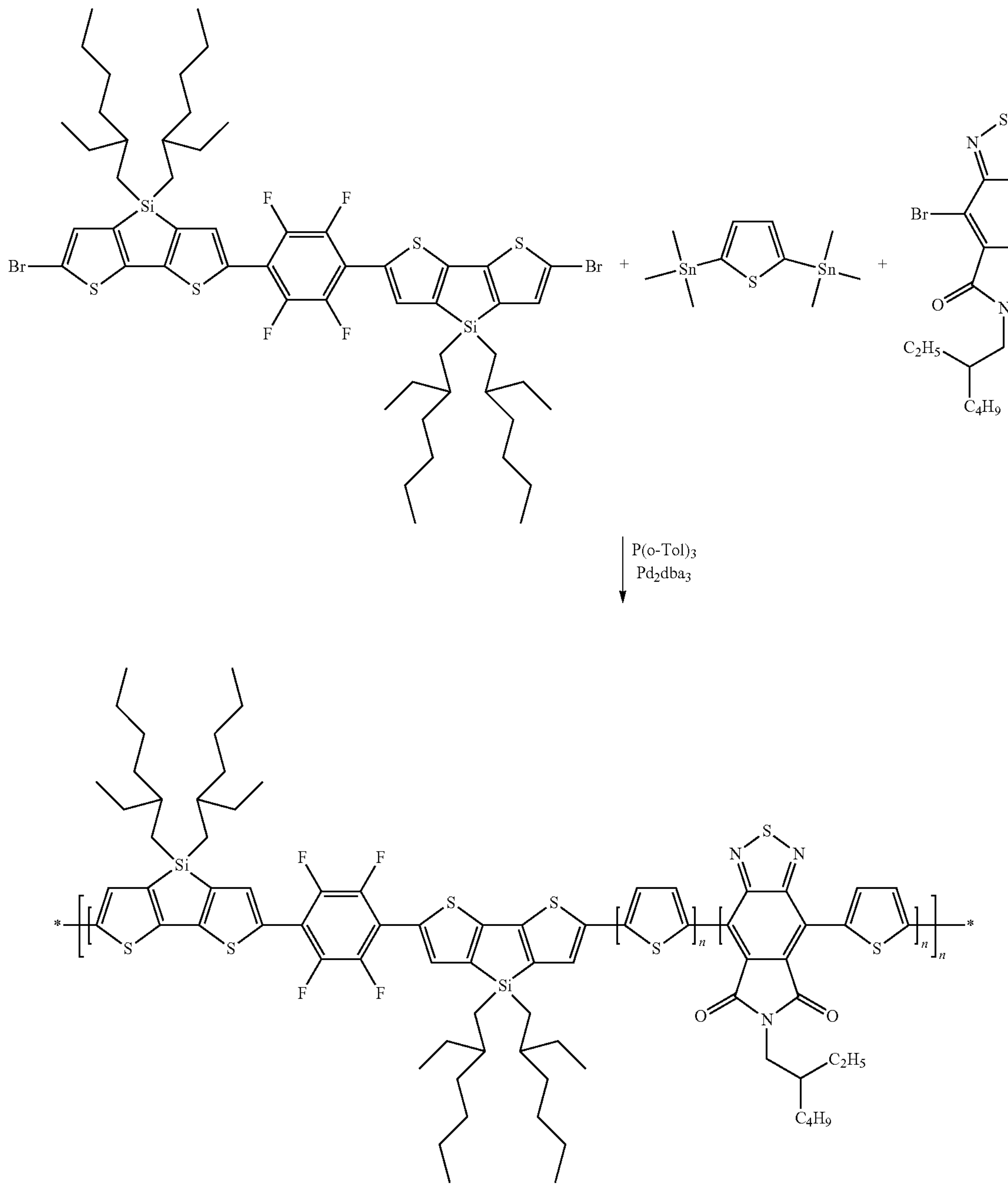

To a 5 $cm^3$ microwave vial is added 1,4-bis-(5-bromo-7,7-bis-(2-ethyl-hexyl)-7H-3,4-dithia-7-sila-cyclopenta[a]pentalen-2-yl)-2,3,5,6-tetrafluorobenzene (285.3 mg; 0.2500 mmol; 1.000 eq.), 2,5-bis-trimethylstannanyl-thiophene (204.9 mg; 0.5000 mmol; 2.000 eq.), 4,8-dibromo-6-(2-ethyl-hexyl)-[1,2,5]thiadiazolo[3,4-e]isoindole-5,7-dione (118.8 mg; 0.2500 mmol; 1.000 eq.), tris(dibenzylideneacetone)dipalladium(0) (9.2 mg; 0.0100 mmol; 0.040 eq.) and tri-o-tolyl-phosphine (12.2 mg; 0.0400 mmol; 0.160 eq.). The vessel is evacuated and nitrogen purged three times and degassed chlorobenzene (2.1 $cm^3$) is added before the reaction mixture is degassed further for 5 minutes. The reaction mixture is heated in microwave reactor (Initator, Biotage) sequentially at 140° C. (60 seconds), 160° C. (60 seconds) and 175° C. (1800 seconds). Immediately after completion of the reaction, the reaction mixture is allowed to cool to 65° C. and precipitated into stirred methanol (100 $cm^3$). The polymer is collected by filtration and washed with methanol (2×100 $cm^3$) to give a solid. The polymer is subjected to sequential Soxhlet extraction with acetone, petroleum ether (40-60° C.), cyclohexane and chloroform. Methanol (200 $cm^3$) is added to the chloroform fraction (150 $cm^3$) and the resulting precipitate is collected by filtration and dried in vacuo to give a black solid (322 mg, Yield: 88%). GPC (50° C., chlorobenzene): $M_n$=34.5 kg·mol$^{-1}$; $M_w$=110.5 kg·mol$^{-1}$; PDI=3.20.

Example 4—Polymer 4

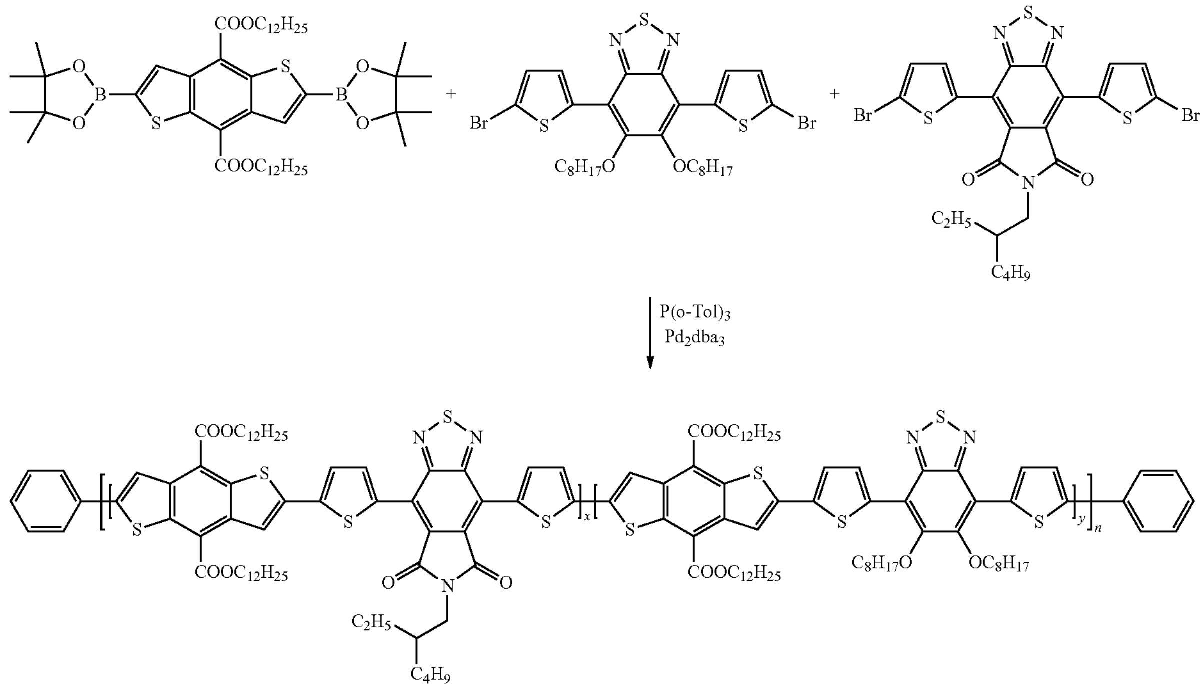

To a dry flask is added 2,6-bis-(4,4,5,5-tetramethyl-[1,3,2]dioxaborolan-2-yl)-benzo[1,2-b;4,5-b']dithiophene-4,8-dicarboxylic acid didodecyl ester (433.4 mg; 500.0 µmol; 1.000 eq.), 4,7-bis-(5-bromo-thiophen-2-yl)-5,6-bis-octyloxy-benzo[1,2,5]thiadiazole (178.7 mg; 250.0 µmol; 0.5000 eq.), 4,8-bis-(5-bromo-thiophen-2-yl)-6-(2-ethylhexyl)-[1,2,5]thiadiazolo[3,4-e]isoindole-5,7-dione (159.9 mg; 250.0 µmol; 0.5000 eq.), tri-o-tolyl phosphine (12.2 mg; 40.00 µmol; 0.0800 eq.), tris(dibenzylideneacetone)dipalladium(0) (9.2 mg; 10.00 µmol; 0.020 eq.) and Aliquat 336 (50.0 mg). The vessel is evacuated and nitrogen purged three times and degassed toluene (10 $cm^3$) and Sodium carbonate (2 M in water) (1.50 $cm^3$; 3.00 mmol; 6.00 eq.) are added before the reaction mixture is degassed further for 5 minutes. The reaction mixture is heated up to 100° C. and stirred at this temperature for 12 minutes. Immediately after completion of the polymerisation reaction, the reaction mixture is allowed to cool to 65° C. and bromo-benzene (0.11 $cm^3$; 1.0 mmol; 2.0 eq.) is added, and the reaction mixture heated back for 30 minutes. Immediately after completion of the first end-capping reaction, the reaction mixture is allowed to cool to 65° C. and phenyl boronic acid (180.0 mg; 1.500 mmol; 3.000 eq.) is added and the reaction mixture heated back a for 90 minutes. After second end-capping reaction, the reaction mixture is allowed to cool to 65° C. and precipitated into stirred methanol and water solution (10:1, 400 $cm^3$). The polymer is collected by filtration and washed with methanol (2×50 $cm^3$) to give a solid. The polymer is subjected to sequential Soxhlet extraction with acetone, petroleum ether (40-60° C.), cyclohexane and chloroform. The chloroform fraction is concentrated in vacuo to 20 $cm^3$, precipitated into stirred methanol (250 $cm^3$) and collected by filtration to give a black solid (500 mg, Yield: 45%). GPC (50° C., chlorobenzene) $M_n$=16.6 kg·mol$^{-1}$, $M_w$=37.4 kg·mol$^{-1}$, PDI=2.25

Example 5—Polymer 5

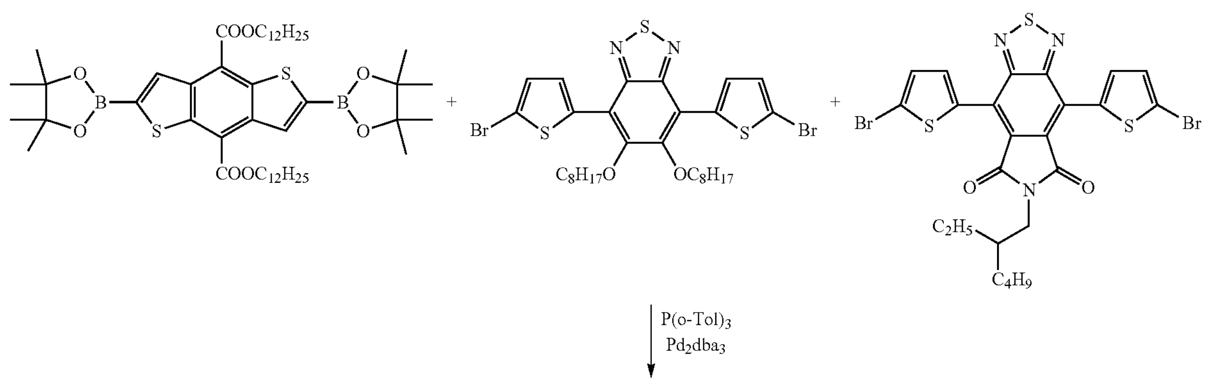

-continued

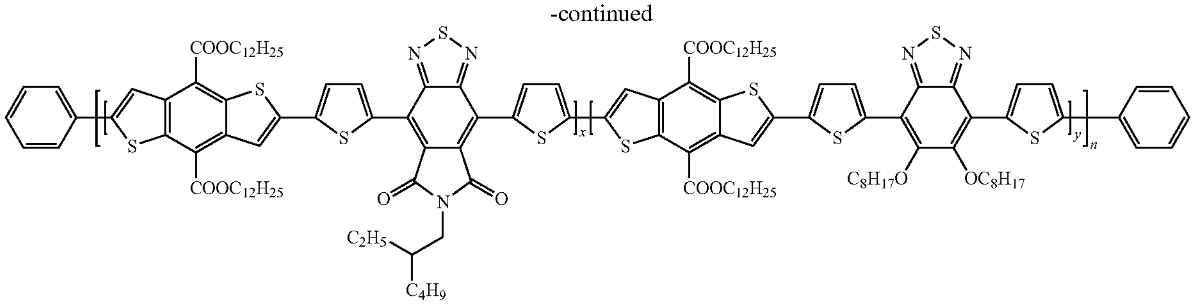

To a dry flask is added 2,6-bis-(4,4,5,5-tetramethyl-[1,3,2]dioxaborolan-2-yl)-benzo[1,2-b;4,5-b']dithiophene-4,8-dicarboxylic acid didodecyl ester (433.4 mg; 0.500 mmol; 1.000 eq.), 4,7-bis-(5-bromo-thiophen-2-yl)-5,6-bis-octyloxy-benzo[1,2,5]thiadiazole (268.0 mg; 0.3750 mmol; 0.7500 eq.), 4,8-bis-(5-bromo-thiophen-2-yl)-6-(2-ethyl-hexyl)-[1,2,5]thiadiazolo[3,4-e]isoindole-5,7-dione (79.9 mg; 0.125 mmol; 0.250 eq.), tri-o-tolyl phosphine (12.2 mg; 0.0400 mmol; 0.0800 eq.), tris(dibenzylideneacetone)dipalladium(0) (9.2 mg; 0.010 mmol; 0.020 eq.) and Aliquat 336 (50.0 mg). The vessel is evacuated and nitrogen purged three times and degassed toluene (10 $cm^3$) and sodium carbonate (2 M in water) (1.50 $cm^3$; 3.00 mmol; 6.00 eq.) are added before the reaction mixture is degassed further for 5 minutes. The reaction mixture is heated up to 100° C. and stirred at this temperature for 11 minutes. Immediately after completion of the polymerisation reaction, the reaction mixture is allowed to cool to 65° C. and bromo-benzene (0.11 $cm^3$; 1.0 mmol; 2.0 eq.) is added, and the reaction mixture heated back for 30 minutes. Immediately after completion of the first end-capping reaction, the reaction mixture is allowed to cool to 65° C. and phenyl boronic acid (180.0 mg; 1.500 mmol; 3.000 eq.) is added and the reaction mixture heated back a for 90 minutes. After second end-capping reaction, the reaction mixture is allowed to cool to 65° C. and precipitated into stirred methanol and water solution (10:1, 400 $cm^3$). The polymer is collected by filtration and washed with methanol (2×50 $cm^3$) to give a solid. The polymer is subjected to sequential Soxhlet extraction with acetone, petroleum ether (40-60° C.), cyclohexane and chloroform. The chloroform fraction is concentrated in vacuo to 20 $cm^3$, precipitated into stirred methanol (250 $cm^3$) and collected by filtration to give a black solid (547 mg, Yield: 49%). GPC (50° C., chlorobenzene) $M_n$=24.4 kg·mol$^{-1}$, $M_w$=75.5 kg·mol$^{-1}$, PDI=3.09

Example 6—Polymer 6

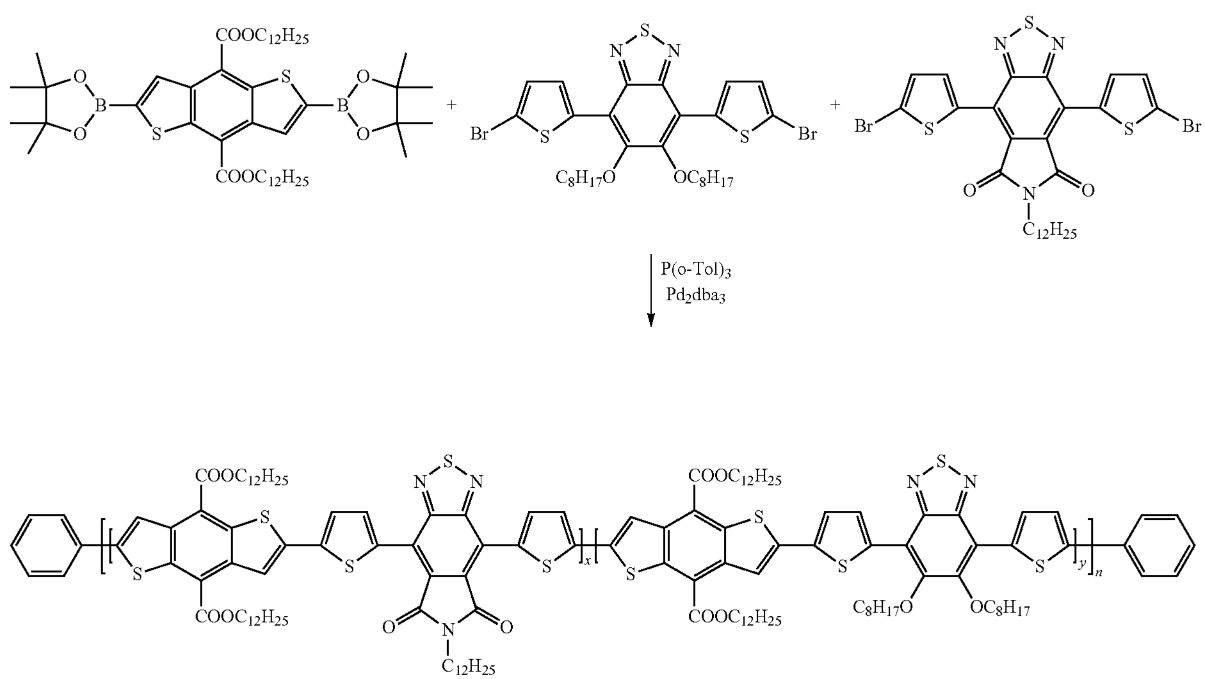

To a dry flask is added 2,6-bis-(4,4,5,5-tetramethyl-[1,3,2]dioxaborolan-2-yl)-benzo[1,2-b;4,5-b']dithiophene-4,8-dicarboxylic acid didodecyl ester (433.4 mg; 0.5000 mmol; 1.000 eq.), 4,7-bis-(5-bromo-thiophen-2-yl)-5,6-bis-octyloxy-benzo[1,2,5]thiadiazole (268.0 mg; 0.3750 mmol; 0.7500 eq.), 4,8-bis-(5-bromo-thiophen-2-yl)-6-dodecyl-[1,2,5]thiadiazolo[3,4-e]isoindole-5,7-dione (86.9 mg; 0.125 mmol; 0.250 eq.), tri-o-tolyl phosphine (12.2 mg; 0.0400 mmol; 0.0800 eq.), tris(dibenzylideneacetone)dipalladium (0) (9.2 mg; 0.010 mmol; 0.020 eq.) and Aliquat 336 (50.0 mg). The vessel is evacuated and nitrogen purged three times and degassed toluene (10 $cm^3$) and sodium carbonate (2 M in water) (1.50 $cm^3$; 3.00 mmol; 6.00 eq.) are added before the reaction mixture is degassed further for 5 minutes. The reaction mixture is heated up to 100° C. and stirred at this temperature for 12 minutes. Immediately after completion of the polymerisation reaction, the reaction mixture is allowed to cool to 65° C. and bromo-benzene (0.11 $cm^3$; 1.0 mmol; 2.0 eq.) is added, and the reaction mixture is heated back for 30 minutes. Immediately after completion of the first end-capping reaction, the reaction mixture is allowed to cool to 65° C. and phenyl boronic acid (180.0 mg; 1.500 mmol; 3.000 eq.) is added and the reaction mixture heated back a for 90 minutes. After second end-capping reaction, the reaction mixture is allowed to cool to 65° C. and precipitated into stirred methanol and water solution (10:1, 400 $cm^3$). The polymer is collected by filtration and washed with methanol (2×50 $cm^3$) to give a solid. The polymer is subjected to sequential Soxhlet extraction with acetone, petroleum ether (40-60° C.), cyclohexane and chloroform. The chloroform fraction is concentrated in vacuo to 20 $cm^3$, precipitated into stirred methanol (250 $cm^3$) and collected by filtration to give a black solid (192.0 mg, Yield: 17%). GPC (50° C., chlorobenzene) $M_n$=13.6 kg·mol$^{-1}$; $M_w$=39.6 kg·mol$^{-1}$; PDI=2.91.

Example 7—Polymer 7

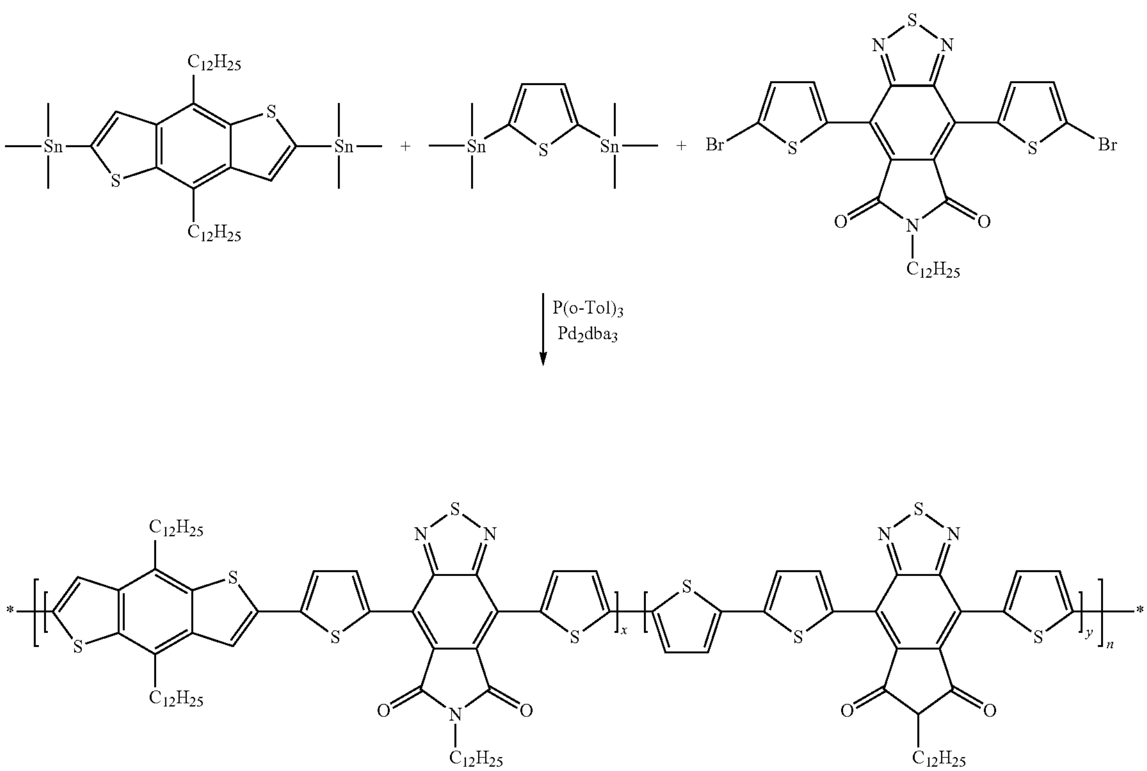

To a dry flask is added 4,8-didodecyl-2,6-bis-trimethyl-stannanyl-benzo[1,2-b;4,5-b']dithiophene (426.3 mg; 0.5000 mmol; 1.000 eq.), 4,8-bis-(5-bromo-thiophen-2-yl)-6-dodecyl-[1,2,5]thiadiazolo[3,4-e]isoindole-5,7-dione (695.5 mg; 1.000 mmol; 2.000 eq.), 2,5-bis-trimethylstannanyl-thiophene (204.9 mg; 0.5000 mmol; 1.000 eq.), tri-o-tolyl-phosphine (24.4 mg; 80.0 μmol; 0.160 eq.) and tris(dibenzylideneacetone)dipalladium(0) (18.3 mg; 20.0 μmol; 0.040 eq.). The vessel is evacuated and nitrogen purged three times and degassed chlorobenzene (6.25 $cm^3$) is added before the reaction mixture is degassed further for 5 minutes. The reaction mixture is heated up to 100° C. and stirred at this temperature for 2 minutes. After completion of the reaction, the reaction mixture is allowed to cool to 65° C. and precipitated into stirred methanol (250 $cm^3$). The polymer is collected by filtration and washed with methanol (2×50 $cm^3$) to give a solid, which is sparingly soluble in chlorobenzene.

Example 8—Polymer 8

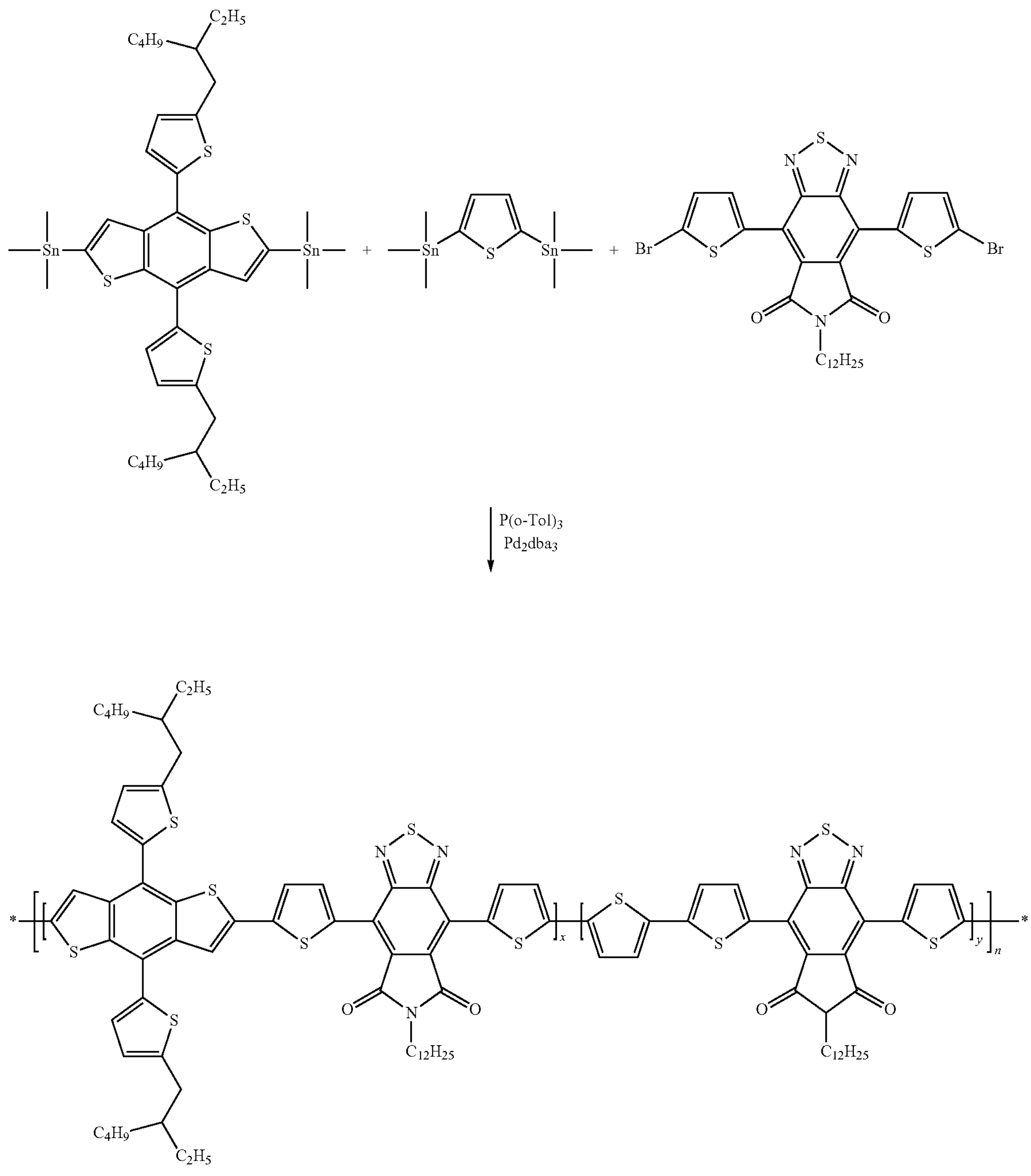

To a dry flask is added 4,8-bis-[5-(2-ethyl-hexyl)-thiophen-2-yl]-2,6-bis-trimethylstannanyl-benzo[1,2-b;4,5-b'] dithiophene (452.3 mg; 0.500 mmol; 1.000 eq.), 4,8-bis-(5-bromo-thiophen-2-yl)-6-dodecyl-[1,2,5]thiadiazolo[3,4-e] isoindole-5,7-dione (695.6 mg; 1.000 mmol; 2.000 eq.), 2,5-bis-trimethylstannanyl-thiophene (204.9 mg; 0.5000 mmol; 1.000 eq.), tri-o-tolyl-phosphine (24.4 mg; 80.00 µmol; 0.160 eq.) and tris(dibenzylideneacetone)dipalladium (0) (18.3 mg; 20.00 µmol; 0.0400 eq.). The vessel is evacuated and nitrogen purged three times and degassed chlorobenzene (6.25 $cm^3$) is added before the reaction mixture is degassed further for 5 minutes. The reaction mixture is heated up to 100° C. and stirred at this temperature for 3 minutes. After completion of the reaction, the reaction mixture is allowed to cool to 65° C. and precipitated into stirred methanol (250 $cm^3$). The polymer is collected by filtration and washed with methanol (2×50 $cm^3$) to give a solid, which is sparingly soluble in chlorobenzene.

Example 9—Polymer 9

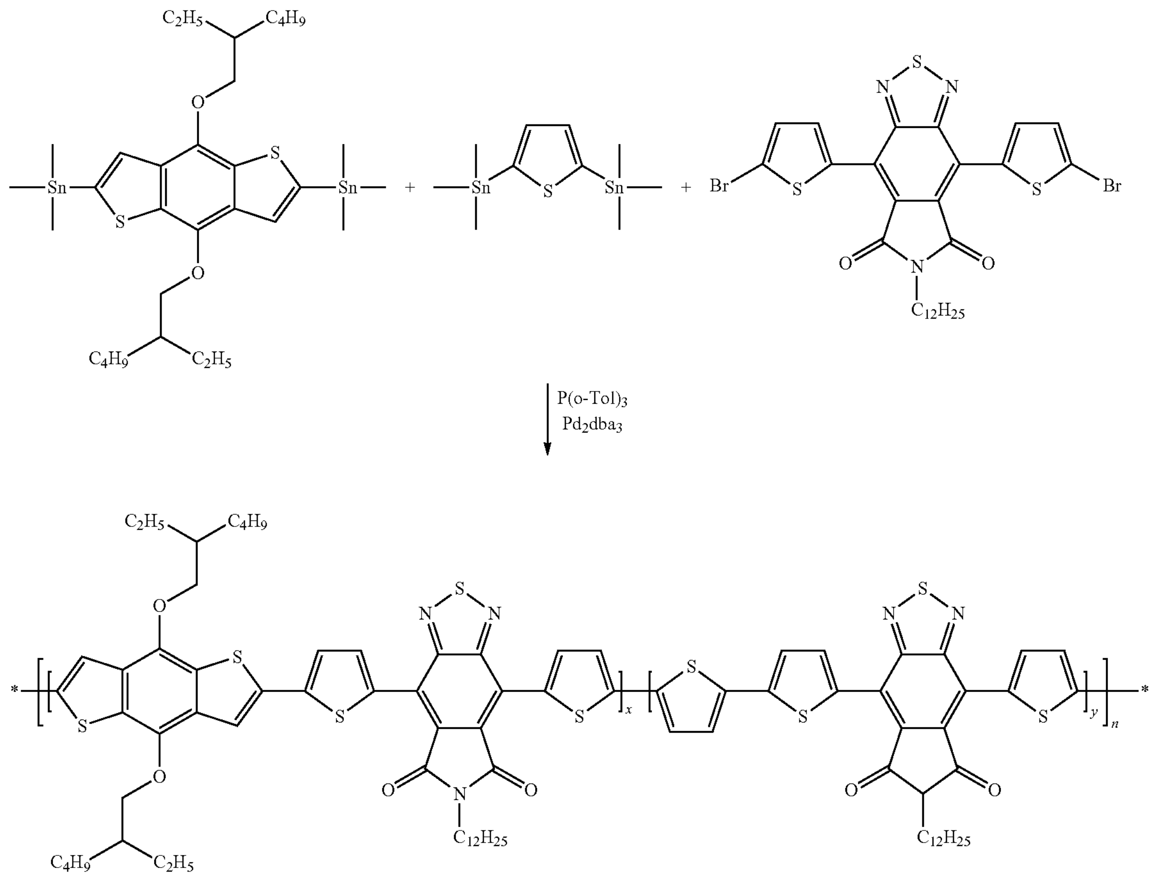

To a dry flask is added 4,8-bis-(2-ethyl-hexyloxy)-2,6-bis-trimethylstannanyl-benzo[1,2-b;4,5-b']dithiophene (386.2 mg; 0.5000 mmol; 1.000 eq.), 4,8-bis-(5-bromo-thiophen-2-yl)-6-dodecyl-[1,2,5]thiadiazolo[3,4-e]isoindole-5,7-dione (695.6 mg; 1.000 mmol; 2.000 eq.), 2,5-bis-trimethylstannanyl-thiophene (204.9 mg; 0.5000 mmol; 1.000 eq.), tri-o-tolyl-phosphine (24.4 mg; 80.0 μmol; 0.160 eq.) and tris(dibenzylideneacetone)dipalladium(0) (18.3 mg; 20.0 μmol; 0.040 eq.). The vessel is evacuated and nitrogen purged three times and degassed chlorobenzene (6.25 $cm^3$) is added before the reaction mixture is degassed further for 5 minutes. The reaction mixture is heated up to 100° C. and stirred at this temperature for 3 minutes. After completion of the reaction, the reaction mixture is allowed to cool to 65° C. and precipitated into stirred methanol (250 $cm^3$). The polymer is collected by filtration and washed with methanol (2×50 $cm^3$) to give a solid, which is sparingly soluble in chlorobenzene.

Example 10—Polymer 10

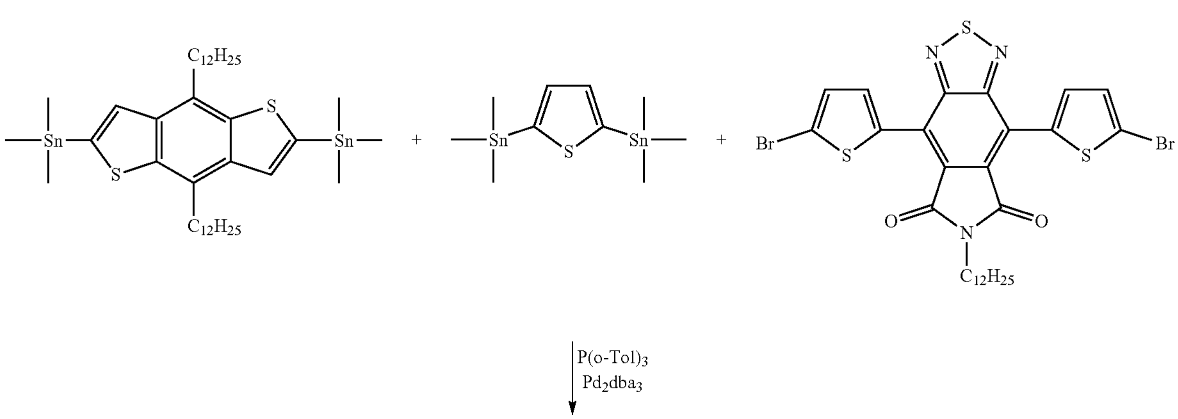

-continued

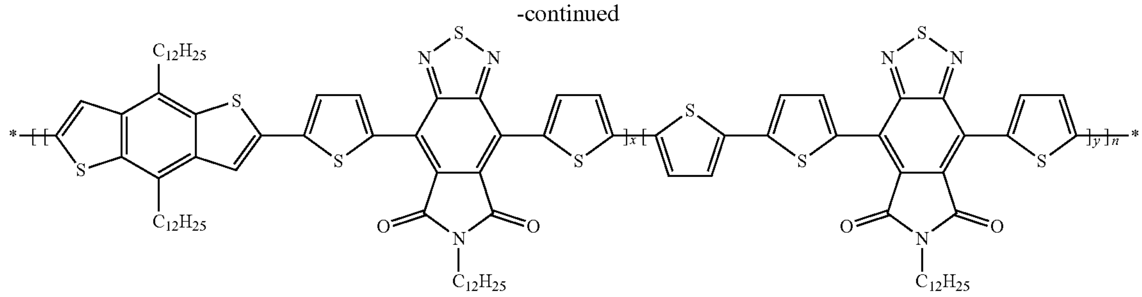

To a dry flask is added 4,8-didodecyl-2,6-bis-trimethyl-stannanyl-benzo[1,2-b;4,5-b']dithiophene (383.6 mg; 0.4500 mmol; 1.000 eq.), 4,8-bis-(5-bromo-thiophen-2-yl)-6-dodecyl-[1,2,5]thiadiazolo[3,4-e]isoindole-5,7-dione (347.4 mg; 0.5000 mmol; 1.110 eq.), 2,5-bis-trimethylstannanyl-thiophene (20.3 mg; 0.0500 mmol; 0.110 eq), tri-o-tolyl-phosphine (21.9 mg; 72.0 μmol; 0.160 eq.) and tris(dibenzylideneacetone)dipalladium(0) (16.5 mg; 18.0 μmol; 0.0400 eq.). The vessel is evacuated and nitrogen purged three times and degassed chlorobenzene (5.63 $cm^3$) is added before the reaction mixture is degassed further for 5 minutes. The reaction mixture is heated up to 100° C. and stirred at this temperature for 3 minutes. After completion of the reaction, the reaction mixture is allowed to cool to 65° C. and precipitated into stirred methanol (250 $cm^3$). The polymer is collected by filtration and washed with methanol (2×50 $cm^3$) to give a solid. The polymer is subjected to sequential Soxhlet extraction with acetone, petroleum ether (40-60° C.), cyclohexane, chloroform and chlorobenzene. The chlorobenzene fraction is concentrated in vacuo to 20 $cm^3$, precipitated into stirred methanol (250 $cm^3$) and collected by filtration to give a black solid (50.0 mg, Yield: 7%). GPC (50° C., chlorobenzene) $M_n$=27.9 kg $mol^{-1}$, $M_w$=68.4 kg $mol^{-1}$, PDI=2.45

Example 11—Polymer 11

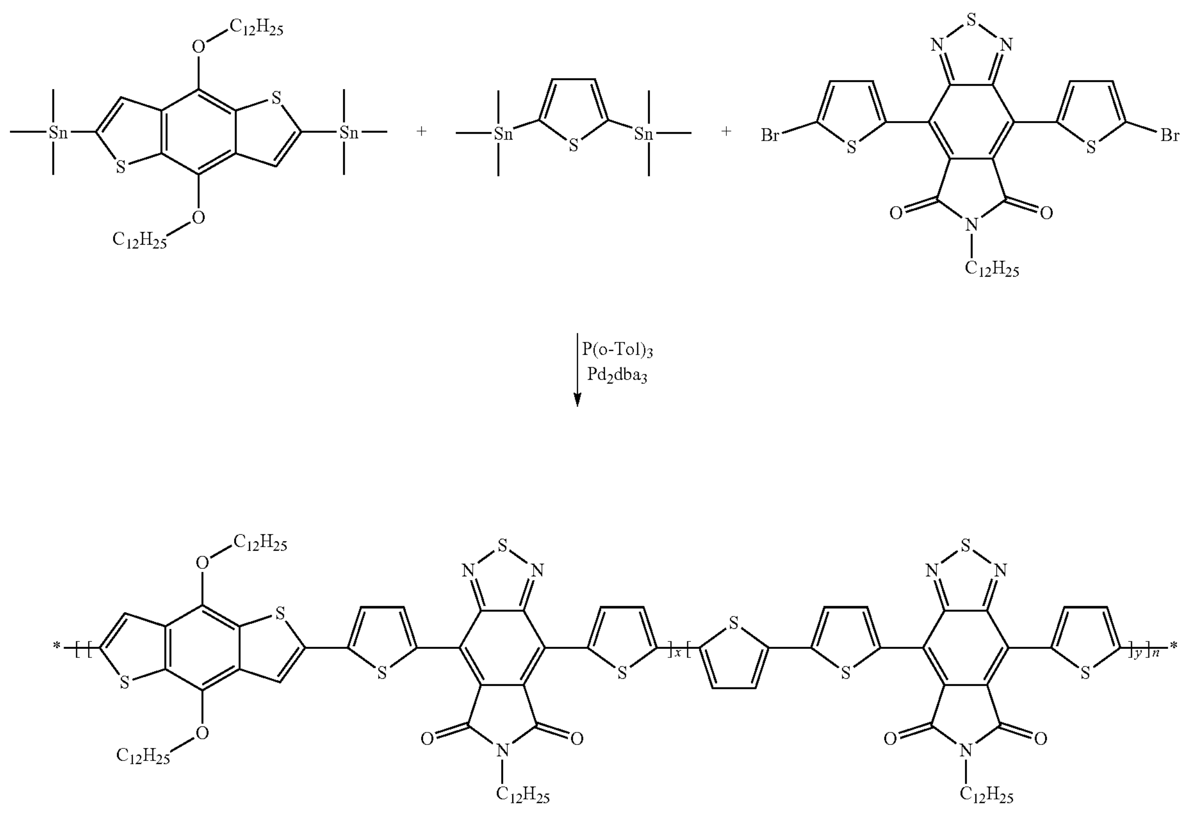

To a dry flask is added 4,8-bis-dodecyloxy-2,6-bis-trimethylstannanyl-benzo[1,2-b;4,5-b']dithiophene (398.0 mg; 0.4500 mmol; 1.000 eq.), 4,8-bis-(5-bromo-thiophen-2-yl)-6-dodecyl-[1,2,5]thiadiazolo[3,4-e]isoindole-5,7-dione (347.4 mg; 0.500 mmol; 1.110 eq.), 2,5-bis-trimethylstannanyl-thiophene (20.3 mg; 0.0500 mmol; 0.110 eq), tri-o-tolyl-phosphine (21.9 mg; 72.0 μmol; 0.160 eq.) and tris(dibenzylideneacetone)dipalladium(0) (16.5 mg; 18.0 μmol; 0.0400 eq.). The vessel is evacuated and nitrogen purged three times and degassed chlorobenzene (5.63 $cm^3$) is added before the reaction mixture is degassed further for 5 minutes. The reaction mixture is heated up to 100° C. and stirred at this temperature for 2 minutes. After completion of the reaction, the reaction mixture is allowed to cool to 65° C. and precipitated into stirred methanol (250 $cm^3$). The polymer is collected by filtration and washed with methanol (2×50 $cm^3$) to give a solid. The polymer is subjected to sequential Soxhlet extraction with acetone, petroleum ether (40-60° C.), cyclohexane, chloroform and chlorobenzene. The chlorobenzene fraction is concentrated in vacuo to 20 $cm^3$, precipitated into stirred methanol (250 $cm^3$) and collected by filtration to give a black solid (90.0 mg, Yield: 12%). GPC (50° C., chlorobenzene) $M_n$=27.1 kg $mol^{-1}$; $M_w$=44.0 kg $mol^{-1}$; PDI=1.6.

Example 12—Polymer 12

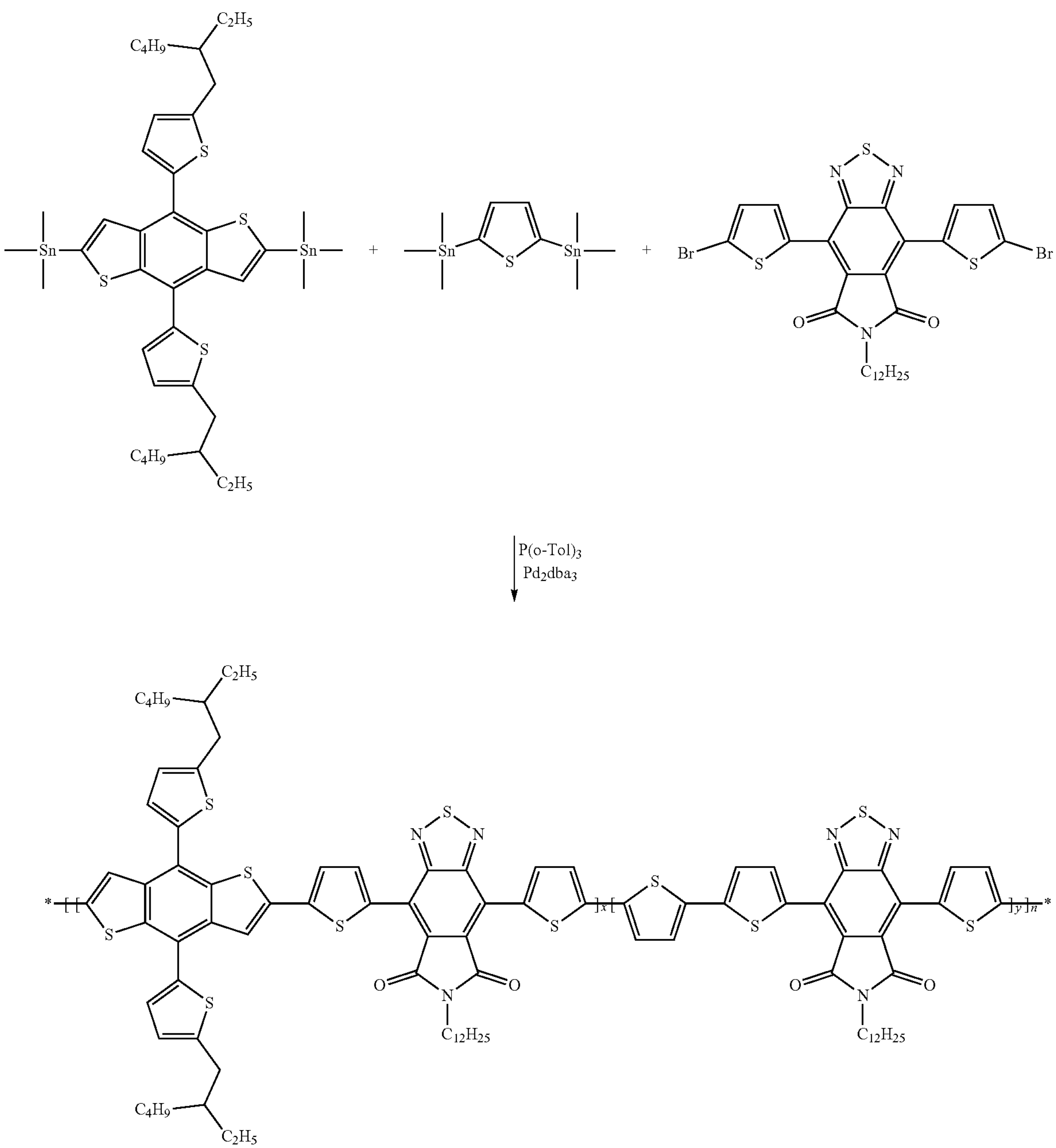

To a dry flask is added 4,8-bis-[5-(2-ethyl-hexyl)-thiophen-2-yl]-2,6-bis-trimethylstannanyl-benzo[1,2-b;4,5-b'] dithiophene (407.1 mg; 0.4500 mmol; 1.000 eq.), 4,8-bis-(5-bromo-thiophen-2-yl)-6-dodecyl-[1,2,5]thiadiazolo[3,4-e]isoindole-5,7-dione (347.4 mg; 0.5000 mmol; 1.110 eq.), 2,5-bis-trimethylstannanyl-thiophene (20.3 mg; 0.0500 mmol; 0.110 eq), tri-o-tolyl-phosphine (21.9 mg; 72.0 μmol; 0.160 eq.) and tris(dibenzylideneacetone)dipalladium(0) (16.48 mg; 18.0 μmol; 0.0400 eq.). The vessel is evacuated and nitrogen purged three times and degassed chlorobenzene (5.63 $cm^3$) is added before the reaction mixture is degassed further for 5 minutes. The reaction mixture is heated up to 100° C. and stirred at this temperature for 2 minutes. After completion of the reaction, the reaction mixture is allowed to cool to 65° C. and precipitated into stirred methanol (250 $cm^3$). The polymer is collected by filtration and washed with methanol (2×50 $cm^3$) to give a black solid which is sparingly soluble in chlorobenzene.

Example 13—Polymer 13

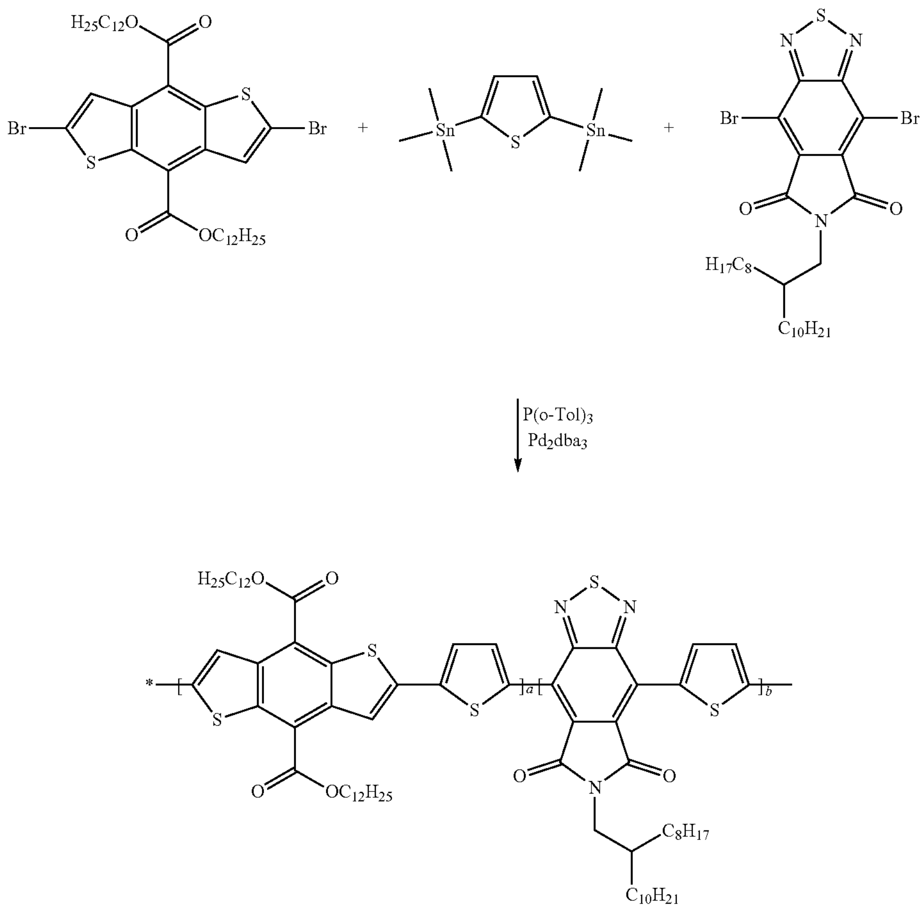

Polymer 13 is prepared following the procedure described in example 2 from 2,6-dibromo-benzo[1,2-b;4,5-b']dithiophene-4,8-dicarboxylic acid didodecyl ester (193.2 mg; 0.2500 mmol; 1.000 eq.), 2,5-bis-trimethylstannanyl-thiophene (204.9 mg; 0.5000 mmol; 2.000 eq.), 4 4,8-dibromo-6-(2-octyl-dodecyl)-[1,2,5]thiadiazolo[3,4-e]isoindole-5,7-dione (160.9 mg; 0.2500 mmol; 1.000 eq.), tris (dibenzylideneacetone)dipalladium(0) (9.2 mg; 0.0100 mmol; 0.040 eq.) and tri-o-tolyl-phosphine (12.2 mg; 0.0400 mmol; 0.160 eq and degassed chlorobenzene (2.1 $cm^3$) in microwave reactor (Initator, Biotage). The polymer is subjected to sequential Soxhlet extraction with acetone, petroleum ether (40-60° C.) and cyclohexane. Propan-2-ol (200 $cm^3$) is added to the cyclohexane fraction (150 $cm^3$) and the resulting precipitate is collected by filtration and dried in vacuo to give a black solid (248 mg, Yield: 79%). GPC (50° C., chlorobenzene): Mn=12.9 kg·mol$^{-1}$; Mw=25.7 kg·mol$^{-1}$; PDI=1.99.

Example 14—Polymer 14

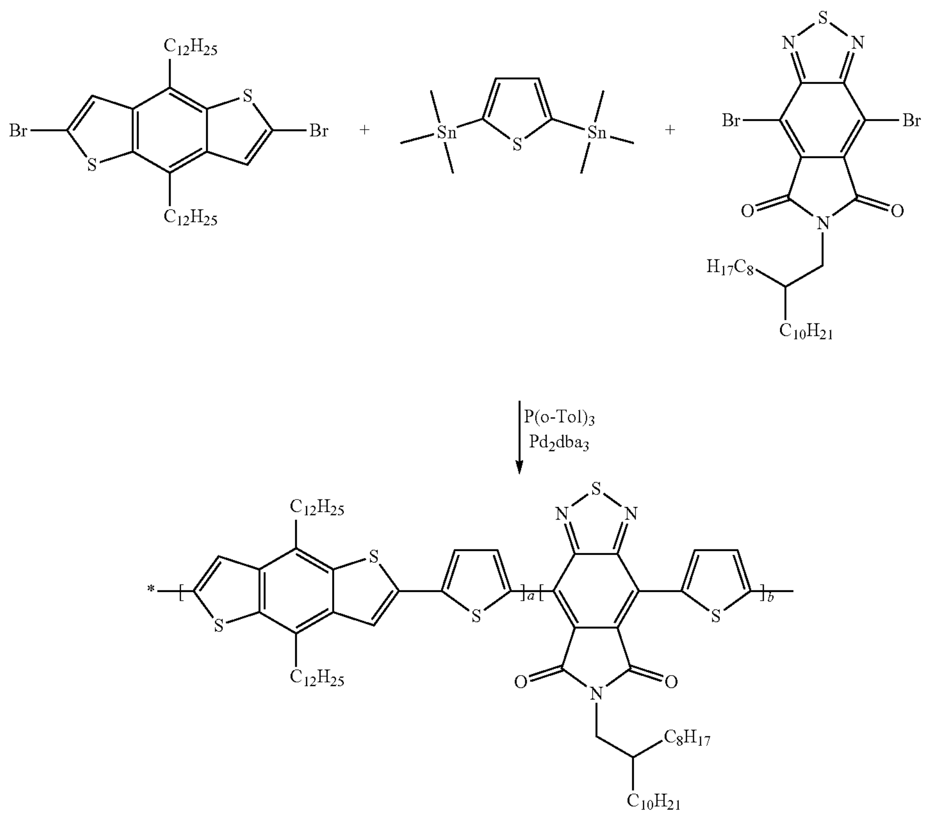

Polymer 13 is prepared following the procedure described in example 2 from 2,6-bibromo-4,8-didodecyl-benzo[1,2-b; 4,5-b']dithiophene (171.2 mg; 0.2500 mmol; 1.000 eq.), 2,5-bis-trimethylstannanyl-thiophene (204.9 mg; 0.5000 mmol; 2.000 eq.), 4 4,8-dibromo-6-(2-octyl-dodecyl)-[1,2,5]thiadiazolo[3,4-e]isoindole-5,7-dione (160.9 mg; 0.2500 mmol; 1.000 eq.), tris(dibenzylideneacetone)dipalladium(0) (9.2 mg; 0.0100 mmol; 0.040 eq.) and tri-o-tolyl-phosphine (12.2 mg; 0.0400 mmol; 0.160 eq and degassed chlorobenzene (2.1 $cm^3$) in microwave reactor (Initator, Biotage). The polymer is subjected to sequential Soxhlet extraction with acetone, petroleum ether (40-60° C.) and cyclohexane. Propan-2-ol (200 $cm^3$) is added to the cyclohexane fraction (150 $cm^3$) and the resulting precipitate is collected by filtration and dried in vacuo to give a black solid (132 mg, Yield: 45%). GPC (50° C., chlorobenzene): $M_n$=10.7 kg·mol$^{-1}$; $M_w$=20.4 kg·mol$^{-1}$; PDI=1.90.

Example 15—Polymer 15

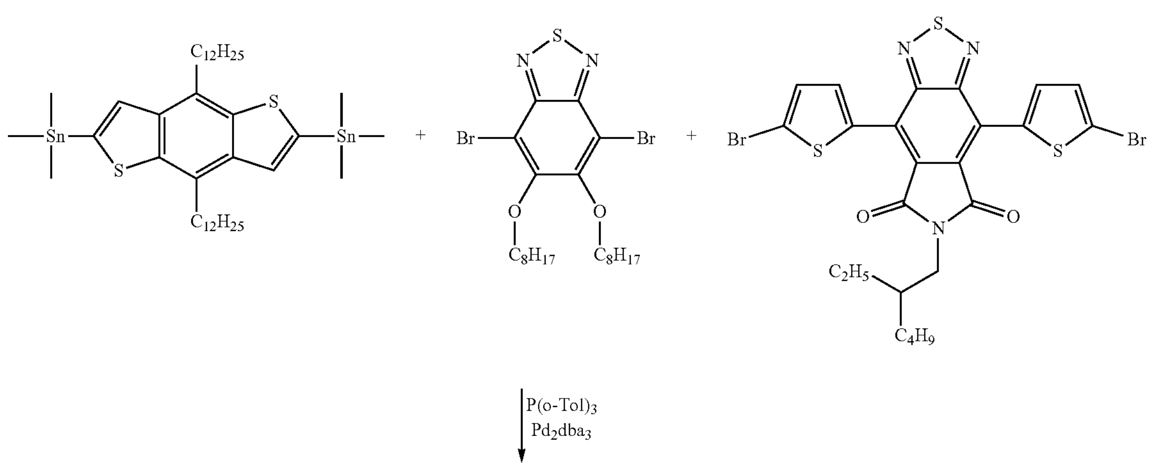

-continued

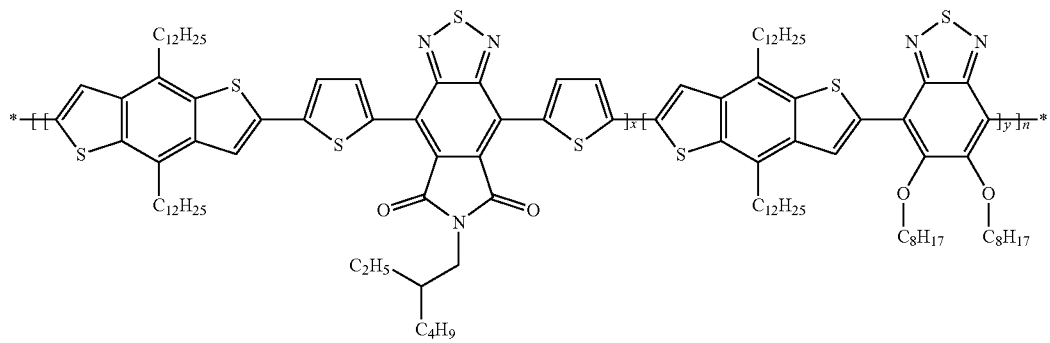

A dry 20 $cm^3$ single neck microwave vial is charged with 4,8-didodecyl-2,6-bis-trimethylstannanyl-benzo[1,2-b;4,5-b']dithiophene (383.6 mg; 0.4500 mmol; 1.000 eq.), 4,7-dibromo-5,6-bis-octyloxy-benzo[1,2,5]thiadiazole (123.8 mg; 0.2250 mmol; 0.500 eq.), 4,8-bis-(5-bromo-thiophen-2-yl)-6-(2-ethyl-hexyl)-[1,2,5]thiadiazolo[3,4-e]isoindole-5,7-dione (143.9 mg; 0.2250 mmol; 0.500 eq.), tri-o-tolyl-phosphine (21.9 mg; 72.0 μmol; 0.160 eq.) and tris(dibenzylideneacetone)dipalladium(0) (16.5 mg; 18.0 μmol; 0.040 eq.). The vessel is evacuated and nitrogen purged three times and degassed chlorobenzene (5.6 $cm^3$) is added before the reaction mixture is degassed further for 15 minutes. The reaction mixture is heated up to 110° C. and stirred at this temperature for 5 minutes. After completion of the reaction, the reaction mixture is allowed to cool to 65° C. and precipitated into stirred methanol (150 $cm^3$). The polymer is collected by filtration and washed with methanol (2×50 $cm^3$) to give a solid. The polymer is then sequentially extracted by Soxhlet extraction with acetone, petroleum ether (40-60° C.), cyclohexane, and chloroform. The chloroform fraction is concentrated in vacuo to 75 $cm^3$, precipitated by addition of methanol (100 $cm^3$) and collected by filtration to give a black solid (424 mg, Yield: 98%). GPC (50° C., chlorobenzene) $M_n$=44.0 kg $mol^{-1}$; $M_w$=108 kg $mol^{-1}$; PDI=2.44.

Example 16—Polymer 16

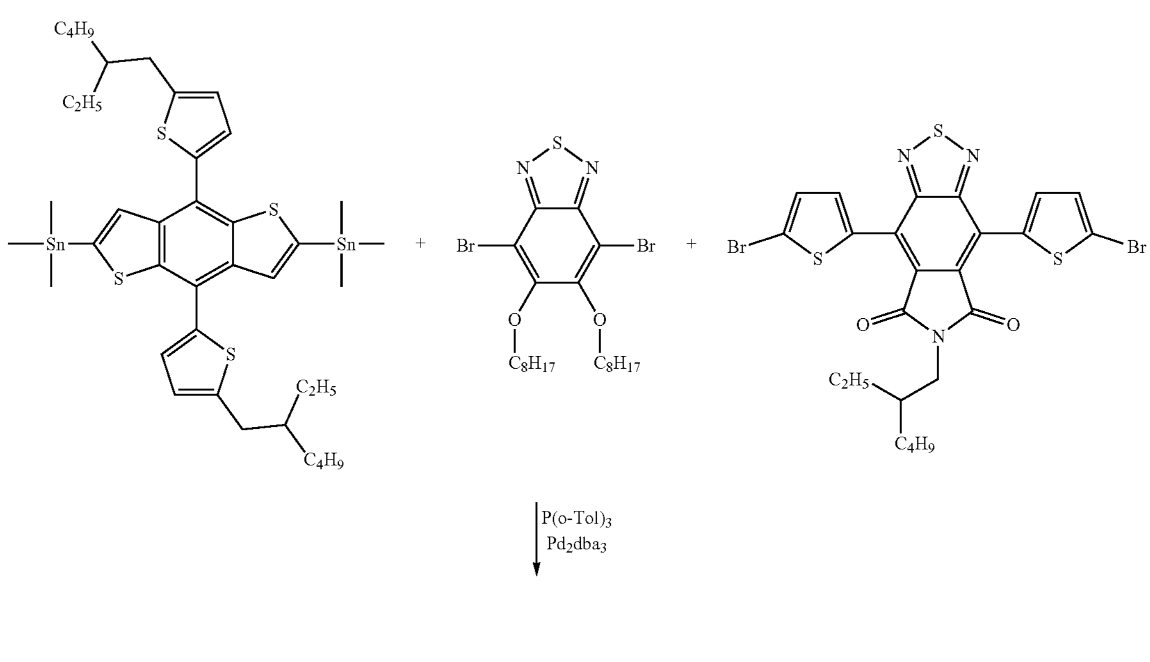

-continued

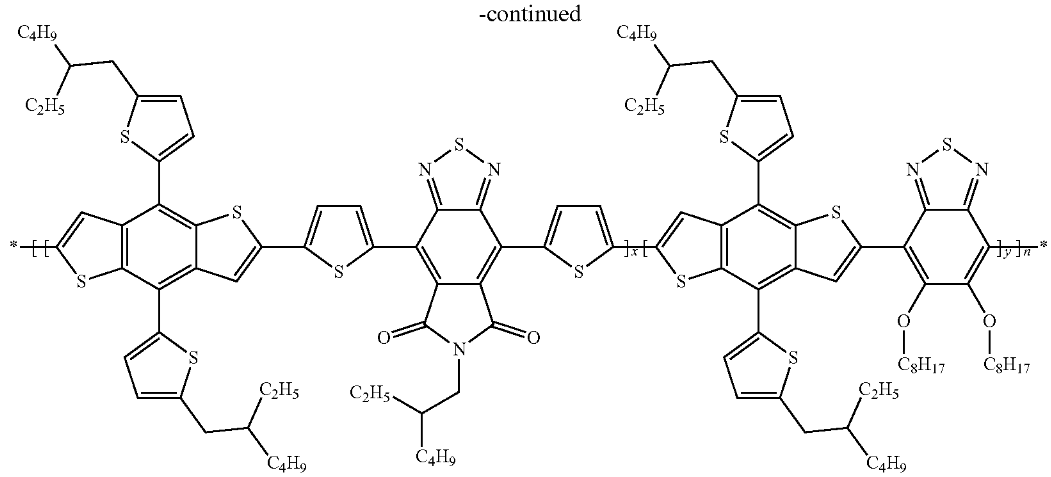

A dry 20 $cm^3$ single neck microwave vial is charged with 4,8-bis-[5-(2-ethyl-hexyl)-thiophen-2-yl]-2,6-bis-trimethyl-stannanyl-benzo[1,2-b;4,5-b]dithiophene (407.1 mg; 0.4500 mmol; 1.000 eq.), 4,7-dibromo-5,6-bis-octyloxy-benzo[1,2,5]thiadiazole (123.8 mg; 0.2250 mmol; 0.500 eq.), 4,8-bis-(5-bromo-thiophen-2-yl)-6-(2-ethyl-hexyl)-[1,2,5]thiadiazolo[3,4-e]isoindole-5,7-dione (143.9 mg; 0.2250 mmol; 0.500 eq.), tri-o-tolyl-phosphine (21.9 mg; 72.0 μmol; 0.160 eq.) and tris(dibenzylideneacetone)dipalladium(0) (16.5 mg; 18.0 μmol; 0.040 eq.). The vessel is evacuated and nitrogen purged three times and degassed chlorobenzene (5.6 $cm^3$) is added before the reaction mixture is degassed further for 15 minutes. The reaction mixture is heated up to 110° C. and stirred at this temperature for 5 minutes. After completion of the reaction, the reaction mixture is allowed to cool to 65° C. and precipitated into stirred methanol (150 $cm^3$). The polymer is collected by filtration and washed with methanol (2×50 $cm^3$) to give a solid. The polymer is then sequentially extracted by Soxhlet extraction with acetone, petroleum ether (40-60° C.), cyclohexane, and chloroform. The chloroform fraction is concentrated in vacuo to 75 $cm^3$, precipitated by addition of methanol (100 $cm^3$) and collected by filtration to give a black solid (100 mg, Yield: 22%). GPC (50° C., chlorobenzene) $M_n$=28.9 kg $mol^{-1}$; $M_w$=106 kg $mol^{-1}$; PDI=3.66.

Example 17—Polymer 17

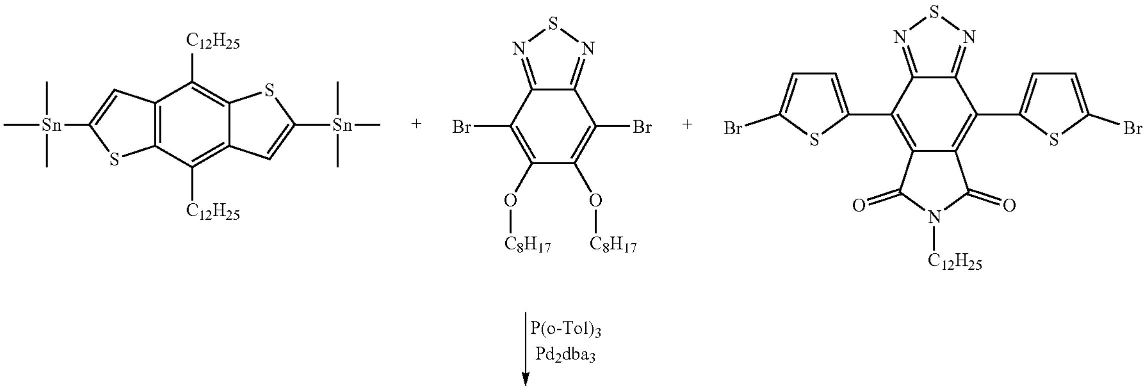

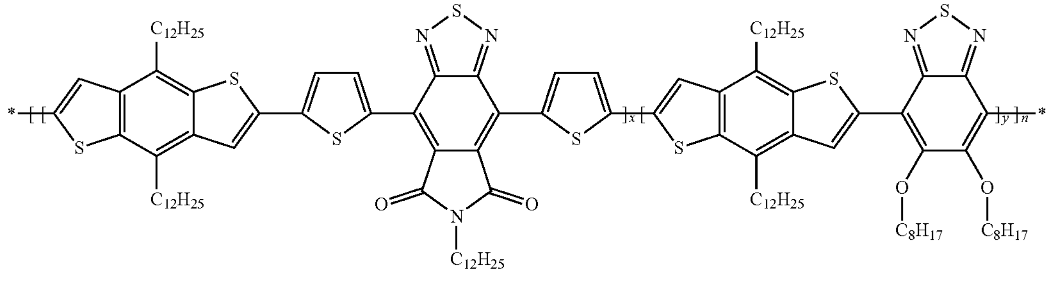

A dry 20 $cm^3$ single neck microwave vial is charged with 4,8-didodecyl-2,6-bis-trimethylstannanyl-benzo[1,2-b;4,5-b']dithiophene (383.6 mg; 0.4500 mmol; 1.000 eq.), 4,7-dibromo-5,6-bis-octyloxy-benzo[1,2,5]thiadiazole (123.8 mg; 0.2250 mmol; 0.500 eq.), 4,8-bis-(5-bromo-thiophen-2-yl)-6-dodecyl-[1,2,5]thiadiazolo[3,4-e]isoindole-5,7-dione (156.5 mg; 0.2250 mmol; 0.500 eq.), tri-o-tolyl-phosphine (21.9 mg; 72.0 μmol; 0.160 eq.) and tris(dibenzylideneacetone)dipalladium(0) (16.5 mg; 18.0 μmol; 0.040 eq.). The vessel is evacuated and nitrogen purged three times and degassed chlorobenzene (5.6 $cm^3$) is added before the reaction mixture is degassed further for 15 minutes. The reaction mixture is heated up to 100° C. and stirred at this temperature for 30 minutes. After completion of the reaction, the reaction mixture is allowed to cool to 65° C. and precipitated into stirred methanol (150 $cm^3$). The polymer is collected by filtration and washed with methanol (2×50 $cm^3$) to give a solid. The polymer is then sequentially extracted by Soxhlet extraction with acetone, petroleum ether (40-60° C.), cyclohexane, and chloroform. The chloroform fraction is concentrated in vacuo to 75 $cm^3$, precipitated by addition of methanol (100 $cm^3$) and collected by filtration to give a black solid (440 mg). GPC (50° C., chlorobenzene) $M_n$=49.0 kg $mol^{-1}$; $M_w$=159.7 kg $mol^{-1}$; PDI=3.26.

Example 18

Example 18.1—4,8-Bis-(5-bromo-4-dodecyl-thiophen-2-yl)-6-dodecyl-[1,2,5]thiadiazolo[3,4-e]isoindole-5,7-dione

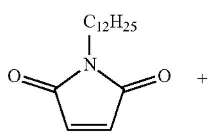

-continued

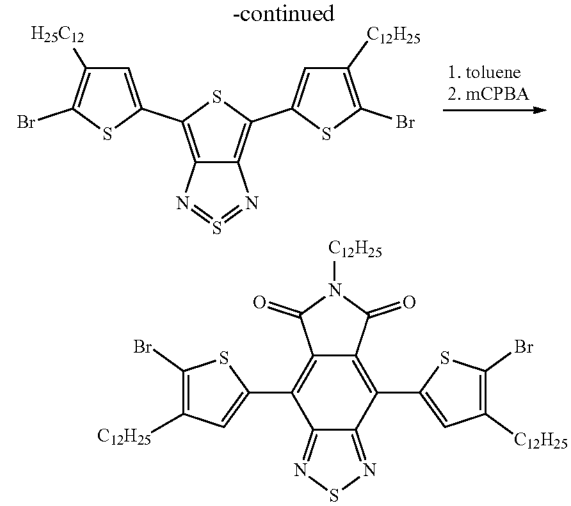

5,7-Bis(5-bromo-4-dodecyl-2-thienyl)thieno[3,4-b]thiadiazole (645.0 mg, 0.8054 mmol, 1.000 eq.), 1-dodecyl-pyrrole-2,5-dione (854.9 mg, 3.221 mmol, 4.000 eq.) and toluene (65 $cm^3$) are placed in a dry flask and stirred at 105° C. for 40 hours. The reaction is cooled to ambient temperature and 3-chloro-benzenecarboperoxoic acid (764.3 mg, 4.429 mmol, 5.500 eq.) is added to the reaction mixture. The reaction mixture is further stirred at 23° C. for 24 hours before solvent is removed in vacuo. The crude material is redissolved in dichloromethane (10 $cm^3$), absorbed on silica and the solvent removed in vacuo. The crude product is purified using a Biotage flash chromatography (petroleum ether/dichloromethane 80:20) to afford a red solid (80.0 mg, Yield: 9.6%). $^1$H NMR (300 MHz, $CDCl_3$) δ ppm 7.67 (2H, s) 7.19 (1H, s) 3.66 (2H, t, J=7.39 Hz) 2.57-2.65 (4H, m) 1.54-1.67 (6H, m) 1.14-1.40 (59H, m) 0.75-0.84 (9H, m)

Example 18.2—Polymer 18

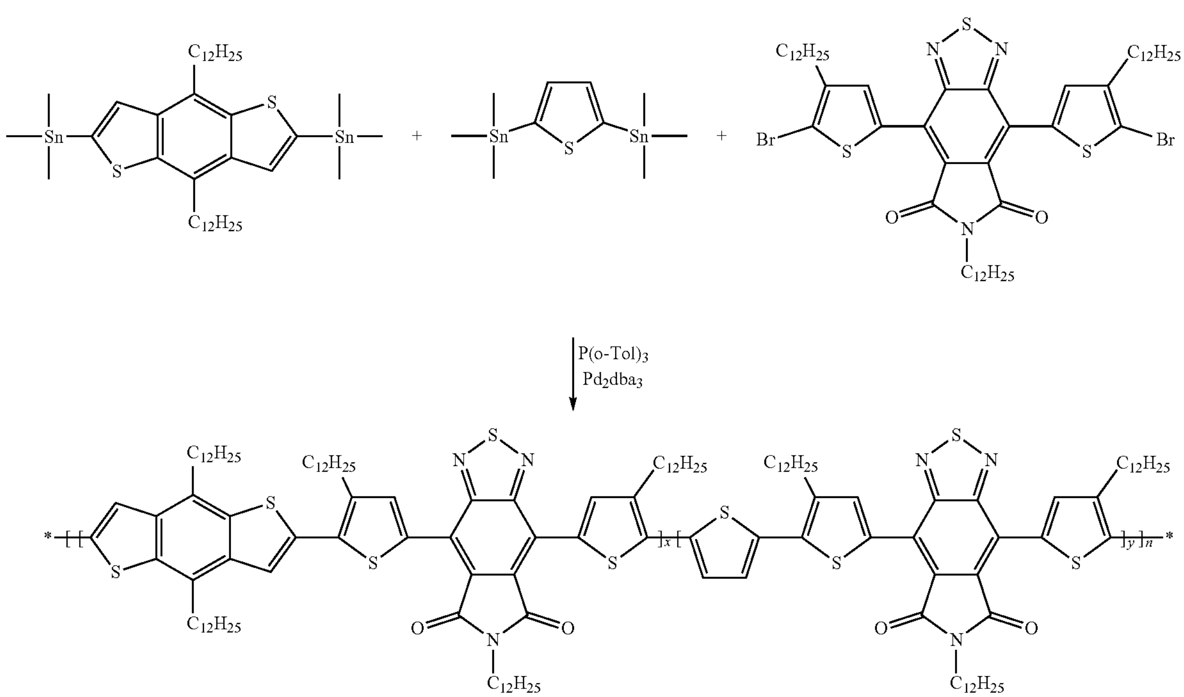

To a dry flask is added 4,8-didodecyl-2,6-bis-trimethyl-stannanyl-benzo[1,2-b;4,5-b']dithiophene (22.0 mg; 0.0258 mmol; 0.900 eq.), 4,8-bis-(5-bromo-4-dodecyl-thiophen-2-yl)-6-dodecyl-[1,2,5]thiadiazolo[3,4-e]isoindole-5,7-dione (29.6 mg; 0.0286 mmol; 1.00 eq.), 2,5-bis-trimethylstannanyl-thiophene (1.2 mg; 0.00029 mmol; 0.10 eq.), tri-o-tolyl-phosphine (1.4 mg; 4.6 μmol; 0.16 eq.) and tris(dibenzylideneacetone)dipalladium(0) (1.1 mg; 1.1 μmol; 0.040 eq.). The vessel is evacuated and nitrogen purged three times and degassed chlorobenzene (0.36 $cm^3$) is added before the reaction mixture is degassed further for 5 minutes. The reaction mixture is heated up to 105° C. and stirred at this temperature for 3 minutes. Immediately after completion of the polymerisation reaction, the reaction mixture is allowed to cool to 65° C. and precipitated into stirred methanol (250 $cm^3$). The polymer is collected by filtration and washed with methanol (2×50 $cm^3$) to give a solid. The polymer is subjected to sequential Soxhlet extraction with acetone, petroleum ether (40-60° C.), cyclohexane, chloroform and chlorobenzene. The chlorobenzene fraction is concentrated in vacuo to 10 $cm^3$, precipitated into stirred methanol (250 $cm^3$) and collected by filtration to give a black solid (48.0 mg, Yield: 55%). GPC (50° C., chlorobenzene) $M_n$=28 kg $mol^{-1}$; $M_w$=64 kg $mol^{-1}$; PDI=2.45.

Example 19

Example 19.1—1-(2-Octyl-dodecyl)-pyrrole-2,5-dione

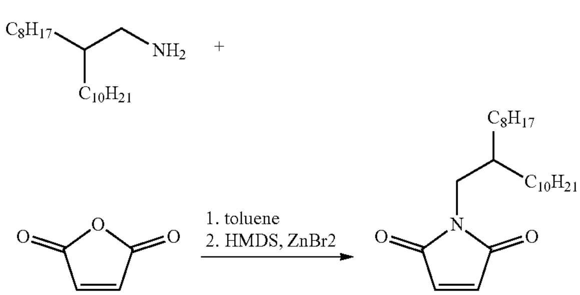

2-Octyl-dodecylamine can be prepared as described, for example, in *J. Mater. Chem,* 2012, 22, 14639.

To a dry flask containing toluene (165 $cm^3$) and maleic anhydride (9.00 g, 91.8 mmol, 1.00 eq) is added 2-octyl-dodecylamine (24.9 g, 83.5 mmol, 0.910 eq). Mixture is stirred at 85° C. for 2.5 hours. Then, zinc bromide (20.7 g, 91.8 mmol, 1.00 eq) and 1,1,1,3,3,3-hexamethyl-disilazane (26.0 $cm^3$, 125 mmol, 1.36 eq) are added to the mixture. The reaction mixture is stirred at 85° C. for 3 hours followed by 48 hours at ambient temperature. After completion of the reaction, reaction mixture is poured into 0.5 M hydrochloric acid solution (300 $cm^3$) and phases are separated. Organic phase is washed twice with saturated solution of sodium carbonate (300 $cm^3$), dried over magnesium sulphate and concentrated in vacuo to afford the product as a beige oil (31.1 g, Yield: 79%). The crude product is used without further purification.

Example 19.2—4,8-bis-(5-bromo-thiophen-2-yl)-6-(2-octyl-dodecyl)-[1,2,5]thiadiazolo[3,4-e]isoindole-5,7-dione

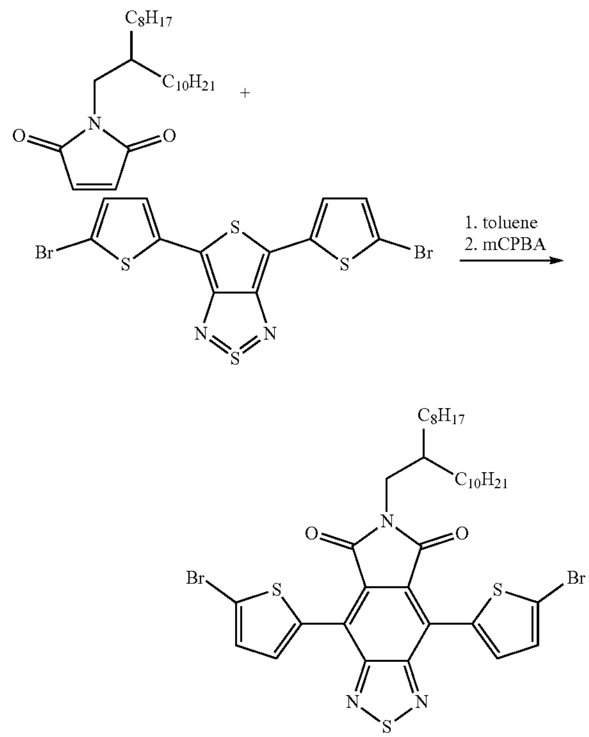

5,7-Bis(5-bromo-2-thienyl)thieno[3,4-b]thiadiazole (7.50 g, 16.2 mmol, 1.00 eq), 1-(2-Octyl-dodecyl)-pyrrole-2,5-dione (24.4 g, 64.6 mmol, 4.00 eq) and toluene (750 $cm^3$) are placed in a dry flask and stirred at 105° C. for 72 hours. Reaction is cooled to ambient temperature and 3-chloro-benzenecarboperoxoic acid (15.3 g, 88.9 mmol, 5.50 eq) is added to the reaction mixture. Mixture is stirred at ambient temperature for 24 hours. Water (300 $cm^3$) is added and phases are separated. Water phase is washed with ethyl acetate (200 $cm^3$). Combined organic phases are washed with 10% sodium bicarbonate solution (2×250 $cm^3$) followed by wash with brine (200 $cm^3$). Organic phases are dried over magnesium sulphate and concentrated in vacuo. Crude material is redissolved in dichloromethane (30 $cm^3$), absorbed on silica and the solvent removed in vacuo. The crude product is purified using Biotage flash chromatography (petroleum ether/dichloromethane 80:20) followed by recrystallization from diethyl ether/methanol to afford a red solid (2.70 g, Yield: 21%). $^1H$ NMR (300 MHz, $CDCl_3$) δ ppm 7.78 (2H, d, J=4.05 Hz) 7.22 (2H, d, J=4.05 Hz) 3.63 (2H, d, J=7.35 Hz) 1.92 (1H, br. s.) 1.17-1.40 (33H, m) 0.80-0.91 (6H, m)

Example 19.3—Polymer 19

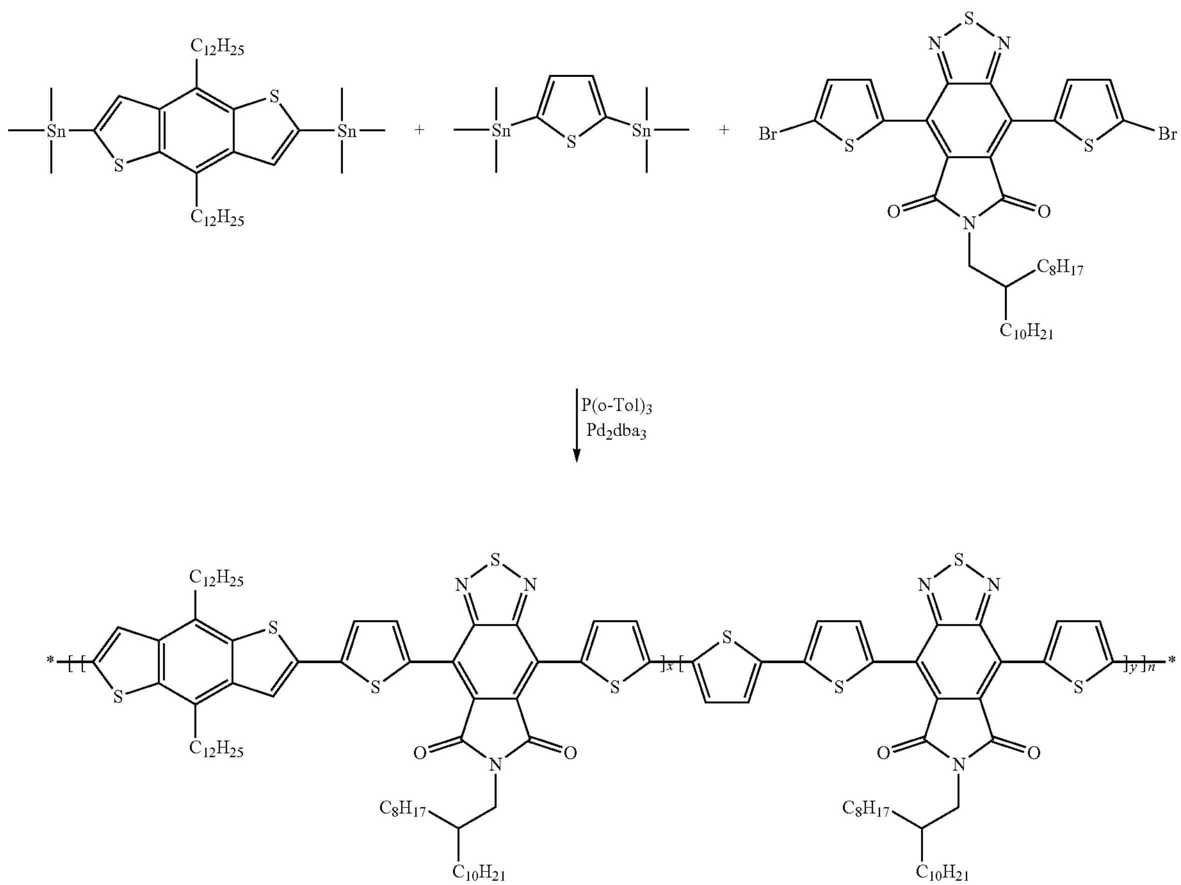

To a dry flask is added 4,8-didodecyl-2,6-bis-trimethyl-stannanyl-benzo[1,2-b;4,5-b']dithiophene (383.6 mg; 0.4500 mmol; 1.000 eq.), 4,8-bis-(5-bromo-thiophen-2-yl)-6-(2-octyl-dodecyl)-[1,2,5]thiadiazolo[3,4-e]isoindole-5,7-dione (403.5 mg; 0.4995 mmol; 1.110 eq.), 2,5-bis-trimethylstannanyl-thiophene (20.3 mg; 0.0495 mmol; 0.110 eq), tri-o-tolyl-phosphine (21.9 mg; 72.0 μmol; 0.160 eq.) and tris(dibenzylideneacetone)dipalladium(0) (16.5 mg; 18.0 μmol; 0.0400 eq.). The vessel is evacuated and nitrogen purged three times and degassed chlorobenzene (5.6 $cm^3$) is added before the reaction mixture is degassed further for 5 minutes. The reaction mixture is heated up to 115° C. and stirred at this temperature for 4 hours. After completion of the reaction, the reaction mixture is allowed to cool to 65° C. and precipitated into stirred methanol (250 $cm^3$). The polymer is collected by filtration and washed with methanol (2×50 $cm^3$) to give a solid. The polymer is subjected to sequential Soxhlet extraction with acetone, petroleum ether (40-60° C.), cyclohexane, chloroform and chlorobenzene. The chlorobenzene fraction is concentrated in vacuo to 20 $cm^3$, precipitated into stirred methanol (250 $cm^3$) and collected by filtration to give a black solid (530.0 mg). GPC (50° C., chlorobenzene) $M_n$=110 kg $mol^{-1}$; $M_w$=330 kg $mol^{-1}$; PDI=3.30.

Example 20

Example 20.1—1-(3,7-Dimethyl-octyl)-pyrrole-2,5-dione

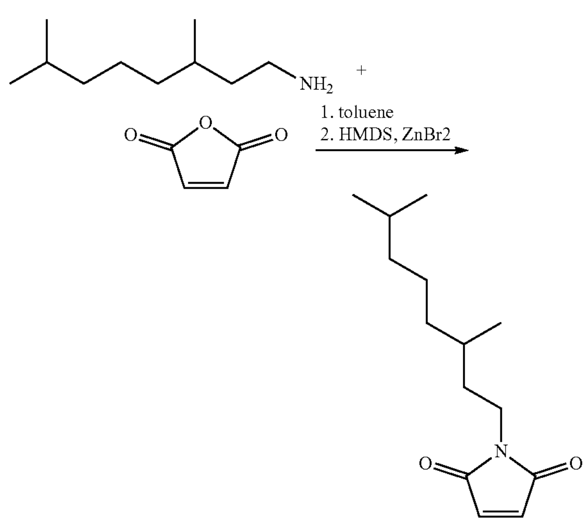

To a dry flask containing toluene (200 $cm^3$) and maleic anhydride (11.00 g, 112.2 mmol, 1.000 eq) is added 3,7-dimethyl-octylamine (16.06 g, 102.1 mmol, 0.9100 eq). The reaction mixture is stirred at 85° C. for 2.5 hours. Then, zinc bromide (25.30 g, 112.2 mmol, 1.000 eq) and 1,1,1,3,3,3-hexamethyl-disilazane (31.8 $cm^3$, 152 mmol, 1.36 eq) are added to the mixture. The reaction mixture is stirred at 85° C. for 3 hours followed by 48 hours at 23° C., after which, the reaction mixture is poured into 0.5 M hydrochloric acid solution (300 cm3) and phases are separated. The organic phase is washed twice with a saturated solution of sodium carbonate (300 $cm^3$), dried over magnesium sulphate and concentrated in vacuo to afford a beige solid (17.00 g, 64% yield). The crude product is used without further purification.

Example 20.2—4,8-Bis-(5-bromo-thiophen-2-yl)-6-(3,7-dimethyl-octyl)-[1,2,5]thiadiazolo[3,4-e]isoindole-5,7-dione

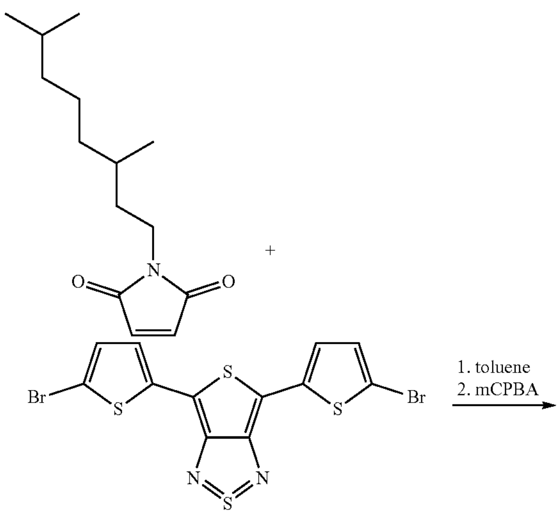

-continued

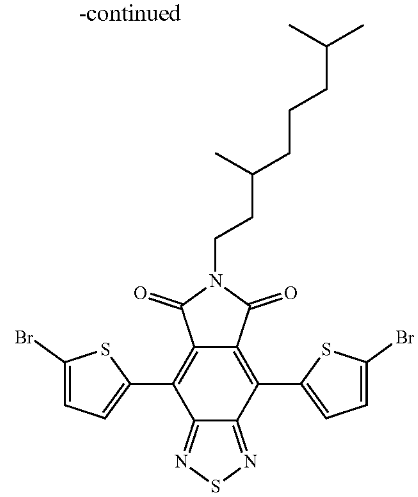

5,7-Bis(5-bromo-2-thienyl)thieno[3,4-b]thiadiazole (8.00 g, 17.2 mmol, 1.00 eq), 1-(3,7-Dimethyl-octyl)-pyrrole-2,5-dione (16.4 g, 68.9 mmol, 4.00 eq) and toluene (750 $cm^3$) are placed in a dry flask and stirred at 105° C. for 72 hours. Reaction is cooled to ambient temperature and 3-chloro-benzenecarboperoxoic acid (16.4 g, 94.8 mmol, 5.50 eq) is added to the reaction mixture. Mixture is stirred at ambient temperature for 24 hours before solvent is removed in vacuo, purified using Biotage flash chromatography (Petroleum ether/dichloromethane 80:20) followed by recrystallization from acetonitrile to afford the title product as red solid 3.00 g, 26% yield). 1H NMR (300 MHz, $CDCl_3$) δ ppm 7.78 (2H, d, J=4.05 Hz) 7.22 (2H, d, J=4.05 Hz) 3.70-3.79 (2H, m) 1.64-1.76 (1H, m) 1.43-1.58 (4H, m) 1.07-1.37 (6H, m) 0.96 (3H, d, J=6.22 Hz) 0.85 (6H, d, J=6.59 Hz)

Example 20.3—Polymer 20

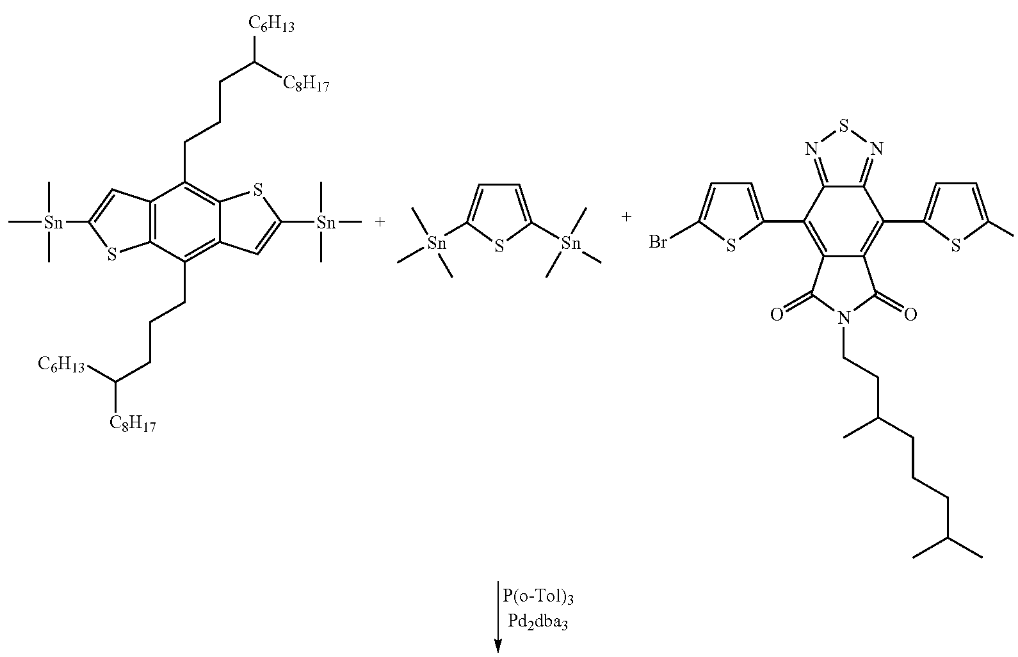

-continued

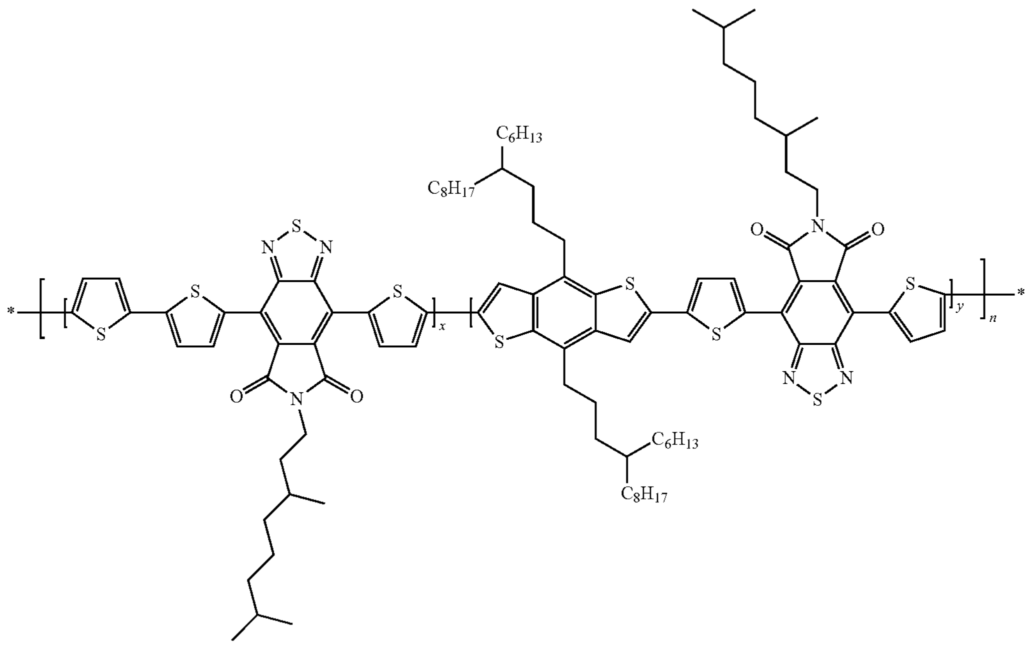

To a dry flask is added 4,8-bis-(4-hexyl-dodecyl)-2,6-bis-trimethylstannanyl-benzo[1,2-b;4,5-b']dithiophene (287.1 mg; 0.2812 mmol; 1.000 eq.), 4,8-bis-(5-bromo-thiophen-2-yl)-6-(3,7-dimethyl-octyl)-[1,2,5]thiadiazolo[3,4-e]isoindole-5,7-dione (208.4 mg; 0.3122 mmol; 1.110 eq.), 2,5-bis-trimethylstannanyl-thiophene (12.7 mg; 0.0309 mmol; 0.1100 eq.), tri-o-tolyl-phosphine (13.7 mg; 45.0 μmol; 0.160 eq.) and tris(dibenzylideneacetone) dipalladium(0) (10.3 mg; 11.3 μmol; 0.0400 eq.). The vessel is evacuated and nitrogen purged three times and degassed chlorobenzene (3.5 $cm^3$) is added before the reaction mixture is degassed further for 5 minutes. The reaction mixture is heated up to 115° C. and stirred at this temperature for 12 hours. After completion of the reaction, the reaction mixture is allowed to cool to 65° C. and precipitated into stirred methanol (250 $cm^3$). The polymer is collected by filtration and washed with methanol (2×50 $cm^3$) to give a solid. The polymer is subjected to sequential Soxhlet extraction with acetone, petroleum ether (40-60° C.) and cyclohexane. The cyclohexane fraction is evaporated in vacuo, redissolved in dichloromethane (10 $cm^3$) precipitated into stirred methanol (250 $cm^3$) and collected by filtration to give a black solid (410.0 mg). GPC (50° C., chlorobenzene) $M_n$=20.2 kg $mol^{-1}$; $M_w$=40.4 kg $mol^{-1}$; PDI=2.00.

Example 21

Example 21.1—1-(4-Dodecyl-phenyl)-pyrrole-2,5-dione

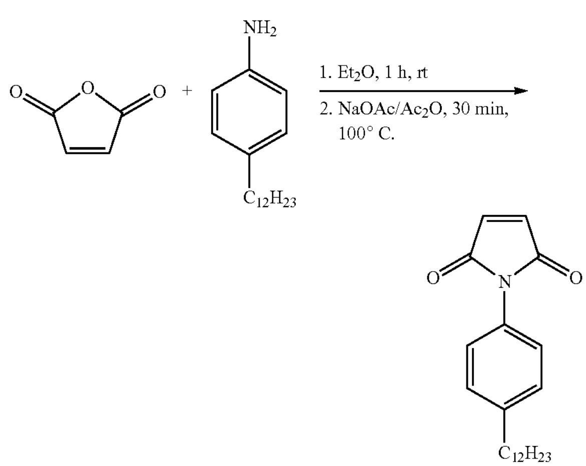

A three-necked round bottom flask provided with a stirrer, a reflux condenser, and a dropping funnel is charged with maleic anhydride (1.89 g; 19.2 mmol; 1.00 eq.) and diethyl ether (30 $cm^3$). A solution of 4-dodecyl-phenylamine (5.03 g; 19.2 mmol; 1.00 eq.) in diethyl ether (4.85 $cm^3$) is added via syringe over five minutes to the stirred mixture. The resulting thick suspension is stirred at room temperature for 1 h and is subsequently then cooled in an ice bath. The precipitate is recovered by filtration, dried in air and subsequently added to a flask containing a solution of anhydrous sodium acetate (0.63 g; 7.7 mmol; 0.40 eq.) in acetic anhydride (6.5 $cm^3$) and stirred at 100° C. for 30 min. The reaction mixture is then cooled to room temperature in a cold water bath and is poured into 100 $cm^3$ of an ice-water mixture. The precipitated product is recovered by filtration, washed three times with 30 $cm^3$ portions of ice-cold water, and dried. Finally, the product is recrystallized from a mixture of 40 $cm^3$ 2-propanol and 25 $cm^3$ water (5.4 g, Yield: 82%). 1H NMR (300 MHz, $CDCl_3$): δ ppm 7.30-7.20 (m, 4H), 6.85 (s, 2H), 2.63 (dd, J=8.0, 8.0 Hz, 2H), 1.61 (m, 2H), 1.35-1.20 (m, 18H), 0.88 (t, J=7.0 Hz, 3H).

Example 21.2—4,8-Bis-(5-bromo-thiophen-2-yl)-6-(4-dodecyl-phenyl)-[1,2,5]thiadiazolo[3,4-e]isoindole-5,7-dione

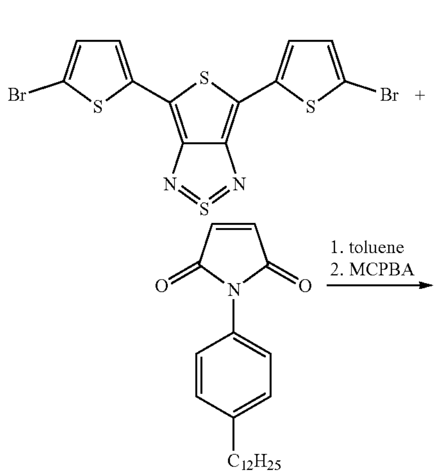

-continued

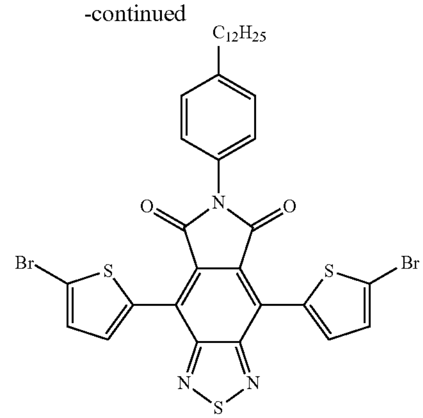

4,6-Bis(5-bromo-2-thienyl)-thieno[3,4-c][1,2,5]thiadiazole (1.70 g; 3.66 mmol; 1.00 eq.), 1-(4-dodecyl-phenyl)-pyrrole-2,5-dione (5.00 g; 14.7 mmol; 4.00 eq.) is dissolved in toluene (310 $cm^3$) and stirred at 105° C. for 4 days, protected from sunlight, under nitrogen. Subsequently, the mixture is cooled to room temperature. 3-Chloro-benzenecarboperoxoic acid (3.48 g; 20.1 mmol; 5.50 eq.) is added and the mixture stirred for 16 h, and passed through a short silica plug (the silica is then washed with 200 $cm^3$ DCM). The solvents are evaporated and the product purified by column chromatography (Dichloromethane/Petroleum Ether 4:1) and subsequent recrystallisation from acetonitrile/THF (5:3). (1.22 g, Yield: 43.3%). 1H NMR (300 MHz, $CDCl_3$): δ ppm 7.81 (d, 2H, J=4.1 Hz), 7.32 (m, 4H), 7.21 (d, 2H, J=4.1 Hz), 2.63 (m, 2H), 1.63 (m, 2H), 1.35-1.20 (m, 18H), 0.88 (t, J=7.0 Hz, 3H).

Example 21.3—Polymer 21

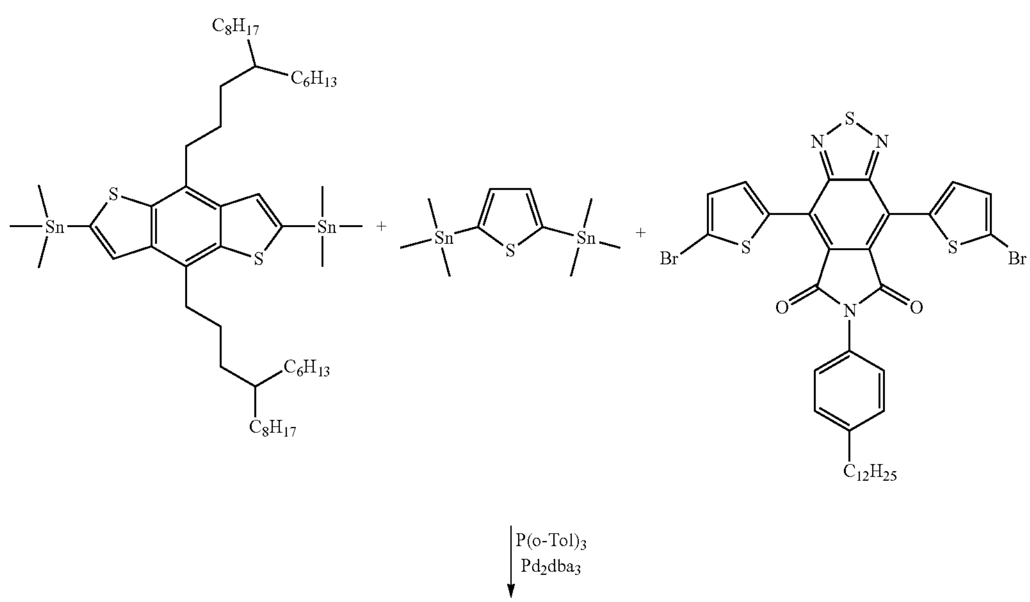

-continued

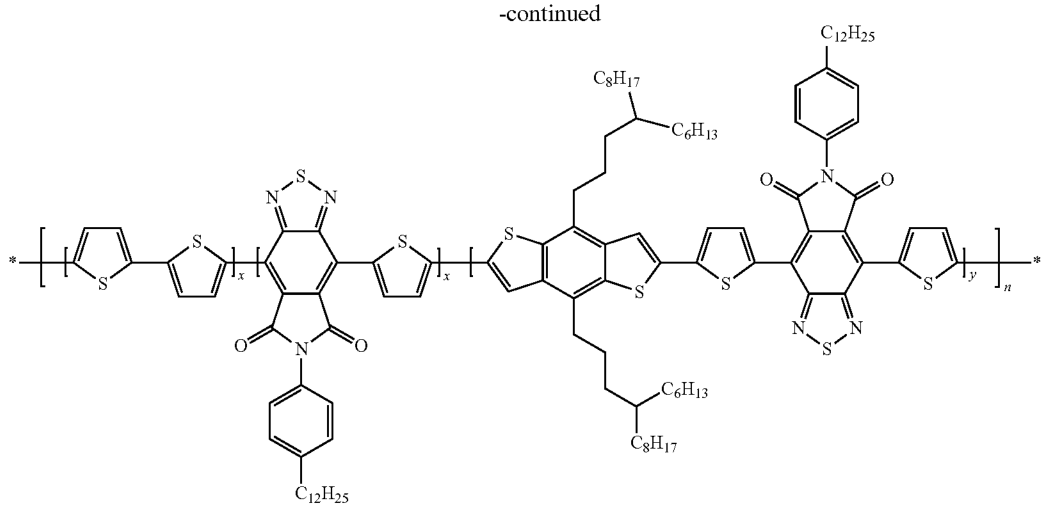

4,8-Bis-(4-hexyl-dodecyl)-2,6-bis-trimethylstannanyl-benzo[1,2-b;4,5-b]dithiophene (386.3 mg; 0.3784 mmol; 1.000 eq.), 4,8-bis-(5-bromo-thiophen-2-yl)-6-(4-dodecyl-phenyl)-[1,2,5]thiadiazolo[3,4-e]isoindole-5,7-dione (324.1 mg; 0.4200 mmol; 1.110 eq.), 2,5-bis-trimethylstannanyl-thiophene (17.1 mg; 0.0416 mmol; 0.110 eq.), tri-o-tolyl-phosphine (18.4 mg; 60.6 μmol; 0.160 eq.) and tris(dibenzylideneacetone)dipalladium(0) (13.9 mg; 15.1 μmol; 0.0400 eq.) are placed in a microwave vial. The vial is sealed and degassed. Degassed chlorobenzene (4.7 $cm^3$) is added and the mixture further purged with nitrogen for 5 minutes. The vial is heated to 120° C. for 1 hour in an oil bath. The mixture is transferred into a flask containing 200 $cm^3$ of methanol, the precipitate collected by filtration and subjected to Soxhlet extraction with, subsequently, acetone, petroleum ether (40-60° C.), cyclohexane and chloroform. The chloroform fraction is triturated by addition to methanol, filtered and dried in vacuo (465 mg). GPC (50° C., chlorobenzene): $M_n$=22 kg·mol$^{-1}$; $M_w$=46 kg·mol$^{-1}$; PDI=2.04.

Example 22—Polymer 22

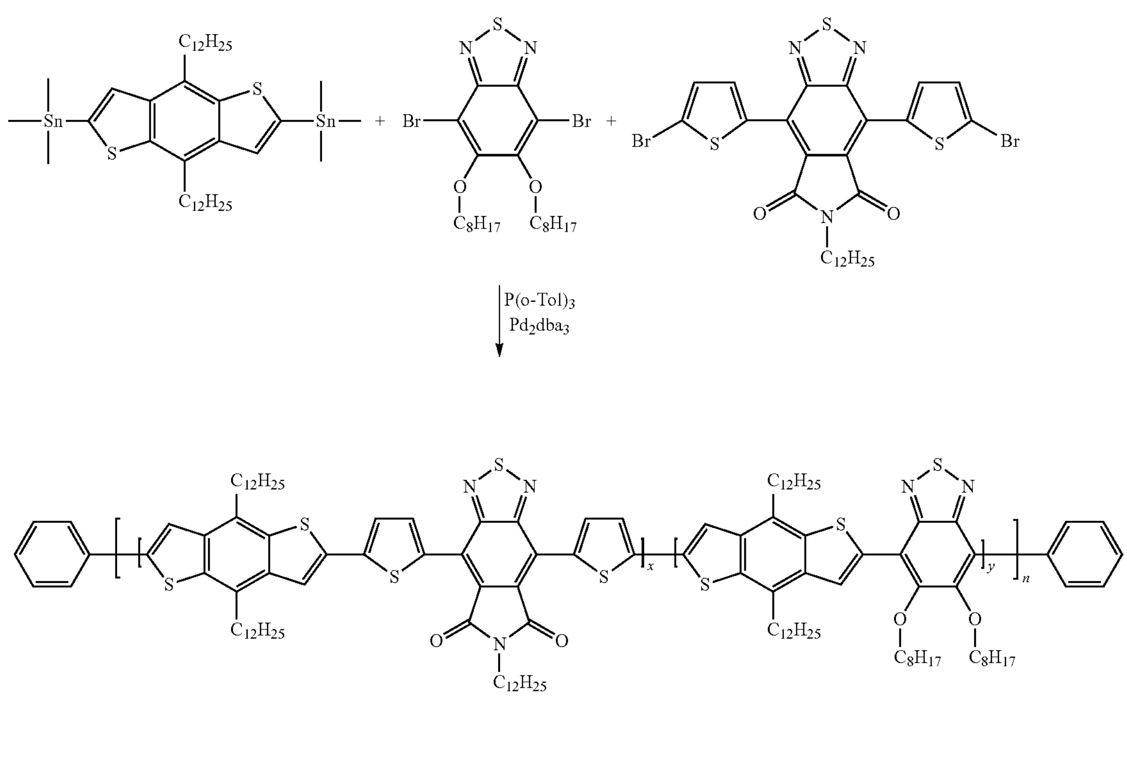

A dry 20 $cm^3$ single neck microwave vial is charged with 4,8-didodecyl-2,6-bis-trimethylstannanyl-benzo[1,2-b;4,5-b']dithiophene (383.6 mg; 0.4500 mmol; 1.000 eq.), 4,7-dibromo-5,6-bis-octyloxy-benzo[1,2,5]thiadiazole (123.8 mg; 0.2250 mmol; 0.5000 eq.), 4,8-bis-(5-bromo-thiophen-2-yl)-6-dodecyl-[1,2,5]thiadiazolo[3,4-e]isoindole-5,7-dione (156.5 mg; 0.2250 mmol; 0.500. eq.), tri-o-tolyl-phosphine (21.9 mg; 72.0 μmol; 0.160 eq.) and tris(dibenzylideneacetone)dipalladium(0) (16.5 mg; 18.0 μmol; 0.040 eq.). The vessel is evacuated and nitrogen purged three times and degassed chlorobenzene (5.6 $cm^3$) is added before the reaction mixture is degassed further for 15 minutes. The reaction mixture is heated up to 130° C. and stirred at this temperature for 45 minutes. 0.29 $cm^3$ (0.90 mmol; 2.0 eq.) of tributyl-phenyl-stannane is then added followed by an additional 1 hour heating at 130° C. Next 0.14 $cm^3$ (1.4 mol; 3.0 eq.) of bromobenzene is then added followed by an additional 1 hour heating at 130° C. After completion of the reaction, the reaction mixture is allowed to cool to 65° C. and precipitated into stirred methanol (150 $cm^3$). The polymer is collected by filtration and washed with methanol (2×50 $cm^3$) to give a solid. The polymer is then sequentially extracted by Soxhlet extraction with acetone, petroleum ether (40-60° C.), cyclohexane, and chloroform. The chloroform fraction is concentrated in vacuo to 75 $cm^3$, precipitated by addition of methanol (100 $cm^3$) and collected by filtration to give a black solid (487 mg). GPC (50° C., chlorobenzene) $M_n$=44.6 kg $mol^{-1}$; $M_w$=124.6 kg $mol^{-1}$; PDI=2.79.

Example 23—Polymer 23

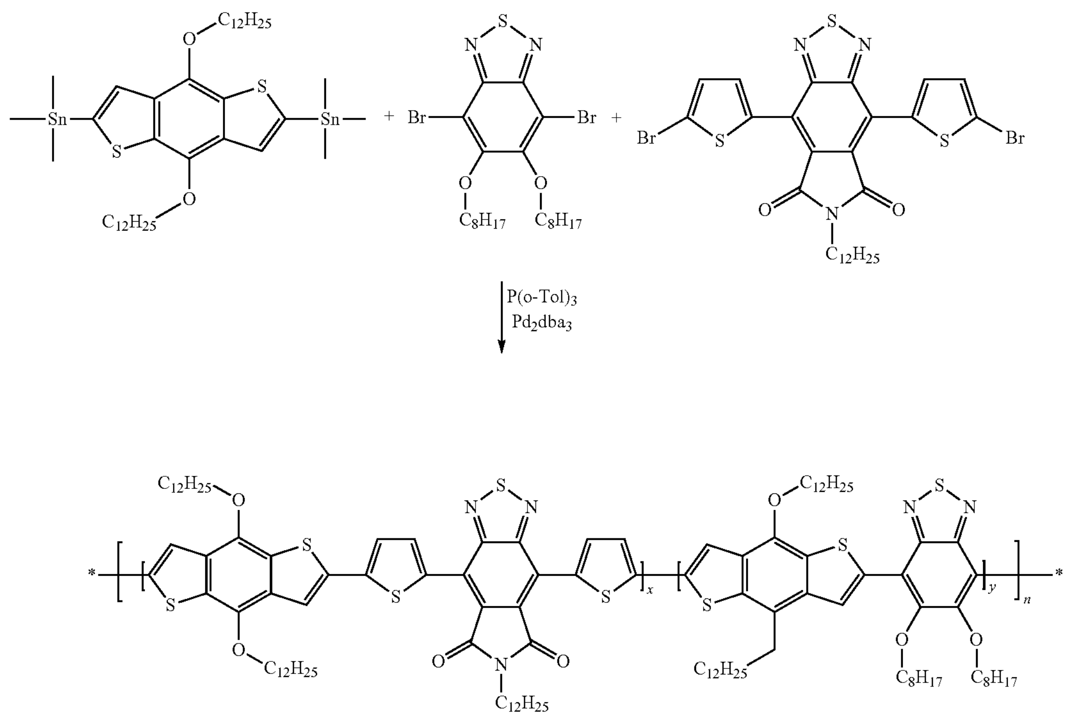

A dry 20 $cm^3$ single neck microwave vial is charged with 4,8-dodecyloxy-2,6-bis-trimethylstannanyl-benzo[1,2-b;4,5-b']dithiophene (398.0 mg; 0.4500 mmol; 1.000 eq.), 4,7-dibromo-5,6-bis-octyloxy-benzo[1,2,5]thiadiazole (123.8 mg; 0.2250 mmol; 0.5000 eq.), 4,8-bis-(5-bromo-thiophen-2-yl)-6-dodecyl-[1,2,5]thiadiazolo[3,4-e]isoindole-5,7-dione (156.5 mg; 0.2250 mmol; 0.5000 eq.), tri-o-tolyl-phosphine (21.9 mg; 72.0 μmol; 0.160 eq.) and tris(dibenzylideneacetone)dipalladium(0) (16.5 mg; 18.0 μmol; 0.040 eq.). The vessel is evacuated and nitrogen purged three times and degassed chlorobenzene (5.6 $cm^3$) is added before the reaction mixture is degassed further for 15 minutes. The reaction mixture is heated up to 130° C. and stirred at this temperature for 45 minutes. After completion of the reaction, the reaction mixture is allowed to cool to 65° C. and precipitated into stirred methanol (150 $cm^3$). The polymer is collected by filtration and washed with methanol (2×50 $cm^3$) to give a solid. The polymer is then sequentially extracted by Soxhlet extraction with acetone, petroleum ether (40-60° C.), cyclohexane, and chloroform. The chloroform fraction is concentrated in vacuo to 75 $cm^3$, precipitated by addition of methanol (100 $cm^3$) and collected by filtration to give a black solid (434 mg). GPC (50° C., chlorobenzene) $M_n$=76.5 kg $mol^{-1}$; $M_w$=129.9 kg $mol^{-1}$; PDI=1.7

Example 24—Polymer 24

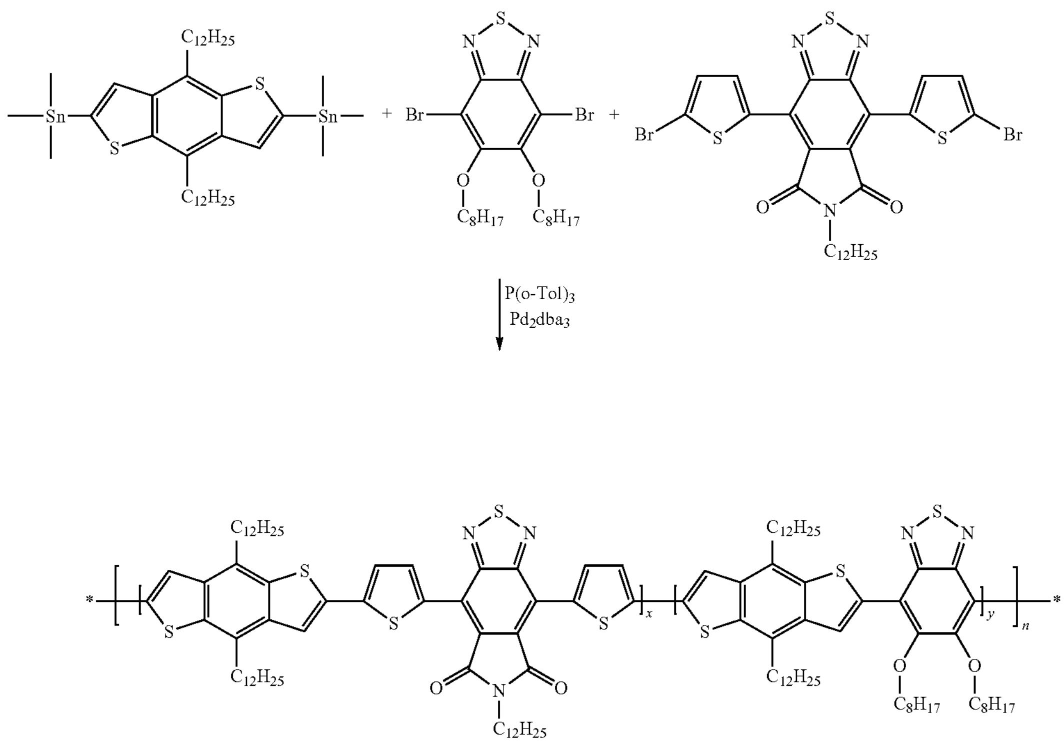

A dry 20 $cm^3$ single neck microwave vial is charged with 4,8-didodecyl-2,6-bis-trimethylstannanyl-benzo[1,2-b;4,5-b']dithiophene (398.0 mg; 0.4500 mmol; 1.000 eq.), 4,7-dibromo-5,6-bis-octyloxy-benzo[1,2,5]thiadiazole (61.9 mg; 0.113 mmol; 0.250 eq.), 4,8-bis-(5-bromo-thiophen-2-yl)-6-dodecyl-[1,2,5]thiadiazolo[3,4-e]isoindole-5,7-dione (234.8 mg; 0.3375 mmol; 0.7500 eq.), tri-o-tolyl-phosphine (21.9 mg; 72.0 μmol; 0.160 eq.) and tris(dibenzylideneacetone)dipalladium(0) (16.5 mg; 18.0 μmol; 0.0400 eq.). The vessel is evacuated and nitrogen purged three times and degassed chlorobenzene (5.6 $cm^3$) is added before the reaction mixture is degassed further for 15 minutes. The reaction mixture is heated up to 130° C. and stirred at this temperature for 45 minutes. After completion of the reaction, the reaction mixture is allowed to cool to 65° C. and precipitated into stirred methanol (150 $cm^3$). The polymer is collected by filtration and washed with methanol (2×50 $cm^3$) to give a solid. The polymer is then sequentially extracted by Soxhlet extraction with acetone, petroleum ether (40-60° C.), cyclohexane, and chloroform. The chloroform fraction is concentrated in vacuo to 75 $cm^3$, precipitated by addition of methanol (100 $cm^3$) and collected by filtration to give a black solid (94 mg,). GPC (50° C., chlorobenzene) $M_n$=23.2 kg $mol^{-1}$; $M_w$=166.9 kg $mol^{-1}$; PDI=7.20.

Example 25—Polymer 25

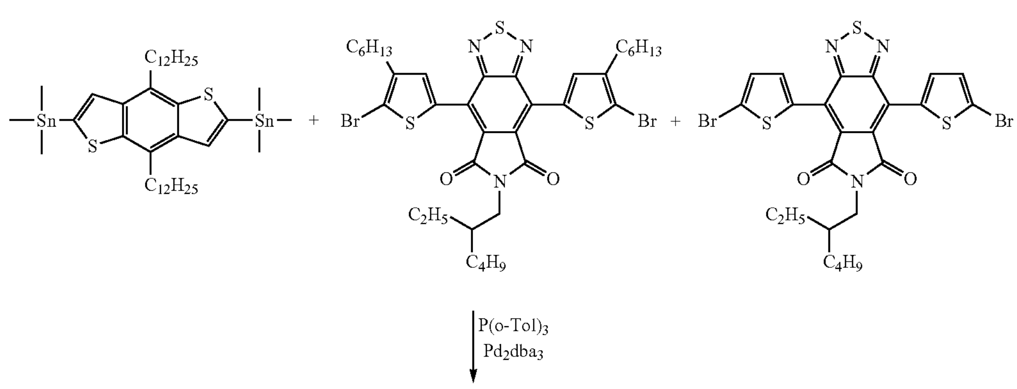

-continued

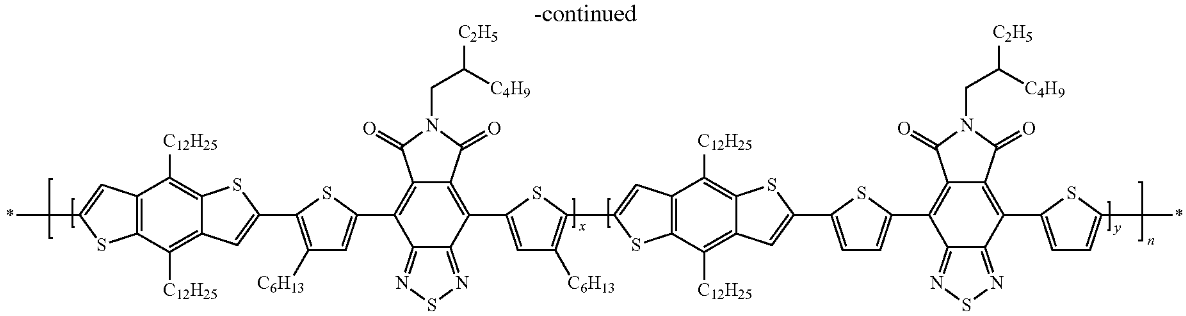

4,8-Bis-(5-bromo-4-hexyl-thiophen-2-yl)-6-(2-ethyl-hexyl)-[1,2,5]thiadiazolo[3,4-e]isoindole-5,7-dione is prepared according to a similar procedure to example 18.1.

To a dry flask is added 4,8-didodecyl-2,6-bis-trimethyl-stannanyl-benzo[1,2-b;4,5-b']dithiophene (295.0 mg; 0.3460 mmol; 1.0000 eq.), 4,8-bis-(5-bromo-4-hexyl-thiophen-2-yl)-6-(2-ethyl-hexyl)-[1,2,5]thiadiazolo[3,4-e]isoindole-5,7-dione (184.5 mg; 0.2284 mmol; 0.6600 eq.), 4,8-bis-(5-bromo-thiophen-2-yl)-6-(2-ethyl-hexyl)-[1,2,5]thiadiazolo[3,4-e]isoindole-5,7-dione (75.2 mg; 0.118 mmol; 0.3400 eq.), tri-o-tolyl-phosphine (16.8 mg; 0.0554 mmol; 0.1600 eq.) and tris(dibenzylideneacetone)dipalladium(0) (12.7 mg; 0.0138 mmol; 0.0400 eq.). The vessel is evacuated and nitrogen purged three times and degassed chlorobenzene (3.90 $cm^3$) is added before the reaction mixture is degassed further for 5 minutes. The reaction mixture is heated up to 140° C. and stirred at this temperature for 2 hours. After completion of the reaction, the reaction mixture is allowed to cool to 65° C. and precipitated into stirred methanol (250 $cm^3$). The polymer is collected by filtration and washed with methanol (2×50 $cm^3$) to give a solid. The polymer is subjected to sequential Soxhlet extraction with acetone, petroleum ether (40-60° C.), cyclohexane, chloroform and chlorobenzene. The chlorobenzene fraction is concentrated in vacuo to 20 $cm^3$, precipitated into stirred methanol (250 $cm^3$) and collected by filtration to give a black solid (357 mg, Yield: 72%). GPC (50° C., chlorobenzene) $M_n$=37 kg $mol^{-1}$; $M_w$=76.5 kg $mol^{-1}$; PDI=2.1

Example 26—Polymer 26

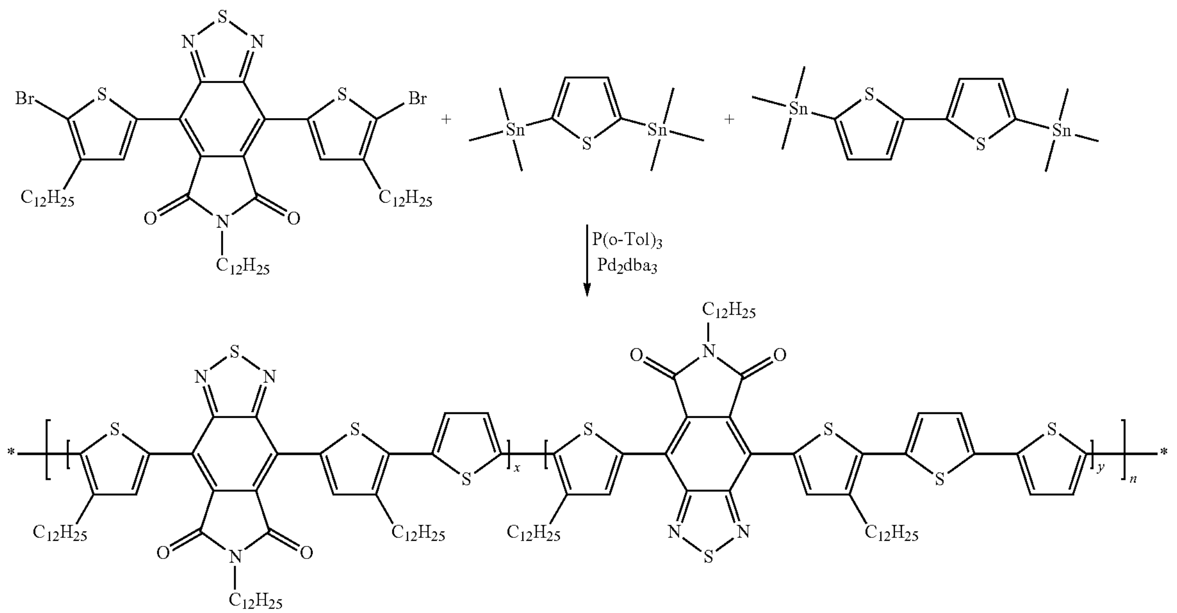

To a dry flask is added 4,8-bis-(5-bromo-4-dodecyl-thiophen-2-yl)-6-dodecyl-[1,2,5]thiadiazolo[3,4-e]isoindole-5,7-dione (110.0 mg; 0.1066 mmol; 1.000 eq.), 2,5-bis-trimethylstannanyl-thiophene (32.7 mg; 0.0799 mmol; 0.750 eq.), 5,5'-bis-trimethylstannanyl-[2,2']bithiophenyl (13.1 mg; 0.0266 mmol; 0.250 eq.), tris(dibenzylideneacetone)dipalladium(0) (3.9 mg; 0.00043 mmol; 0.040 eq.), tri-o-tolyl-phosphane (5.2 mg; 0.017 mmol; 0.16 eq.). The vessel is evacuated and nitrogen purged three times and degassed chlorobenzene (1.33 $cm^3$) is added before the reaction mixture is degassed further for 5 minutes. The reaction mixture is heated up to 140° C. and stirred at this temperature for 16 hours. After completion of the reaction, the reaction mixture is allowed to cool to 65° C. and precipitated into stirred methanol (250 $cm^3$). The polymer is collected by filtration and washed with methanol (2×50 $cm^3$) to give a solid. The polymer is subjected to sequential Soxhlet extraction with acetone, petroleum ether (40-60° C.), cyclohexane, chloroform. The chloroform fraction is concentrated in vacuo to 20 $cm^3$, precipitated into stirred methanol (250 $cm^3$) and collected by filtration to give a black solid (80 mg). GPC (50° C., chlorobenzene) $M_n$=35.0 kg $mol^{-1}$; $M_w$=80.2 kg $mol^{-1}$; PDI=2.3.

Example 27—Polymer 27

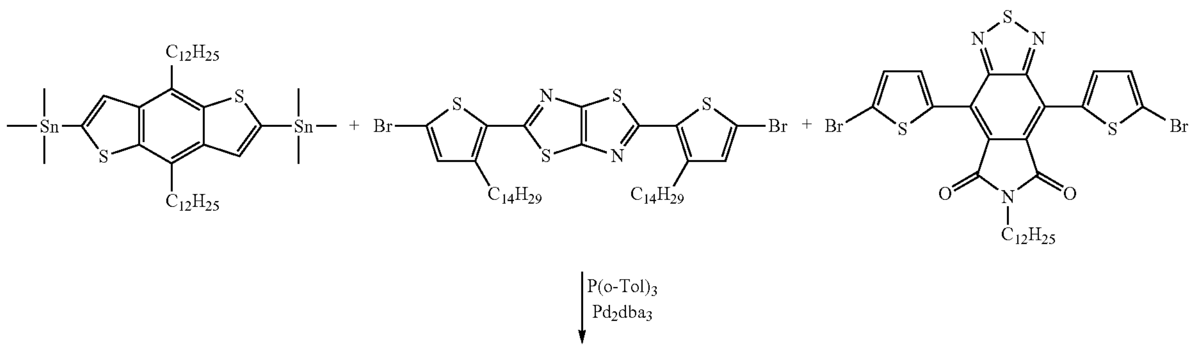

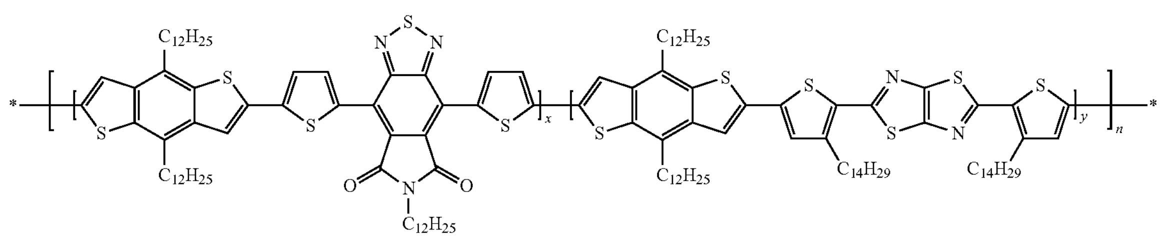

A dry 20 $cm^3$ single neck microwave vial is charged with 4,8-didodecyl-2,6-bis-trimethylstannanyl-benzo[1,2-b;4,5-b']dithiophene (383.6 mg; 0.4500 mmol; 1.000 eq.), 2,5-bis-(5-bromo-3-tetradecyl-thiophen-2-yl)-thiazolo[5,4-d]thiazole (192.8 mg; 0.2250 mmol; 0.5000 eq.), 4,8-bis-(5-bromo-thiophen-2-yl)-6-dodecyl-[1,2,5]thiadiazolo[3,4-e]isoindole-5,7-dione (156.5 mg; 0.2250 mmol; 0.5000 eq.), tri-o-tolyl-phosphine (21.9 mg; 72.0 μmol; 0.160 eq.) and tris(dibenzylideneacetone)dipalladium(0) (16.5 mg; 18.0 μmol; 0.040 eq.). The vessel is evacuated and nitrogen purged three times and degassed chlorobenzene (5.6 $cm^3$) is added before the reaction mixture is degassed further for 15 minutes. The reaction mixture is heated up to 130° C. and stirred at this temperature for 45 minutes. After completion of the reaction, the reaction mixture is allowed to cool to 65° C. and precipitated into stirred methanol (150 $cm^3$). The polymer is collected by filtration and washed with methanol (2×50 $cm^3$) to give a solid. The polymer is then sequentially extracted by Soxhlet extraction with acetone, petroleum ether (40-60° C.), cyclohexane, and chloroform. The chloroform fraction is concentrated in vacuo to 75 $cm^3$, precipitated by addition of methanol (100 $cm^3$) and collected by filtration to give a purple solid (289 mg). GPC (50° C., chlorobenzene) $M_n$=333.5 kg $mol^{-1}$; $M_w$=506.7 kg $mol^{-1}$; PDI=1.51.

Example 28—Polymer 28

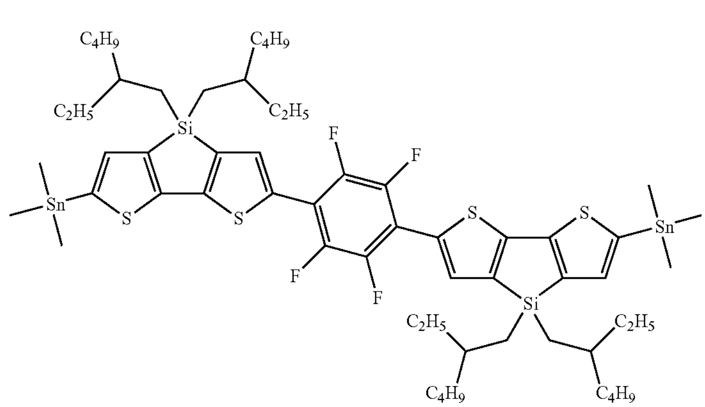

-continued

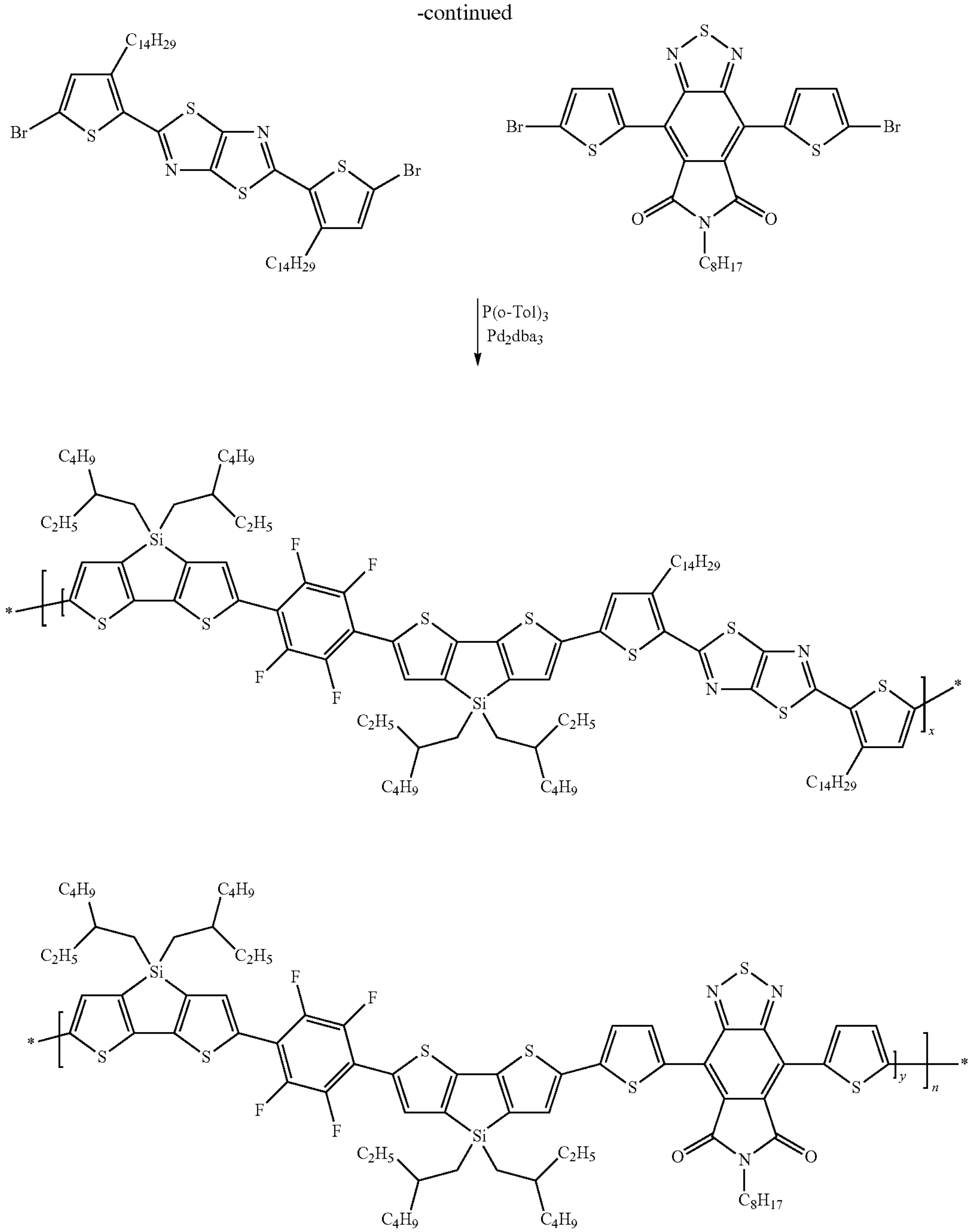

1,4-Bis-(5-trimethylstannanyl-7,7-bis-(2-ethyl-hexyl)-7H-3,4-dithia-7-sila-cyclopenta[a]pentalen-2-yl)-2,3,5,6-tetrafluorobenzene synthesis is described, for example, in WO 2012/149189 A2.

To a 5 $cm^3$ microwave vial is added 1,4-bis-(5-trimethylstannanyl-7,7-bis-(2-ethyl-hexyl)-7H-3,4-dithia-7-sila-cyclopenta[a]pentalen-2-yl)-2,3,5,6-tetrafluorobenzene (397.4 mg; 0.3035 mmol; 1.000 eq.), 4,8-bis-(5-bromo-thiophen-2-yl)-6-octyl-[1,2,5]thiadiazolo[3,4-e]isoindole-5,7-dione (97.1 mg; 0.152 mmol; 0.500 eq.), 2,5-bis-(5-bromo-3-tetradecyl-thiophen-2-yl)-thiazolo[5,4-d]thiazole (130.1 mg; 0.1518 mmol; 0.5000 eq.), tri-o-tolyl-phosphine (7.4 mg; 0.024 mmol; 0.080 eq.) and tris(dibenzylideneacetone) dipalladium(0) (5.6 mg; 0.0061 mmol; 0.020 eq.). The vessel is evacuated and nitrogen purged three times and degassed chlorobenzene (3.1 $cm^3$) is added before the reaction mixture is degassed further for 5 minutes. The reaction mixture is heated in 110° C. for 5 to 10 minutes until the reaction jellified. Immediately after completion of the reaction, the reaction mixture is allowed to cool to 65° C. and precipitated into stirred methanol (100 $cm^3$). The polymer is collected by filtration and washed with methanol (2×100 $cm^3$) to give a solid. The polymer is subjected to sequential Soxhlet extraction with acetone, petroleum ether (40-60° C.), cyclohexane and chloroform. Methanol (200 $cm^3$) is added to the chloroform fraction (150 $cm^3$) and the resulting precipitate is collected by filtration and dried in vacuo to give a black solid (405 mg, Yield: 85%). GPC (140° C., 1,2,4-trichlorobenzene): $M_n$=21.9 kg·mol$^{-1}$; $M_w$=43.3 kg·mol$^{-1}$; PDI=1.97.

Example 29—Polymer 29
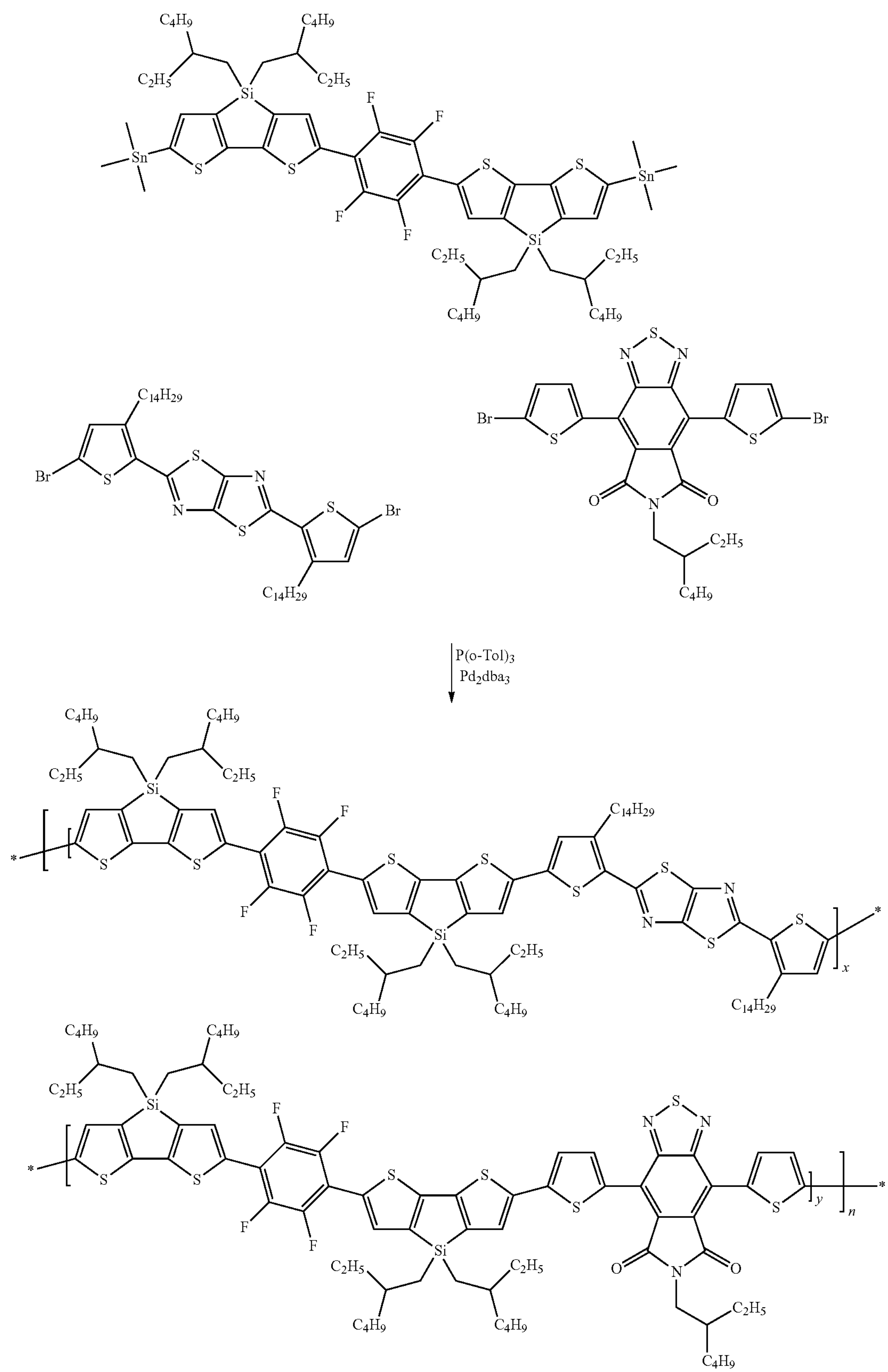

To a 5 $cm^3$ microwave vial is added 1,4-bis-(5-trimethylstannanyl-7,7-bis-(2-ethyl-hexyl)-7H-3,4-dithia-7-sila-cyclopenta[a]pentalen-2-yl)-2,3,5,6-tetrafluorobenzene (380.4 mg; 0.2906 mmol; 1.000 eq.), 4,8-bis-(5-bromo-thiophen-2-yl)-6-(2-ethyl-hexyl)-[1,2,5]thiadiazolo[3,4-e]isoindole-5,7-dione (167.2 mg; 0.2615 mmol; 0.900 eq.), 2,5-bis-(5-bromo-3-tetradecyl-thiophen-2-yl)-thiazolo[5,4-d]thiazole (24.9 mg; 0.0291 mmol; 0.100 eq.), tri-o-tolyl-phosphine (7.1 mg; 0.023 mmol; 0.080 eq.) and tris(dibenzylideneacetone)dipalladium(0) (5.3 mg; 0.0058 mmol; 0.020 eq.). The vessel is evacuated and nitrogen purged three times and degassed chlorobenzene (3.0 $cm^3$) is added before the reaction mixture is degassed further for 5 minutes. The reaction mixture is heated in 110° C. for 5 to 10 minutes until the reaction jellified. Immediately after completion of the reaction, the reaction mixture is allowed to cool to 65° C. and precipitated into stirred methanol (100 $cm^3$). The polymer is collected by filtration and washed with methanol (2×100 $cm^3$) to give a solid. The polymer is subjected to sequential Soxhlet extraction with acetone, petroleum ether (40-60° C.), cyclohexane and chloroform. Methanol (200 $cm^3$) is added to the chloroform fraction (150 $cm^3$) and the resulting precipitate is collected by filtration and dried in vacuo to give a black solid (125 mg). GPC (140° C., 1,2,4-trichlorobenzene): $M_n$=18.6 kg·mol$^{-1}$; $M_w$=38.5 kg·mol$^{-1}$; PDI=2.07.

Example 30—Polymer 30

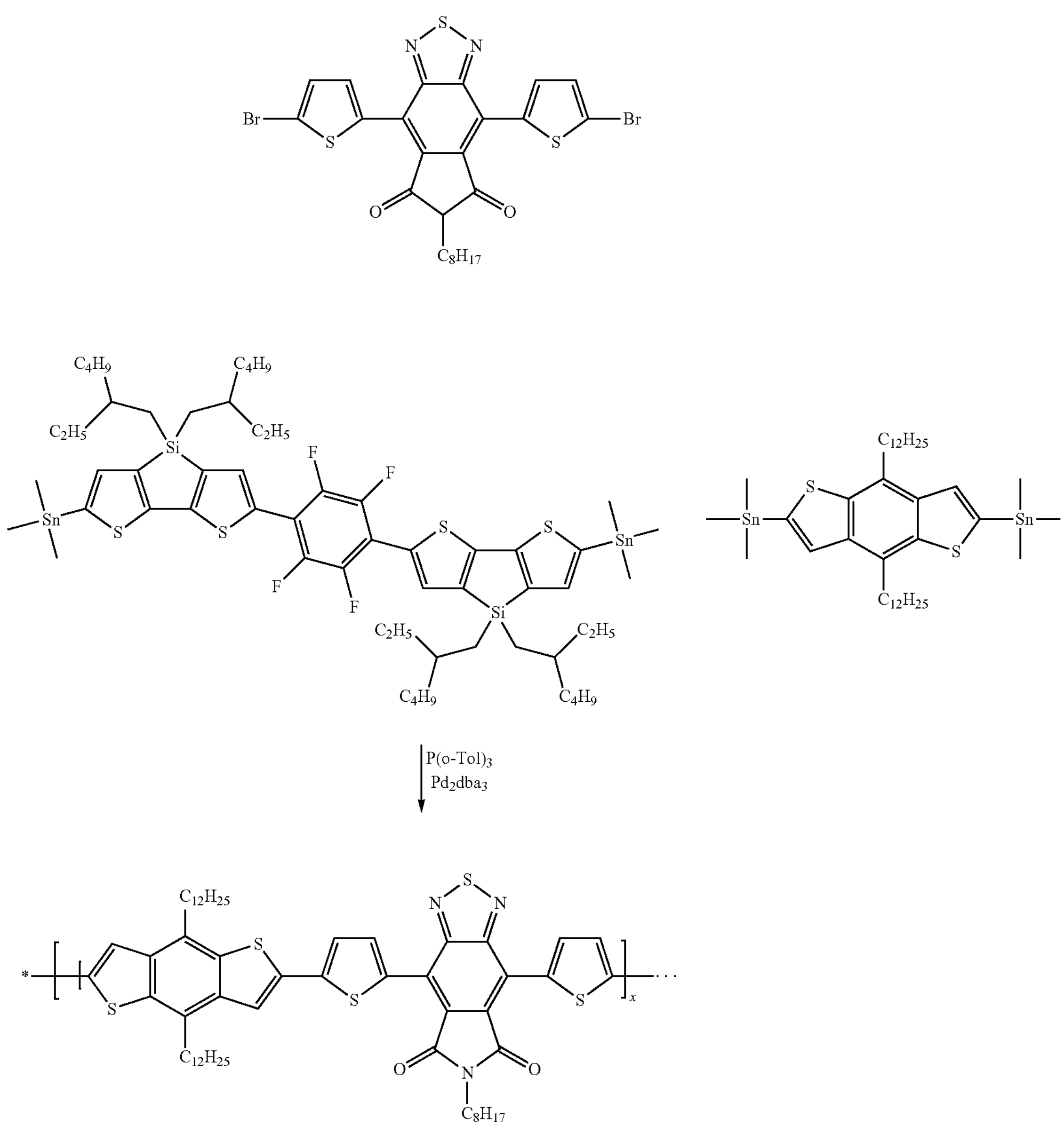

-continued

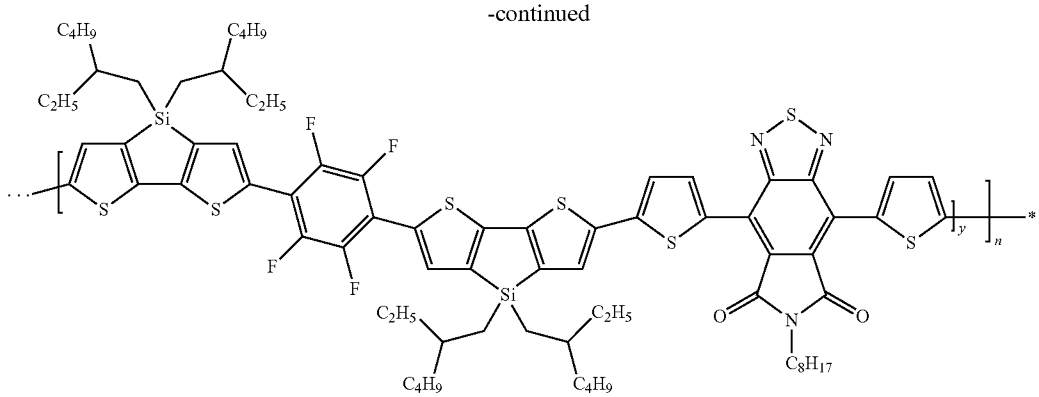

To a 20 cm[3] microwave vial is added 1,4-bis-(5-trimethylstannanyl-7,7-bis-(2-ethyl-hexyl)-7H-3,4-dithia-7-sila-cyclopenta[a]pentalen-2-yl)-2,3,5,6-tetrafluorobenzene (423.4 mg; 0.3234 mmol; 1.000 eq.), 4,8-bis-(5-bromo-thiophen-2-yl)-6-octyl-[1,2,5]thiadiazolo[3,4-e]isoindole-5,7-dione (413.6 mg; 0.6468 mmol; 2.000 eq.), 4,8-didodecyl-2,6-bis-trimethylstannanyl-benzo[1,2-b;4,5-b']dithiophene (275.7 mg; 0.3234 mmol; 1.000 eq.), tri-o-tolyl-phosphine (7.9 mg; 0.026 mmol; 0.080 eq.) and tris(dibenzylideneacetone)dipalladium(0) (5.9 mg; 0.0065 mmol; 0.020 eq.). The vessel is evacuated and nitrogen purged three times and degassed chlorobenzene (6.6 cm[3]) is added before the reaction mixture is degassed further for 5 minutes. The reaction mixture is heated in 110° C. for 5 to 10 minutes until the reaction jellified. Immediately after completion of the reaction, the reaction mixture is allowed to cool to 65° C. and precipitated into stirred methanol (100 cm[3]). The polymer is collected by filtration and washed with methanol (2×100 cm[3]) to give a solid. The polymer is subjected to sequential Soxhlet extraction with acetone, petroleum ether (40-60° C.), cyclohexane, chloroform and chlorobenzene. Methanol (200 cm[3]) is added to the chlorobenzene fraction (150 cm[3]) and the resulting precipitate is collected by filtration and dried in vacuo to give a black solid (728 mg, Yield: 91%). GPC (140° C., 1,2,4-trichlorobenzene): Mn=53.2 kg·mol$^{-1}$; Mw=115.8 kg·mol$^{-1}$; PDI=2.18.

Example 31—Polymer 31

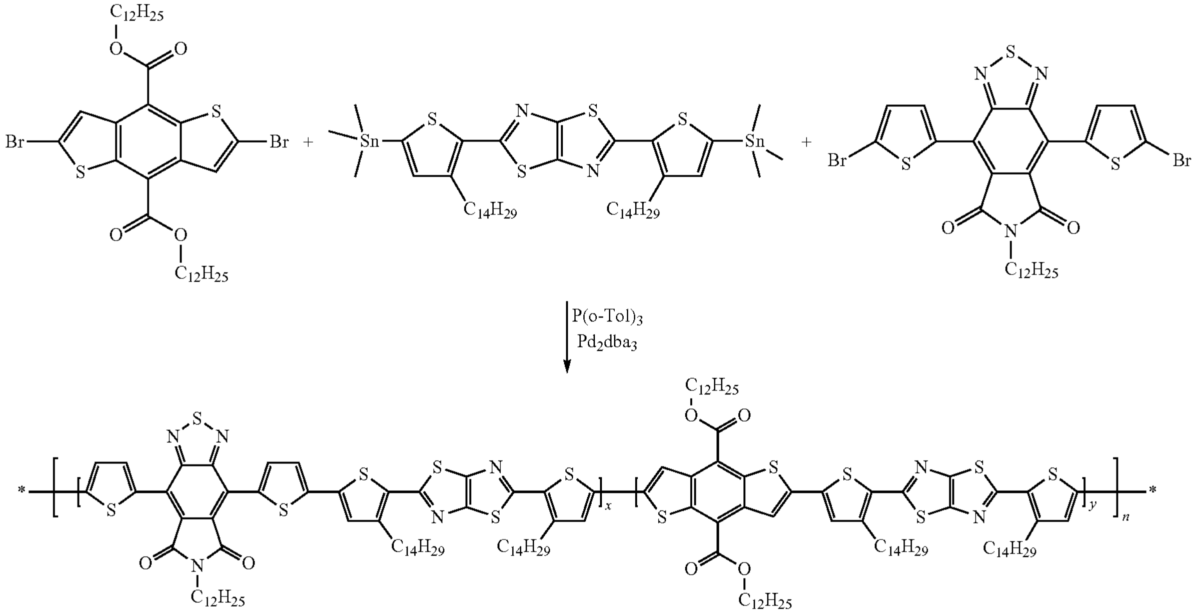

A dry 20 cm[3] single neck microwave vial is charged with 2,6-dibromo-benzo[1,2-b;4,5-b']dithiophene-4,8-dicarboxylic acid didodecyl ester (135.7 mg; 0.1756 mmol; 0.5000 eq.), 2,5-bis-(3-tetradecyl-5-trimethylstannanyl-thiophen-2-yl)-thiazolo[5,4-d]thiazole (360.0 mg; 0.3513 mmol; 1.000 eq.), 4,8-bis-(5-bromo-thiophen-2-yl)-6-dodecyl-[1,2,5]thiadiazolo[3,4-e]isoindole-5,7-dione (122.2 mg; 0.1756 mmol; 0.5000 eq.), tri-o-tolyl-phosphine (8.5 mg; 28 μmol; 0.080 eq.) and tris(dibenzylideneacetone)dipalladium(0) (6.4 mg; 7.0 μmol; 0.020 eq.). The vessel is evacuated and nitrogen purged three times and degassed chlorobenzene (3.6 cm[3]) is added before the reaction mixture is degassed further for 15 minutes. The reaction mixture is heated up to 130° C. and stirred at this temperature for 45 minutes. After completion of the reaction, the reaction mixture is allowed to cool to 65° C. and precipitated into stirred methanol (150 $cm^3$). The polymer is collected by filtration and washed with methanol (2×50 $cm^3$) to give a solid. The polymer is then sequentially extracted by Soxhlet extraction with acetone, petroleum ether (40-60° C.), cyclohexane, and chloroform. The chloroform fraction is concentrated in vacuo to 75 $cm^3$, precipitated by addition of methanol (100 $cm^3$) and collected by filtration to give a black solid (115 mg). GPC (140° C., 1,2,4-trichlorobenzene) $M_n$=14.1 kg $mol^{-1}$; $M_w$=27.4 kg $mol^{-1}$; PDI=1.94.

Example 32—Example 32.1

1-{2-[2-(2-methoxy-ethoxy)-ethoxy]-ethyl}-pyrrole-2,5-dione

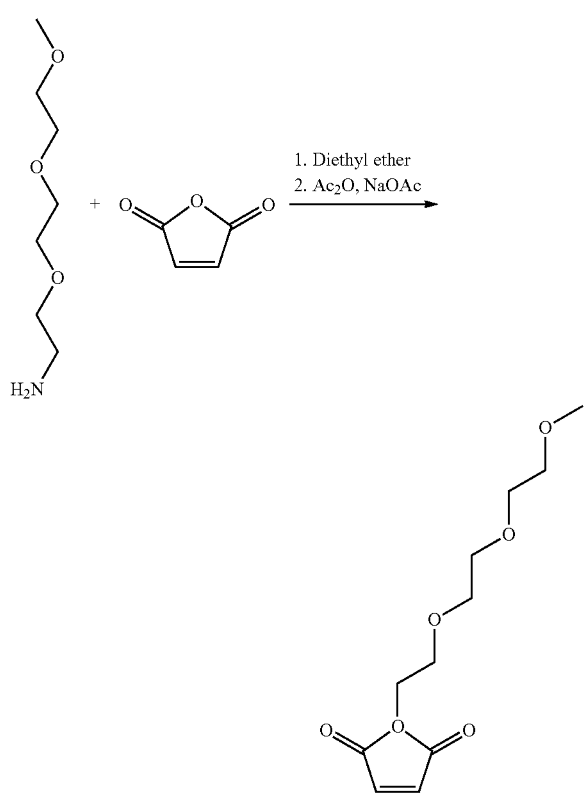

To a flask containing maleic anhydride (10.95 g, 111.7 mmol, 1.2000 eq) and diethyl ether (360 $cm^3$) is added 2-[2-(2-methoxy-ethoxy)-ethoxy]-ethylamine (15.19 g, 93.07 mmol, 1.000 eq.). The reaction mixture is stirred at 23° C. for 2 hours, and then, water (200 $cm^3$) is added and phases are separated, dried over magnesium sulphate and concentrated in vacuo. Acetic anhydride (360 $cm^3$) and sodium acetate (2.88 g, 35.1 mmol, 0.314 eq.) are added to the reaction mixture and mixture is stirred at 100° C. for 2 hours. After cooling to 23° C., water (250 $cm^3$) and diethyl ether (200 $cm^3$) are added to the mixture. Phases are separated. The organic phase is dried over magnesium sulphate and concentrated in vacuo. The crude product is purified by flash column chromatography using dichloromethane as an eluent to afford a beige oil (8.61 g, Yield: 38%). The crude product is used without further purification.

Example 32.2—4,8-Bis-(5-bromo-thiophen-2-yl)-6-{2-[2-(2-methoxy-ethoxy)-ethoxy]-ethyl}-[1,2,5]thiadiazolo[3,4-e]isoindole-5,7-dione

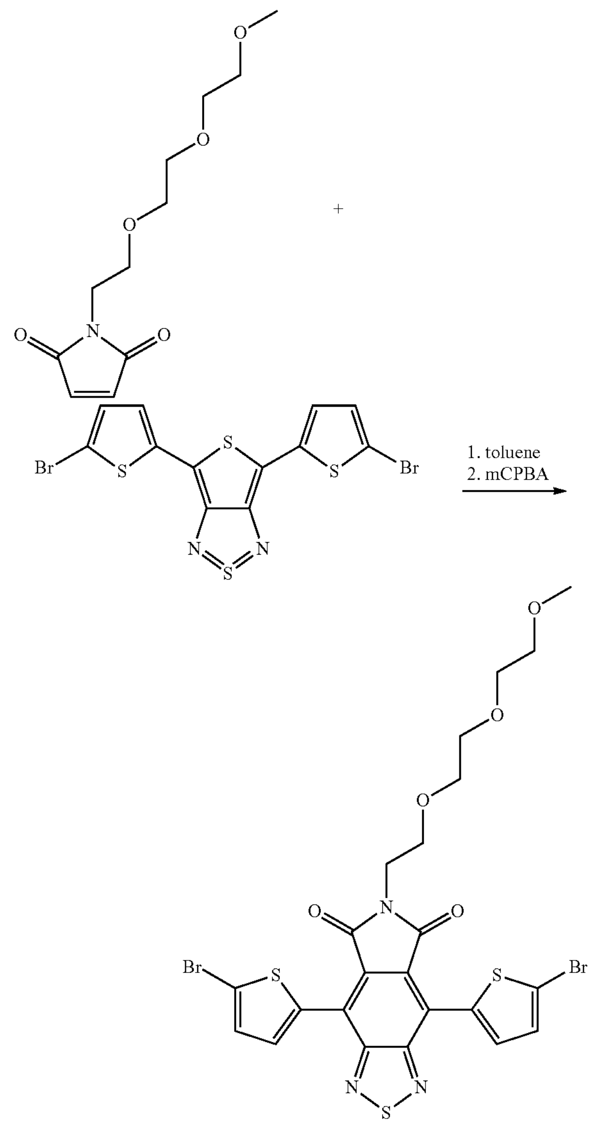

5,7-Bis(5-bromo-2-thienyl)thieno[3,4-b]thiadiazole (4.110 g, 8.848 mmol, 1.000 eq), 1-{2-[2-(2-methoxy-ethoxy)-ethoxy]-ethyl}-pyrrole-2,5-dione (8.610 g, 35.39 mmol, 4.000 eq) and toluene (320 $cm^3$) are placed in a dry flask and stirred at 105° C. for 72 hours. Reaction is cooled to ambient temperature and 3-chloro-benzenecarboperoxoic acid (9.162 g, 53.09 mmol, 5.500 eq) is added to the reaction mixture. Mixture is stirred at ambient temperature for 24 hours before solvent is removed in vacou. Crude material is redissolved in dichloromethane (30 $cm^3$), absorbed on silica and the solvent evaporated. The crude product is purified using Biotage flash chromatography (Petroleum ether/dichloromethane 80:20) followed by recrystallization from acetonitrile to afford the title product as red solid (1.19 g, 19.9% yield). $^1$H NMR (300 MHz, $CDCl_3$) δ ppm 7.78 (2H, d, J=4.05 Hz) 7.22 (2H, d, J=4.05 Hz) 3.93-3.99 (2H, m) 3.74-3.82 (2H, m) 3.64-3.69 (2H, m) 3.56-3.63 (4H, m) 3.44-3.48 (2H, m) 3.31 (3H, s)

Example 32.3—Polymer 32

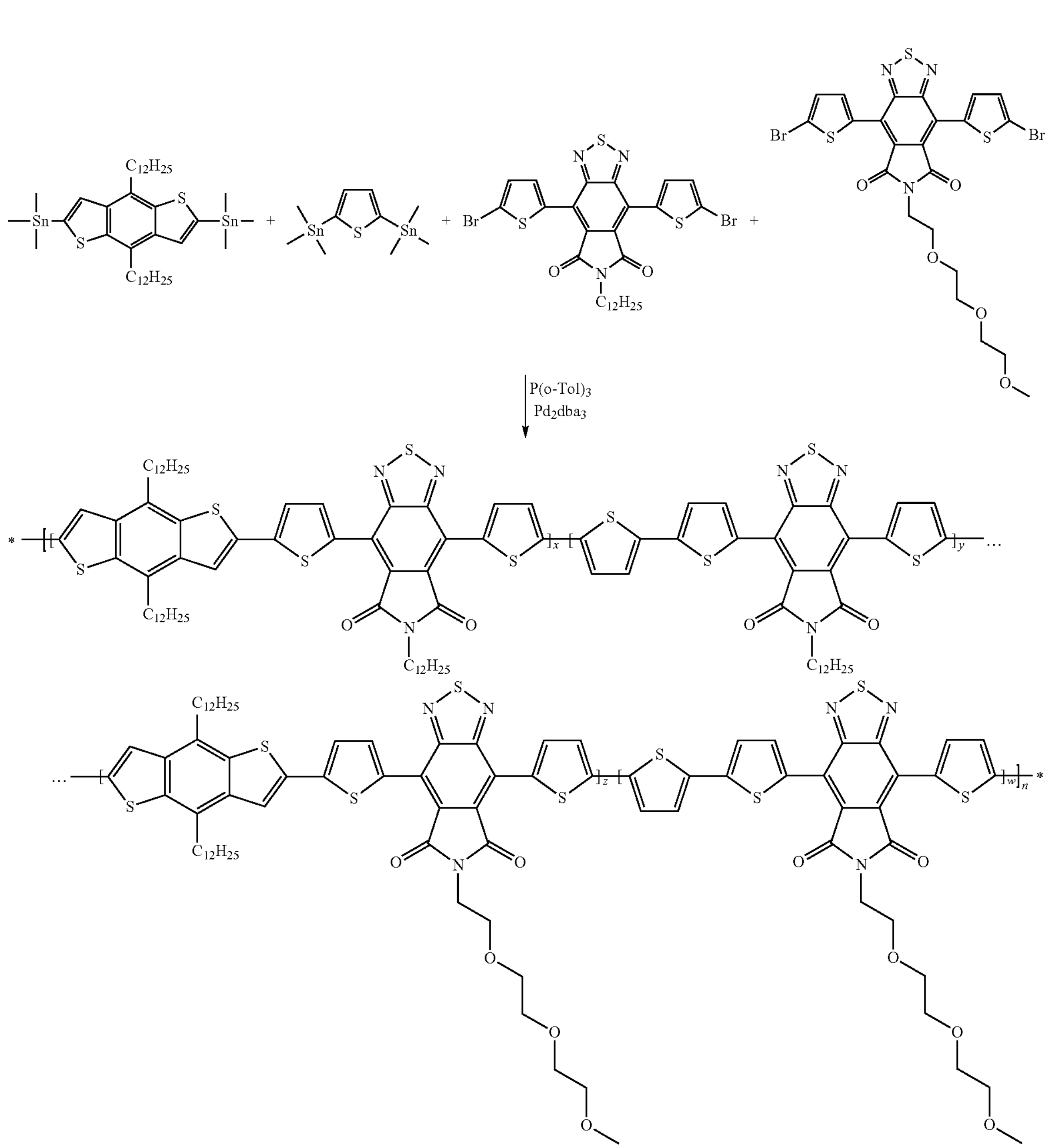

To a dry flask is added 4,8-didodecyl-2,6-bis-trimethylstannanyl-benzo[1,2-b;4,5-b']dithiophene (383.6 mg; 0.4500 mmol; 1.000 eq.), 4,8-bis-(5-bromo-thiophen-2-yl)-6-dodecyl-[1,2,5]thiadiazolo[3,4-e]isoindole-5,7-dione (313.0 mg; 0.4500 mmol; 1.000 eq.), 2,5-bis-trimethylstannanyl-thiophene (20.3 mg; 0.0495 mmol; 0.110 eq.), 4,8-Bis-(5-bromo-thiophen-2-yl)-6-{2-[2-(2-methoxy-ethoxy)-ethoxy]-ethyl}-[1,2,5]thiadiazolo[3,4-e]isoindole-5,7-dione (33.3 mg; 0.0495 mmol; 0.110 eq.), tri-o-tolyl-phosphine (21.9 mg; 72.0 μmol; 0.1600 eq.) and tris(dibenzylideneacetone)dipalladium(0) (16.5 mg; 18.0 μmol; 0.0400 eq.). The vessel is evacuated and nitrogen purged three times and degassed chlorobenzene (5.6 $cm^3$) is added before the reaction mixture is degassed further for 5 minutes. The reaction mixture is heated up to 115° C. and stirred at this temperature for 5 minutes. After completion of the reaction, the reaction mixture is allowed to cool to 65° C. and precipitated into stirred methanol (250 $cm^3$). The polymer is collected by filtration and washed with methanol (2×50 $cm^3$) to give a solid. The polymer is subjected to sequential Soxhlet extraction with acetone, petroleum ether (40-60° C.), cyclohexane, chloroform and chlorobenzene. The chlorobenzene fraction is concentrated in vacuo to 20 $cm^3$, precipitated into stirred methanol (250 $cm^3$) and collected by filtration to give a black solid (60.0 mg). GPC (50° C., chlorobenzene) $M_n$=41 kg $mol^{-1}$; $M_w$=141 kg $mol^{-1}$; PDI=3.4.

Example 33—Polymer 33

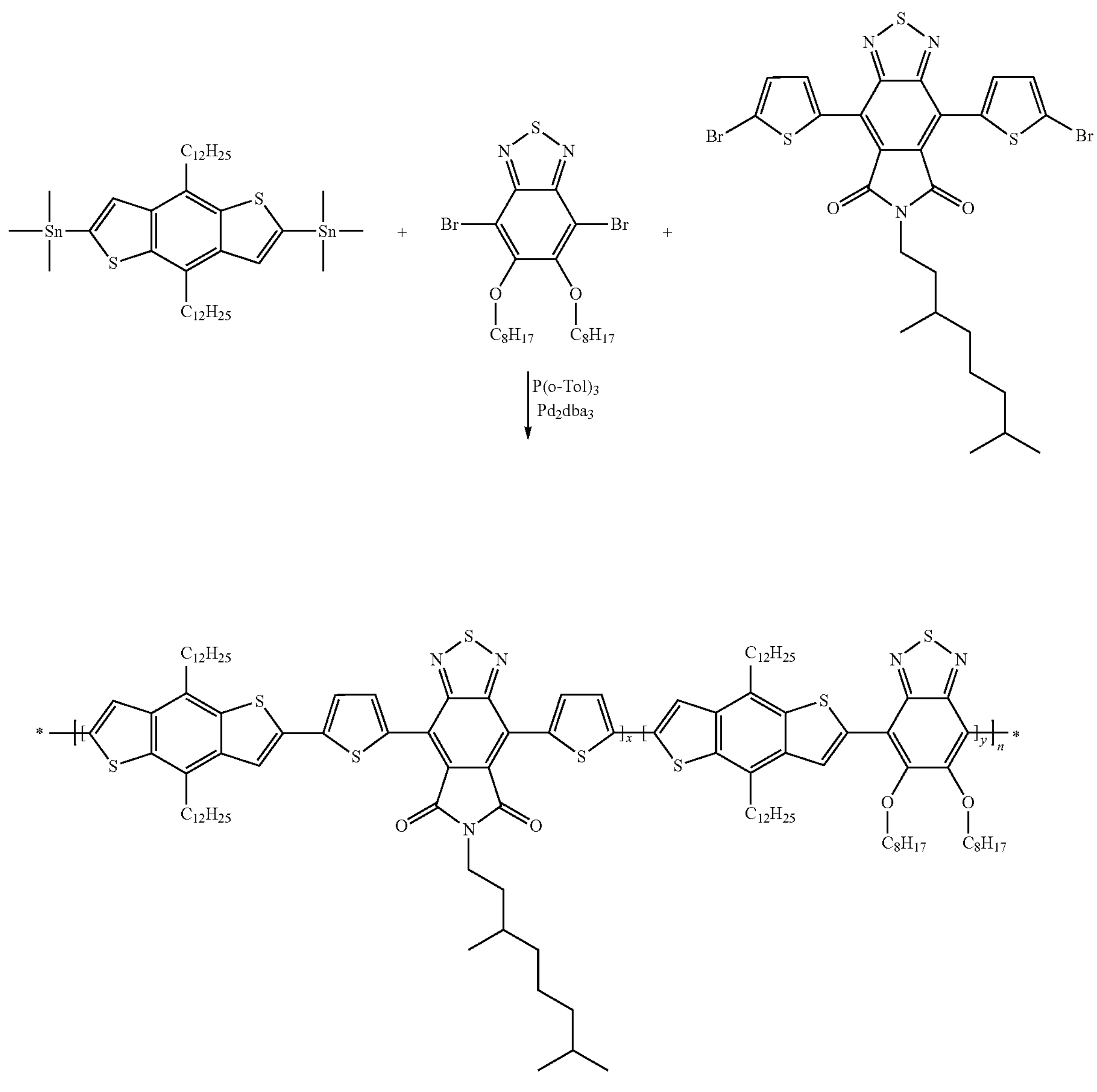

To a dry flask is added 4,8-didodecyl-2,6-bis-trimethyl-stannanyl-benzo[1,2-b;4,5-b']dithiophene (383.6 mg; 0.4500 mmol; 1.000 eq.), 4,8-bis-(5-bromo-thiophen-2-yl)-6-(3,7-dimethyl-octyl)-[1,2,5]thiadiazolo[3,4-e]isoindole-5,7-dione (150.2 mg; 0.2300 mmol; 0.5000 eq.), 4,7-dibromo-5,6-bis-octyloxy-benzo[1,2,5]thiadiazole (123.8 mg; 0.2300 mmol; 0.5000 eq.), tri-o-tolyl-phosphine (21.9 mg; 72.00 μmol; 0.160 eq.) and tris(dibenzylideneacetone)dipalladium (0) (16.5 mg; 18.00 μmol; 0.0400 eq.). The vessel is evacuated and nitrogen purged three times and degassed chlorobenzene (5.6 $cm^3$) is added before the reaction mixture is degassed further for 5 minutes. The reaction mixture is heated up to 115° C. and stirred at this temperature for 90 minutes. After completion of the reaction, the reaction mixture is allowed to cool to 65° C. and precipitated into stirred methanol (250 $cm^3$). The polymer is collected by filtration and washed with methanol (2×50 $cm^3$) to give a solid. The polymer is subjected to sequential Soxhlet extraction with acetone, petroleum ether (40-60° C.), cyclohexane, chloroform. The chloroform fraction is concentrated in vacuo to 20 $cm^3$, precipitated into stirred methanol (250 $cm^3$) and collected by filtration to give a black solid (390.0 mg, Yield: 90%). GPC (50° C., chlorobenzene) $M_n$=36.7 kg $mol^{-1}$; $M_w$=91.1 kg $mol^{-1}$; PDI=2.6.

Example 34—Polymer 34

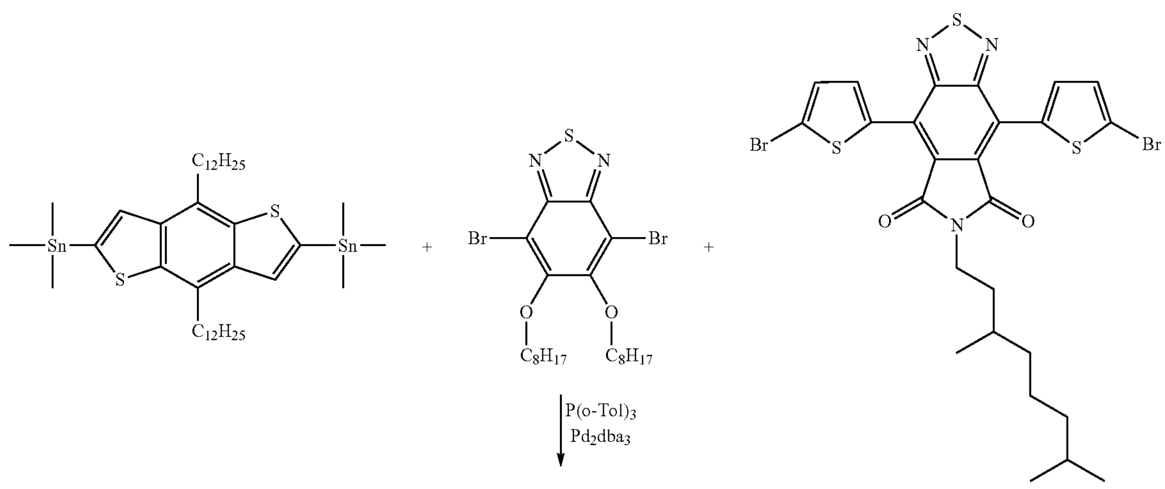

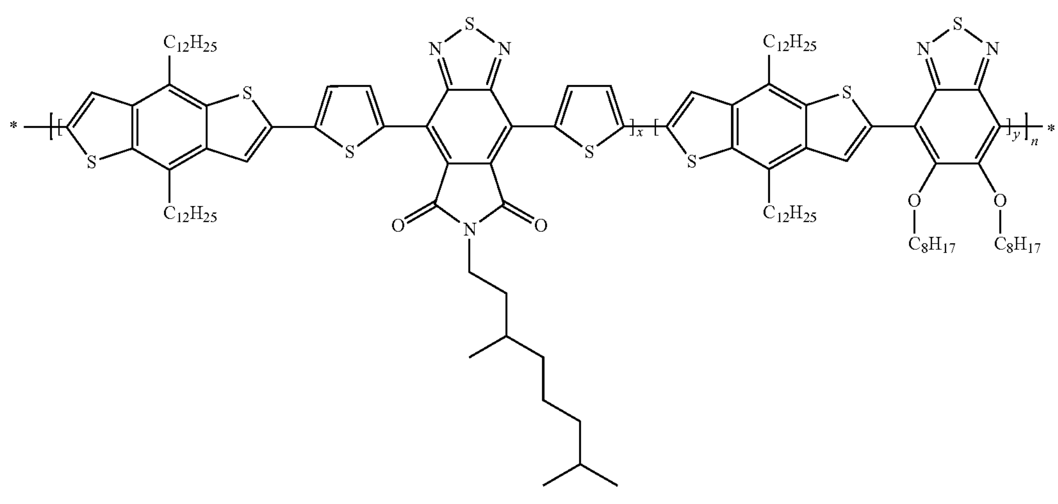

To a dry flask is added 4,8-didodecyl-2,6-bis-trimethyl-stannanyl-benzo[1,2-b;4,5-b']dithiophene (383.6 mg; 0.4500 mmol; 1.0000 eq.), 4,8-bis-(5-bromo-thiophen-2-yl)-6-(3,7-dimethyl-octyl)-[1,2,5]thiadiazolo[3,4-e]isoindole-5,7-dione (225.3 mg; 0.3375 mmol; 0.7500 eq.), 4,7-dibromo-5,6-bis-octyloxy-benzo[1,2,5]thiadiazole (61.9 mg; 0.1125 mmol; 0.2500 eq.), tri-o-tolyl-phosphine (21.9 mg; 72.0 μmol; 0.160 eq.) and tris(dibenzylideneacetone)dipalladium (0) (16.5 mg; 18.0 μmol; 0.0400 eq.). The vessel is evacuated and nitrogen purged three times and degassed chlorobenzene (5.6 $cm^3$) is added before the reaction mixture is degassed further for 5 minutes. The reaction mixture is heated up to 115° C. and stirred at this temperature for 10 minutes. After completion of the reaction, the reaction mixture is allowed to cool to 65° C. and precipitated into stirred methanol (250 $cm^3$). The polymer is collected by filtration and washed with methanol (2×50 $cm^3$) to give a solid. The polymer is subjected to sequential Soxhlet extraction with acetone, petroleum ether (40-60° C.), cyclohexane, chloroform and chlorobenzene. The chlorobenzene fraction is concentrated in vacuo to 20 $cm^3$, precipitated into stirred methanol (250 $cm^3$) and collected by filtration to give a black solid (390 mg). GPC (50° C., chlorobenzene) $M_n$=74.2 kg $mol^{-1}$; $M_w$=253 kg $mol^{-1}$; PDI=3.47.

Example 35—Polymer 35

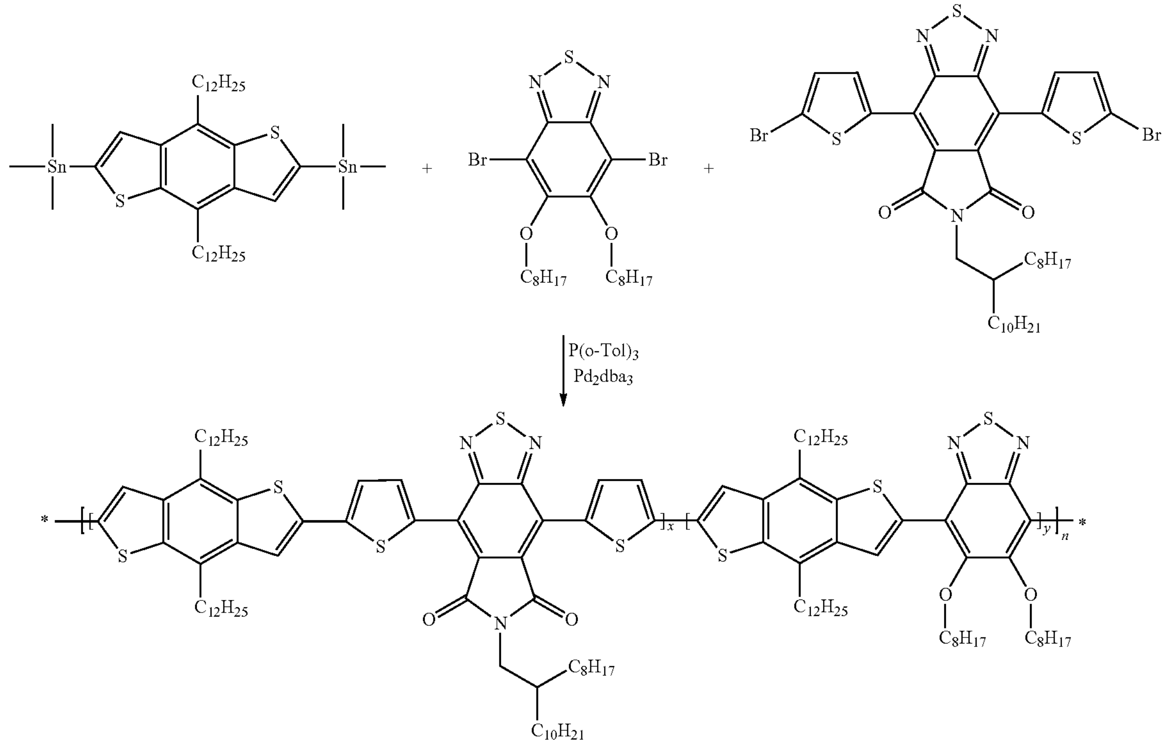

To a dry flask is added 4,8-didodecyl-2,6-bis-trimethyl-stannanyl-benzo[1,2-b;4,5-b']dithiophene (341.0 mg; 0.4000 mmol; 1.000 eq.), 4,8-bis-(5-bromo-thiophen-2-yl)-6-(2-octyl-dodecyl)-[1,2,5]thiadiazolo[3,4-e]isoindole-5,7-dione (242.3 mg; 0.3000 mmol; 0.7500 eq.), 4,7-dibromo-5,6-bis-octyloxy-benzo[1,2,5]thiadiazole (55.0 mg; 0.1000 mmol; 0.2500 eq.) tri-o-tolyl-phosphine (19.5 mg; 64.0 μmol; 0.160 eq.) and tris(dibenzylideneacetone)dipalladium (0) (14.6 mg; 16.0 μmol; 0.0400 eq.). The vessel is evacuated and nitrogen purged three times and degassed chlorobenzene (5.00 $cm^3$) is added before the reaction mixture is degassed further for 5 minutes. The reaction mixture is heated up to 115° C. and stirred at this temperature for 10 minutes. After completion of the reaction, the reaction mixture is allowed to cool to 65° C. and precipitated into stirred methanol (250 $cm^3$). The polymer is collected by filtration and washed with methanol (2×50 $cm^3$) to give a solid. The polymer is subjected to sequential Soxhlet extraction with acetone, petroleum ether (40-60° C.), cyclohexane and chloroform. The chloroform fraction is concentrated in vacuo to 20 $cm^3$, precipitated into stirred methanol (250 $cm^3$) and collected by filtration to give a black solid (390 mg, Yield: 93%). GPC (50° C., chlorobenzene) $M_n$=74.2 kg $mol^{-1}$; $M_w$=253 kg $mol^{-1}$; PDI=3.47.

Example 36—Polymer 36

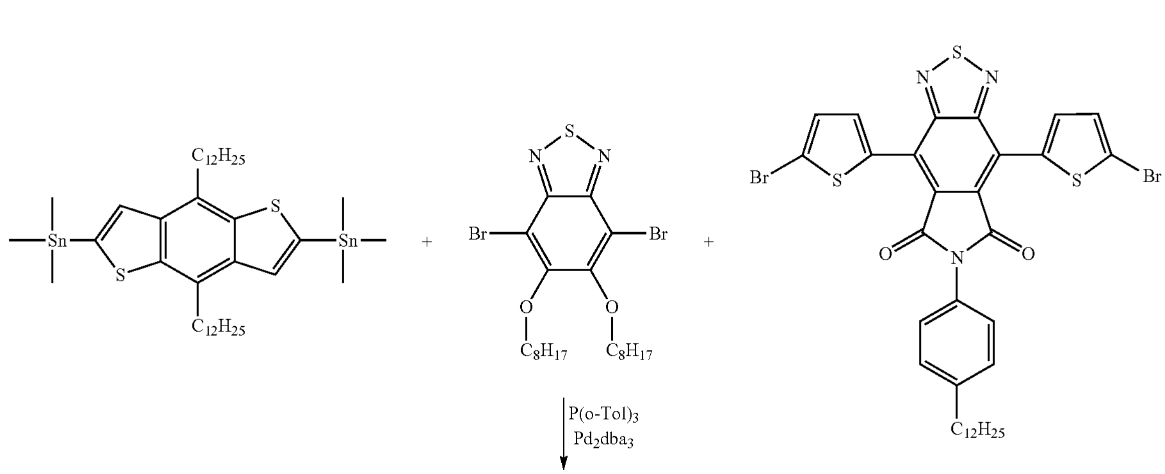

-continued

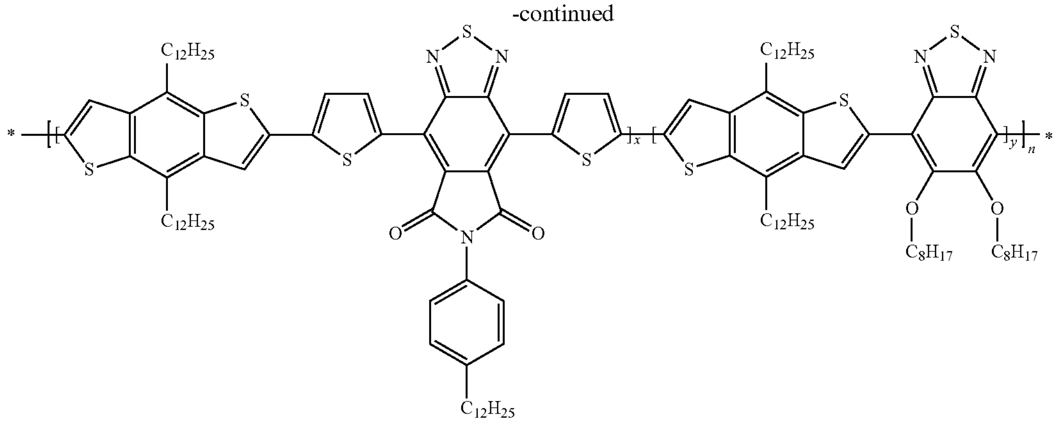

4,8-Didodecyl-2,6-bis-trimethylstannanyl-benzo[1,2-b;4,5-b']dithiophene (350.0 mg; 0.4105 mmol; 1.000 eq.), 4,7-dibromo-5,6-bis-octyloxy-benzo[1,2,5]thiadiazole (113.0 mg; 0.2053 mmol; 0.5000 eq.), 4,8-bis-(5-bromo-thiophen-2-yl)-6-(4-dodecyl-phenyl)-[1,2,5]thiadiazolo[3,4-e]isoindole-5,7-dione (158.4 mg; 0.2053 mmol; 0.5000 eq.), tri-o-tolyl-phosphine (20.0 mg; 65.7 μmol; 0.160 eq.) and tris(dibenzylideneacetone)dipalladium(0) (15.0 mg; 16.4 μmol; 0.0400 eq.) are placed in a microwave vial. The vial is sealed and degassed. Degassed chlorobenzene (5.1 $cm^3$) is added and the mixture further purged with nitrogen for 15 minutes. The vial is heated in an oil bath to 130° C. for 2 hours. The mixture is poured into methanol, the precipitate filtered and subjected to Soxhlet extraction with, subsequently, acetone, petroleum ether (40-60° C.), cyclohexane, chloroform and chlorobenzene. The chlorobenzene fraction is separately precipitated by addition into excess of methanol, filtered and dried in vacuo (342 mg, Yield: 81%). GPC (chlorobenzene, 50° C.): $M_n$=60.7 kg·mol$^{-1}$; Mw=149 kg·mol$^{-1}$; PDI=2.45.

Example 37—Polymer 37

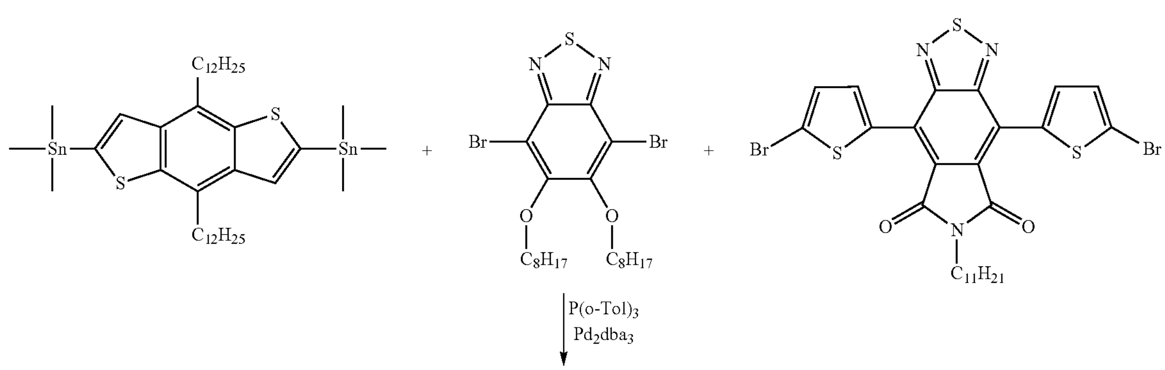

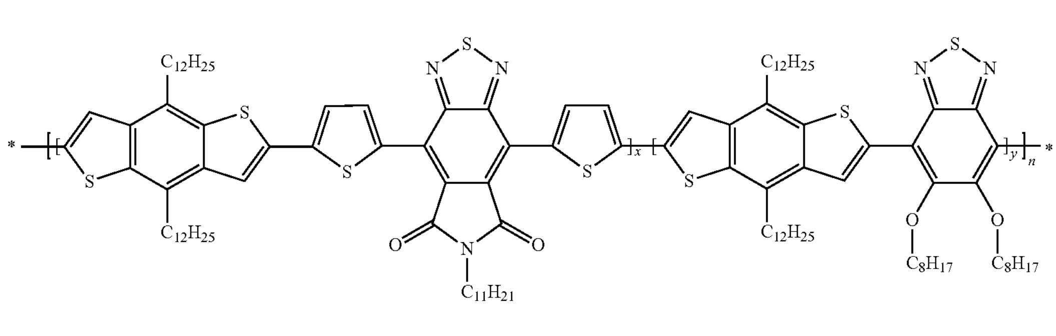

To a dry flask is added 4,8-didodecyl-2,6-bis-trimethyl-stannanyl-benzo[1,2-b;4,5-b']dithiophene (426.3 mg; 0.5000 mmol; 1.000 eq.), 4,8-bis-(5-bromo-thiophen-2-yl)-6-undecyl-[1,2,5]thiadiazolo[3,4-e]isoindole-5,7-dione (170.4 mg; 0.2500 mmol; 0.5000 eq.), 4,7-dibromo-5,6-bis-octyloxy-benzo[1,2,5]thiadiazole (137.6 mg; 0.2500 mmol; 0.5000 eq.), tri-o-tolyl-phosphine (24.3 mg; 80.0 μmol; 0.160 eq.) and tris(dibenzylideneacetone)dipalladium(0) (18.3 mg; 20.0 μmol; 0.0400 eq.). The vessel is evacuated and nitrogen purged three times and degassed chlorobenzene (6.25 $cm^3$) is added before the reaction mixture is degassed further for 5 minutes. The reaction mixture is heated up to 130° C. and stirred at this temperature for 90 minutes. After completion of the reaction, the reaction mixture is allowed to cool to 65° C. and precipitated into stirred methanol (250 $cm^3$). The polymer is collected by filtration and washed with methanol (2×50 $cm^3$) to give a solid. The polymer is subjected to sequential Soxhlet extraction with acetone, petroleum ether (40-60° C.), cyclohexane, chloroform. The chloroform fraction is concentrated in vacuo to 20 $cm^3$, precipitated into stirred methanol (250 $cm^3$) and collected by filtration to give a black solid (460 mg, Yield: 94%). GPC (50° C., chlorobenzene) $M_n$=39 kg $mol^{-1}$; $M_w$=134 kg $mol^{-1}$; PDI=3.4.

Example 38—Polymer 38

To a dry flask is added 4,8-didodecyl-2,6-bis-trimethyl-stannanyl-benzo[1,2-b;4,5-b']dithiophene (426.3 mg; 0.5000 mmol; 1.000 eq.), 4,8-bis-(5-bromo-thiophen-2-yl)-6-(2-octyl-dodecyl)-[1,2,5]thiadiazolo[3,4-e]isoindole-5,7-dione (201.9 mg; 0.2500 mmol; 0.5000 eq.), 4,7-dibromo-benzo[1,2,5]thiadiazole (73.5 mg; 0.250 mmol; 0.500 eq.), tri-o-tolyl-phosphine (24.3 mg; 80.0 μmol; 0.160 eq.) and tris(dibenzylideneacetone)dipalladium(0) (18.3 mg; 20.0 μmol; 0.0400 eq.). The vessel is evacuated and nitrogen purged three times and degassed chlorobenzene (6.25 $cm^3$) is added before the reaction mixture is degassed further for 5 minutes. The reaction mixture is heated up to 130° C. and stirred at this temperature for 5 minutes. After completion of the reaction, the reaction mixture is allowed to cool to 65° C. and precipitated into stirred methanol (250 $cm^3$). The polymer is collected by filtration and washed with methanol (2×50 $cm^3$) to give a solid. The polymer is subjected to sequential Soxhlet extraction with acetone, petroleum ether (40-60° C.), cyclohexane, chloroform. The chloroform fraction is concentrated in vacuo to 20 $cm^3$, precipitated into stirred methanol (250 $cm^3$) and collected by filtration to give a black solid (120 mg, Yield: 35%). GPC (50° C., chlorobenzene) $M_n$=105.5 kg $mol^{-1}$; $M_w$=264 kg $mol^{-1}$; PDI=2.5.

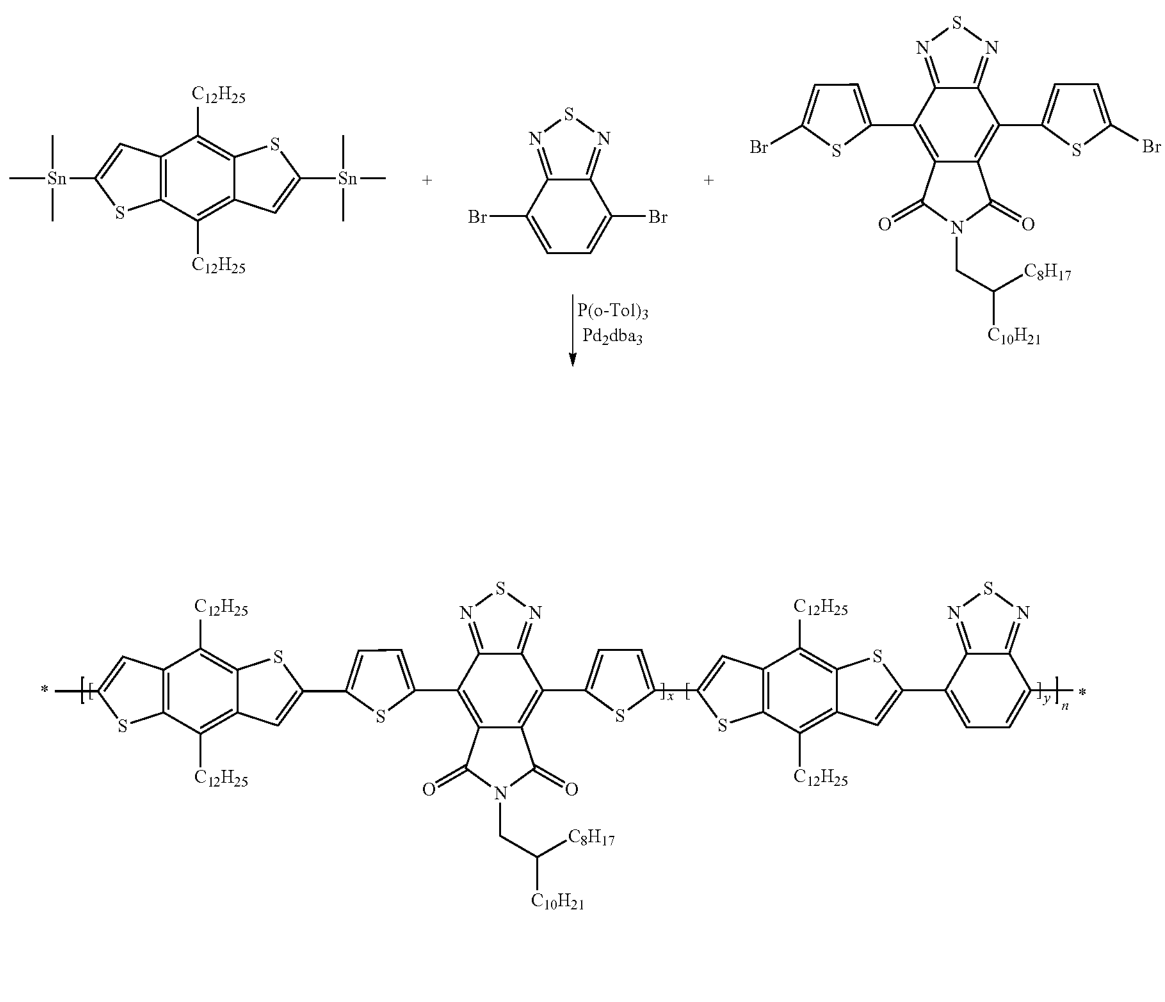

Example 39—Polymer 39

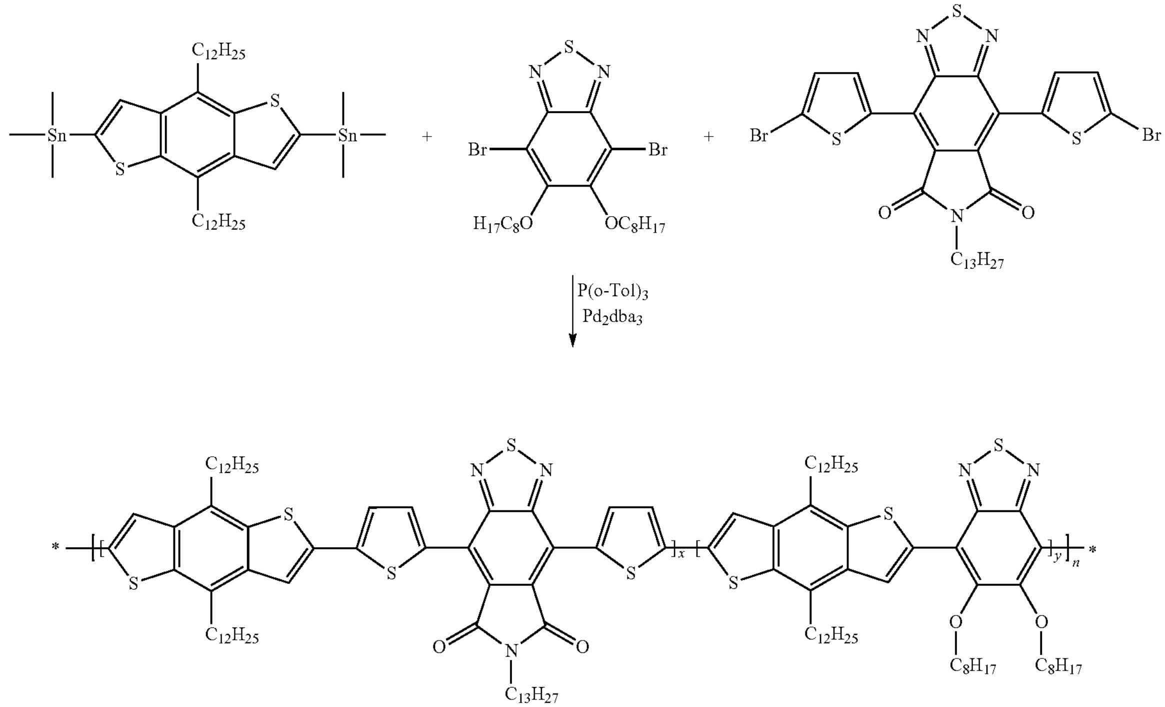

A dry 20 $cm^3$ single neck microwave vial is charged with 4,8-didodecyl-2,6-bis-trimethylstannanyl-benzo[1,2-b;4,5-b']dithiophene (341.0 mg; 0.4000 mmol; 1.000 eq.), 4,7-dibromo-5,6-bis-octyloxy-benzo[1,2,5]thiadiazole (110.1 mg; 0.2000 mmol; 0.5000 eq.), 4,8-bis-(5-bromo-thiophen-2-yl)-6-tridecyl-[1,2,5]thiadiazolo[3,4-e]isoindole-5,7-dione (141.9 mg; 0.2000 mmol; 0.5000 eq.), tri-o-tolyl-phosphine (19.5 mg; 64.0 μmol; 0.160 eq.) and tris(dibenzylideneacetone)dipalladium(0) (14.7 mg; 16.0 μmol; 0.0400 eq.). The vessel is evacuated and nitrogen purged three times and degassed chlorobenzene (5.0 $cm^3$) is added before the reaction mixture is degassed further for 15 minutes. The reaction mixture is heated up to 140° C. and stirred at this temperature for 2 hours 40 minutes. After completion of the reaction, the reaction mixture is allowed to cool to 65° C. and precipitated into stirred methanol (150 $cm^3$). The polymer is collected by filtration and washed with methanol (2×50 $cm^3$) to give a solid. The polymer is then sequentially extracted by Soxhlet extraction with acetone, petroleum ether (40-60° C.), cyclohexane, and chloroform. The chloroform fraction is concentrated in vacuo, precipitated by addition of methanol (100 $cm^3$) and collected by filtration to give a black solid (394 mg, Yield: 99%). GPC (50° C., chlorobenzene) $M_n$=41.0 kg $mol^{-1}$, $M_w$=133.1 kg $mol^{-1}$, PDI=3.25

Example 40—Polymer 40

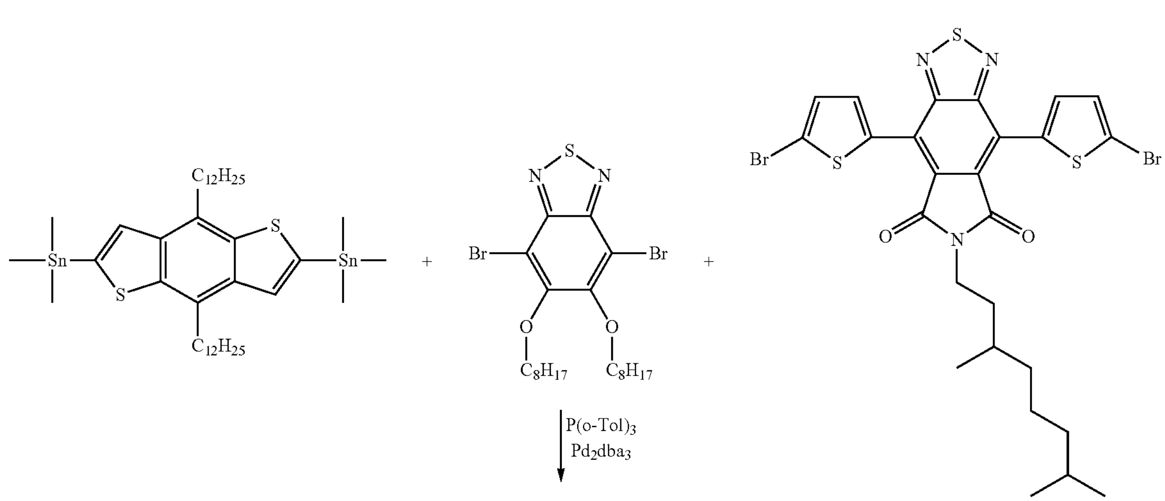

-continued

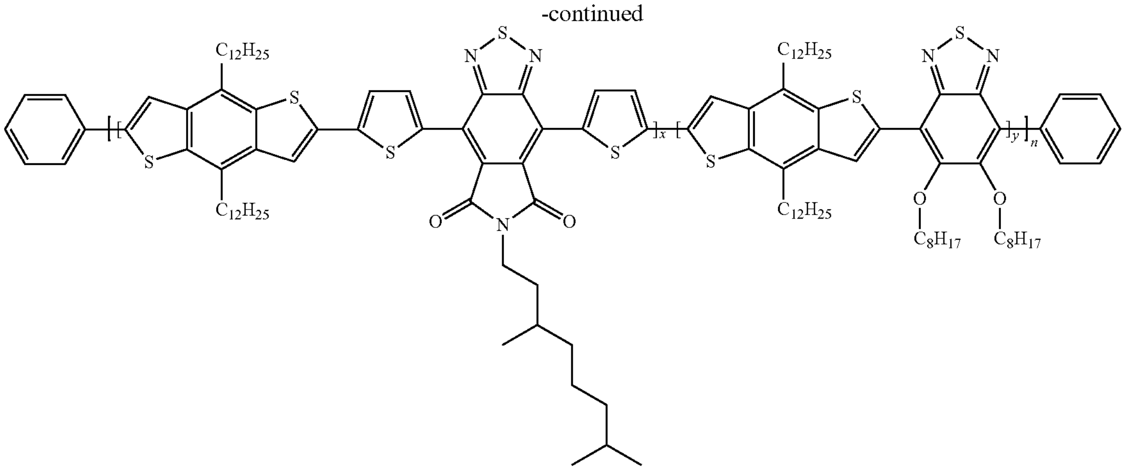

To a dry flask is added 4,8-didodecyl-2,6-bis-trimethyl-stannanyl-benzo[1,2-b;4,5-b']dithiophene (1065.7 mg; 1.2500 mmol; 1.0000 eq.), 4,8-bis-(5-bromo-thiophen-2-yl)-6-(3,7-dimethyl-octyl)-[1,2,5]thiadiazolo[3,4-e]isoindole-5,7-dione (417.2 mg; 0.6250 mmol; 0.5000 eq.), 4,7-dibromo-5,6-bis-octyloxy-benzo[1,2,5]thiadiazole (344.0 mg; 0.6250 mmol; 0.5000 eq.), tri-o-tolyl-phosphine (60.9 mg; 200 μmol; 0.160 eq.) and tris(dibenzylideneacetone)dipalladium (0) (45.8 mg; 50.0 μmol; 0.0400 eq.). The vessel is evacuated and nitrogen purged three times and degassed chlorobenzene (15.6 $cm^3$) is added before the reaction mixture is degassed further for 5 minutes. The reaction mixture is heated up to 115° C. and stirred at this temperature for 3 minutes. Immediately after completion of the polymerisation reaction, the reaction mixture is allowed to cool to 65° C. and tributyl-phenyl-stannane (1.84 g; 5.00 mmol; 4.00 eq.) is added, and the reaction mixture is heated back for 30 minutes. Immediately after completion of the first end-capping reaction, the reaction mixture is allowed to cool to 65° C. and bromo-benzene (1.18 g; 7.50 mmol; 6.00 eq.) is added and the reaction mixture heated back for 17 hours. After second end-capping reaction, the reaction mixture is allowed to cool to 65° C. and precipitated into stirred methanol (250 $cm^3$). The polymer is collected by filtration and washed with methanol (2×50 $cm^3$) to give a solid. The polymer is subjected to sequential Soxhlet extraction with acetone, petroleum ether (40-60° C.), cyclohexane, chloroform. The chloroform fraction is concentrated in vacuo to 40 $cm^3$, precipitated into stirred methanol (250 $cm^3$) and collected by filtration to give a black solid (1.210 g, Yield: 99%). GPC (50° C., chlorobenzene) $M_n$=51 kg $mol^{-1}$; $M_w$=134 kg $mol^{-1}$; PDI=2.63.

Example 41

Example 41.1—1-(4-Hexyl-dodecyl)-pyrrole-2,5-dione

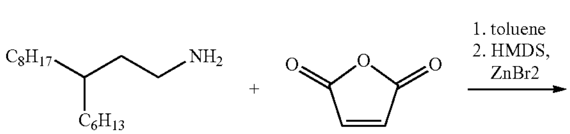

-continued

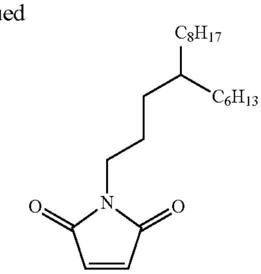

4-hexyl-dodecylamine is prepared, for example, as described in *Chem. Mater.* 2011, 23, 1204.

To a dry flask containing toluene (140 $cm^3$) and maleic anhydride (7.000 g, 71.39 mmol, 1.000 eq) is added 4-hexyl-dodecylamine (17.51 g, 64.96 mmol, 0.9100 eq). The reaction mixture is stirred at 85° C. for 2.5 hours, and then, zinc bromide (16.08 g, 71.39 mmol, 1.000 eq) and 1,1,1,3,3,3-hexamethyl-disilazane (20.2 $cm^3$, 97.1 mmol, 1.36 eq) are added. The reaction mixture is stirred at 85° C. for 3 hours followed by 48 hours at 23° C. Then, reaction mixture is poured into 0.5 M hydrochloric acid solution (300 $cm^3$) and phases are separated. The organic phase is washed twice with saturated solution of sodium carbonate (300 $cm^3$), dried over magnesium sulphate and concentrated in vacuo to afford a brown oil (16.30 g, 65.3% yield). The product is used without further purification.

Example 41.2—4,8-Bis-(5-bromo-thiophen-2-yl)-6-(4-hexyl-dodecyl)-[1,2,5]thiadiazolo[3,4-e]isoindole-5,7-dione

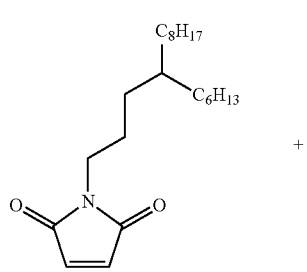

-continued

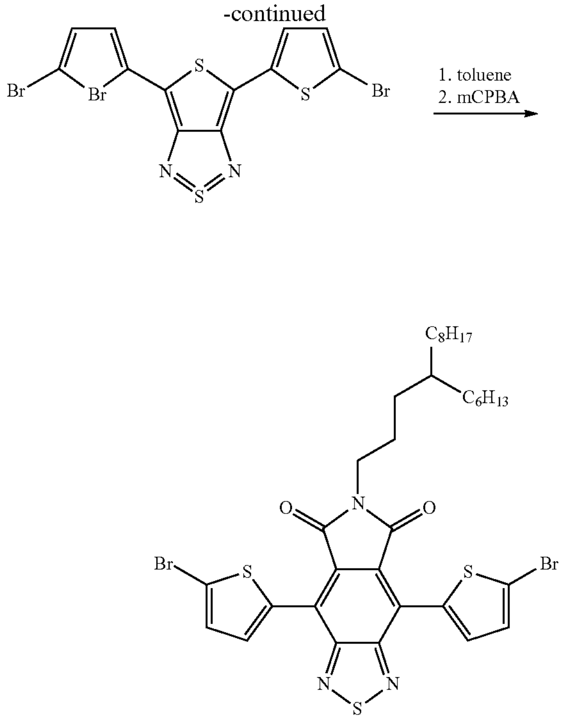

5,7-Bis(5-bromo-2-thienyl)thieno[3,4-b]thiadiazole (8.650 g, 18.63 mmol, 1.000 eq), 1-(4-hexyl-dodecyl)-pyrrole-2,5-dione (16.28 g, 46.58 mmol, 2.500 eq) and toluene (350 $cm^3$) are placed in a dry flask and stirred at 105° C. for 72 hours. The reaction is cooled to 23° C. and 3-chlorobenzenecarboperoxoic acid (9.650 g, 55.90 mmol, 3.500 eq) is added to the reaction mixture. Mixture is stirred at 23° C. for 24 hours. Water (300 $cm^3$) is added and phases are separated. Water phase is washed with ethyl acetate (200 $cm^3$). Combined organic phases are washed with 10% sodium bicarbonate solution (2×250 $cm^3$) followed by wash with brine (200 $cm^3$). Organic phases are dried over magnesium sulphate and concentrated in vacuo. Crude material is redissolved in dichloromethane (30 $cm^3$) absorbed on silica and the solvent removed in vacuo. The crude product is purified using Biotage flash chromatography (Petroleum Ether/Dichloromethane 80:20) followed by recrystallisation from hot acetone and methanol leading to a red solid (4.10 g, Yield: 28.2%). $^1H$ NMR (300 MHz, $CDCl_3$) δ ppm 7.79 (2H, d, J=4.05 Hz) 7.23 (2H, d, J=4.05 Hz) 3.71 (2H, t, J=7.44 Hz), 1.67 (2H, br. s.) 1.14-1.34 (29H, m) 0.86 (6H, dq, J=6.70, 3.36 Hz)

Example 41.3—Polymer 41

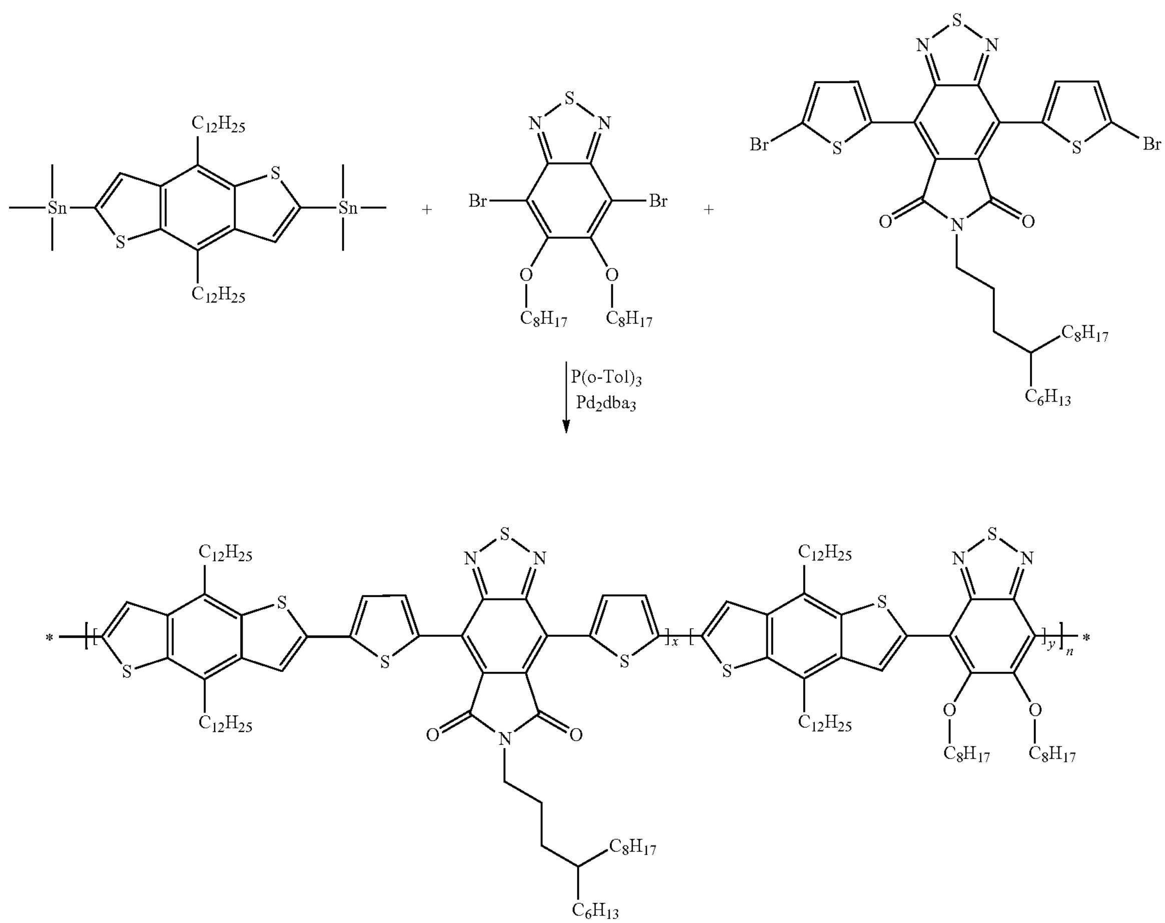

To a dry flask is added 4,8-didodecyl-2,6-bis-trimethyl-stannanyl-benzo[1,2-b;4,5-b']dithiophene (511.5 mg; 0.6000 mmol; 1.000 eq.), 4,8-bis-(5-bromo-thiophen-2-yl)-6-(4-hexyl-dodecyl)-[1,2,5]thiadiazolo[3,4-e]isoindole-5,7-dione (233.9 mg; 0.3000 mmol; 0.5000 eq.), 4,7-dibromo-5,6-bis-octyloxy-benzo[1,2,5]thiadiazole (165.1 mg; 0.3000 mmol; 0.5000 eq.), tri-o-tolyl-phosphine (29.2 mg; 96.0 μmol; 0.160 eq.) and tris(dibenzylideneacetone)dipalladium (0) (22.0 mg; 24.0 μmol; 0.0400 eq.). The vessel is evacuated and nitrogen purged three times and degassed chlorobenzene (7.5 $cm^3$) is added before the reaction mixture is degassed further for 5 minutes. The reaction mixture is heated up to 130° C. and stirred at this temperature for 2 hours. After completion of the reaction, the reaction mixture is allowed to cool to 65° C. and precipitated into stirred methanol (250 $cm^3$). The polymer is collected by filtration and washed with methanol (2×50 $cm^3$) to give a solid. The polymer is subjected to sequential Soxhlet extraction with acetone, petroleum ether (40-60° C.), cyclohexane, chloroform. The chloroform fraction is concentrated in vacuo to 20 $cm^3$, precipitated into stirred methanol (250 $cm^3$) and collected by filtration to give a black solid (420 mg, Yield: 68%). GPC (50° C., chlorobenzene) $M_n$=51.2 kg $mol^{-1}$; $M_w$=127 kg $mol^{-1}$; PDI=2.5.

Example 42—Polymer 42

To a dry flask is added 4,8-didodecyl-2,6-bis-trimethyl-stannanyl-benzo[1,2-b;4,5-b']dithiophene (153.5 mg; 0.1800 mmol; 0.5000 eq.), 2,6-bis-trimethylstannanyl-benzo[1,2-b;4,5-b']dithiophene-4,8-dicarboxylic acid didodecyl ester (169.3 mg; 0.1800 mmol; 0.5000 eq.), 4,8-bis-(5-bromo-thiophen-2-yl)-6-(2-octyl-dodecyl)-[1,2,5]thiadiazolo[3,4-e]isoindole-5,7-dione (290.8 mg; 0.3600 mmol; 1.0000 eq.), tri-o-tolyl-phosphine (17.5 mg; 57.6 μmol; 0.160 eq.) and tris(dibenzylideneacetone)dipalladium(0) (13.2 mg; 14.0 μmol; 0.0400 eq.). The vessel is evacuated and nitrogen purged three times and degassed chlorobenzene (4.5 $cm^3$) is added before the reaction mixture is degassed further for 5 minutes. The reaction mixture is heated up to 130° C. and stirred at this temperature for 90 minutes. After completion of the reaction, the reaction mixture is allowed to cool to 65° C. and precipitated into stirred methanol (250 $cm^3$). The polymer is collected by filtration and washed with methanol (2×50 $cm^3$) to give a solid. The polymer is subjected to sequential Soxhlet extraction with acetone, petroleum ether (40-60° C.), cyclohexane, chloroform. The chloroform fraction is concentrated in vacuo to 20 $cm^3$, precipitated into stirred methanol (250 $cm^3$) and collected by filtration to give a black solid (430 mg, Yield: 97%). GPC (50° C., chlorobenzene) $M_n$=78.6 kg $mol^{-1}$; $M_w$=286 kg $mol^{-1}$; PDI=3.6.

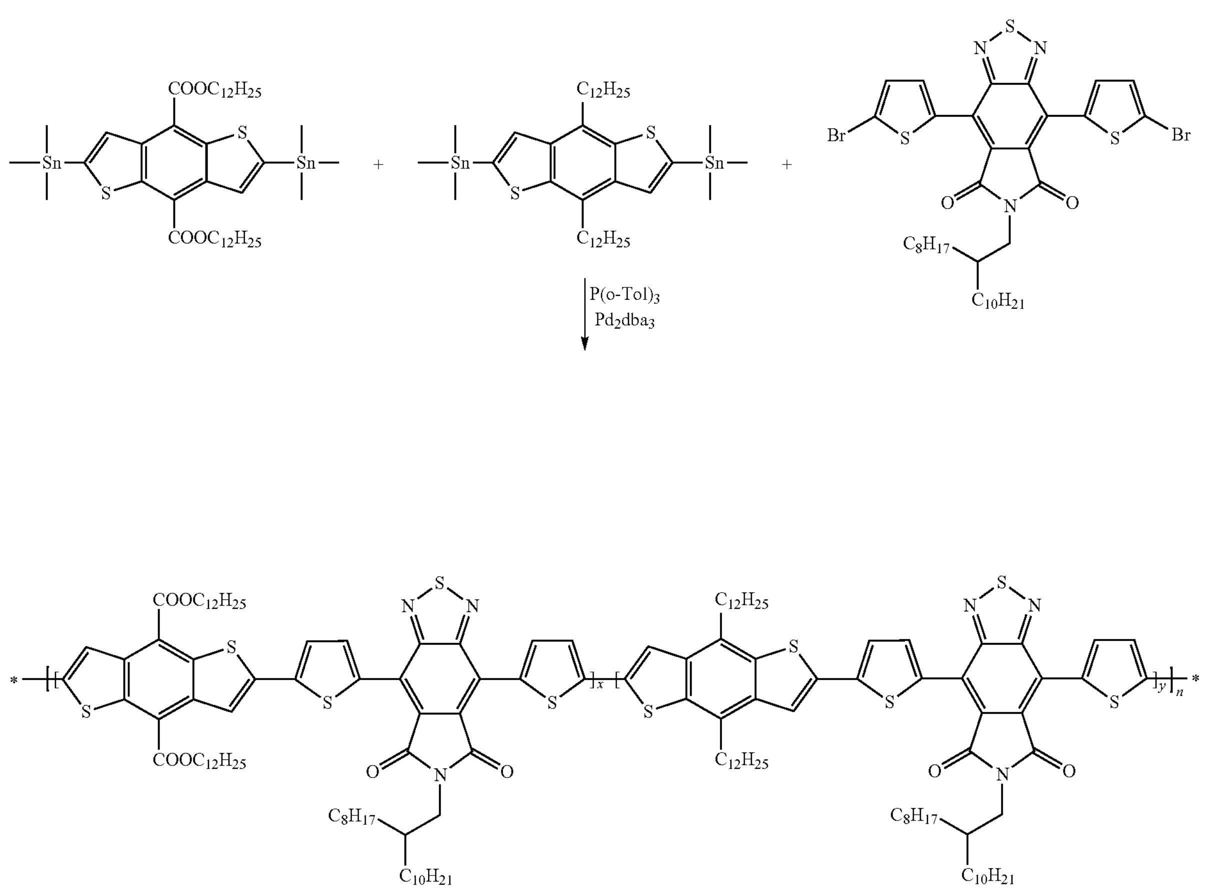

Example 43—Polymer 43

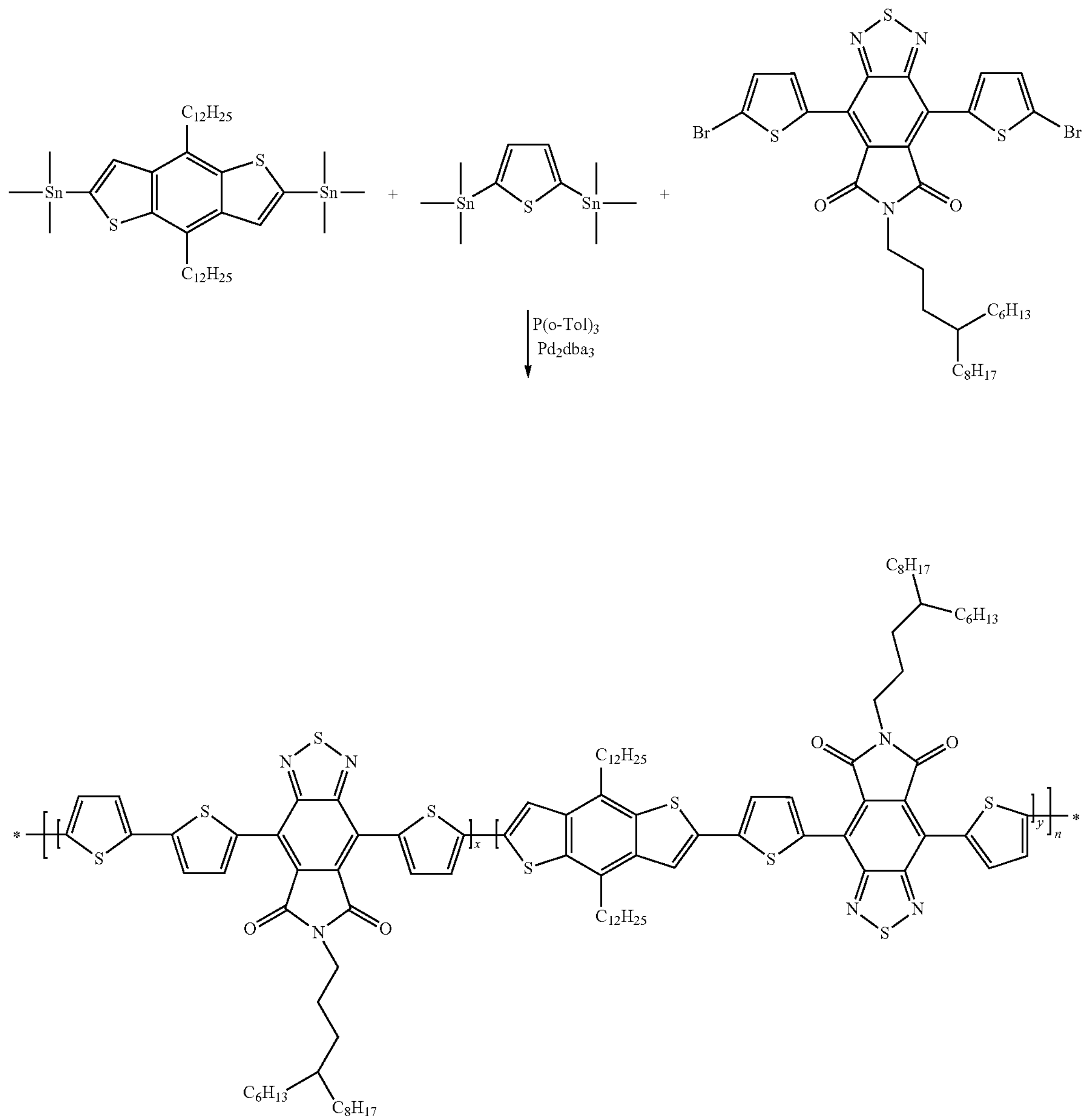

To a dry flask is added 4,8-didodecyl-2,6-bis-trimethyl-stannanyl-benzo[1,2-b;4,5-b']dithiophene (460.4 mg; 0.5400 mmol; 0.9000 eq.), 4,8-bis-(5-bromo-thiophen-2-yl)-6-(4-hexyl-dodecyl)-[1,2,5]thiadiazolo[3,4-e]isoindole-5,7-dione (467.8 mg; 0.6000 mmol; 1.0000 eq.), 2,5-bis-trimethylstannanyl-thiophene (24.6 mg; 0.0600 mmol; 0.100 eq.), tri-o-tolyl-phosphine (29.2 mg; 96.0 µmol; 0.160 eq.) and tris(dibenzylideneacetone)dipalladium(0) (24.0 mg; 24.0 µmol; 0.0400 eq.). The vessel is evacuated and nitrogen purged three times and degassed chlorobenzene (7.5 $cm^3$) is added before the reaction mixture is degassed further for 5 minutes. The reaction mixture is heated up to 130° C. and stirred at this temperature for 2 minutes. After completion of the reaction, the reaction mixture is allowed to cool to 65° C. and precipitated into stirred methanol (250 $cm^3$). The polymer is collected by filtration and washed with methanol (2×50 $cm^3$) to give a solid. The polymer is subjected to sequential Soxhlet extraction with acetone, petroleum ether (40-60° C.), cyclohexane, chloroform and chlorobenzene. The chlorobenzene fraction is concentrated in vacuo to 20 $cm^3$, precipitated into stirred methanol (250 $cm^3$) and collected by filtration to give a black solid (120 mg, Yield: 25%). GPC (50° C., chlorobenzene) $M_n$=78.0 kg $mol^{-1}$; $M_w$=294 kg $mol^{-1}$; PDI=3.77.

Example 44—Polymer 44

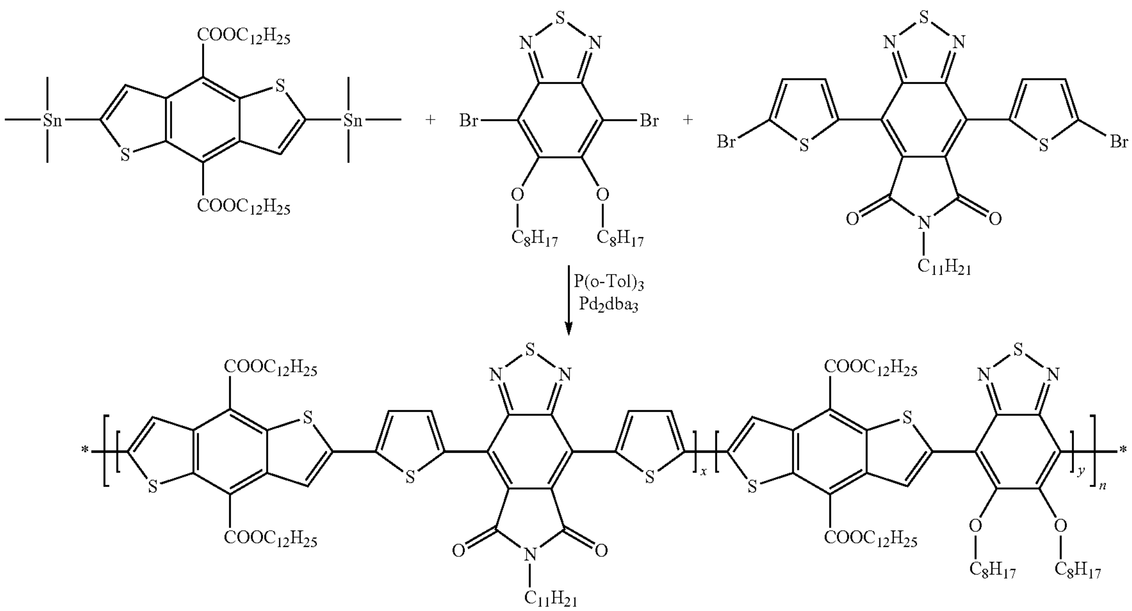

To a dry flask is added 2,6-bis-trimethylstannanyl-benzo[1,2-b;4,5-b]dithiophene-4,8-dicarboxylic acid didodecyl ester (470.3 mg; 0.5000 mmol; 1.000 eq.), 4,7-dibromo-5,6-bis-octyloxy-benzo[1,2,5]thiadiazole (137.6 mg; 0.2500 mmol; 0.5000 eq.), 4,8-bis-(5-bromo-thiophen-2-yl)-6-undecyl-[1,2,5]thiadiazolo[3,4-e]isoindole-5,7-dione (170.4 mg; 0.2500 mmol; 0.5000 eq.), tri-o-tolyl-phosphine (24.4 mg; 80.0 μmol; 0.160 eq.) and tris(dibenzylideneacetone) dipalladium(0) (18.3 mg; 20.0 μmol; 0.0400 eq.). The vessel is evacuated and nitrogen purged three times and degassed chlorobenzene (6.25 $cm^3$) is added before the reaction mixture is degassed further for 5 minutes. The reaction mixture is heated up to 130° C. and stirred at this temperature for 1 hour. After completion of the reaction, the reaction mixture is allowed to cool to 65° C. and precipitated into stirred methanol (250 $cm^3$). The polymer is collected by filtration and washed with methanol (2×50 $cm^3$) to give a solid. The polymer is subjected to sequential Soxhlet extraction with acetone, petroleum ether (40-60° C.), cyclohexane, chloroform. The chloroform fraction is concentrated in vacuo to 20 $cm^3$, precipitated into stirred methanol (250 $cm^3$) and collected by filtration to give a black solid (120.0 mg, Yield: 22%). GPC (50° C., chlorobenzene): $M_n$=55.7 kg $mol^{-1}$; $M_w$=122.7 kg $mol^{-1}$; PDI=2.2.

Example 45—Polymer 45

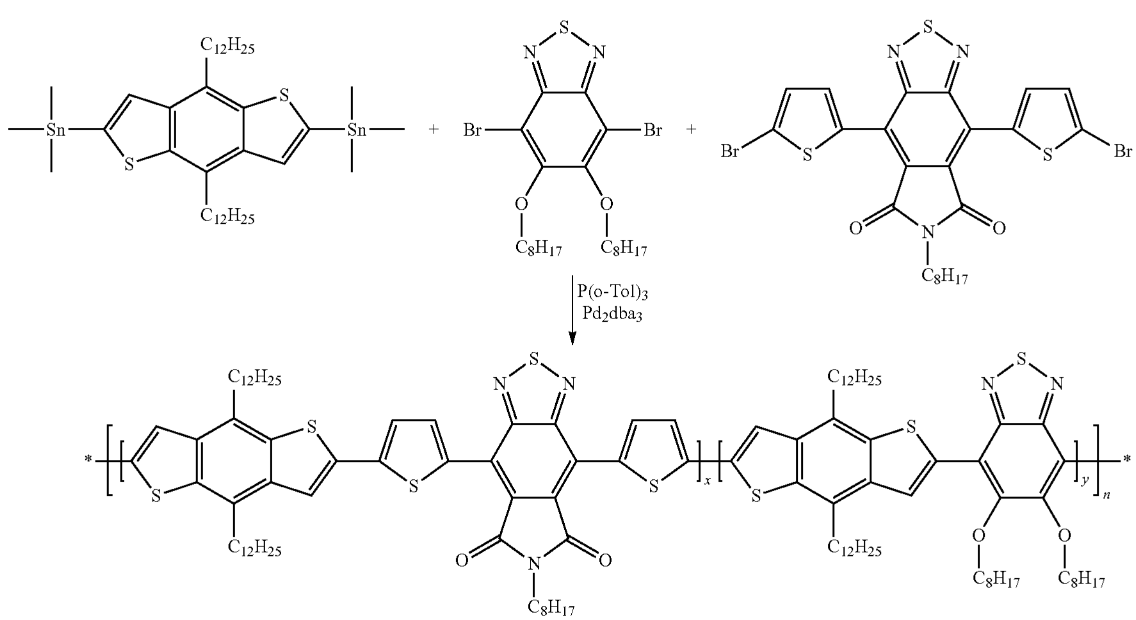

A dry 20 $cm^3$ single neck microwave vial is charged with 4,8-didodecyl-2,6-bis-trimethylstannanyl-benzo[1,2-b;4,5-b']dithiophene (383.6 mg; 0.4500 mmol; 1.000 eq.), 4,7-dibromo-5,6-bis-octyloxy-benzo[1,2,5]thiadiazole (123.8 mg; 0.2250 mmol; 0.5000 eq.), 4,8-bis-(5-bromo-thiophen-2-yl)-6-octyl-[1,2,5]thiadiazolo[3,4-e]isoindole-5,7-dione (143.9 mg; 0.2250 mmol; 0.5000 eq.), tri-o-tolyl-phosphine (21.9 mg; 72.0 μmol; 0.160 eq.) and tris(dibenzylideneacetone)dipalladium(0) (16.5 mg; 18.0 μmol; 0.0400 eq.). The vessel is evacuated and nitrogen purged three times and degassed chlorobenzene (5.6 $cm^3$) is added before the reaction mixture is degassed further for 15 minutes. The reaction mixture is heated up to 130° C. and stirred at this temperature for 45 minutes. After completion of the reaction, the reaction mixture is allowed to cool to 65° C. and precipitated into stirred methanol (150 $cm^3$). The polymer is collected by filtration and washed with methanol (2×50 $cm^3$) to give a solid. The polymer is then sequentially extracted by Soxhlet extraction with acetone, petroleum ether (40-60° C.), cyclohexane, and chloroform. The chloroform fraction is concentrated in vacuo to 75 $cm^3$, precipitated by addition of methanol (100 $cm^3$) and collected by filtration to give a black solid (343 mg). GPC (50° C., chlorobenzene) $M_n$=27.2 kg $mol^{-1}$; $M_w$=112.3 kg $mol^{-1}$; PDI=4.1.

Example 46—Polymer 46

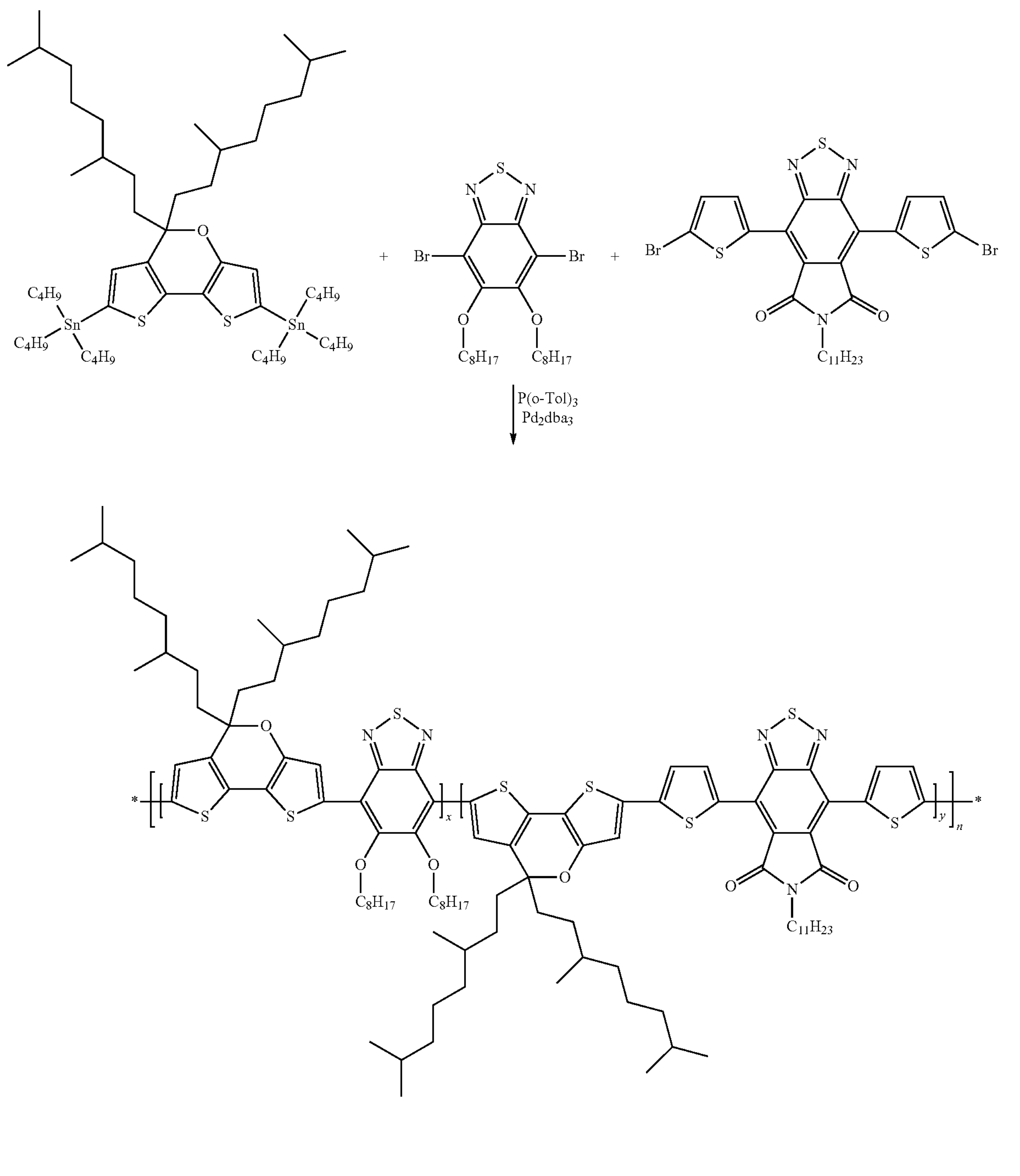

To a dry flask is added 5,5-bis-(3,7-dimethyl-octyl)-2,7-bis-tributylstannanyl-5H-4-oxa-1,8-dithia-as-indacene (386.2 mg; 0.3668 mmol; 1.000 eq.), 4,7-dibromo-5,6-bis-octyloxy-benzo[1,2,5]thiadiazole (98.9 mg; 0.1797 mmol; 0.4900 eq.), 4,8-bis-(5-bromo-thiophen-2-yl)-6-undecyl-[1,2,5]thiadiazolo[3,4-e]isoindole-5,7-dione (122.5 mg; 0.1797 mmol; 0.4900 eq.), tri-o-tolyl-phosphine (13.4 mg; 44.0 μmol; 0.120 eq.) and tris(dibenzylideneacetone)dipalladium(0) (6.7 mg; 7.3 μmol; 0.020 eq.). The vessel is evacuated and nitrogen purged three times and degassed toluene (17.2 $cm^3$) is added before the reaction mixture is degassed further for 5 minutes. The reaction mixture is heated up to 100° C. and stirred at this temperature for 17 hour. Immediately after completion of the first end-capping reaction, the reaction mixture is allowed to cool to 65° C. and bromo-benzene (0.3 $cm^3$; 2.2 mmol; 6.0 eq.) is added and the reaction mixture heated back for 2 hours. After completion of the end-capping reaction, the reaction mixture is allowed to cool to 65° C. and precipitated into stirred methanol (250 $cm^3$). The polymer is collected by filtration and washed with methanol (2×50 $cm^3$) to give a solid. The polymer is subjected to sequential Soxhlet extraction with acetone, petroleum ether (40-60° C.), cyclohexane. The cyclohexane fraction is concentrated in vacuo to 20 $cm^3$, precipitated into stirred methanol (250 $cm^3$) and collected by filtration to give a black solid (240 mg, Yield: 70%). GPC (50° C., chlorobenzene) $M_n$=17 kg $mol^{-1}$; $M_w$=32 kg $mol^{-1}$; PDI=1.9.

Example 47—Polymer 47

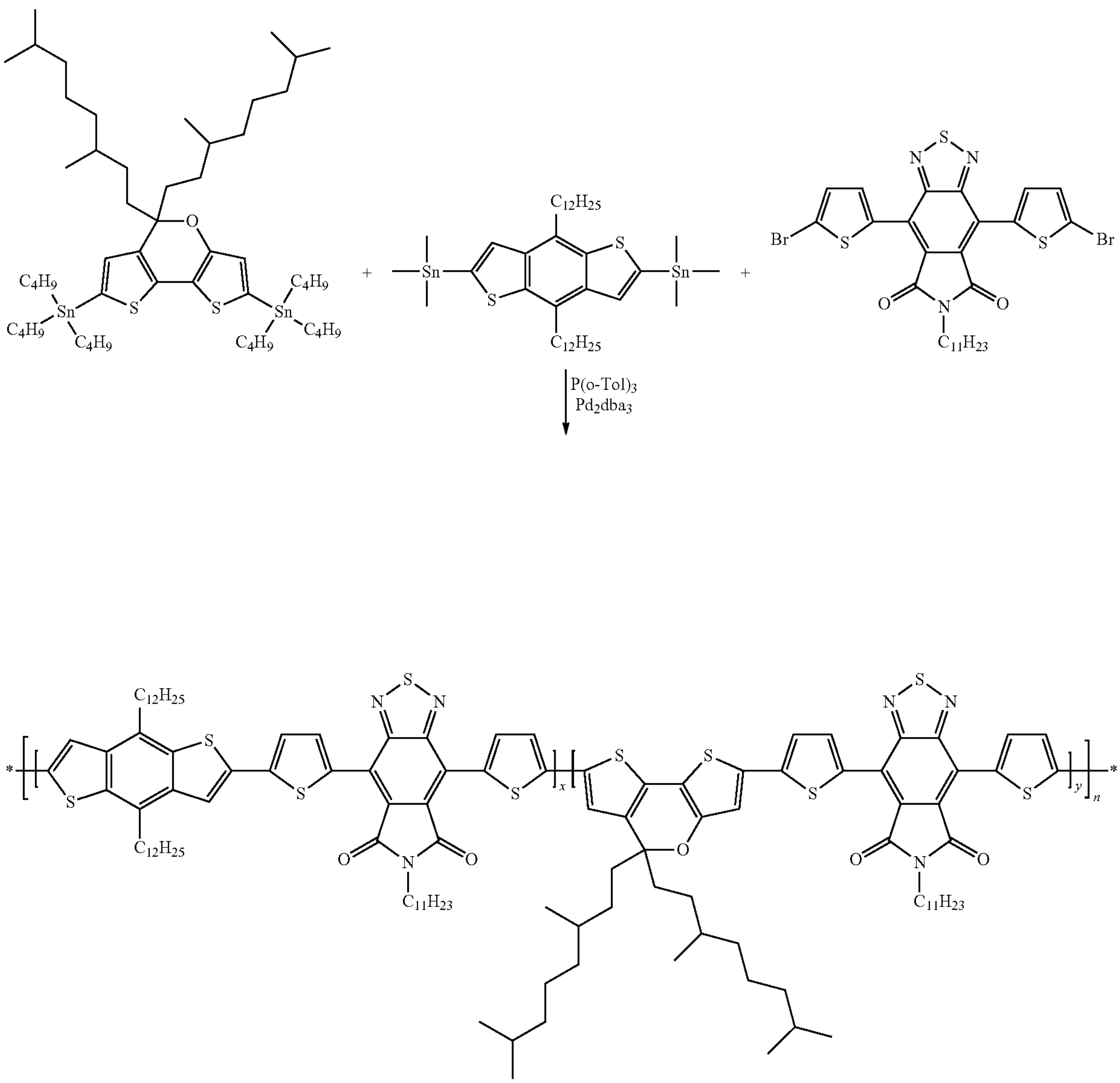

To a dry flask is added 5,5-bis-(3,7-dimethyl-octyl)-2,7-bis-tributylstannanyl-5H-4-oxa-1,8-dithia-as-indacene (361.7 mg; 0.3435 mmol; 1.000 eq.), 4,8-didodecyl-2,6-bis-trimethylstannanyl-benzo[1,2-b;4,5-b']dithiophene (292.9 mg; 0.3435 mmol; 1.000 eq.), 4,8-bis-(5-bromo-thiophen-2-yl)-6-undecyl-[1,2,5]thiadiazolo[3,4-e]isoindole-5,7-dione (456.5 mg; 0.6699 mmol; 1.950 eq.), tri-o-tolyl-phosphine (12.5 mg; 41.2 μmol; 0.120 eq.) and tris (dibenzylideneacetone)dipalladium(0) (6.3 mg; 6.9 μmol; 0.020 eq.). The vessel is evacuated and nitrogen purged three times and degassed toluene (16.5 $cm^3$) is added before the reaction mixture is degassed further for 5 minutes. The reaction mixture is heated up to 100° C. and stirred at this temperature for 1 hour. After completion of reaction, the reaction mixture is allowed to cool to 65° C. and precipitated into stirred methanol (250 $cm^3$). The polymer is collected by filtration and washed with methanol (2×50 $cm^3$) to give a solid. The polymer is subjected to sequential Soxhlet extraction with acetone, petroleum ether (40-60° C.), cyclohexane and chloroform. The chloroform fraction is concentrated in vacuo to 20 $cm^3$, precipitated into stirred methanol (250 $cm^3$) and collected by filtration to give a black solid (450 mg, Yield: 95%). GPC (50° C., chlorobenzene) $M_n$=56.5 kg $mol^{-1}$; $M_w$=183 kg $mol^{-1}$; PDI=3.2.

Example 48—Polymer 48

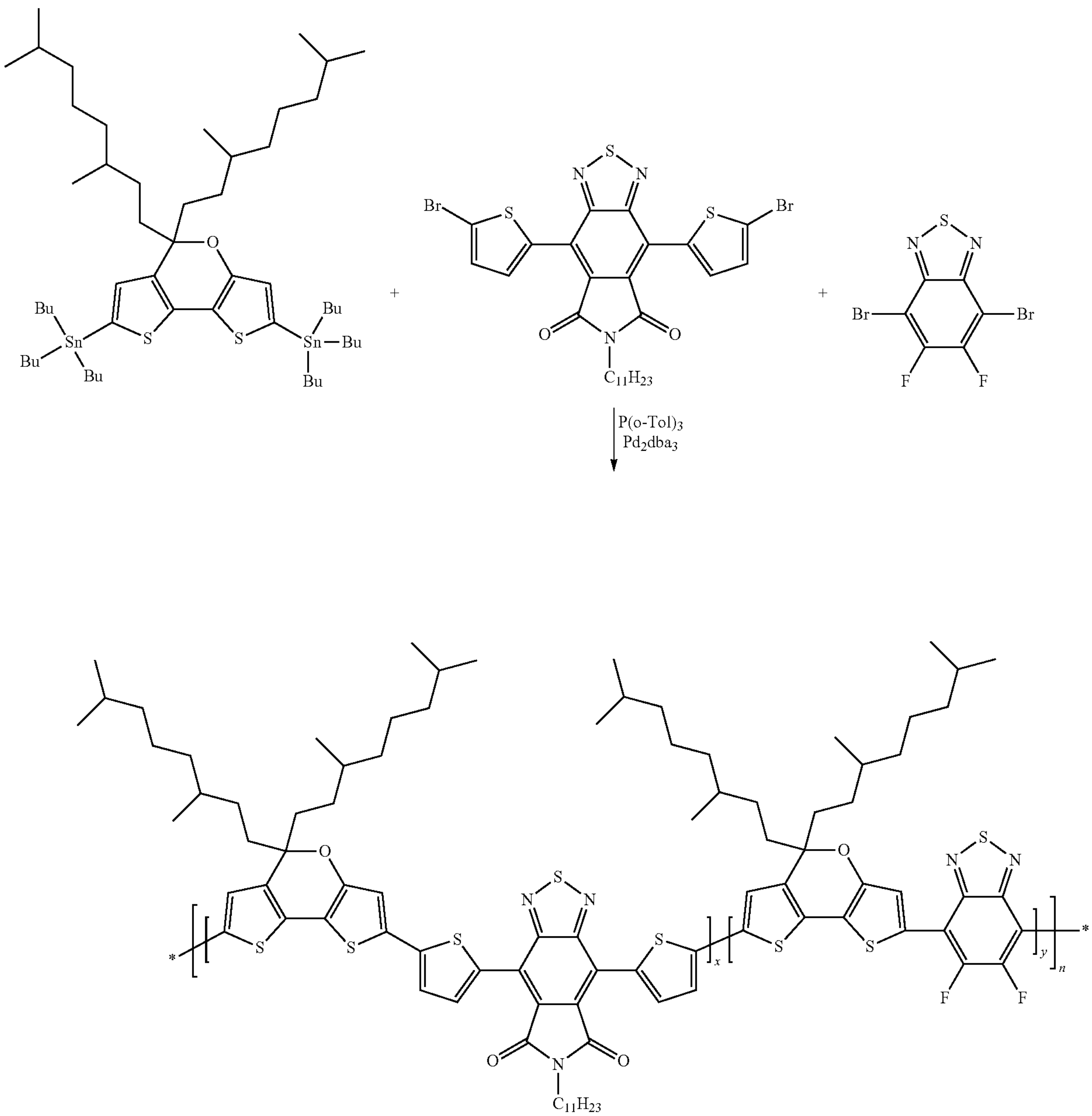

5,5-Bis-(3,7-dimethyl-octyl)-2,7-bis-tributylstannanyl-5H-4-oxa-1,8-dithia-as-indacene (347.8 mg; 0.3303 mmol; 1.000 eq.), 4,7-dibromo-5,6-difluoro-benzo[1,2,5]thiadiazole (52.3 mg; 0.159 mmol; 0.480 eq.) and 4,8-bis-(5-bromo-thiophen-2-yl)-6-undecyl-[1,2,5]thiadiazolo[3,4-e]isoindole-5,7-dione (110.3 mg; 0.1619 mmol; 0.4900 eq.), tris(dibenzylideneacetone)dipalladium(0) (6.00 mg; 6.55 μmol; 0.0200 eq.) and tri-o-tolyl-phosphine (12.0 mg; 39.4 μmol; 0.119 eq.) are placed in a microwave vial. The vial is sealed and degassed. Degassed toluene (16.2 $cm^3$) is added, the mixture further purged with nitrogen for 10 minutes. The vial is put into a cold oil bath and heated to 100° C. for 14 hours. Tributylstannylbenzene (0.1 $cm^3$) is added and the mixture heated to 130° C. for 1 hour. Subsequently, bromobenzene (0.3 $cm^3$) is added and the mixture heated for 1 hour at the same temperature. The mixture is then cooled to room temperature, poured to excess of methanol and the precipitate collected by filtration and subjected to Soxhlet extraction, using, subsequently, acetone, cyclohexane, and chloroform. Chloroform fraction is triturated by addition to excess of methanol, the precipitate collected by filtration and dried in vacuo (220 mg). GPC (50° C., chlorobenzene): $M_n$=18.6 kg·mol$^{-1}$; $M_w$=104 kg·mol$^{-1}$; PDI=5.6.

Example 49—Polymer 49

A dry 20 $cm^3$ single neck microwave vial is charged with 4,8-didodecyl-2,6-bis-trimethylstannanyl-benzo[1,2-b;4,5-b']dithiophene (341.0 mg; 0.4000 mmol; 1.000 eq.), 4,7-dibromo-5,6-bis-dodecyloxy-benzo[1,2,5]thiadiazole (132.5 mg; 0.2000 mmol; 0.5000 eq.), 4,8-bis-(5-bromo-thiophen-2-yl)-6-octyl-[1,2,5]thiadiazolo[3,4-e]isoindole-5,7-dione (127.9 mg; 0.2000 mmol; 0.5000 eq.), tri-o-tolyl-phosphine (19.5 mg; 64.0 μmol; 0.160 eq.) and tris(dibenzylideneacetone)dipalladium(0) (14.7 mg; 16.0 μmol; 0.0400 eq.). The vessel is evacuated and nitrogen purged three times and degassed chlorobenzene (5.0 $cm^3$) is added before the reaction mixture is degassed further for 15 minutes. The reaction mixture is heated up to 140° C. and stirred at this temperature for 30 minutes. After completion of the reaction, the reaction mixture is allowed to cool to 65° C. and precipitated into stirred methanol (150 $cm^3$). The polymer is collected by filtration and washed with methanol (2×50 $cm^3$) to give a solid. The polymer is then sequentially extracted by Soxhlet extraction with acetone, petroleum ether (40-60° C.), cyclohexane and chloroform. The chloroform fraction is concentrated in vacuo, precipitated by addition of methanol (100 $cm^3$) and collected by filtration to give a black solid (382 mg, Yield: 94%). GPC (50° C., chlorobenzene) $M_n$=36.0 kg mol$^{-1}$; $M_w$=103.0 kg mol$^{-1}$; PDI=2.86.

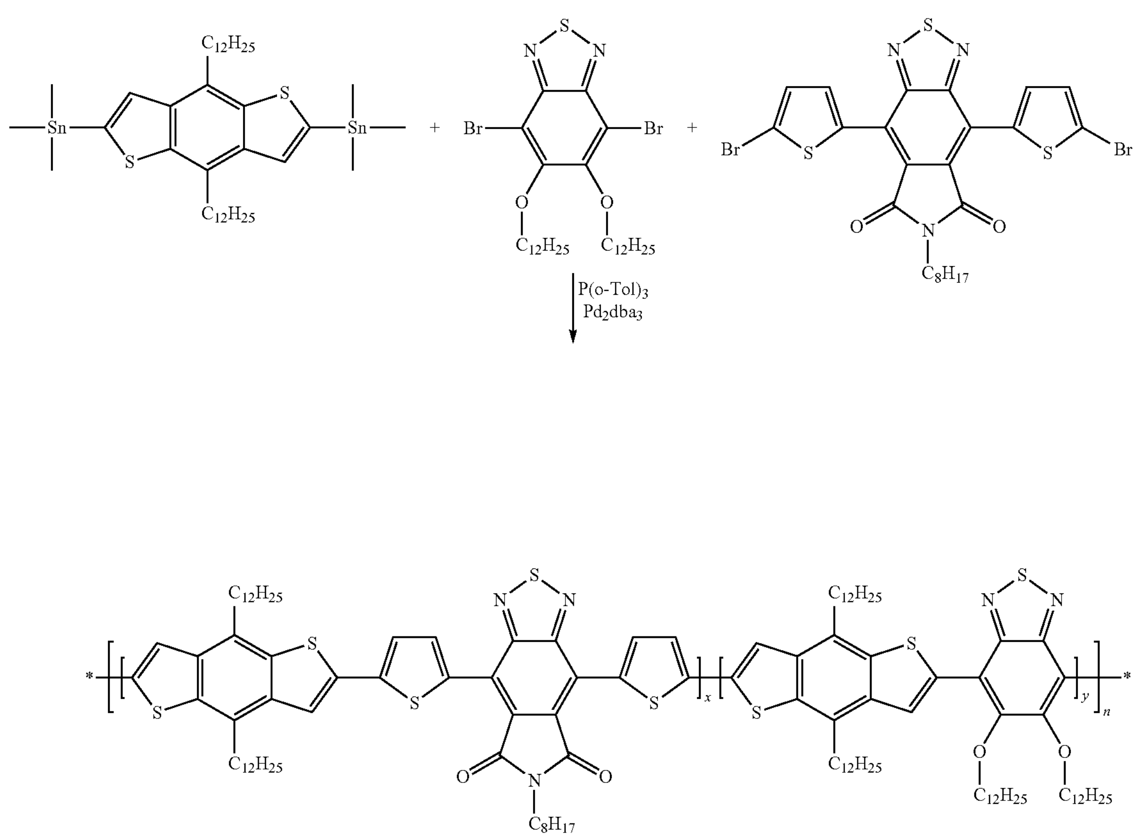

Example 50—Polymer 50

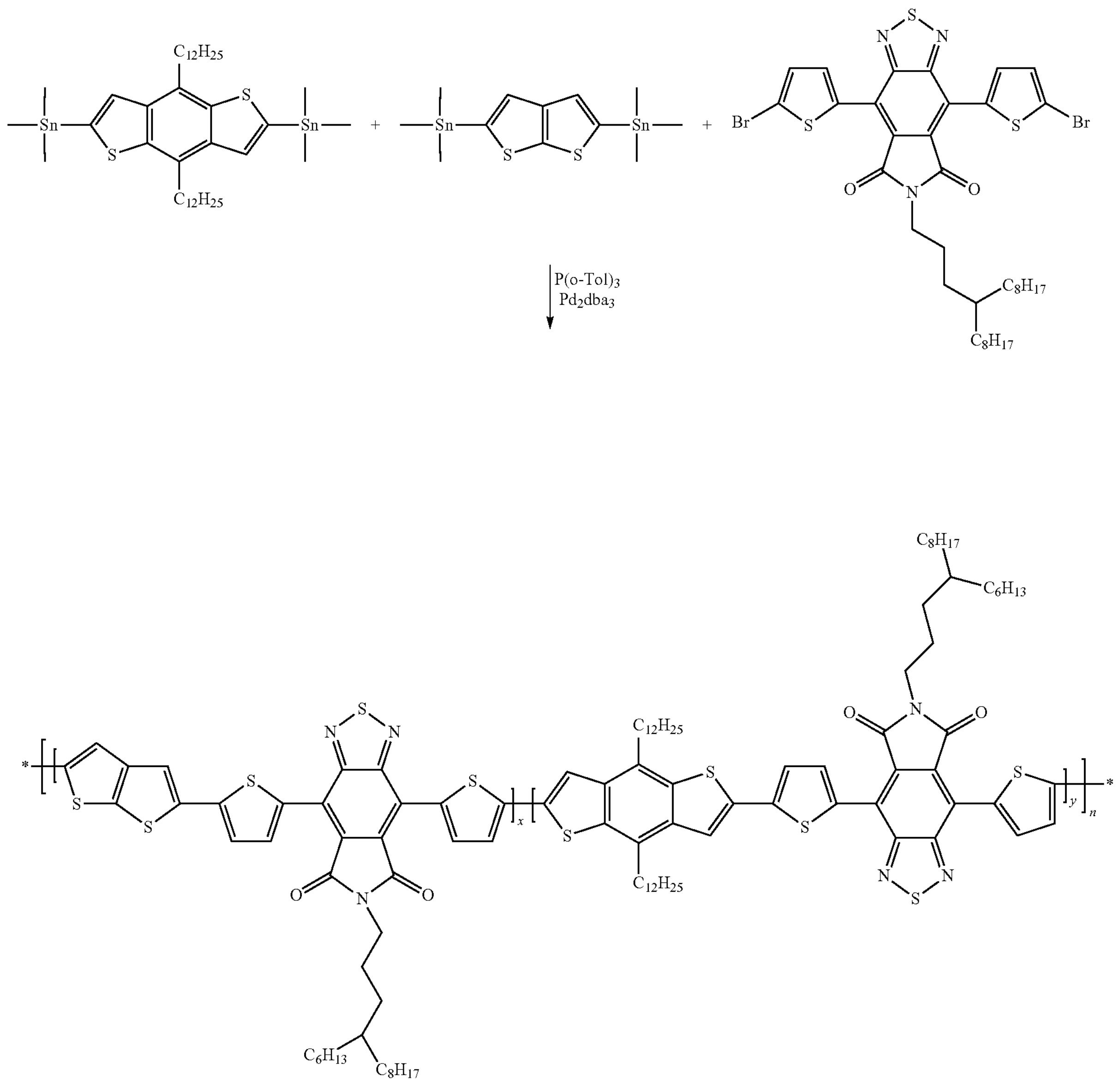

To a dry flask is 4,8-didodecyl-2,6-bis-trimethylstannanyl-benzo[1,2-b;4,5-b]dithiophene (306.9 mg; 0.3600 mmol; 0.9000 eq.), 4,8-bis-(5-bromo-thiophen-2-yl)-6-(4-hexyl-dodecyl)-[1,2,5]thiadiazolo[3,4-e]isoindole-5,7-dione (311.9 mg; 0.4000 mmol; 1.000 eq.), 2,5-bis-trimethylstannanyl-thieno[2,3-b]thiophene (18.6 mg; 0.0400 mmol; 0.100 eq.), tri-o-tolyl-phosphine (14.6 mg; 48.0 μmol; 0.120 eq.) and tris(dibenzylideneacetone)dipalladium(0) (7.3 mg; 8.0 μmol; 0.020 eq.). The vessel is evacuated and nitrogen purged three times and degassed toluene (17.0 $cm^3$) is added before the reaction mixture is degassed further for 5 minutes. The reaction mixture is heated up to 100° C. and stirred at this temperature for 15 minutes. After completion of the reaction, the reaction mixture is allowed to cool to 65° C. and precipitated into stirred methanol (250 $cm^3$). The polymer is collected by filtration and washed with methanol (2×50 $cm^3$) to give a solid. The polymer is subjected to sequential Soxhlet extraction with acetone, petroleum ether (40-60° C.), cyclohexane and chloroform and chlorobenzene. The chlorobenzene fraction is concentrated in vacuo to 20 $cm^3$, precipitated into stirred methanol (250 $cm^3$) and collected by filtration to give a black solid (160.0 mg). GPC (50° C., chlorobenzene) $M_n$=107 kg $mol^{-1}$; $M_w$=353.5 kg $mol^{-1}$; PDI=3.3.

Example 51—Polymer 51

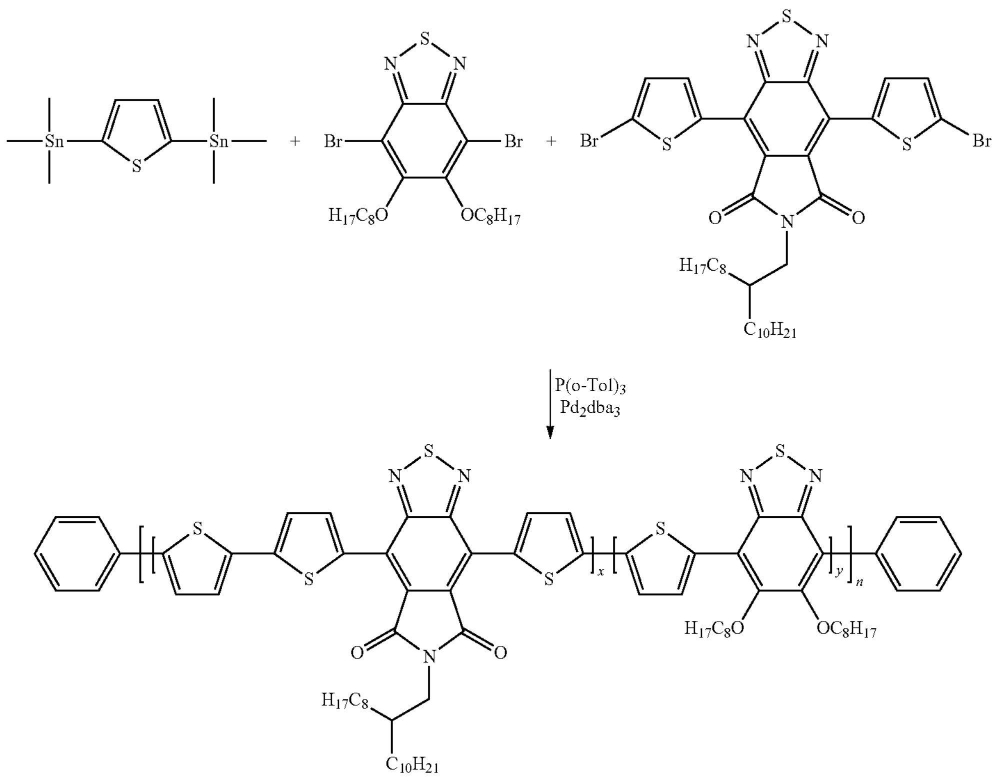

A dry 20 $cm^3$ single neck microwave vial is charged with 4,7-dibromo-5,6-bis-octyloxy-benzo[1,2,5]thiadiazole (192.6 mg; 0.3500 mmol; 1.000 eq.), 4,8-bis-(5-bromo-thiophen-2-yl)-6-(2-octyl-dodecyl)-[1,2,5]thiadiazolo[3,4-e]isoindole-5,7-dione (282.7 mg; 0.3500 mmol; 1.000 eq.), 2,5-bis-trimethylstannanyl-thiophene (286.8 mg; 0.7000 mmol; 2.000 eq.), tri-o-tolyl-phosphine (12.8 mg; 42.0 μmol; 0.120 eq.) and tris(dibenzylideneacetone)dipalladium (0) (6.4 mg; 7.0 μmol; 0.020 eq.). The vessel is evacuated and nitrogen purged three times and degassed toluene (14.9 $cm^3$) is added before the reaction mixture is degassed for a further 15 minutes. The reaction mixture is heated to 100° C. and stirred at this temperature for 4 hours, and then tributyl-phenyl-stannane (0.11 $cm^3$; 0.35 mmol; 1.0 eq.) and 60 minutes later bromo-benzene (0.055 $cm^3$; 0.53 mmol; 1.5 eq.) are added. The reaction is stirred for a further 18 hours, and then the reaction mixture is allowed to cool to 65° C. and precipitated into stirred methanol (150 $cm^3$). The polymer is collected by filtration and washed with methanol (2×50 $cm^3$) to give a solid. The polymer is then sequentially extracted by Soxhlet extraction with acetone, petroleum ether (40-60° C.), cyclohexane, and chloroform. The chloroform fraction is concentrated in vacuo to 75 $cm^3$, precipitated by addition of methanol (100 $cm^3$) and collected by filtration to give a black solid (419 mg, Yield: 99%). GPC (50° C., chlorobenzene) $M_n$=38.1 kg $mol^{-1}$; $M_w$=88.7 kg $mol^{-1}$; PDI=2.33.

Example 52—Polymer 52

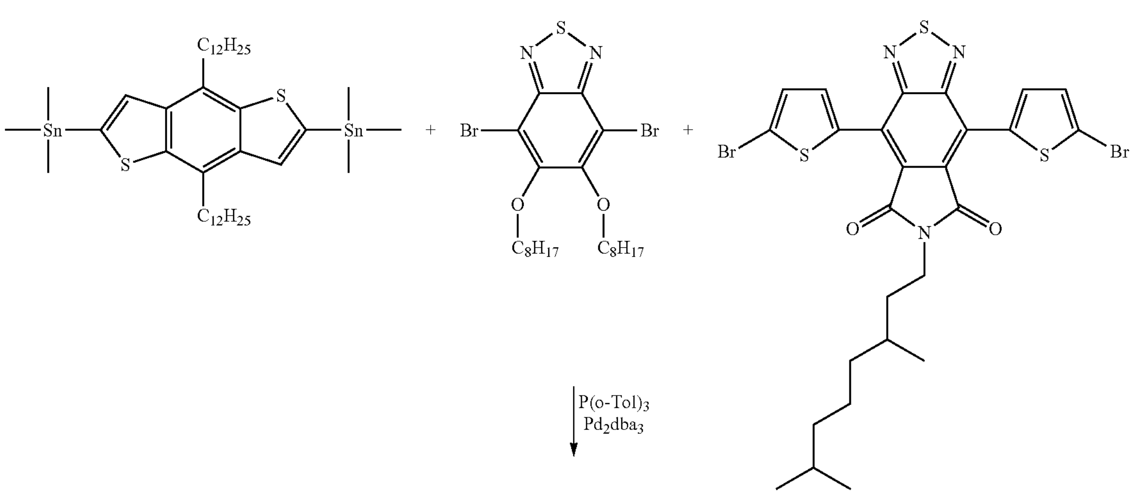

-continued

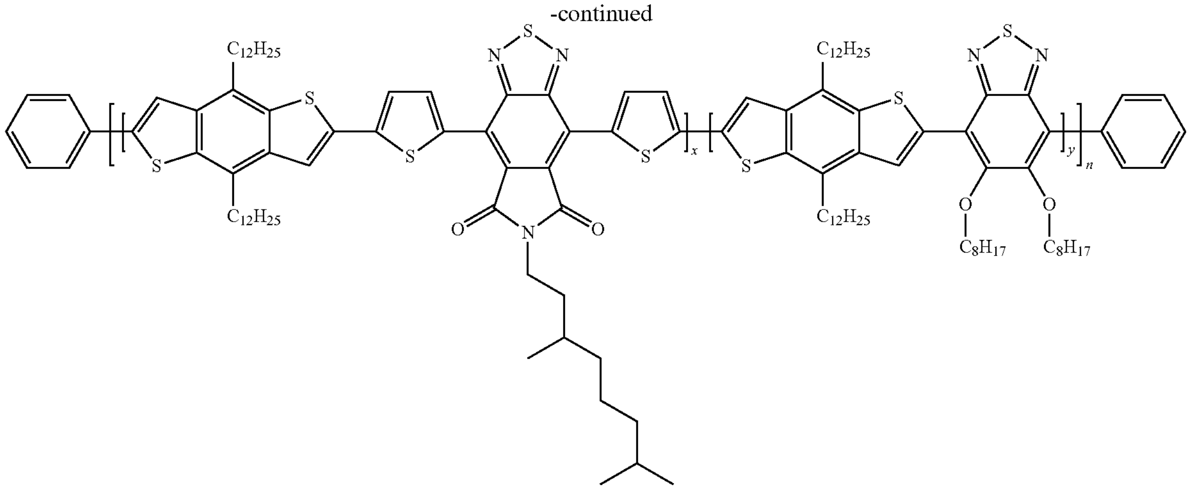

To a dry flask is added 4,8-didodecyl-2,6-bis-trimethyl-stannanyl-benzo[1,2-b;4,5-b']dithiophene (426.3 mg; 0.5000 mmol; 1.000 eq.), 4,8-bis-(5-bromo-thiophen-2-yl)-6-(3,7-dimethyl-octyl)-[1,2,5]thiadiazolo[3,4-e]isoindole-5,7-dione (200.2 mg; 0.3000 mmol; 0.6000 eq.), 4,7-dibromo-5,6-bis-octyloxy-benzo[1,2,5]thiadiazole (110.1 mg; 0.2000 mmol; 0.4000 eq.), tri-o-tolyl-phosphine (24.3 mg; 80.0 μmol; 0.160 eq.) and tris(dibenzylideneacetone)dipalladium (0) (18.3 mg; 20.0 μmol; 0.0400 eq.). The vessel is evacuated and nitrogen purged three times and degassed chlorobenzene (6.25 $cm^3$) is added before the reaction mixture is degassed further for 5 minutes. The reaction mixture is heated up to 115° C. and stirred at this temperature for 3 minutes. Immediately after completion of the polymerisation reaction, the reaction mixture is allowed to cool to 65° C. and tributyl-phenyl-stannane (734 mg; 2.00 mmol; 4.00 eq.) is added, and the reaction mixture is heated back for 30 minutes. Immediately after completion of the first end-capping reaction, the reaction mixture is allowed to cool to 65° C. and bromo-benzene (471 mg; 3.00 mmol; 6.00 eq.) is added and the reaction mixture heated back for 17 hours. After second end-capping reaction, the reaction mixture is allowed to cool to 65° C. and precipitated into stirred methanol (250 $cm^3$). The polymer is collected by filtration and washed with methanol (2×50 $cm^3$) to give a solid. The polymer is subjected to sequential Soxhlet extraction with acetone, petroleum ether (40-60° C.), cyclohexane, chloroform. The chloroform fraction is concentrated in vacuo to 40 $cm^3$, precipitated into stirred methanol (250 $cm^3$) and collected by filtration to give a black solid (475 mg, Yield: 98%). GPC (50° C., chlorobenzene) $M_n$=46.3 kg $mol^{-1}$; $M_w$=136.4 kg $mol^{-1}$; PDI=2.95.

Example 53—Polymer 53

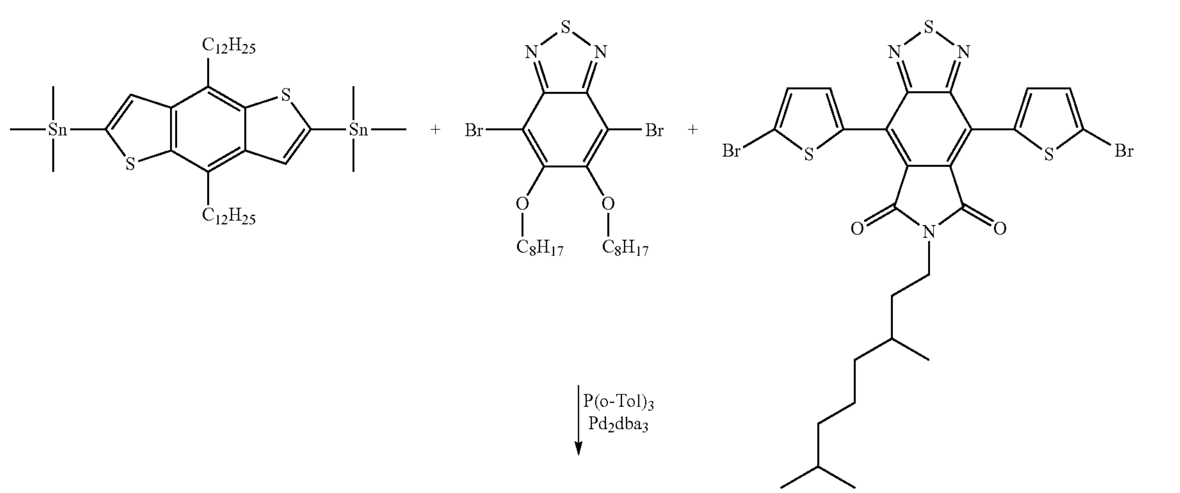

-continued

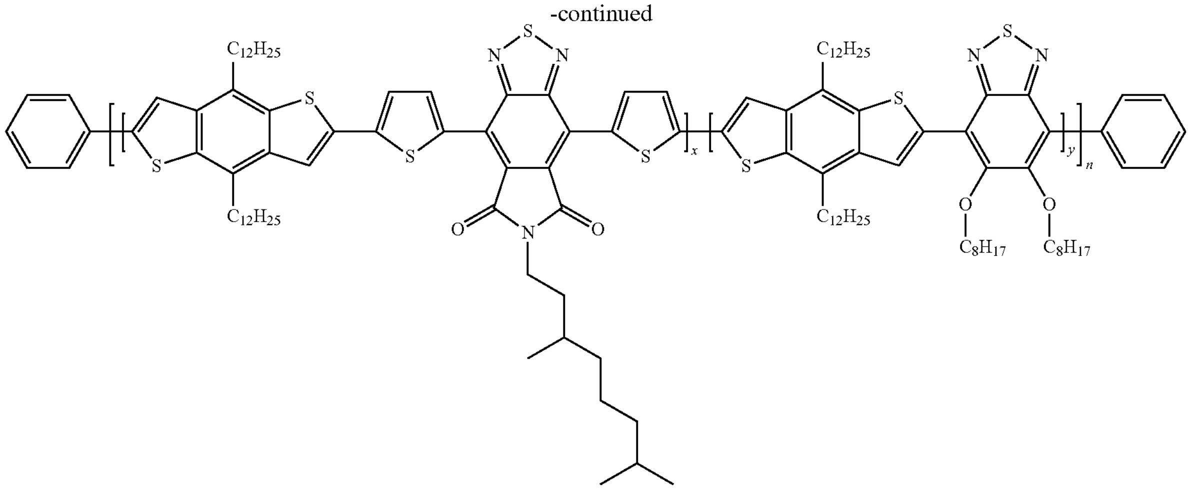

To a dry flask is added 4,8-didodecyl-2,6-bis-trimethyl-stannanyl-benzo[1,2-b;4,5-b']dithiophene (426.3 mg; 0.5000 mmol; 1.000 eq.), 4,8-bis-(5-bromo-thiophen-2-yl)-6-(3,7-dimethyl-octyl)-[1,2,5]thiadiazolo[3,4-e]isoindole-5,7-dione (133.5 mg; 0.2000 mmol; 0.4000 eq.), 4,7-dibromo-5,6-bis-octyloxy-benzo[1,2,5]thiadiazole (165.1 mg; 0.3000 mmol; 0.6000 eq.), tri-o-tolyl-phosphine (24.3 mg; 80.0 µmol; 0.160 eq.) and tris(dibenzylideneacetone)dipalladium (0) (18.3 mg; 20.0 µmol; 0.0400 eq.).

The vessel is evacuated and nitrogen purged three times and degassed chlorobenzene (6.25 $cm^3$) is added before the reaction mixture is degassed further for 5 minutes. The reaction mixture is heated up to 115° C. and stirred at this temperature for 3 minutes. Immediately after completion of the polymerisation reaction, the reaction mixture is allowed to cool to 65° C. and tributyl-phenyl-stannane (734 mg; 2.00 mmol; 4.00 eq.) is added, and the reaction mixture is heated back for 30 minutes. Immediately after completion of the first end-capping reaction, the reaction mixture is allowed to cool to 65° C. and bromo-benzene (471 mg; 3.00 mmol; 6.00 eq.) is added and the reaction mixture heated back for 17 hours. After second end-capping reaction, the reaction mixture is allowed to cool to 65° C. and precipitated into stirred methanol (250 $cm^3$). The polymer is collected by filtration and washed with methanol (2×50 $cm^3$) to give a solid. The polymer is subjected to sequential Soxhlet extraction with acetone, petroleum ether (40-60° C.), cyclohexane, chloroform. The chloroform fraction is concentrated in vacuo to 40 $cm^3$, precipitated into stirred methanol (250 $cm^3$) and collected by filtration to give a black solid (480.0 mg), GPC (50° C., chlorobenzene) $M_n$=38.0 kg $mol^{-1}$; $M_w$=104 kg $mol^{-1}$; PDI=2.75.

Example 54—Polymer 54

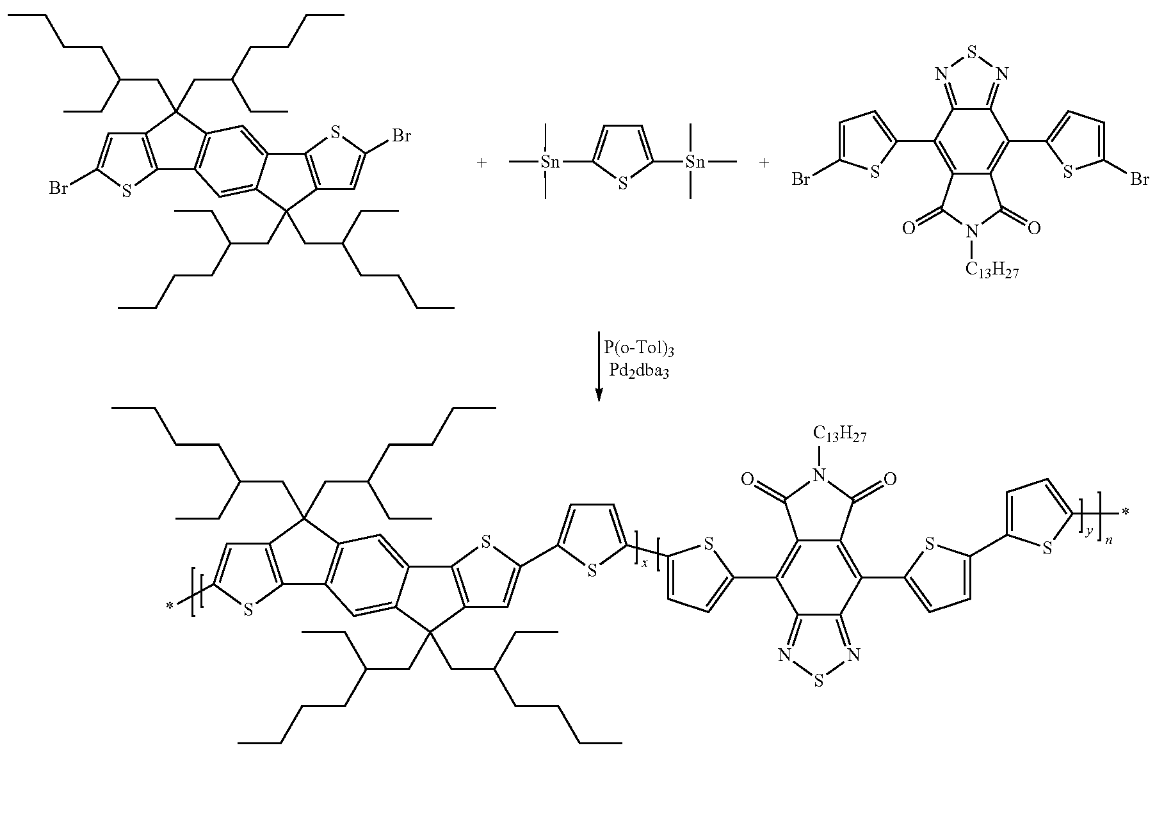

2,7-Dibromo-4,4,9,9-tetrakis(2-ethylhexyl)-4,9-dihydro-s-indaceno[1,2-b:5, 6-b']dithiophene, (263.5 mg; 0.3018 mmol; 1.000 eq.), 2,5-bis-trimethylstannanyl-thiophene (247.4 mg; 0.6036 mmol; 2.000 eq.) 4,8-bis-(5-bromo-thiophen-2-yl)-6-tridecyl-[1,2,5]thiadiazolo[3,4-e]isoindole-5,7-dione (214.2 mg; 0.3018 mmol; 1.000 eq.) tri-o-tolyl-phosphine (14.7 mg; 48.3 μmol; 0.160 eq.) and tris (dibenzylideneacetone)dipalladium(0) (11.1 mg; 12.1 μmol; 0.0400 eq.) are placed in a vial. The vial is sealed and degassed. Degassed chlorobenzene (12.3 $cm^3$) is added and the mixture further purged with nitrogen for 15 minutes. The vial is put in an oil bath and stirred at 140° C. for 2 hours. Tributylstannylbenzene (0.1 $cm^3$) is added and the mixture heated to 140° C. for 1 hour. Subsequently, bromobenzene (0.3 $cm^3$) is added and the mixture heated for 1 hour at the same temperature. The mixture is then poured to excess of methanol and the precipitate collected by filtration and subjected to Soxhlet extraction, using, subsequently, acetone, cyclohexane, chloroform and chlorobenzene. The chlorobenzene fraction is triturated separately by addition to excess of methanol, the precipitates collected by filtration and dried in vacuo. (265 mg, Yield: 61%), GPC (50° C., chlorobenzene): $M_n$=50.2 kg·mol$^{-1}$; $M_w$=280 kg·mol$^{-1}$; PDI=5.6.

Example 55—Polymer 55

A dry 20 $cm^3$ single neck microwave vial is charged with 4,8-didodecyl-2,6-bis-trimethylstannanyl-benzo[1,2-b;4,5-b']dithiophene (341.0 mg; 0.4000 mmol; 1.000 eq.), 4,7-dibromo-5,6-bis-(2-ethyl-hexyloxy)-benzo[1,2,5]thiadiazole (110.1 mg; 0.2000 mmol; 0.5000 eq.), 4,8-bis-(5-bromo-thiophen-2-yl)-6-octyl-[1,2,5]thiadiazolo[3,4-e]isoindole-5,7-dione (127.9 mg; 0.2000 mmol; 0.5000 eq.), tri-o-tolyl-phosphine (19.5 mg; 64.0 μmol; 0.160 eq.) and tris (dibenzylideneacetone)dipalladium(0) (14.7 mg; 16.0 μmol; 0.0400 eq.). The vessel is evacuated and nitrogen purged three times and degassed chlorobenzene (5.0 $cm^3$) is added before the reaction mixture is degassed further for 15 minutes. The reaction mixture is heated up to 140° C. and stirred at this temperature for 2 hours 20 minutes. After completion of the reaction, the reaction mixture is allowed to cool to 65° C. and precipitated into stirred methanol (150 $cm^3$). The polymer is collected by filtration and washed with methanol (2×50 $cm^3$) to give a solid. The polymer is then sequentially extracted by Soxhlet extraction with acetone, petroleum ether (40-60° C.) and cyclohexane. The cyclohexane fraction is concentrated in vacuo, precipitated by addition of methanol (100 $cm^3$) and collected by filtration to give a black solid (322 mg, Yield: 84%). GPC (50° C., chlorobenzene) $M_n$=15.5 kg mol$^{-1}$; $M_w$=33.5 kg mol$^{-1}$; PDI=2.16.

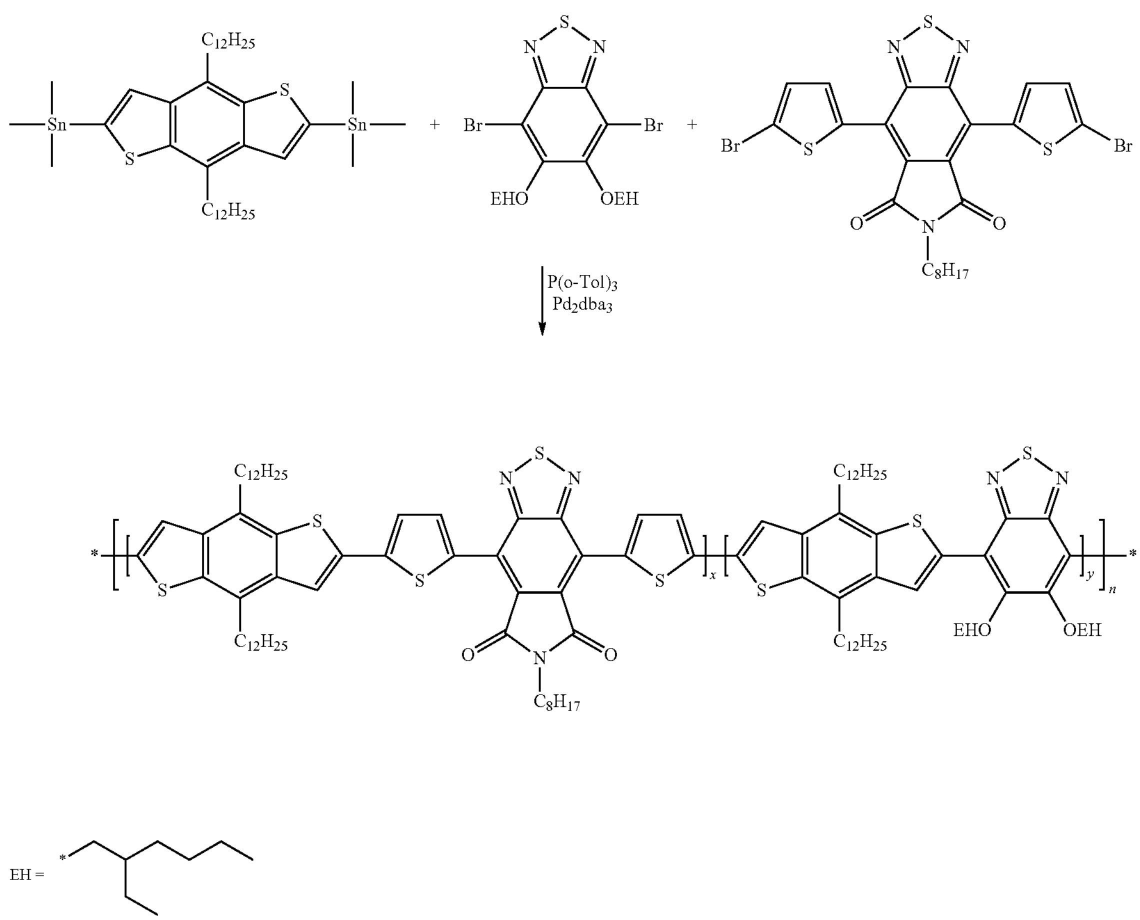

Example 56—Polymer 56

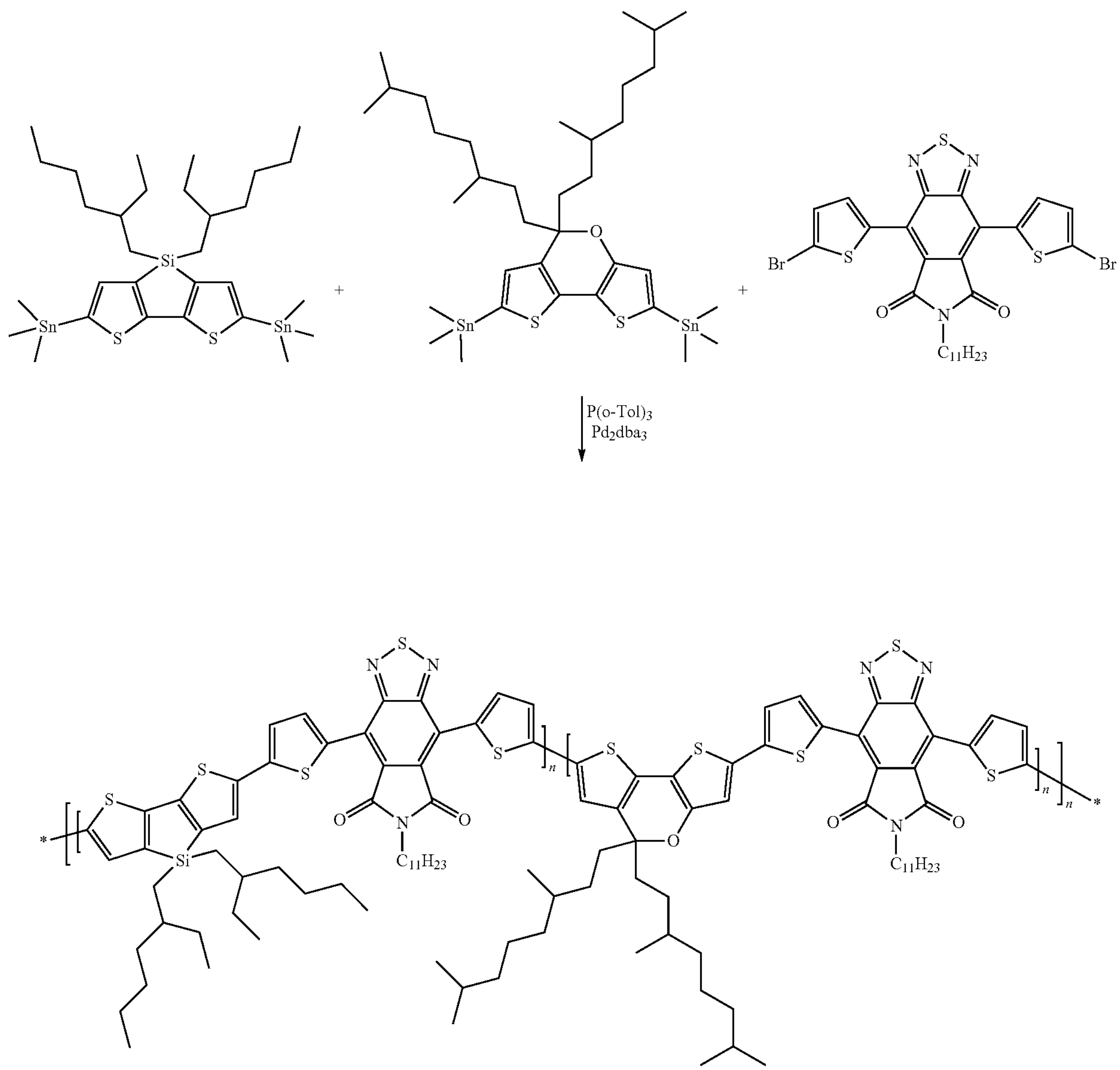

A dry 20 $cm^3$ single neck microwave vial is charged with 5,5-bis-(3,7-dimethyl-octyl)-2,7-bis-tributylstannanyl-5H-4-oxa-1,8-dithia-as-indacene (315.9 mg; 0.3000 mmol; 1.000 eq.), 7,7-bis-(2-ethyl-hexyl)-2,5-bis-trimethylstannanyl-7H-3,4-dithia-7-sila-cyclopenta[a]pentalene (223.3 mg; 0.3000 mmol; 1.000 eq.), 4,8-bis-(5-bromo-thiophen-2-yl)-6-undecyl-[1,2,5]thiadiazolo[3,4-e]isoindole-5,7-dione (396.6 mg; 0.5820 mmol; 1.940 eq.), tri-o-tolyl-phosphine (11.0 mg; 36.0 μmol; 0.120 eq.) and tris (dibenzylideneacetone)dipalladium(0) (5.5 mg; 6.0 μmol; 0.020 eq.). The vessel is evacuated and nitrogen purged three times and degassed toluene (15.0 $cm^3$) is added before the reaction mixture is degassed further for 15 minutes. The reaction mixture is heated up to 100° C. and stirred at this temperature for 3 hours 30 minutes. After completion of the reaction, the reaction mixture is allowed to cool to 65° C. and precipitated into stirred methanol (150 $cm^3$). The polymer is collected by filtration and washed with methanol (2×50 $cm^3$) to give a solid. The polymer is then sequentially extracted by Soxhlet extraction with acetone, petroleum ether (40-60° C.), cyclohexane and chloroform. The chloroform fraction is concentrated in vacuo, precipitated by addition of methanol (100 $cm^3$) and collected by filtration to give a black solid (533 mg, Yield: 92%). GPC (50° C., chlorobenzene) $M_n$=39.5 kg $mol^{-1}$; $M_w$=157.5 kg $mol^{-1}$; PDI=3.99.

Example 57—Polymer 57

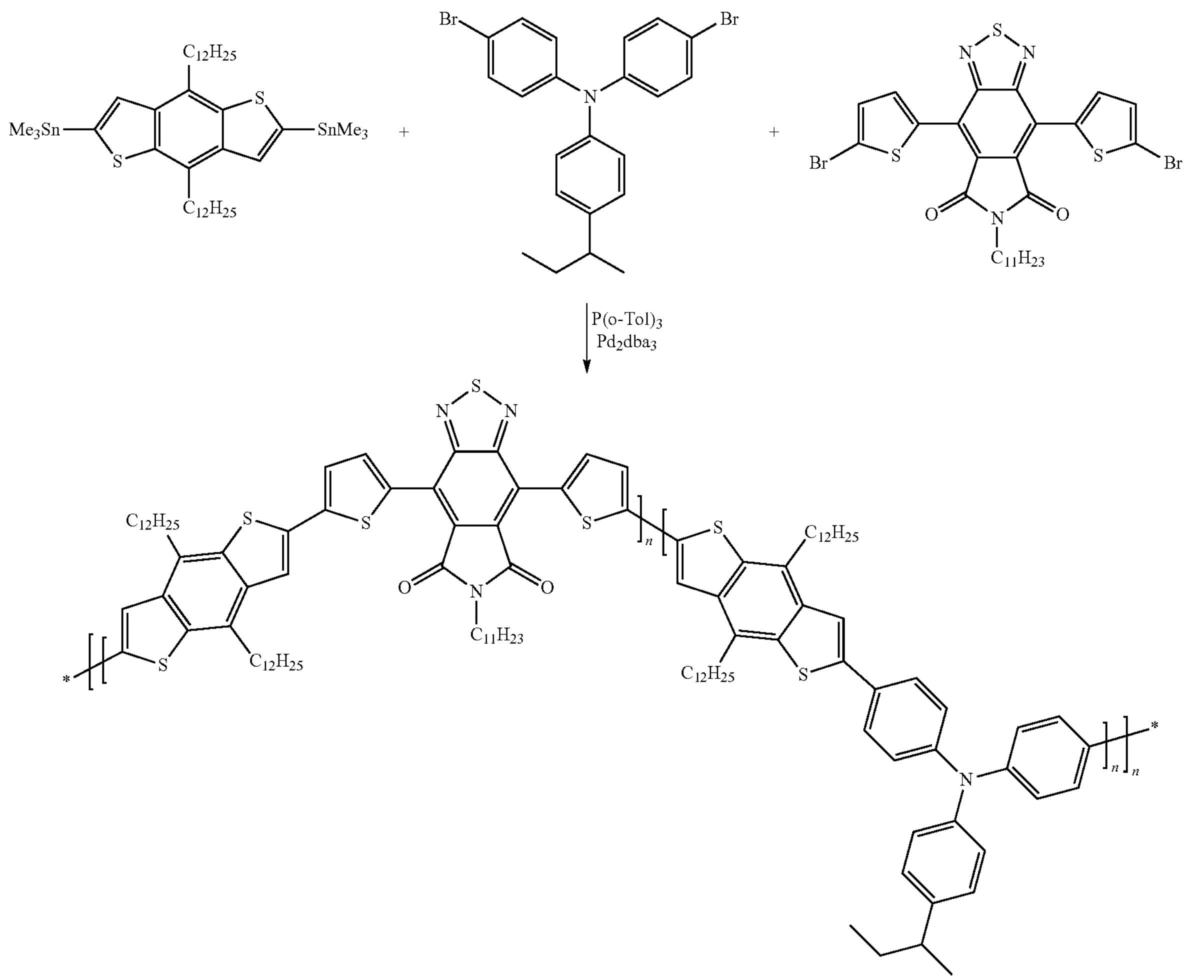

A dry 20 $cm^3$ single neck microwave vial is charged with 4,8-didodecyl-2,6-bis-trimethylstannanyl-benzo[1,2-b;4,5-b']dithiophene (341.0 mg; 0.4000 mmol; 1.000 eq.), bis-(4-bromo-phenyl)-(4-sec-butyl-phenyl)-amine (91.8 mg; 0.200 mmol; 0.500 eq.), 4,8-bis-(5-bromo-thiophen-2-yl)-6-undecyl-[1,2,5]thiadiazolo[3,4-e]isoindole-5,7-dione (136.3 mg; 0.2000 mmol; 0.5000 eq.), tri-o-tolyl-phosphine (19.5 mg; 64.0 μmol; 0.160 eq.) and tris(dibenzylideneacetone)dipalladium(0) (14.7 mg; 16.0 μmol; 0.0400 eq.).

The vessel is evacuated and nitrogen purged three times and degassed chlorobenzene (5.0 $cm^3$) is added before the reaction mixture is degassed further for 15 minutes. The reaction mixture is heated up to 140° C. and stirred at this temperature for 2 hours 40 minutes. After completion of the reaction, the reaction mixture is allowed to cool to 65° C. and precipitated into stirred methanol (150 $cm^3$). The polymer is collected by filtration and washed with methanol (2×50 $cm^3$) to give a solid. The polymer is then sequentially extracted by Soxhlet extraction with acetone, petroleum ether (40-60° C.), cyclohexane, and chloroform. The chloroform fraction is concentrated in vacuo, precipitated by addition of methanol (100 $cm^3$) and collected by filtration to give a black solid (187 mg, Yield: 50%). GPC (50° C., chlorobenzene) $M_n$=13.2 kg $mol^{-1}$; $M_w$=30.2 kg $mol^{-1}$; PDI=2.29.

Example 58—Polymer 58

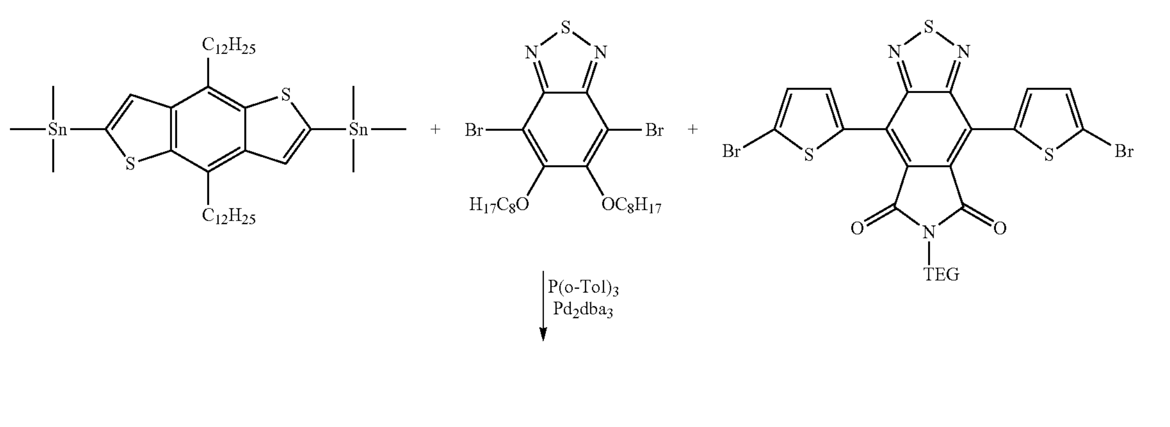

-continued

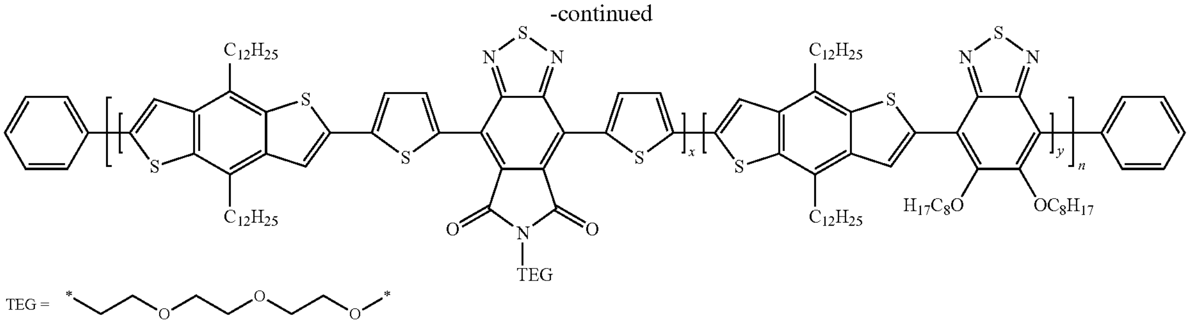

A dry 20 $cm^3$ single neck microwave vial is charged with 4,8-didodecyl-2,6-bis-trimethylstannanyl-benzo[1,2-b;4,5-b']dithiophene (341.0 mg; 0.4000 mmol; 1.000 eq.), 4,7-dibromo-5,6-bis-octyloxy-benzo[1,2,5]thiadiazole (110.1 mg; 0.2000 mmol; 0.5000 eq.), 4,8-bis-(5-bromo-thiophen-2-yl)-6-{2-[2-(2-methoxy-ethoxy)-ethoxy]-ethyl}-[1,2,5]thiadiazolo[3,4-e]isoindole-5,7-dione (134.7 mg; 0.2000 mmol; 0.5000 eq.), tri-o-tolyl-phosphine (19.5 mg; 64.0 μmol; 0.160 eq.) and tris(dibenzylideneacetone)dipalladium (0) (14.7 mg; 16.0 μmol; 0.0400 eq.). The vessel is evacuated and nitrogen purged three times and degassed chlorobenzene (5.0 $cm^3$) is added before the reaction mixture is degassed further for 15 minutes. The reaction mixture is heated up to 140° C. and stirred at this temperature for 2 hours 10 minutes, then end-capped with tributylphenylstannane (0.13 $cm^3$; 0.40 mmol; 1.0 eq.), heated to 140° C. for 1 hour, and then end-capped with bromobenzene (0.08 $cm^3$; 0.80 mmol; 2.0 eq.) and heated to 140° C. for 1 hour. After completion of the reaction, the reaction mixture is allowed to cool to 65° C. and precipitated into stirred methanol (150 $cm^3$). The polymer is collected by filtration and washed with methanol (2×50 $cm^3$) to give a solid. The polymer is then sequentially extracted by Soxhlet extraction with acetone, petroleum ether (40-60° C.), cyclohexane, and chloroform. The chloroform fraction is concentrated in vacuo, precipitated by addition of methanol (100 $cm^3$) and collected by filtration to give a black solid (379 mg, Yield: 97%). GPC (50° C., chlorobenzene) $M_n$=29.6 kg $mol^{-1}$; $M_w$=82.5 kg $mol^{-1}$; PDI=2.78.

Example 59—Polymer 59

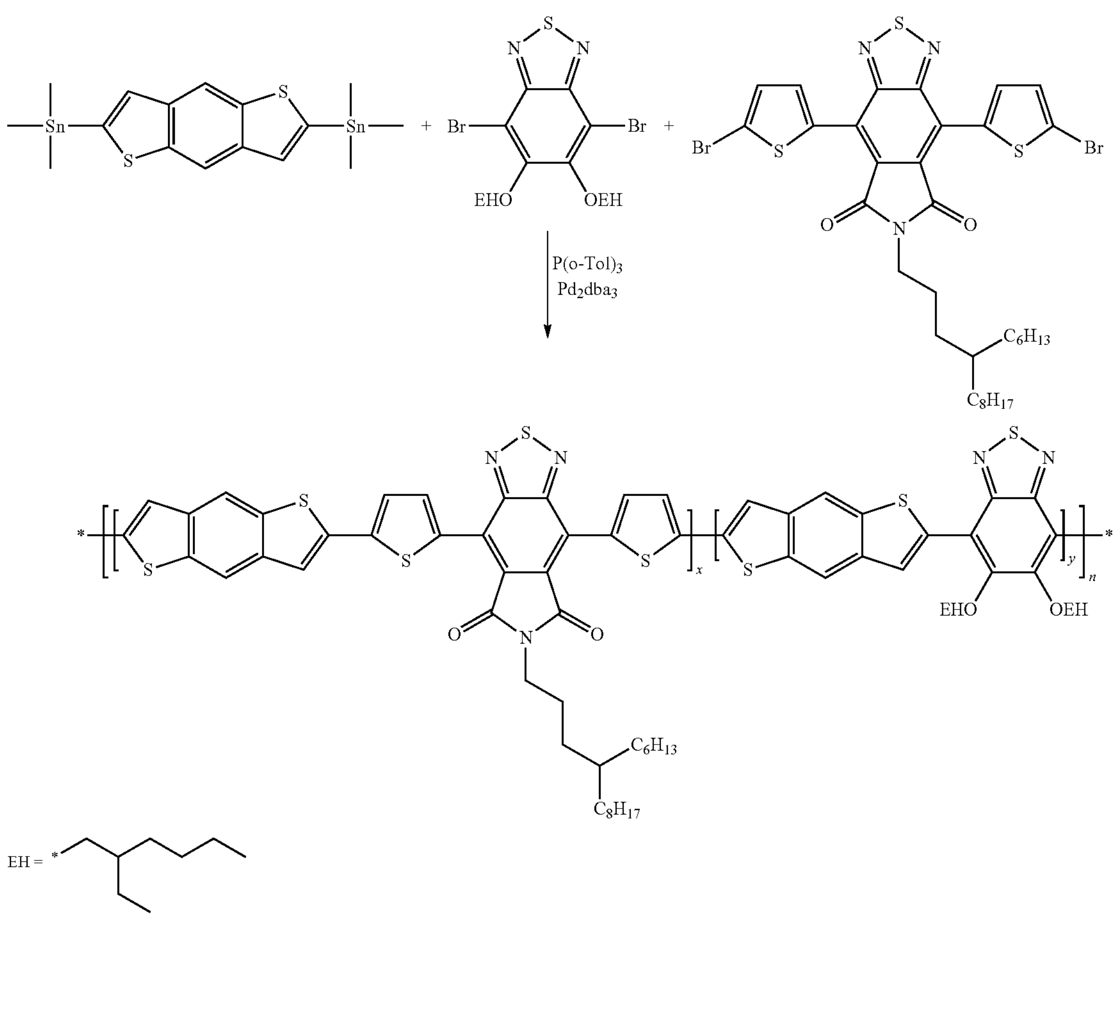

A dry 20 $cm^3$ single neck microwave vial is charged with 2,6-bis-trimethylstannanyl-benzo[1,2-b;4,5-b']dithiophene (206.4 mg; 0.4000 mmol; 1.000 eq.), 4,7-dibromo-5,6-bis-(2-ethyl-hexyloxy)-benzo[1,2,5]thiadiazole (110.1 mg; 0.2000 mmol; 0.5000 eq.), 4,8-bis-(5-bromo-thiophen-2-yl)-6-(4-hexyl-dodecyl)-[1,2,5]thiadiazolo[3,4-e]isoindole-5,7-dione (155.9 mg; 0.2000 mmol; 0.5000 eq.), tri-o-tolyl-phosphine (19.5 mg; 64.0 μmol; 0.160 eq.) and tris(dibenzylideneacetone)dipalladium(0) (14.7 mg; 16.0 μmol; 0.0400 eq.). The vessel is evacuated and nitrogen purged three times and degassed chlorobenzene (5.0 $cm^3$) is added before the reaction mixture is degassed further for 15 minutes. The reaction mixture is heated up to 140° C. and stirred at this temperature for 40 minutes. After completion of the reaction, the reaction mixture is allowed to cool to 65° C. and precipitated into stirred methanol (150 $cm^3$). The polymer is collected by filtration and washed with methanol (2×50 $cm^3$) to give a solid. The polymer is then sequentially extracted by Soxhlet extraction with acetone, petroleum ether (40-60° C.), cyclohexane, chloroform and chlorobenzene. The chloroform fraction is concentrated in vacuo, precipitated by addition of methanol (100 $cm^3$) and collected by filtration to give a black solid (40 mg, Yield: 14%). GPC (50° C., chlorobenzene) $M_n$=3.8 kg $mol^{-1}$; $M_w$=27.5 kg $mol^{-1}$; PDI=7.2

Example 60—Polymer 60

4,8-Didodecyl-2,6-bis-trimethylstannanyl-benzo[1,2-b;4,5-b']dithiophene (511.5 mg; 0.60 mmol; 1.00 eq.), 2,6-dibromo-4,8-didodecyl-benzo[1,2-b;4,5-b']dithiophene (205.4 mg; 0.30 mmol; 0.50 eq.), 4,8-bis-(5-bromo-thiophen-2-yl)-6-tridecyl-[1,2,5]thiadiazolo[3,4-e]isoindole-5,7-dione (212.9 mg; 0.30 mmol; 0.50 eq.), tri-o-tolyl-phosphine (29.2 mg; 96.00 μmol; 0.16 eq.) and tris(dibenzylideneacetone)dipalladium(0) (22.0 mg; 24.0 μmol; 0.04 eq.) are placed in a 20 $cm^3$ vial. The vial is sealed and degassed. Degassed chlorobenzene (12.2 $cm^3$) is added and the mixture further purged with nitrogen for 15 minutes. The vial is heated and stirred at 140° C. After 5 minutes, the mixture formed a dark blue gel, which was cooled to room temperature, washed with methanol and extracted in a Soxhlet extraction with, subsequently, acetone, petroleum ether (40-60° C.), cyclohexane, chloroform and chlorobenzene. The polymer is found to be insoluble in these solvents.

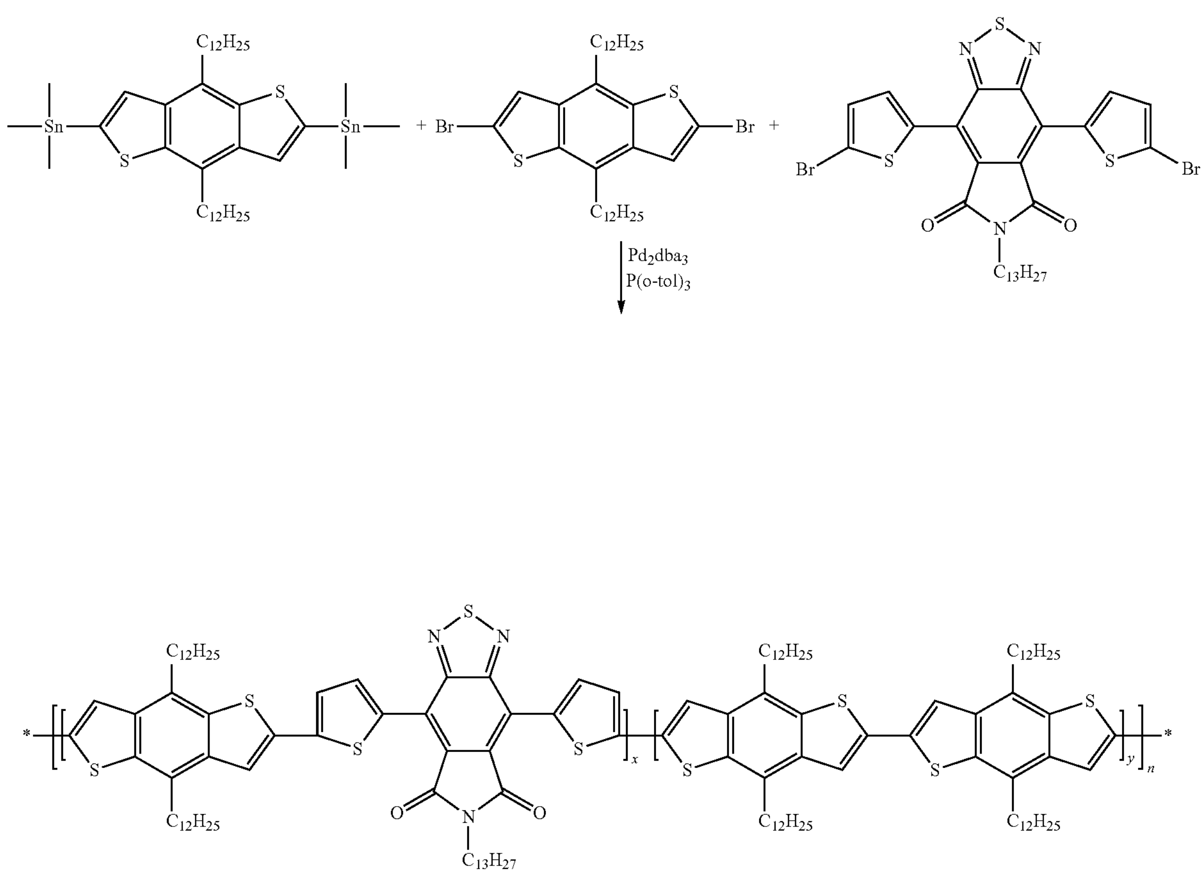

Example 61—Polymer 61

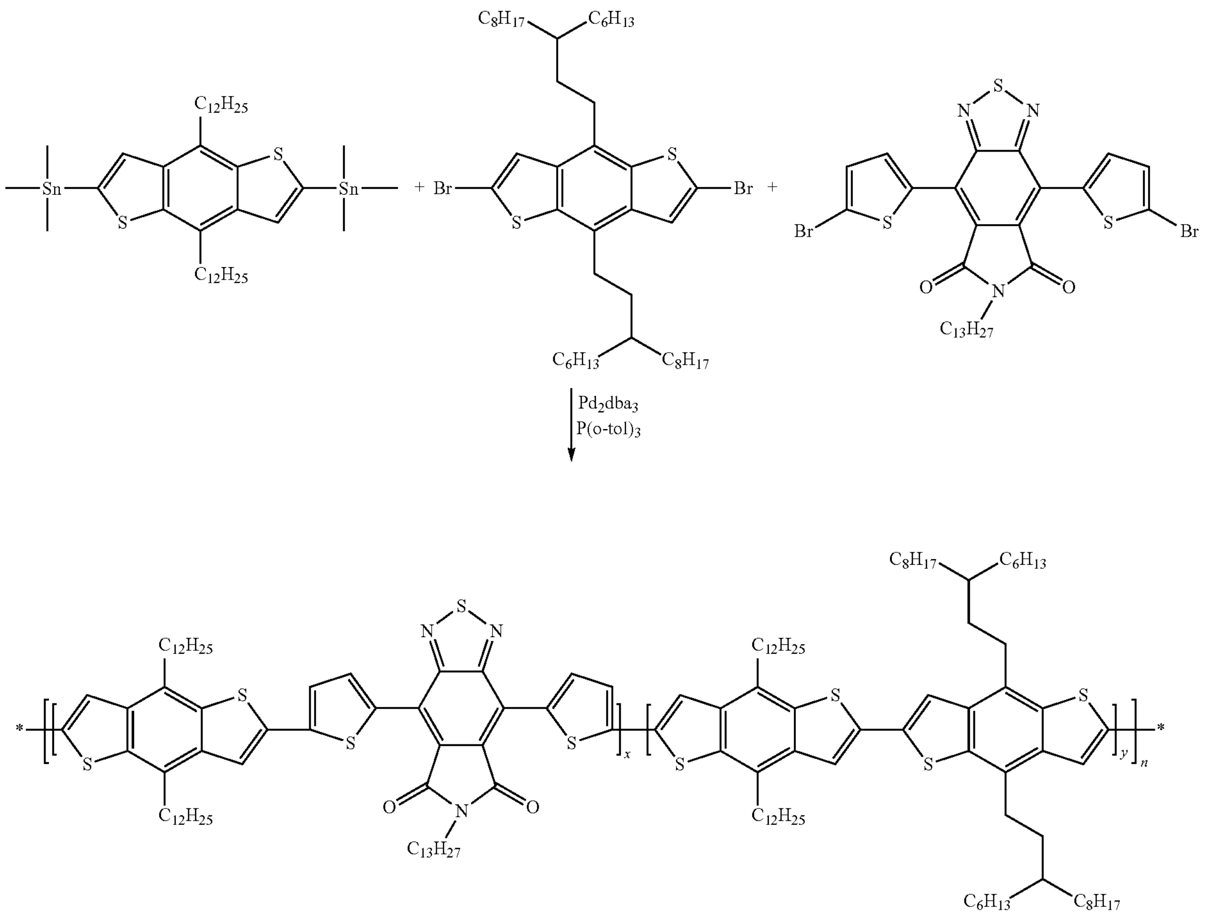

4,8-Didodecyl-2,6-bis-trimethylstannanyl-benzo[1,2-b;4,5-b']dithiophene (250.0 mg; 0.29 mmol; 1.00 eq.), 2,6-dibromo-4,8-bis-(3-hexyl-undecyl)-benzo[1,2-b;4,5-b']dithiophene (120.96 mg; 0.15 mmol; 0.50 eq.), 4,8-Bis-(5-bromo-thiophen-2-yl)-6-tridecyl-[1,2,5]thiadiazolo[3,4-e]isoindole-5,7-dione (104.04 mg; 0.15 mmol; 0.50 eq.), tri-o-tolyl-phosphine (14.3 mg; 46.92 μmol; 0.16 eq.) and tris(dibenzylideneacetone)dipalladium(0) (10.7 mg; 11.7 μmol; 0.04 eq.) are placed in a 20 $cm^3$ vial. The vial is sealed and degassed. Degassed chlorobenzene (6.0 $cm^3$) is added and the mixture further purged with nitrogen for 15 minutes. The vial is heated and stirred at 140° C. After 5 minutes, the mixture formed a dark blue gel, which was cooled to room temperature, washed with methanol and extracted in a Soxhlet extraction with, subsequently, acetone, petroleum ether (40-60° C.), cyclohexane, chloroform and chlorobenzene. The polymer is found to be insoluble in these solvents.

Example 62—Polymer 62

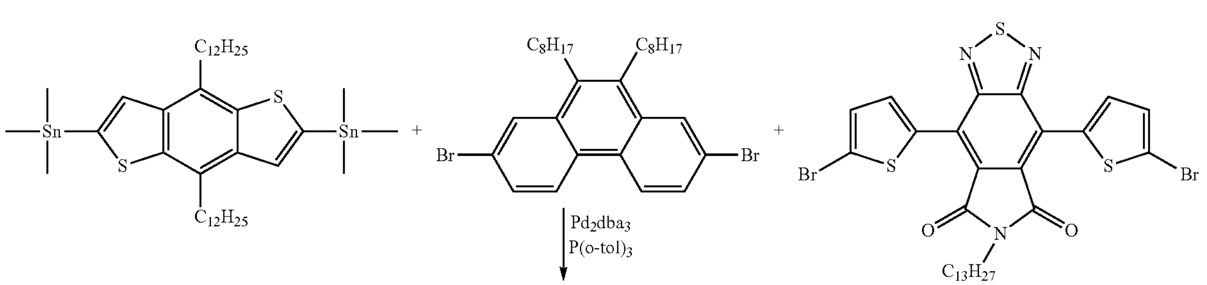

-continued

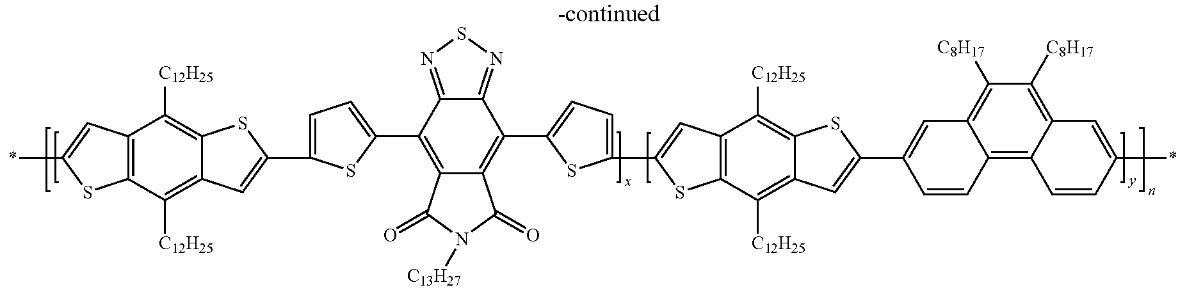

4,8-Didodecyl-2,6-bis-trimethylstannanyl-benzo[1,2-b;4,5-b']dithiophene (250.0 mg; 0.29 mmol; 1.00 eq.), 2,7-dibromo-9,10-dioctyl-phenanthrene (82.17 mg; 0.15 mmol; 0.50 eq.), 4,8-bis-(5-bromo-thiophen-2-yl)-6-tridecyl-[1,2,5]thiadiazolo[3,4-e]isoindole-5,7-dione (104.0 mg; 0.15 mmol; 0.50 eq.), tri-o-tolyl-phosphine (14.28 mg; 46.92 μmol; 0.16 eq.) and $Pd_2(dba)_3$ (10.74 mg; 11.73 μmol; 0.04 eq.) are placed in a 20 $cm^3$ vial. The vial is sealed and degassed. Degassed chlorobenzene (6.0 $cm^3$) is added and the mixture further purged with nitrogen for 15 minutes. The vial is heated at 140° C. for 1 h in an oil bath. The mixture is transferred into a flask containing 200 $cm^3$ of methanol, the precipitate collected by filtration and subjected to Soxhlet extraction with, subsequently, acetone, petroleum ether (40-60° C.), cyclohexane, chloroform and chlorobenzene. The chlorobenzene fraction is triturated by addition of excess methanol, the precipitate is collected by filtration and dried in vacuo to give a black solid (221 mg, 75%). GPC (50° C., chlorobenzene) $M_n$=24.4 kg $mol^{-1}$; $M_w$=74.4 $mol^{-1}$; PDI=3.04.

Example 63—Polymer 63

A dry 20 $cm^3$ single neck microwave vial is charged with 4,8-didodecyl-2,6-bis-trimethylstannanyl-benzo[1,2-b;4,5-b']dithiophene (383.6 mg; 0.4500 mmol; 1.000 eq.), 2,5-bis-(5-bromo-3-tetradecyl-thiophen-2-yl)-thiazolo[5,4-d]thiazole (192.8 mg; 0.2250 mmol; 0.500 eq.), 4,8-bis-(5-bromo-thiophen-2-yl)-6-(4-hexyl-dodecyl)-[1,2,5]thiadiazolo[3,4-e]isoindole-5,7-dione (175.4 mg; 0.2250 mmol; 0.500 eq.), tri-o-tolyl-phosphine (21.9 mg; 72.0 μmol; 0.160 eq.) and tris(dibenzylideneacetone)dipalladium(0) (16.5 mg; 18.0 μmol; 0.040 eq.). The vessel is evacuated and nitrogen purged three times and degassed chlorobenzene (5.6 $cm^3$) is added before the reaction mixture is degassed further for 15 minutes. The reaction mixture is heated up to 130° C. and stirred at this temperature for 45 minutes. After completion of the reaction, the reaction mixture is allowed to cool to 65° C. and precipitated into stirred methanol (150 $cm^3$). The polymer is collected by filtration and washed with methanol (2×50 $cm^3$) to give a solid. The polymer is then sequentially extracted by Soxhlet extraction with acetone, petroleum ether (40-60° C.), cyclohexane, chloroform and chlorobenzene. The chlorobenzene fraction is concentrated in vacuo to 75 $cm^3$, precipitated by addition of methanol (100 $cm^3$) and collected by filtration to give a purple solid (435 mg, 82%) which is sparingly soluble in chlorobenzene.

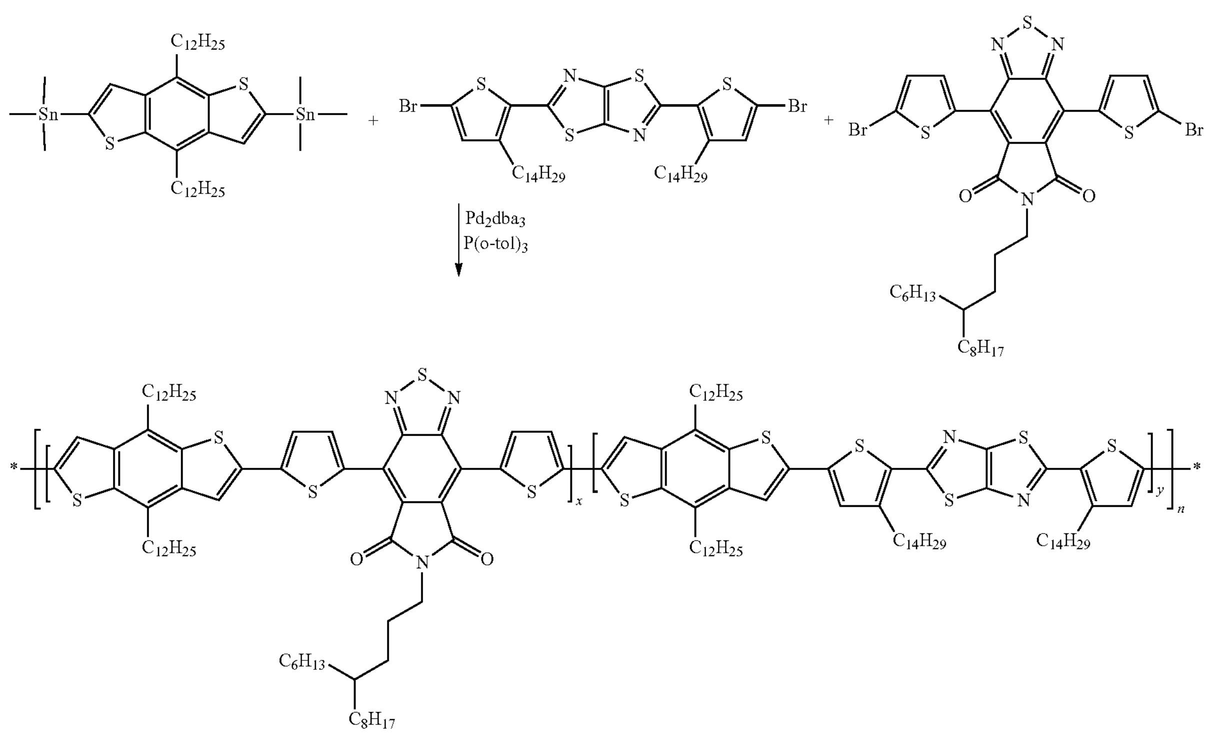

Example 64—Polymer 64

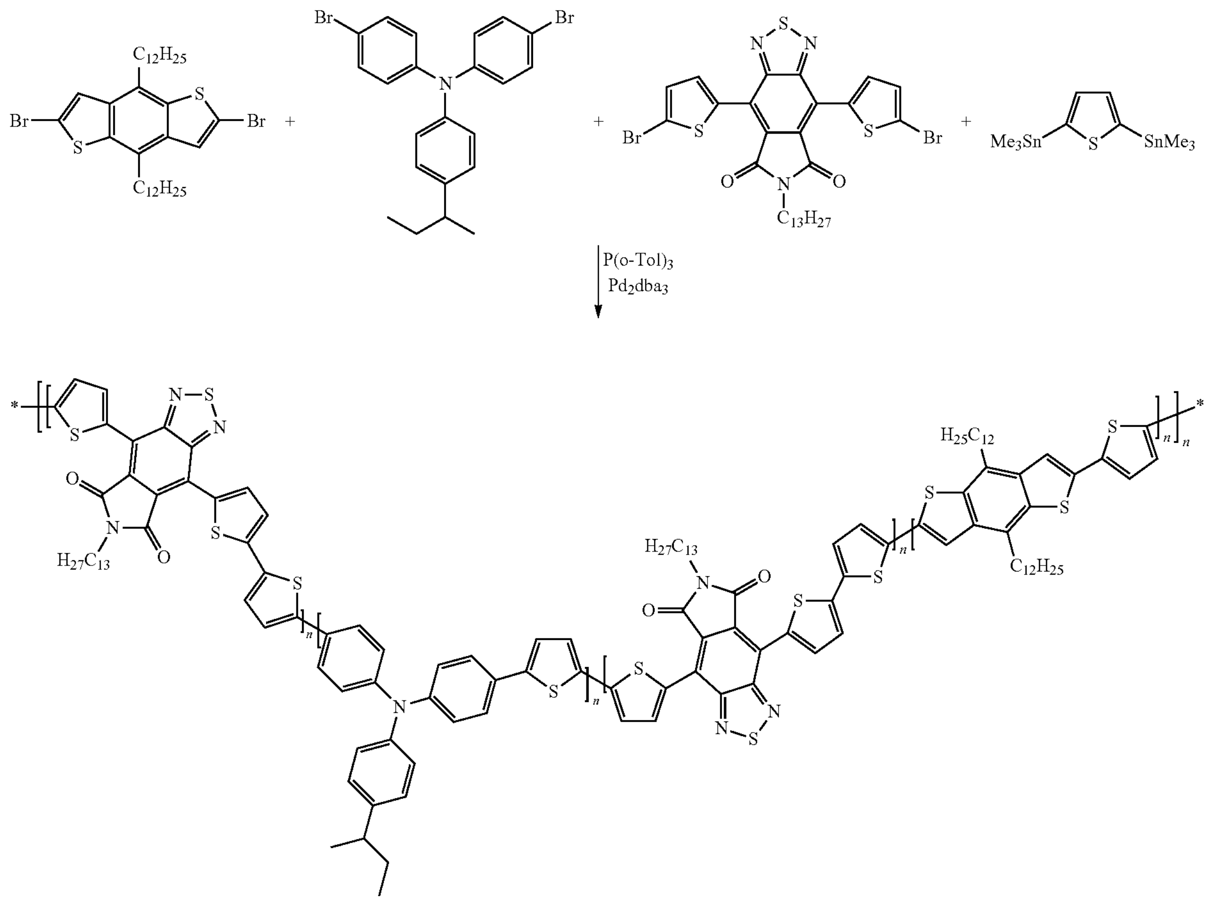

A dry 20 $cm^3$ single neck microwave vial is charged with 2,6-dibromo-4,8-didodecyl-benzo[1,2-b;4,5-b']dithiophene (68.5 mg; 0.1000 mmol; 0.250 eq.), bis-(4-bromo-phenyl)-(4-sec-butyl-phenyl)-amine (45.9 mg; 0.100 mmol; 0.250 eq.), 4,8-bis-(5-bromo-thiophen-2-yl)-6-tridecyl-[1,2,5]thiadiazolo[3,4-e]isoindole-5,7-dione (141.9 mg; 0.2000 mmol; 0.5000 eq.), 2,5-bis-trimethylstannanyl-thiophene (163.9 mg; 0.4000 mmol; 1.000 eq.), tri-o-tolyl-phosphine (19.5 mg; 64.0 μmol; 0.160 eq.) and tris(dibenzylideneacetone) dipalladium(0) (14.7 mg; 16.0 μmol; 0.0400 eq.). The vessel is evacuated and nitrogen purged three times and degassed chlorobenzene (5.0 $cm^3$) is added before the reaction mixture is degassed further for 15 minutes. The reaction mixture is heated up to 140° C. and stirred at this temperature for 2 hours 40 minutes. After completion of the reaction, the reaction mixture is allowed to cool to 65° C. and precipitated into stirred methanol (150 $cm^3$). The polymer is collected by filtration and washed with methanol (2×50 $cm^3$) to give a solid. The polymer is then sequentially extracted by Soxhlet extraction with acetone, petroleum ether (40-60° C.), cyclohexane, chloroform and chlorobenzene. The polymer is found to be insoluble in these solvents.

Example 65—Polymer 65

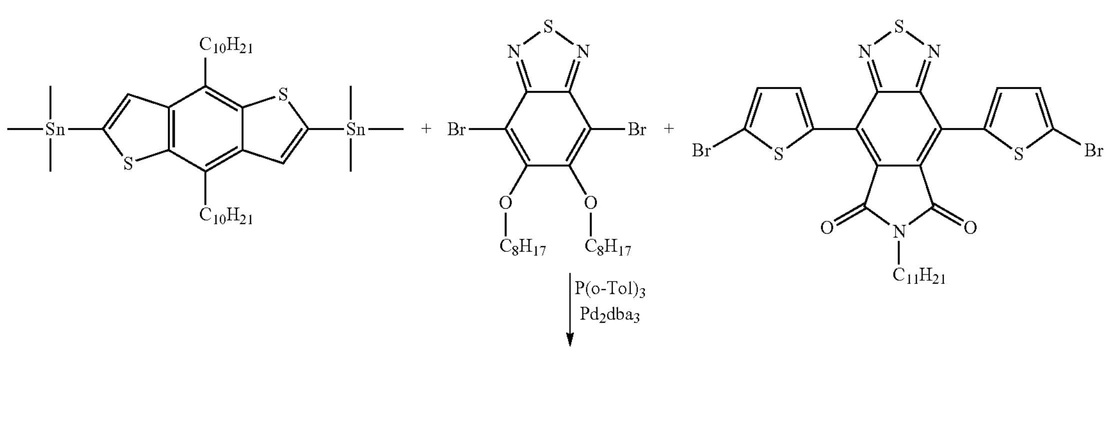

-continued

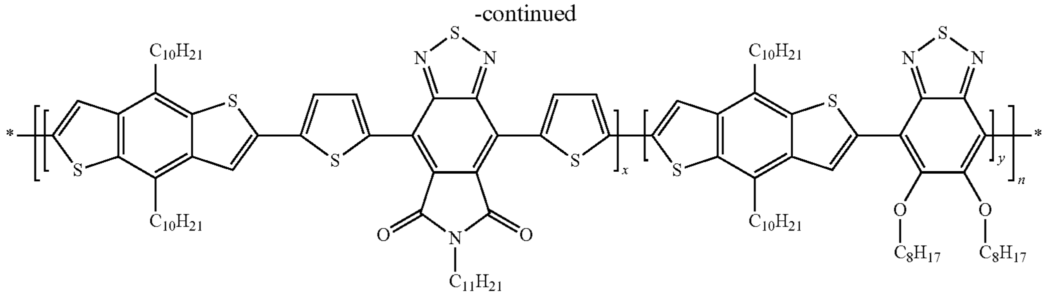

To a dry flask is added 4,8-didecyl-2,6-bis-trimethylstannanyl-benzo[1,2-b;4,5-b']dithiophene (318.6 mg; 0.4000 mmol; 1.000 eq.), 4,8-bis-(5-bromo-thiophen-2-yl)-6-undecyl-[1,2,5]thiadiazolo[3,4-e]isoindole-5,7-dione (136.3 mg; 0.200 mmol; 0.5000 eq.), 4,7-dibromo-5,6-bis-octyloxy-benzo[1,2,5]thiadiazole (110.1 mg; 0.200 mmol; 0.5000 eq.), tri-o-tolyl-phosphine (19.5 mg; 64.0 μmol; 0.160 eq.) and tris(dibenzylideneacetone)dipalladium(0) (14.7 mg; 16.0 μmol; 0.0400 eq.). The vessel is evacuated and nitrogen purged three times and degassed chlorobenzene (5.00 $cm^3$) is added before the reaction mixture is degassed further for 15 minutes. The reaction mixture is heated up to 140° C. and stirred at this temperature for 1 hour 45 minutes, then tributyl-phenyl-stannane (0.13 $cm^3$; 0.400 mmol; 1.000 eq.) is added and the reaction mixture stirred at 140° C. for 1 h, and then bromo-benzene (0.08 $cm^3$; 0.800 mmol; 2.000 eq.) is added and the reaction mixture is stirred at 140° C. for 1 hour. After completion of the reaction, the reaction mixture is allowed to cool to 65° C. and precipitated into stirred methanol (250 $cm^3$). The polymer is collected by filtration and washed with methanol (2×50 $cm^3$) to give a solid. The polymer is subjected to sequential Soxhlet extraction with acetone, petroleum ether (40-60° C.), cyclohexane and chloroform. The chloroform fraction is concentrated in vacuo to 20 $cm^3$, precipitated into stirred methanol (250 $cm^3$) and collected by filtration to give a black solid (373 mg). GPC (50° C., chlorobenzene) $M_n$=30.1 kg $mol^{-1}$; $M_w$=90.2 kg $mol^{-1}$; PDI=3.0.

Example 66—Polymer 66

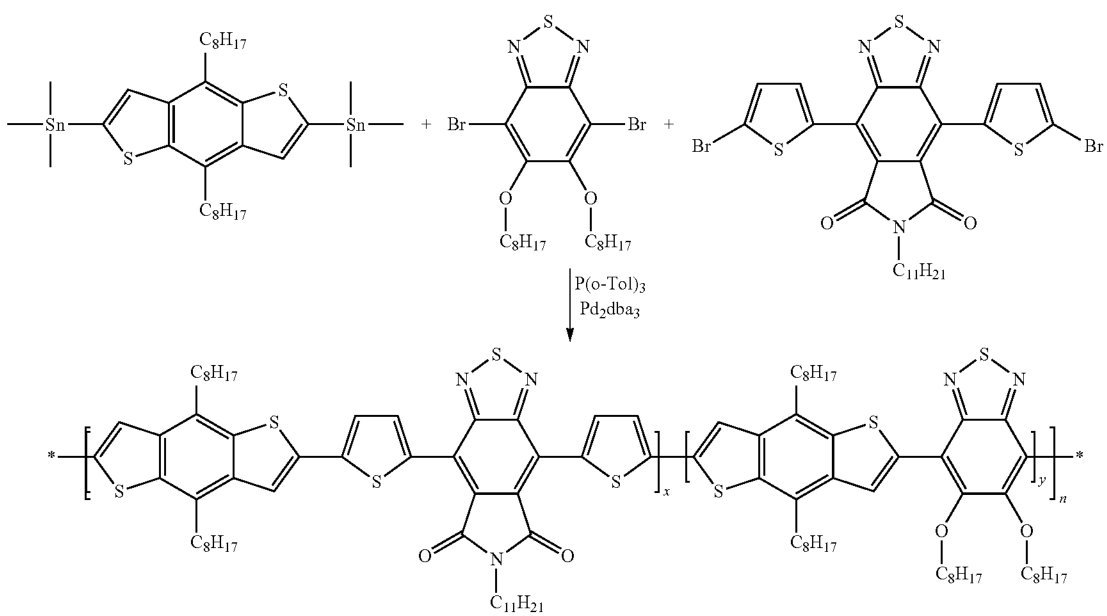

To a dry flask is added 4,8-dioctyl-2,6-bis-trimethylstannanyl-benzo[1,2-b;4,5-b']dithiophene (296.1 mg; 0.4000 mmol; 1.000 eq.), 4,8-bis-(5-bromo-thiophen-2-yl)-6-undecyl-[1,2,5]thiadiazolo[3,4-e]isoindole-5,7-dione (136.3 mg; 0.200 mmol; 0.5000 eq.), 4,7-dibromo-5,6-bis-octyloxy-benzo[1,2,5]thiadiazole (110.1 mg; 0.200 mmol; 0.5000 eq.), tri-o-tolyl-phosphine (19.5 mg; 64.0 μmol; 0.160 eq.) and tris(dibenzylideneacetone)dipalladium(0) (14.7 mg; 16.0 μmol; 0.0400 eq.). The vessel is evacuated and nitrogen purged three times and degassed chlorobenzene (5.00 $cm^3$) is added before the reaction mixture is degassed further for 15 minutes. The reaction mixture is heated up to 140° C. and stirred at this temperature for 2 hour 5 minutes, then tributyl-phenyl-stannane (0.13 $cm^3$; 0.400 mmol; 1.000 eq.) is added and the reaction mixture stirred at 140° C. for 1 h, and then bromo-benzene (0.08 $cm^3$; 0.800 mmol; 2.000 eq.) is added and the reaction mixture is stirred at 140° C. for 1 hour. After completion of the reaction, the reaction mixture is allowed to cool to 65° C. and precipitated into stirred methanol (250 $cm^3$).

The polymer is collected by filtration and washed with methanol (2×50 $cm^3$) to give a solid. The polymer is subjected to sequential Soxhlet extraction with acetone, petroleum ether (40-60° C.), cyclohexane and chloroform. The chloroform fraction is concentrated in vacuo to 20 $cm^3$, precipitated into stirred methanol (250 $cm^3$) and collected by filtration to give a black solid (297 mg, Yield: 85%). GPC (50° C., chlorobenzene) $M_n$=23.7 kg $mol^{-1}$; $M_w$=79.4 kg $mol^{-1}$; PDI=3.36.

Example 67—Polymer 67

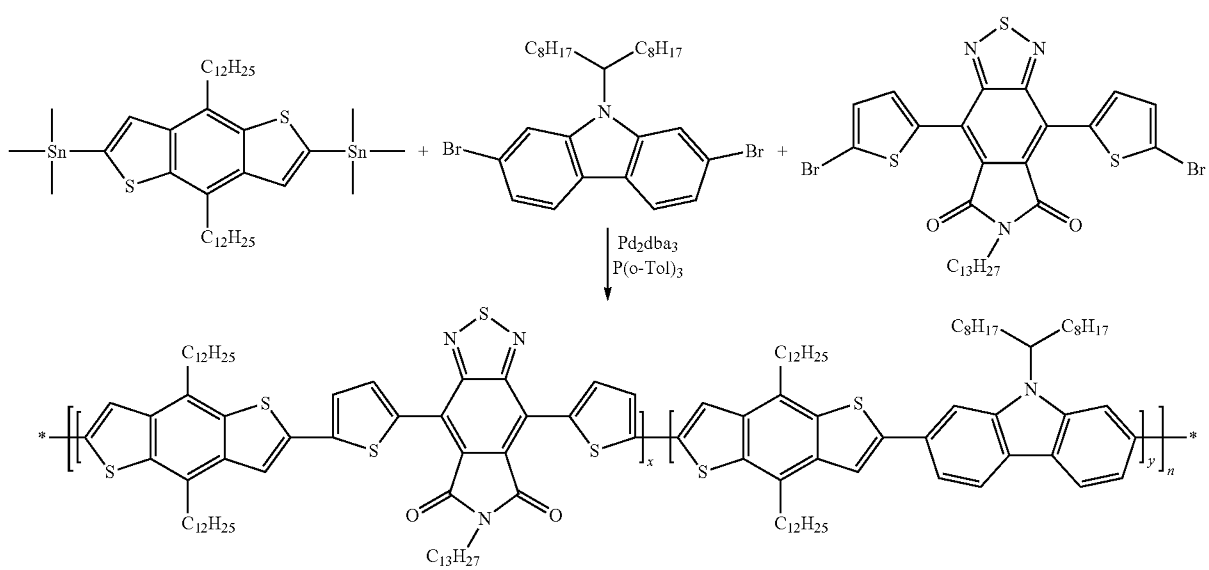

4,8-Didodecyl-2,6-bis-trimethylstannanyl-benzo[1,2-b;4,5-b']dithiophene (250.0 mg; 0.29 mmol; 1.00 eq.), 2,7-dibromo-9-(1-octyl-nonyl)-9H-carbazole (82.6 mg; 0.15 mmol; 0.50 eq.), 4,8-bis-(5-bromo-thiophen-2-yl)-6-tridecyl-[1,2,5]thiadiazolo[3,4-e]isoindole-5,7-dione (104.0 mg; 0.15 mmol; 0.50 eq.), tri-o-tolyl-phosphine (14.3 mg; 46.9 μmol; 0.16 eq.) and tris(dibenzylideneacetone)dipalladium (0) (10.7 mg; 11.7 μmol; 0.04 eq.) are placed in a 20 $cm^3$ vial. The vial is sealed and degassed. Degassed toluene (6.2 $cm^3$) is added and the mixture further purged with nitrogen for 15 minutes. The vial is heated at 100° C. for 16 hours in an oil bath. The mixture is transferred into a flask containing 200 $cm^3$ of methanol, the precipitate collected by filtration and subjected to Soxhlet extraction with, subsequently, acetone, petroleum ether (40-60° C.), cyclohexane, chloroform and chlorobenzene. The chloroform fraction is triturated by addition of excess methanol, the precipitate is collected by filtration and dried in vacuo to give a black solid (93 mg). GPC (50° C., chlorobenzene) $M_n$=33.2 kg $mol^{-1}$; $M_w$=132.6 $mol^{-1}$; PDI=3.99. The chlorobenzene fraction is triturated by addition of excess methanol, the precipitate is collected by filtration and dried in vacuo to give a black solid (132 mg). GPC (50° C., chlorobenzene) $M_n$=64.9 kg $mol^{-1}$; $M_w$=294.4 $mol^{-1}$; PDI=4.54

Example 68—Polymer 68

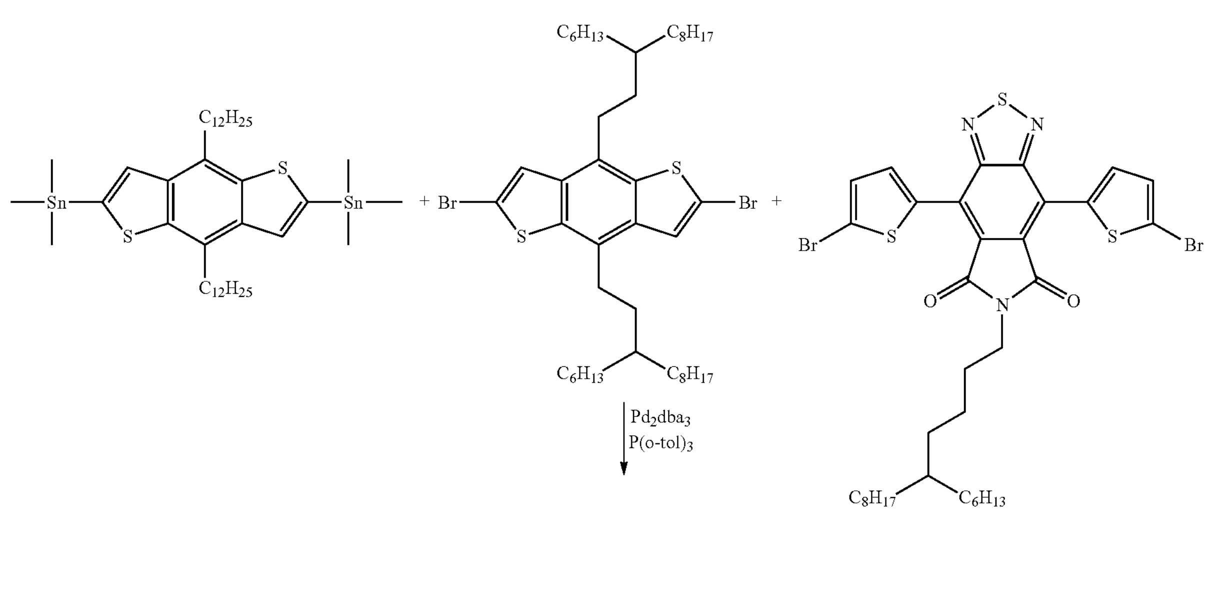

-continued

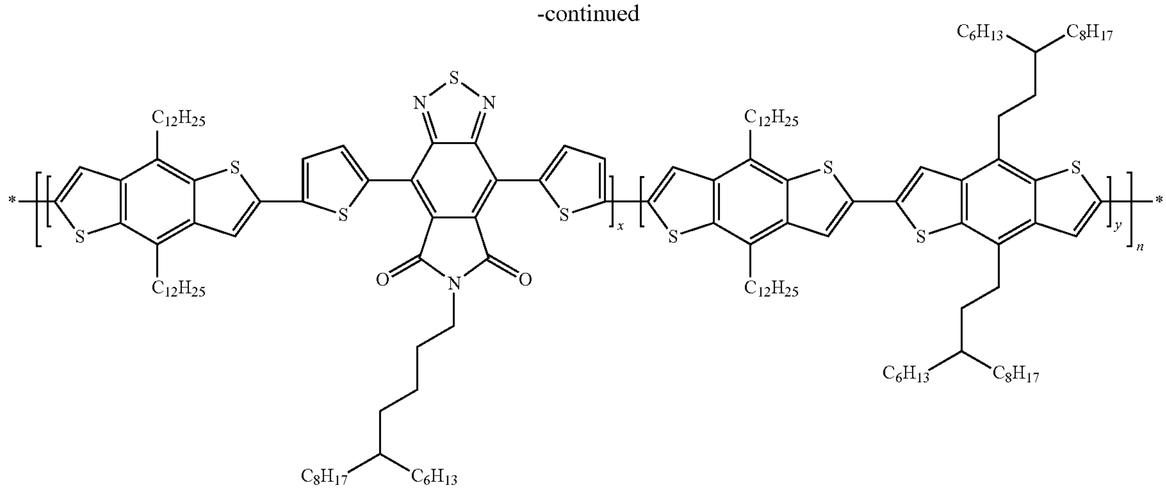

4,8-Didodecyl-2,6-bis-trimethylstannanyl-benzo[1,2-b;4,5-b']dithiophene (300.0 mg; 0.35 mmol; 1.00 eq.), 2,6-dibromo-4,8-bis-(3-hexyl-undecyl)-benzo[1,2-b;4,5-b']dithiophene (145.15 mg; 0.18 mmol; 0.50 eq.), 4,8-bis-(5-bromo-thiophen-2-yl)-6-(4-hexyl-dodecyl)-[1,2,5]thiadiazolo[3,4-e]isoindole-5,7-dione (137.2 mg; 0.18 mmol; 0.50 eq.), tri-o-tolyl-phosphine (17.14 mg; 56.30 μmol; 0.16 eq.) and tris(dibenzylideneacetone)dipalladium (0) (12.89 mg; 14.08 μmol; 0.04 eq.) are placed in a 20 $cm^3$ vial. The vial is sealed and degassed. Degassed toluene (14.9 $cm^3$) is added and the mixture further purged with nitrogen for 15 minutes. The vial is heated at 100° C. for 2 hours in an oil bath. The mixture is transferred into a flask containing 200 $cm^3$ of methanol, the precipitate collected by filtration and subjected to Soxhlet extraction with, subsequently, acetone, petroleum ether (40-60° C.), cyclohexane, chloroform and chlorobenzene. The chlorobenzene is triturated by addition of excess methanol, the precipitate is collected by filtration and dried in vacuo to give a black solid (389 mg). GPC (50° C., chlorobenzene) $M_n$=141.8 kg $mol^{-1}$; $M_w$=442.8 kg $mol^{-1}$; PDI=3.12.

Example 69—Polymer 69

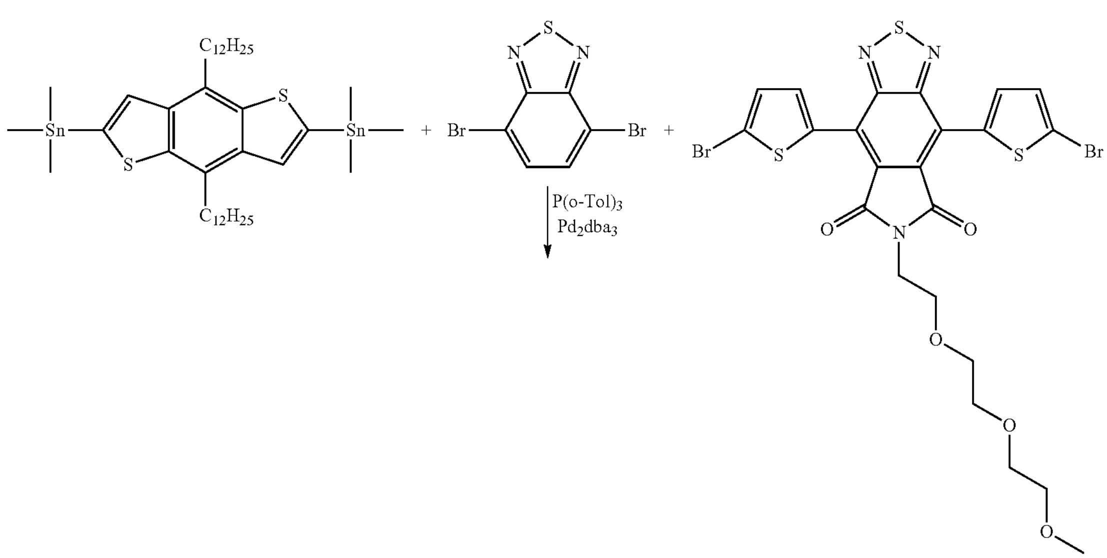

-continued

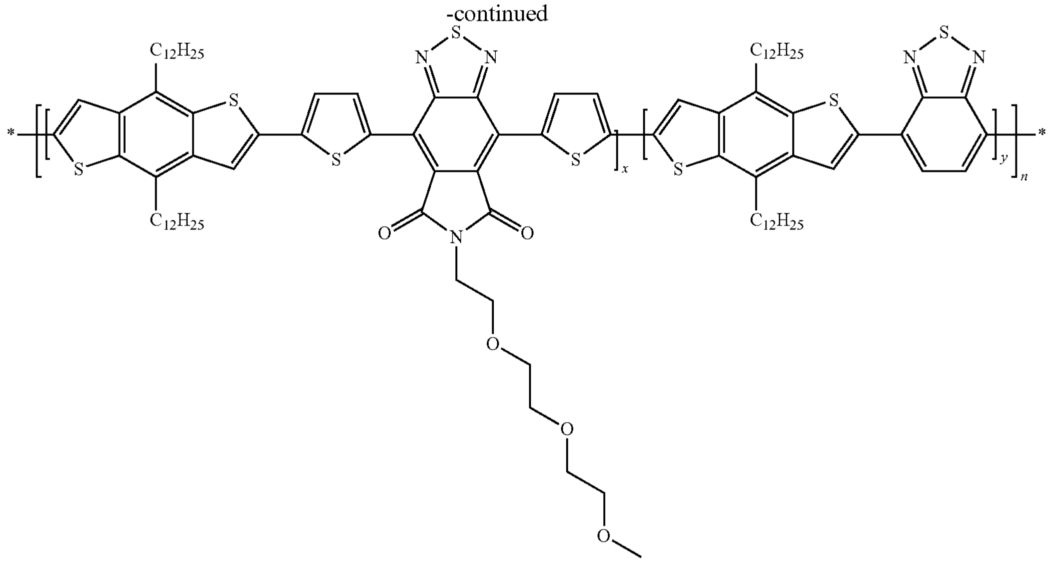

To a dry flask is added 4,8-didodecyl-2,6-bis-trimethyl-stannanyl-benzo[1,2-b;4,5-b']dithiophene (384.6 mg; 0.450 mmol; 1.000 eq.), 4,8-bis-(5-bromo-thiophen-2-yl)-6-{2-[2-(2-methoxy-ethoxy)-ethoxy]-ethyl}-[1,2,5]thiadiazolo[3,4-e]isoindole-5,7-dione (151.5 mg; 0.2250 mmol; 0.500 eq.), 4,7-dibromo-benzo[1,2,5]thiadiazole (66.1 mg; 0.2250 mmol; 0.500 eq.), tri-o-tolyl-phosphine (21.9 mg; 72.0 µmol; 0.160 eq.) and tris(dibenzylideneacetone) dipalladium(0) (16.5 mg; 18.0 µmol; 0.0400 eq.). The vessel is evacuated and nitrogen purged three times and degassed chlorobenzene (5.95 $cm^3$) is added before the reaction mixture is degassed further for 5 minutes. The reaction mixture is heated up to 130° C. and stirred at this temperature for 2 minutes. After completion of the reaction, the reaction mixture is allowed to cool to 65° C. and precipitated into stirred methanol (250 $cm^3$). The polymer is collected by filtration and washed with methanol (2×50 $cm^3$) to give a black solid which is sparingly soluble in chlorobenzene.

Example 70—Polymer 70

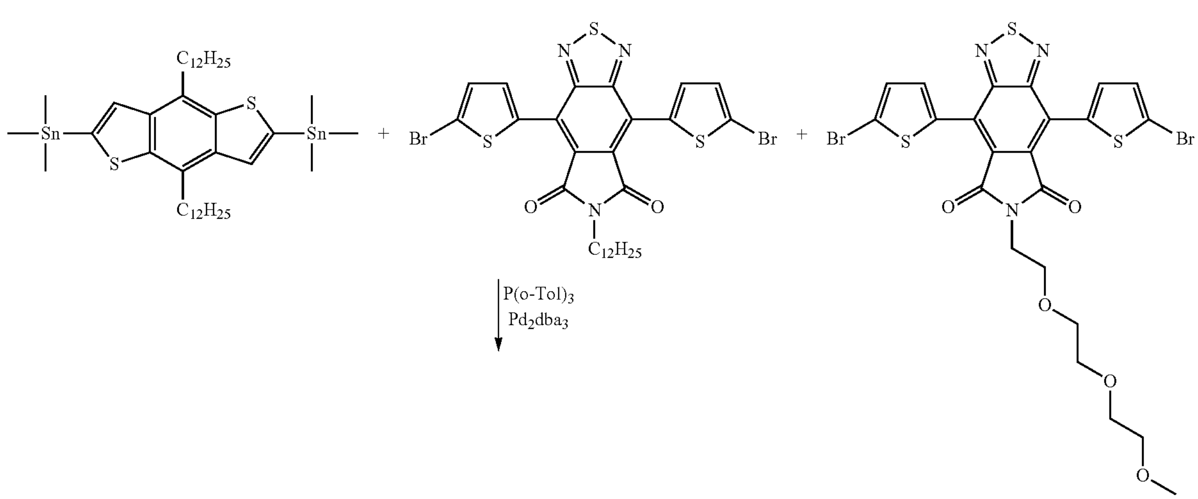

-continued

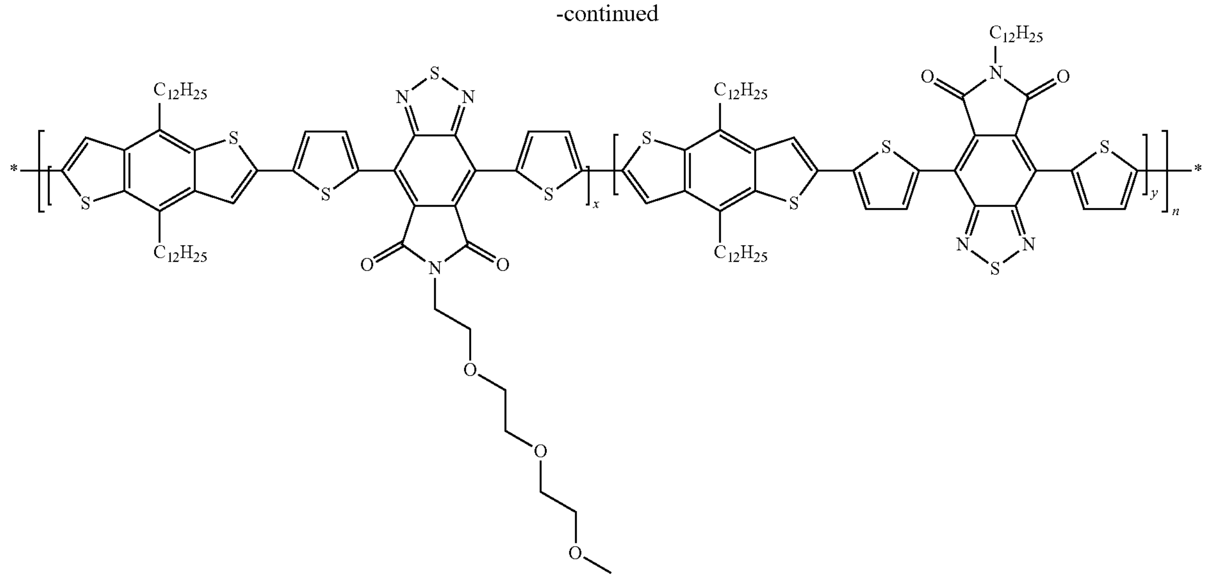

To a dry flask is added 4,8-didodecyl-2,6-bis-trimethylstannanyl-benzo[1,2-b;4,5-b']dithiophene (400.0 mg; 0.4692 mmol; 1.0000 eq.), 4,8-bis-(5-bromo-thiophen-2-yl)-6-dodecyl-[1,2,5]thiadiazolo[3,4-e]isoindole-5,7-dione (293.7 mg; 0.4223 mmol; 0.900 eq.), 4,8-bis-(5-bromo-thiophen-2-yl)-6-{2-[2-(2-methoxy-ethoxy)-ethoxy]-ethyl}-[1,2,5]thiadiazolo[3,4-e]isoindole-5,7-dione (31.6 mg; 0.0469 mmol; 0.100 eq.), tri-o-tolyl-phosphine (22.6 mg; 75.1 μmol; 0.16 eq.) and tris(dibenzylideneacetone) dipalladium(0) (17.2 mg; 18.8 μmol; 0.0400 eq.). The vessel is evacuated and nitrogen purged three times and degassed chlorobenzene (5.95 $cm^3$) is added before the reaction mixture is degassed further for 5 minutes. The reaction mixture is heated up to 130° C. and stirred at this temperature for 2 minutes. After completion of the reaction, the reaction mixture is allowed to cool to 65° C. and precipitated into stirred methanol (250 $cm^3$). The polymer is collected by filtration and washed with methanol (2×50 $cm^3$) to give a black solid which is sparingly soluble in chlorobenzene.

Example 71—Polymer 71

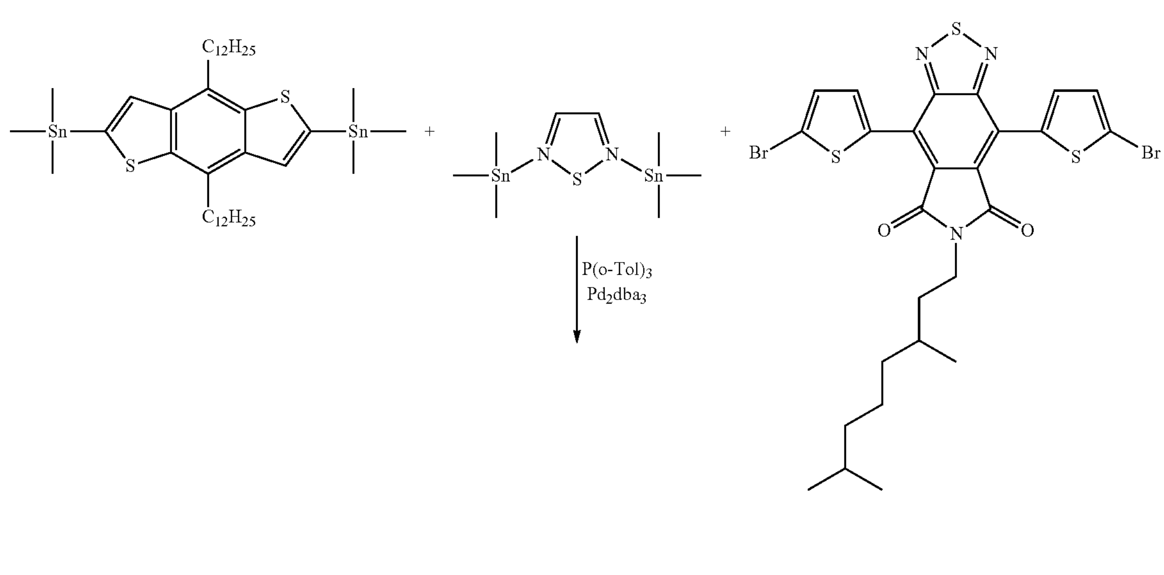

-continued

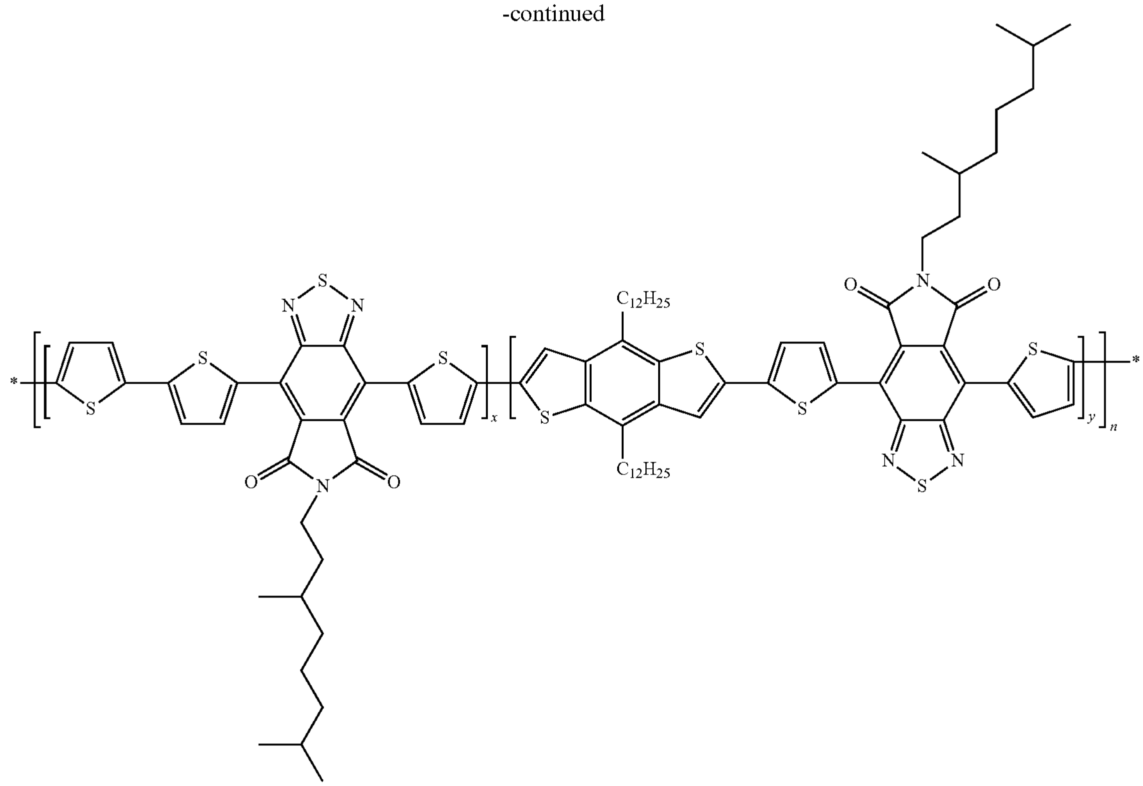

To a dry flask is added 4,8-didodecyl-2,6-bis-trimethyl-stannanyl-benzo[1,2-b;4,5-b']dithiophene (383.6 mg; 0.4500 mmol; 1.0000 eq.), 4,8-bis-(5-bromo-thiophen-2-yl)-6-(3,7-dimethyl-octyl)-[1,2,5]thiadiazolo[3,4-e]isoindole-5,7-dione (333.4 mg; 0.495 mmol; 1.11 eq.), 2,5-bis-trimethylstannanyl-thiophene (20.3 mg; 0.0499 mmol; 0.110 eq.), tri-o-tolyl-phosphine (21.9 mg; 72.00 μmol; 0.1600 eq.) and tris(dibenzylideneacetone)dipalladium(0) (16.5 mg; 18.00 μmol; 0.0400 eq.). The vessel is evacuated and nitrogen purged three times and degassed chlorobenzene (7.5 $cm^3$) is added before the reaction mixture is degassed further for 5 minutes. The reaction mixture is heated up to 130° C. and stirred at this temperature for 2 minutes. After completion of the reaction, the reaction mixture is allowed to cool to 65° C. and precipitated into stirred methanol (250 $cm^3$). The polymer is collected by filtration and washed with methanol (2×50 $cm^3$) to give a black solid which is sparingly soluble in chlorobenzene.

Example 72—Polymer 72

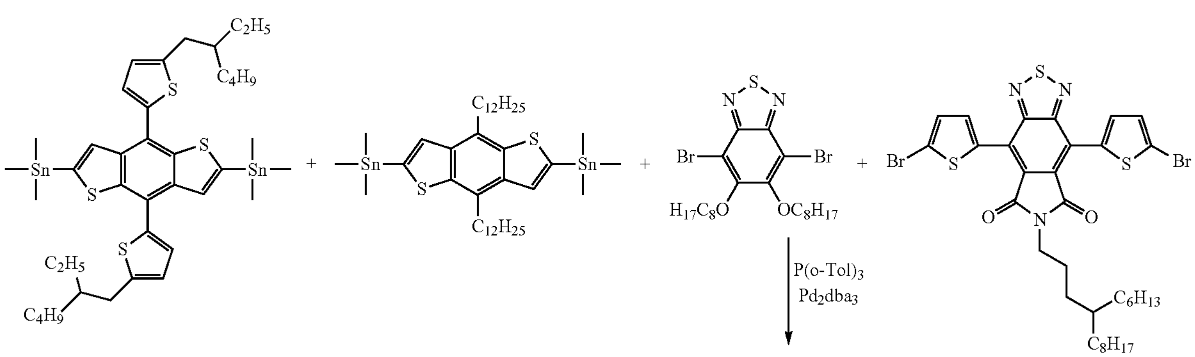

-continued

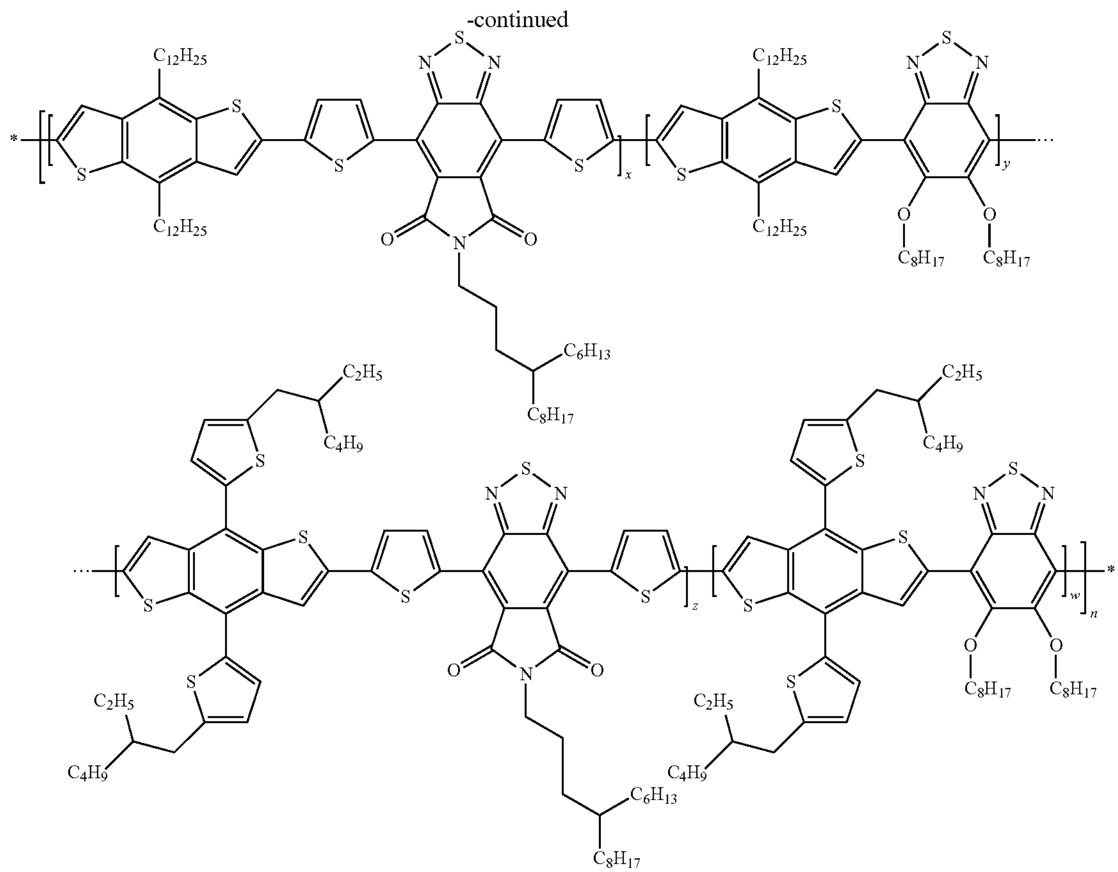

To a dry flask is added 4,8-didodecyl-2,6-bis-trimethylstannanyl-benzo[1,2-b;4,5-b']dithiophene (341.0 mg; 0.4000 mmol; 1.0000 eq.), 4,8-bis-[5-(2-ethyl-hexyl)-thiophen-2-yl]-2,6-bis-trimethylstannanyl-benzo[1,2-b;4,5-b'] dithiophene (361.8 mg; 0.4000 mmol; 1.0000 eq.), 4,7-dibromo-5,6-bis-octyloxy-benzo[1,2,5]thiadiazole (220.2 mg; 0.4000 mmol; 1.0000 eq.), 4,8-bis-(5-bromo-thiophen-2-yl)-6-(4-hexyl-dodecyl)-[1,2,5]thiadiazolo[3,4-e]isoindole-5,7-dione (283.8 mg; 0.4000 mmol; 1.0000 eq.), tri-o-tolyl-phosphine (19.5 mg; 64.00 μmol; 0.1600 eq.) and tris(dibenzylideneacetone)dipalladium(0) (14.65 mg; 16.0000 μmol; 0.04 eq.). The vessel is evacuated and nitrogen purged three times and degassed chlorobenzene (6.11 $cm^3$) is added before the reaction mixture is degassed further for 5 minutes. The reaction mixture is heated up to 130° C. and stirred at this temperature for 2 minutes. After completion of the reaction, the reaction mixture is allowed to cool to 65° C. and precipitated into stirred methanol (250 $cm^3$). The polymer is collected by filtration and washed with methanol (2×50 $cm^3$) to give a black solid which is sparingly soluble in chlorobenzene.

Example 73—Polymer 73

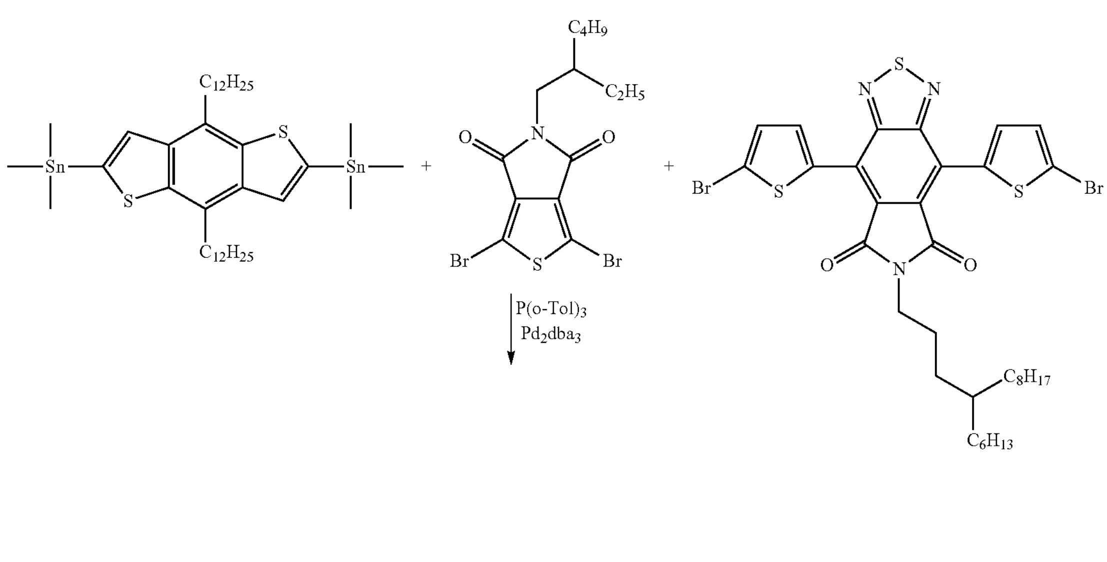

-continued

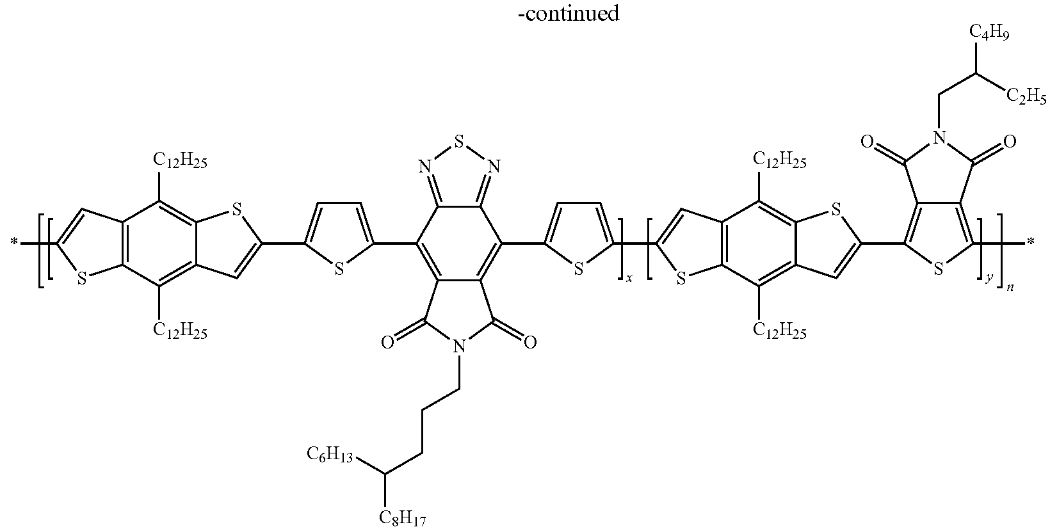

To a dry flask is added 4,8-didodecyl-2,6-bis-trimethyl-stannanyl-benzo[1,2-b;4,5-b']dithiophene (426.3 mg; 0.500 mmol; 1.000 eq.), 1,3-dibromo-5-(2-ethyl-hexyl)-thieno[3,4-c]pyrrole-4,6-dione (105.8 mg; 0.250 mmol; 0.500 eq.), 4,8-bis-(5-bromo-thiophen-2-yl)-6-(4-hexyl-dodecyl)-[1,2,5]thiadiazolo[3,4-e]isoindole-5,7-dione (194.9 mg; 0.250 mmol; 0.500 eq.), tri-o-tolyl-phosphine (24.4 mg; 80.00 μmol; 0.160 eq.) and tris(dibenzylideneacetone)dipalladium (0) (18.3 mg; 20.00 μmol; 0.040 eq.). The vessel is evacuated and nitrogen purged three times and degassed chlorobenzene (6.25 $cm^3$) is added before the reaction mixture is degassed further for 5 minutes. The reaction mixture is heated up to 130° C. and stirred at this temperature for 7 hours. After completion of the reaction, the reaction mixture is allowed to cool to 65° C. and precipitated into stirred methanol (150 $cm^3$). The polymer is collected by filtration and washed with methanol (2×50 $cm^3$) to give a solid. The polymer is then sequentially extracted by Soxhlet extraction with acetone, petroleum ether (40-60° C.), cyclohexane and chloroform. The chloroform fraction is concentrated in vacuo, precipitated by addition of methanol (100 $cm^3$) and collected by filtration to give a black solid (375 mg, Yield: 80%). GPC (50° C., chlorobenzene) $M_n$=25.5 kg $mol^{-1}$; $M_w$=148.5 kg $mol^{-1}$; PDI=5.8.

B) Use Examples

Bulk Heterojunction OPV Devices for Various Polymers

Organic photovoltaic (OPV) devices are fabricated on pre-patterned ITO-glass substrates (13 Ω/sq.) purchased from LUMTEC Corporation. Substrates were cleaned using common solvents (acetone, iso-propanol, deionized-water) in an ultrasonic bath. A conducting polymer poly(ethylene dioxythiophene) doped with poly(styrene sulfonic acid) [Clevios VPAI 4083 (H. C. Starck)] is mixed in a 1:1 ratio with deionized-water. This solution was filtered using a 0.45 μm filter before spin-coating to achieve a thickness of 20 nm. Substrates were exposed to ozone prior to the spin-coating process to ensure good wetting properties. Films were then annealed at 140° C. for 30 minutes in a nitrogen atmosphere where they were kept for the remainder of the process. Active material solutions (i.e. polymer+PCBM) were prepared and stirred overnight to fully dissolve the solutes. Thin films were either spin-coated or blade-coated in a nitrogen atmosphere to achieve active layer thicknesses between 100 and 500 nm as measured using a profilometer. A short drying period followed to ensure removal of any residual solvent.

Typically, spin-coated films were dried at 23° C. for 10 minutes and blade-coated films were dried at 70° C. for 2 minutes on a hotplate. For the last step of the device fabrication, Ca (30 nm)/Al (125 nm) cathodes were thermally evaporated through a shadow mask to define the cells. Current voltage characteristics were measured using a Keithley 2400 SMU while the solar cells were illuminated by a Newport Solar Simulator at 100 mW·cm-2 white light. The Solar Simulator was equipped with AM1.5G filters. The illumination intensity was calibrated using a Si photodiode. All the device preparation and characterization is done in a dry-nitrogen atmosphere.

Power conversion efficiency is calculated using the following expression $$\eta = \frac{V_{oc} \times J_{sc} \times FF}{P_{in}}$$

where FF is defined as $$FF = \frac{V_{max} \times J_{max}}{V_{oc} \times J_{sc}}$$

OPV devices were prepared wherein the photoactive layer contains a blend of a polymer selected from one of the Examples 1-15 with the fullerene $PC_{60}BM$, which is coated from a o-dichlorobenzene solution at a total solid concentration as shown in Table 1 below. The OPV device characteristics are shown in Table 1.

TABLE 1

Photovoltaic cell characteristics.

| Polymer | ratio Polymer: PCBM-$C_{60}$ | conc$^a$ mg · $ml^{-1}$ | Voc mV | Jsc mA · $cm^{-2}$ | FF % | PCE % |
|---|---|---|---|---|---|---|
| Polymer 1 | 1.00:2.00 | 30 | 774 | −10.79 | 55 | 5.65 |
| Polymer 4 | 1.00:1.00 | 30 | 760 | −4.76 | 54 | 1.93 |
| Polymer 5 | 1.00:2.00 | 30 | 710 | −7.12 | 40 | 2.04 |
| Polymer 6 | 1.00:2.00 | 30 | 753 | −6.51 | 47 | 2.31 |
| Polymer 10 | 1.00:2.00 | 30 | 748 | −10.04 | 52 | 3.89 |
| Polymer 11 | 1.00:1.00 | 30 | 720 | −3.02 | 37 | 0.80 |
| Polymer 15 | 1.00:2.00 | 30 | 790 | −11.40 | 45 | 4.00 |

TABLE 1-continued

| Photovoltaic cell characteristics. | | | | | | |
|---|---|---|---|---|---|---|
| Polymer | ratio Polymer: PCBM-$C_{60}$ | conc[a] mg · $ml^{-1}$ | Voc mV | Jsc mA · $cm^{-2}$ | FF % | PCE % |
| Polymer 16 | 1.00:2.00 | 20 | 840 | −7.56 | 32 | 2.05 |
| Polymer 17 | 1.00:2.00 | 30 | 793 | −12.83 | 53 | 5.37 |
| Polymer 18 | 1.00:2.00 | 30 | 673 | −6.39 | 33 | 1.41 |
| Polymer 19 | 1.00:2.00 | 30 | 810 | −13.54 | 55 | 5.96 |
| Polymer 20 | 1.00:2.00 | 30 | 880 | −6.05 | 51 | 2.71 |
| Polymer 21 | 1.00:2.00 | 30 | 700 | −3.94 | 49 | 1.36 |
| Polymer 22 | 1.00:2.00 | 30 | 849 | −13.41 | 59 | 6.69 |
| Polymer 23 | 1.00:2.00 | 30 | 733 | −6.25 | 42 | 1.93 |
| Polymer 24 | 1.00:3.00 | 30 | 818 | −12.16 | 65 | 6.41 |
| Polymer 25 | 1.00:1.00 | 30 | 815 | −3.76 | 29 | 0.88 |
| Polymer 26 | 1.00:2.00 | 30 | 662 | −1.27 | 27 | 0.23 |
| Polymer 27 | 1.00:1.00 | 30 | 747 | −9.90 | 53 | 3.89 |
| Polymer 28 | 1.00:3.00 | 30 | 698 | −9.72 | 54 | 3.64 |
| Polymer 29 | 1.00:2.00 | 20 | 820 | −10.63 | 56 | 4.88 |
| Polymer 30 | 1.00:2.00 | 30 | 802 | −13.00 | 57 | 5.87 |
| Polymer 31 | 1.00:2.00 | 20 | 713 | −3.00 | 45 | 0.95 |
| Polymer 32 | 1.00:2.00 | 30 | 763 | 8.33 | 56 | 3.57 |
| Polymer 33 | 1.00:2.00 | 30 | 860 | −12.03 | 66 | 6.77 |
| Polymer 34 | 1.00:2.00 | 30 | 840 | −7.26 | 49 | 3.01 |
| Polymer 35 | 1.00:2.00 | 30 | 853 | −11.18 | 61 | 5.79 |
| Polymer 36 | 1.00:2.00 | 30 | 857 | −12.08 | 56 | 5.81 |
| Polymer 37 | 1.00:2.00 | 30 | 824 | −13.91 | 52 | 5.95 |
| Polymer 38 | 1.00:2.00 | 30 | 750 | −8.68 | 39 | 2.54 |
| Polymer 39 | 1.00:2.00 | 30 | 830 | −12.69 | 52 | 5.44 |
| Polymer 40 | 1.00:2.00 | 30 | 846 | −10.98 | 57 | 5.32 |
| Polymer 41 | 1.00:2.00 | 30 | 880 | −12.08 | 63 | 6.70 |
| Polymer 42 | 1.00:2.00 | 30 | 791 | −2.76 | 60 | 1.31 |
| Polymer 43 | 1.00:2.00 | 30 | 755 | −7.55 | 51 | 2.87 |
| Polymer 44 | 1.00:2.00 | 30 | 720 | −5.16 | 50 | 1.87 |
| Polymer 45 | 1.00:2.00 | 30 | 836 | −11.85 | 60 | 5.98 |
| Polymer 46 | 1.00:2.00 | 30 | 700 | −4.58 | 33 | 1.04 |
| Polymer 47 | 1.00:2.00 | 30 | 658 | −11.41 | 52 | 3.87 |
| Polymer 48 | 1.00:2.00 | 30 | 618 | −8.11 | 35 | 1.80 |
| Polymer 49 | 1.00:2.00 | 30 | 844 | −9.71 | 59 | 4.88 |
| Polymer 50 | 1.00:2.00 | 30 | 770 | −2.71 | 56 | 0.99 |
| Polymer 51 | 1.00:2.00 | 30 | 778 | −6.33 | 37 | 1.84 |
| Polymer 52 | 1.00:2.00 | 30 | 855 | −13.15 | 58 | 6.55 |
| Polymer 53 | 1.00:2.00 | 30 | 853 | −12.11 | 60 | 6.25 |
| Polymer 54 | 1.00:2.00 | 30 | 797 | −3.41 | 35 | 0.94 |
| Polymer 55 | 1.00:2.00 | 30 | 869 | −5.05 | 34 | 1.48 |
| Polymer 56 | 1.00:2.00 | 30 | 602 | −5.22 | 34 | 1.06 |
| Polymer 57 | 1.00:2.00 | 30 | 596 | −6.09 | 32 | 1.18 |
| Polymer 58 | 1.00:2.00 | 30 | 811 | −12.48 | 51 | 5.12 |
| Polymer 62 | 1.00:2.00 | 30 | 760 | −3.10 | 31 | 0.72 |
| Polymer 63 | 1.00:2.00 | 30 | 790 | −11.30 | 51 | 4.59 |
| Polymer 65 | 1.00:2.00 | 30 | 860 | −12.62 | 55 | 5.88 |
| Polymer 66 | 1.00:2.00 | 30 | 817 | −9.66 | 34 | 2.72 |
| Polymer 67 | 1.00:2.00 | 30 | 760 | −6.39 | 33 | 1.64 |
| Polymer 68 | 1.00:2.00 | 30 | 760 | −6.39 | 33 | 1.64 |
| Polymer 73 | 1.00:2.00 | 30 | 800 | −3.23 | 41. | 1.06 |

The invention claimed is:

1. A process of preparing a polymer comprising: one or more units of formula T (TID units)

T

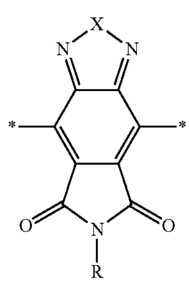

wherein

* each means a chemical linkage to an adjacent unit or to a terminal group in the polymer, X is S, Se, O or NR, R denotes H or straight-chain, branched or cyclic alkyl with 1 to 30 C atoms, in which one or more $CH_2$ groups are optionally replaced by —O—, —S—, —C(═O)—, —C(═S)—, —C(═O)—O—, —O—C(═O)—, —$NR^0$—, —$SiR^0R^{00}$—, —$CF_2$—, —$CHR^0$═$CR^{00}$—, —$CY^1$═$CY^2$— or —C≡C— in such a manner that O and/or S atoms are not linked directly to one another, and in which one or more H atoms are optionally replaced by F, Cl, Br, I or CN, or denotes aryl or heteroaryl with 5 to 15 ring atoms, which is mono- or polycyclic and unsubstituted or substituted, $Y^1$ and $Y^2$ are independently of each other H, F, Cl or CN, $R^0$ and $R^{00}$ are independently of each other H or optionally substituted $C_{1-40}$ carbyl or hydrocarbyl, optionally one or more distinct donor units having electron donor properties, optionally one or more distinct acceptor units having electron acceptor properties, one or more distinct spacer units which are located between each of said TID units, optional donor units and optional acceptor units, thereby preventing said TID units, optional donor units and optional acceptor units from having directly connected to each other in the polymer chain, said optional donor units, optional acceptor units and spacer units being different from the TID units, and being arylene or heteroarylene groups that are optionally substituted, wherein the polymer formed is a random copolymer formed by co-polymerising at least three different monomers comprising said TID units, spacer units, optional donor units and/or optional acceptor units, said process, comprising:

coupling three or more monomers of the following formulae with each other and/or with one or more co-monomers in an aryl-aryl coupling reaction $$R^7—U—R^8 \quad \text{MI}$$

$$R^7\text{-Sp-}R^8 \quad \text{MII}$$

$$R^7\text{-}(Sp)_x\text{-U-}(Sp)_y\text{-}R^8 \quad \text{MIII}$$

wherein

U denotes a unit of formula T or T1 wherein T1 is

T1

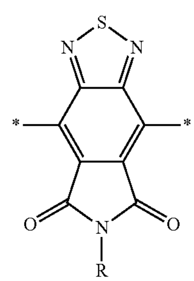

a donor unit or an acceptor unit wherein said donor or acceptor unit is arylene or heteroarylene that is different from formula I, has 5 to 30 ring atoms, and is optionally substituted by one or more groups $R^S$, wherein $R^S$ is on each occurrence identically or differently F, Br, Cl, —CN, —NC, —NCO, —NCS, —OCN, —SCN, —C(O)$NR^0R^{00}$, —C(O)$X^0$, —C(O)$R^0$, —C(O)$OR^0$, —$NH_2$, —$NR^0R^{00}$, —SH, —SR, —$SO_3H$, —$SO_2R^0$, —OH, —$NO_2$, —$CF_3$, —$SF_5$, optionally substituted silyl, carbyl or hydrocarbyl with 1 to 40 C atoms that is optionally substituted and optionally comprises one or more hetero atoms, and at least one of the monomers is of formula MI or MIII wherein U denotes a unit of formula T, Sp denotes a spacer unit wherein the spacer units are:

Sp1

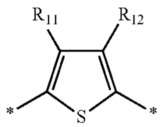

Sp2

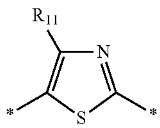

Sp3

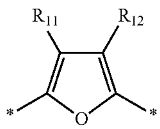

Sp4

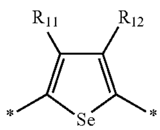

Sp5

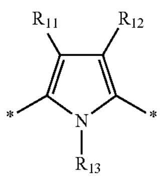

Sp6

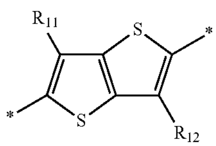

Sp7

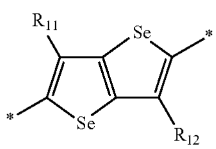

Sp8

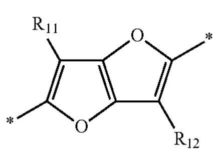

Sp9

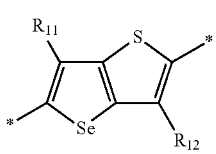

Sp10

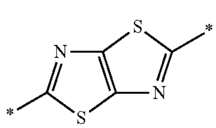

-continued

Sp11

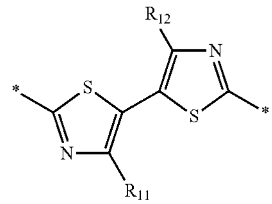

Sp12

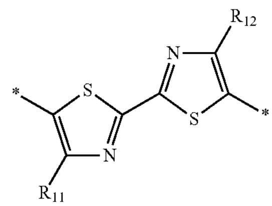

Sp13

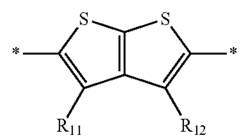

Sp14

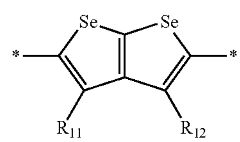

Sp15

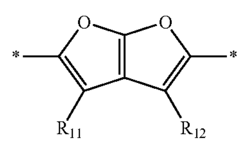

and

Sp16

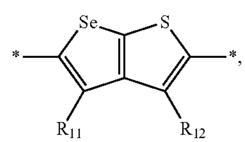

x and y are independently of each other 0, 1 or 2, and $R^7$ and $R^8$ are, independently of each other, an activated C—H bond, Cl, Br, I, O-tosylate, O-triflate, O-mesylate, O-nonaflate, —$SiMe_2F$, —$SiMeF_2$, —O—$SO_2Z^1$, —$B(OZ^2)_2$, —$CZ^3$=$C(Z^3)_2$, —C≡CH, —C≡$CSi(Z^1)_3$, —$ZnX^0$ or —$Sn(Z^4)_3$, wherein $X^0$ is halogen, $Z^{1-4}$ are alkyl or aryl, each being optionally substituted, and two groups $Z^2$ may also together form a cyclic group, and

* each means a chemical linkage to an adjacent unit or to a terminal group in the polymer.

2. The process according to claim 1, wherein the donor units have the following formulae (D1)

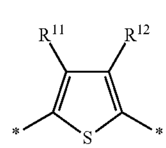

-continued
(D2)
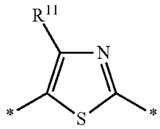
(D3)
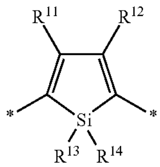
(D4)
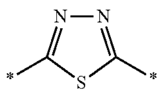
(D5)
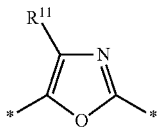
(D6)
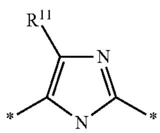
(D7)
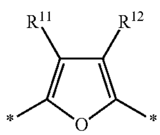
(D8)
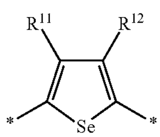
(D9)
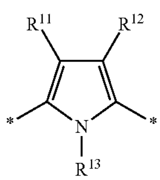
(D10)
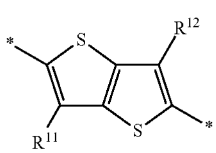
(D11)
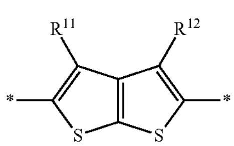
(D12)
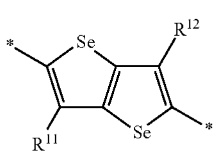
-continued
(D13)
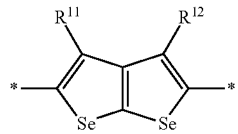
(D14)
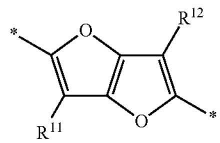
(D15)
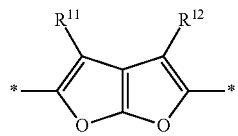
(D16)
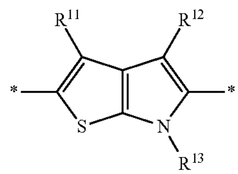
(D17)
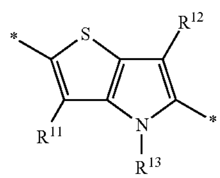
(D18)
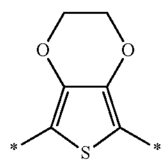
(D19)
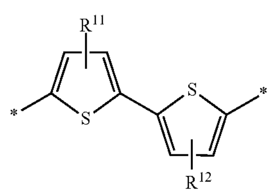
(D20)
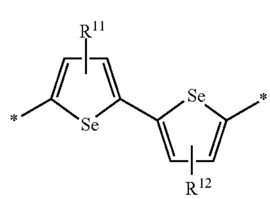
(D21)
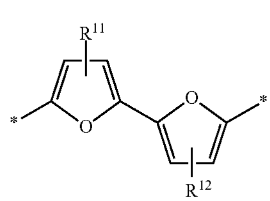

-continued
(D22)
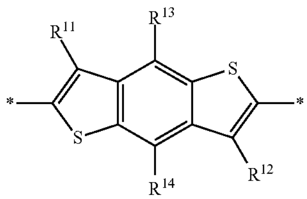
(D23)
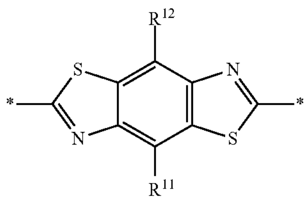
(D24)
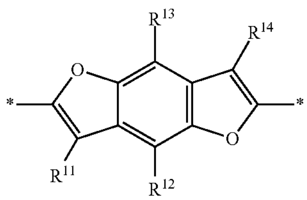
(D25)
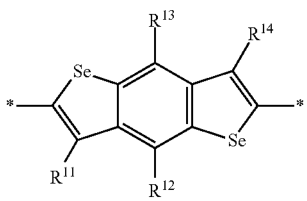
(D26)
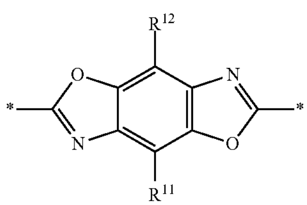
(D27)
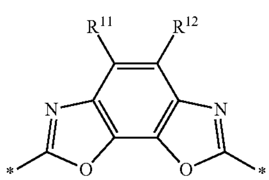
(D28)
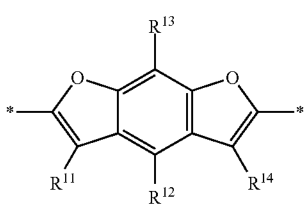
(D29)
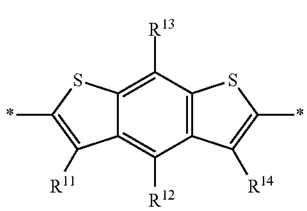
-continued
(D30)
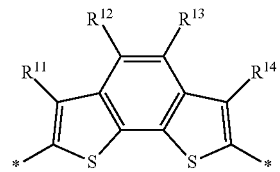
(D31)
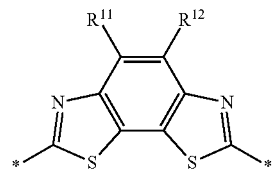
(D32)
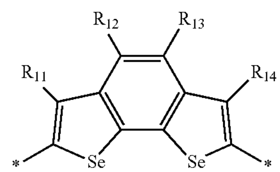
(D33)
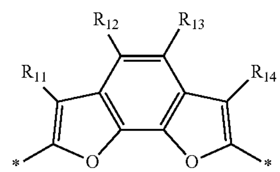
(D34)
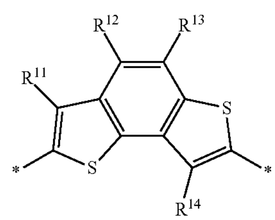
(D35)
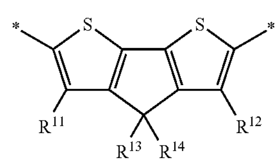
(D36)
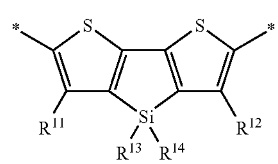
(D37)
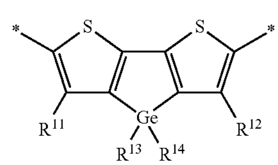
(D38)
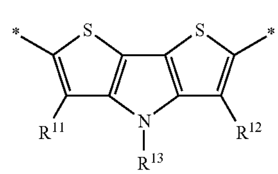

-continued
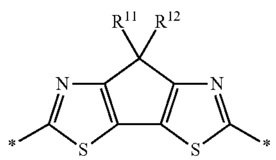
(D39)
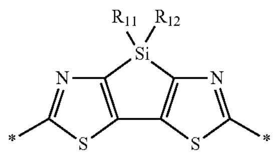
(D40)
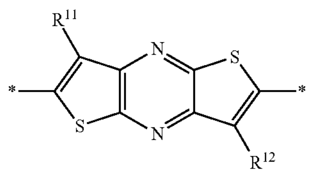
(D41)
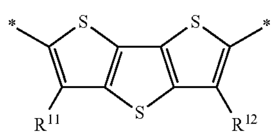
(D42)
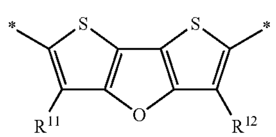
(D43)
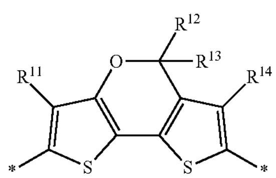
(D44)
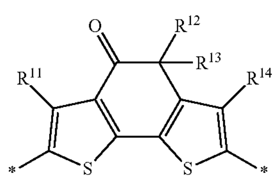
(D45)
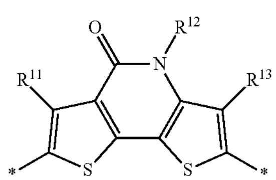
(D46)
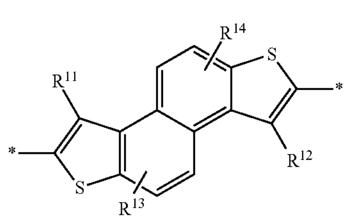
(D47)
-continued
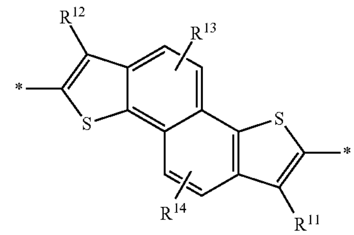
(D48)
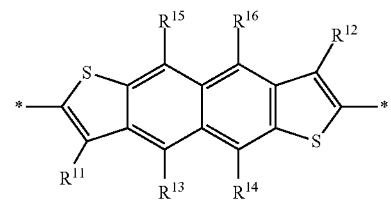
(D49)
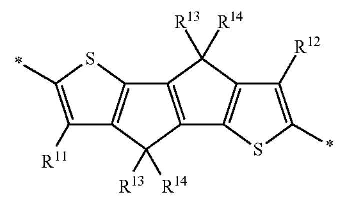
(D50)
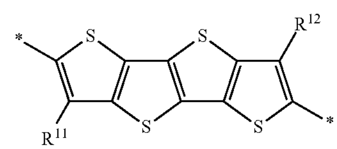
(D51)
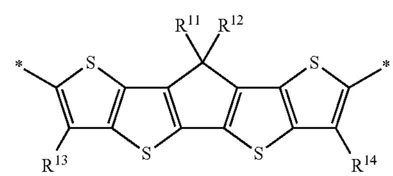
(D52)
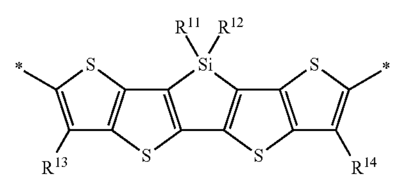
(D53)
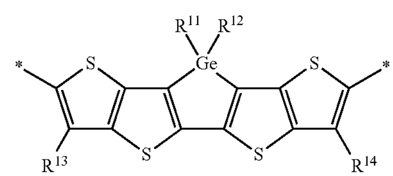
(D54)
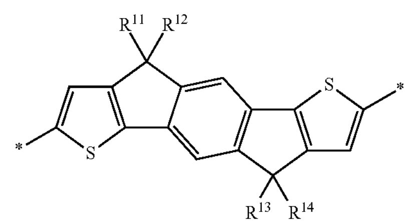
(D55)

-continued
(D56)
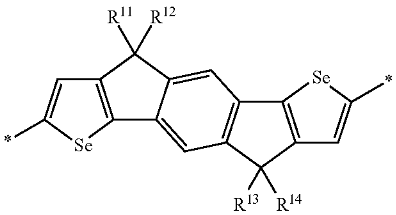
(D57)
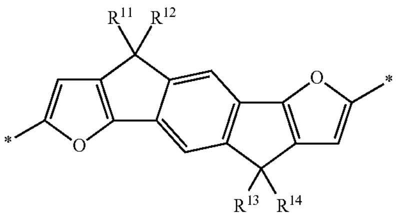
(D58)
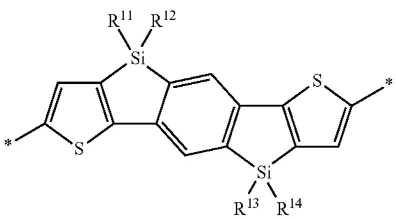
(D59)
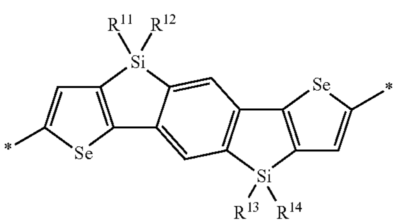
(D60)
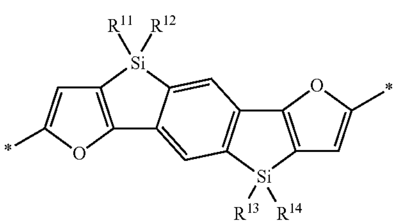
(D61)
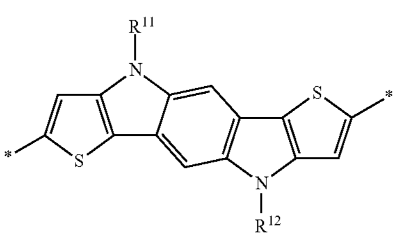
(D62)
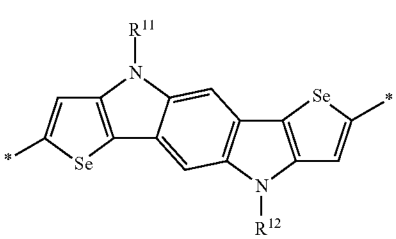
-continued
(D63)
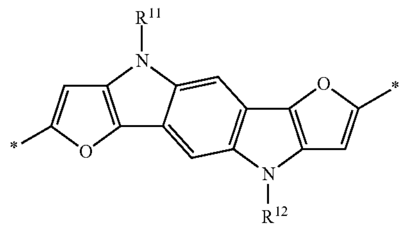
(D64)
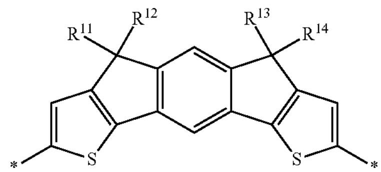
(D65)
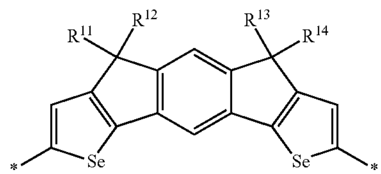
(D66)
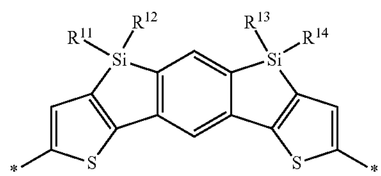
(D67)
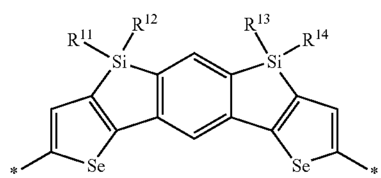
(D68)
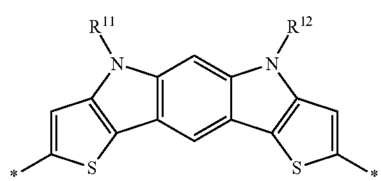
(D69)
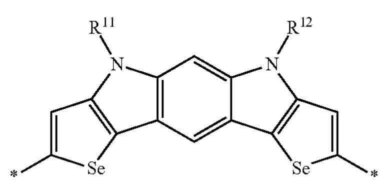
(D70)
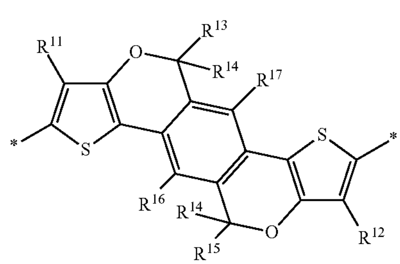

-continued
(D71)
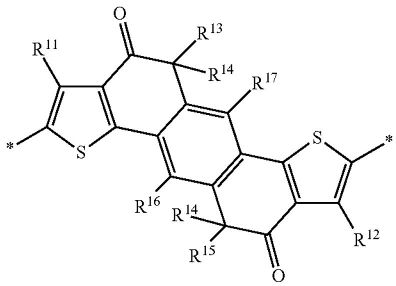
(D72)
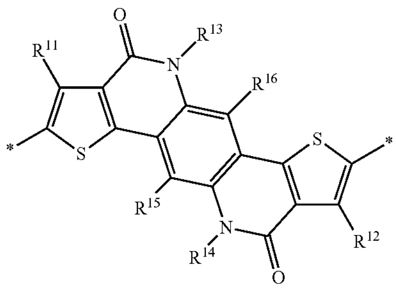
(D73)
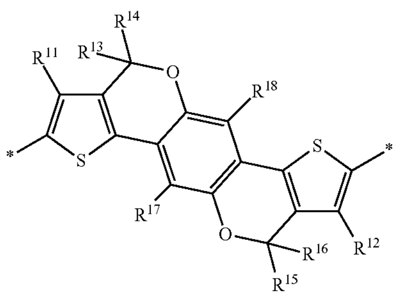
(D74)
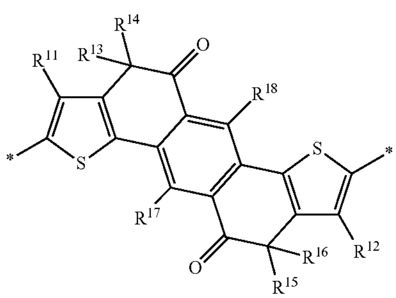
(D75)
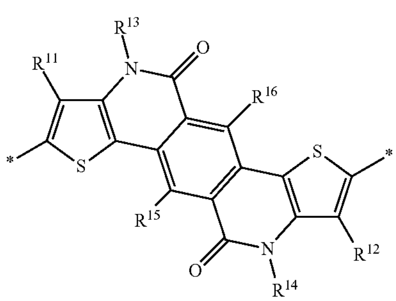
-continued
(76)
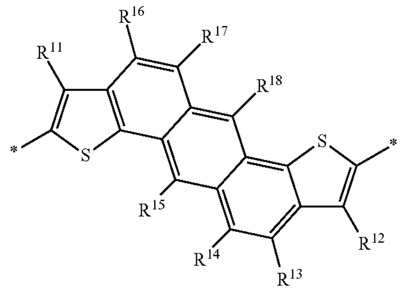
(D77)
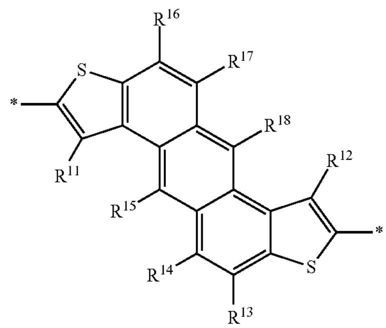
(D78)
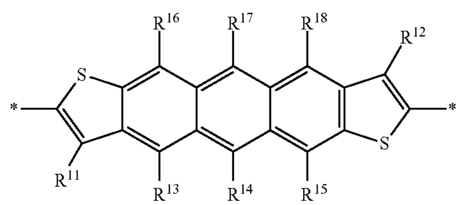
(D79)
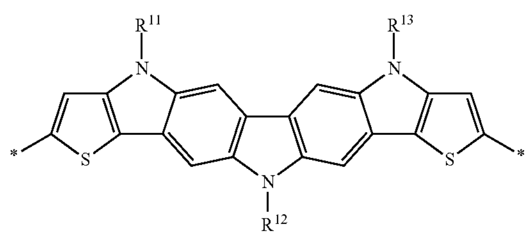
(D80)
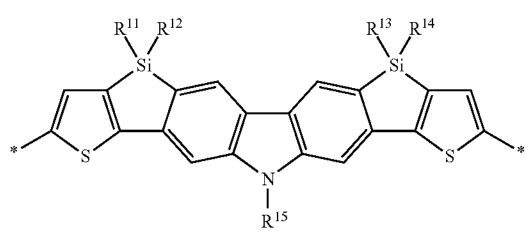
(D81)
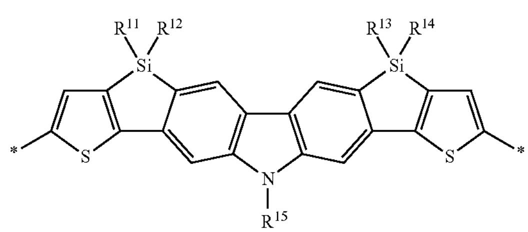

-continued
(D82)
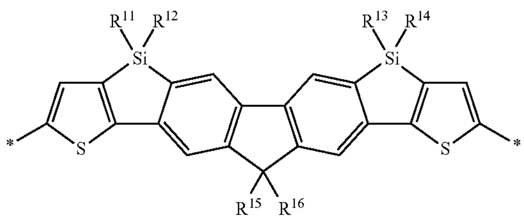
(D83)
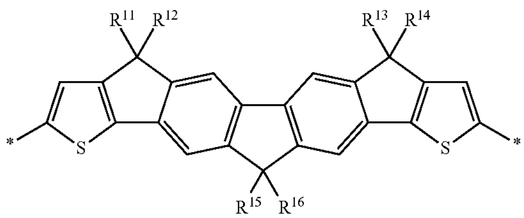
(D84)
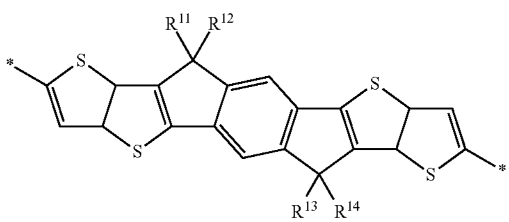
(D85)
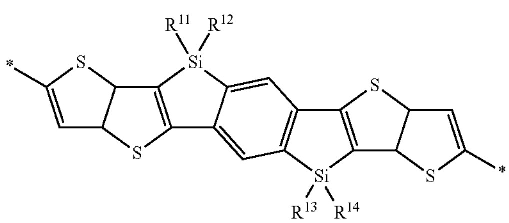
(D86)
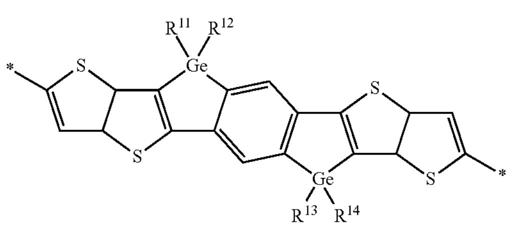
(D87)
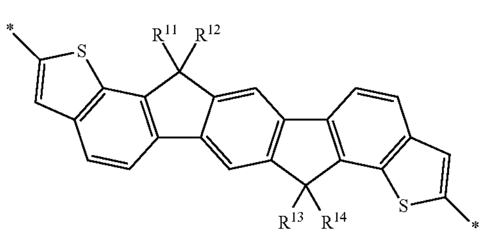
-continued
(D88)
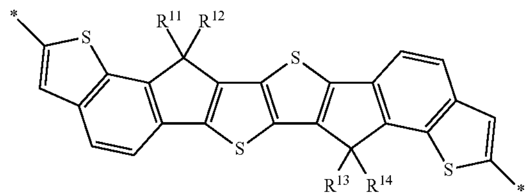
(D89)
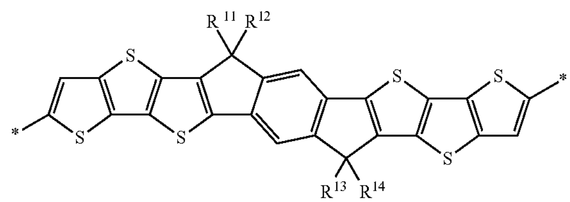
(D90)
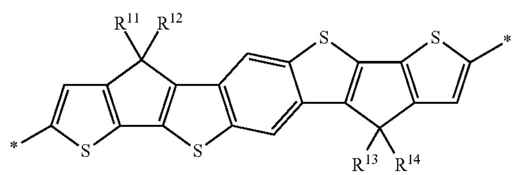
(D91)
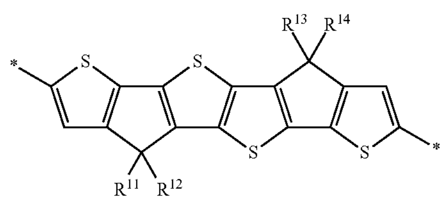
(D92)
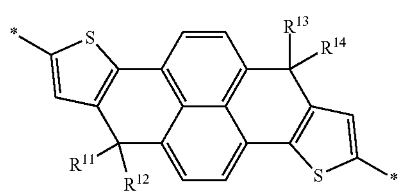
(D93)
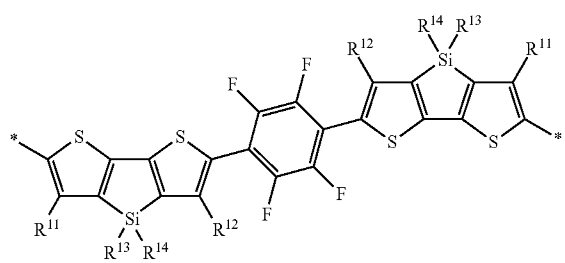
(D94)
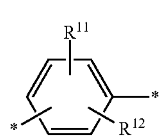
(D95)
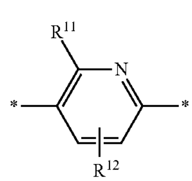

-continued
(D96)
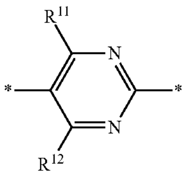
(D97)
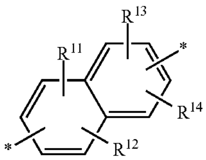
(D98)
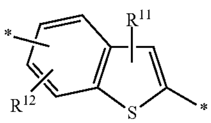
(D99)
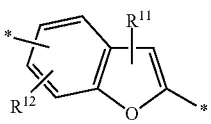
(D100)
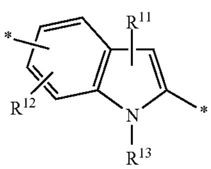
(D101)
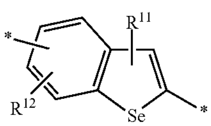
(D102)
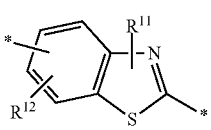
(D103)
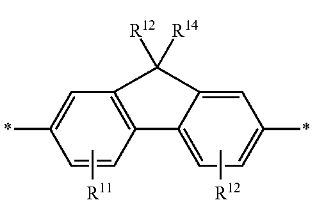
(D104)
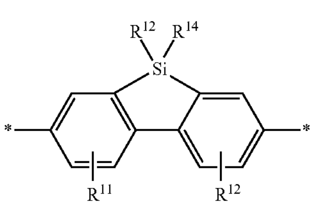
-continued
(D105)
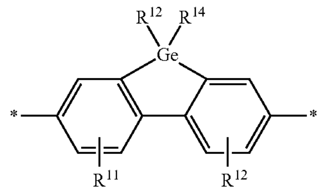
(D106)
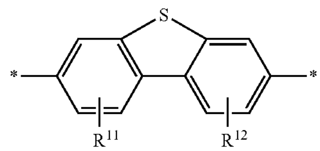
(D107)
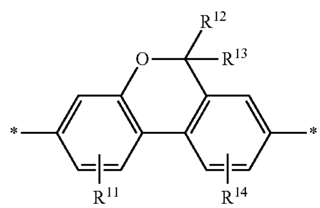
(D108)
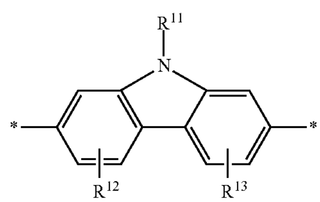
(D109)
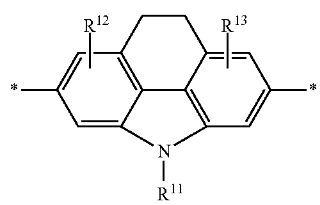
(D110)
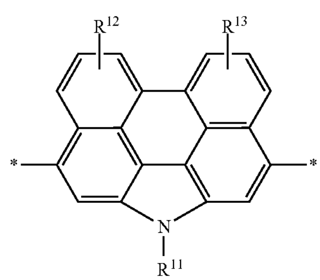
(D111)
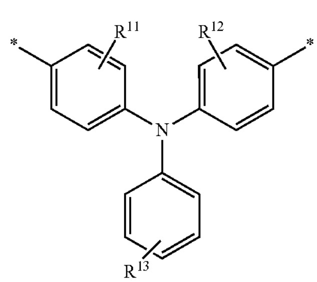

-continued
(D112
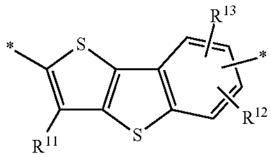
(D113)
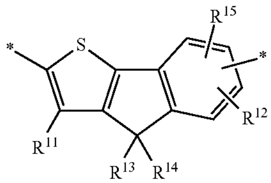
(D114)
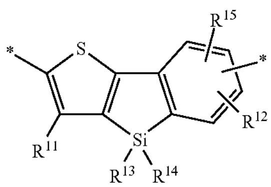
(D115)
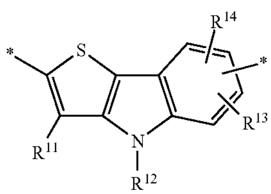
(D116)
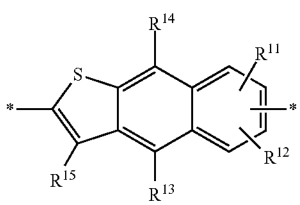
(D117)
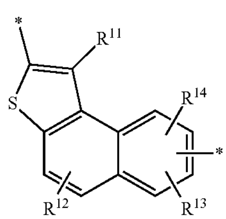
(D118)
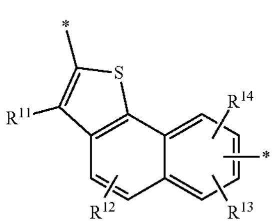
-continued
(D119)
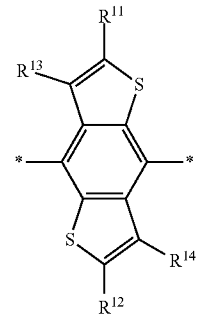
(D120)
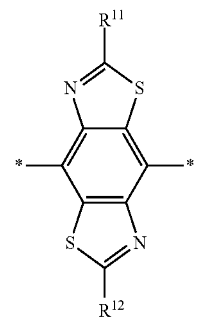
(D121)
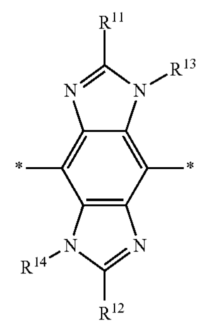
(D122)
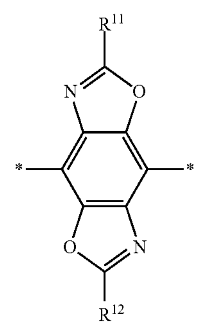
(D123)
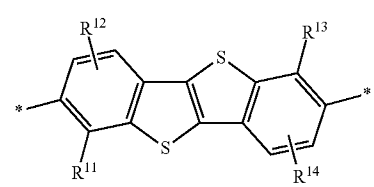

-continued
(D124)
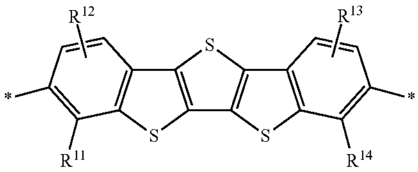
(D125)
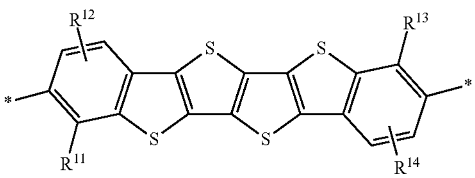
(D126)
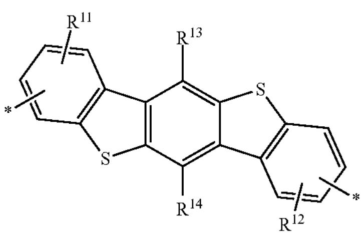
(D127)
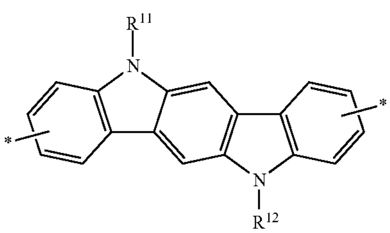
(D128)
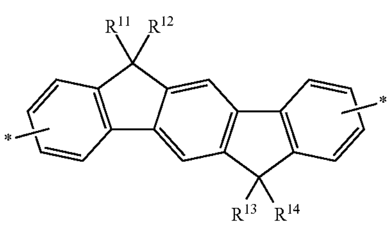
(D129)
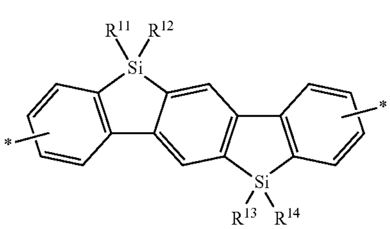
(D130)
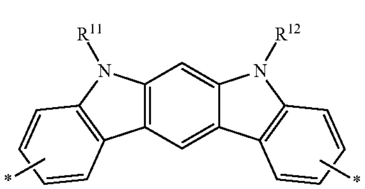
-continued
(D131)
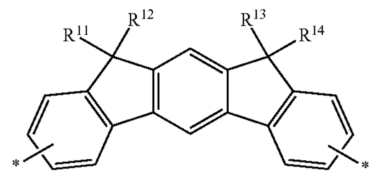
(D132)
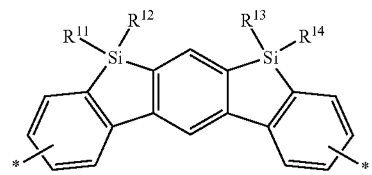
(D133)
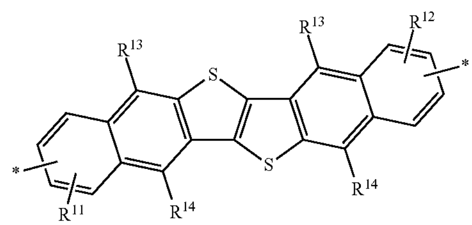
(D134)
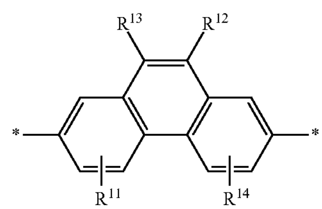
(D135)
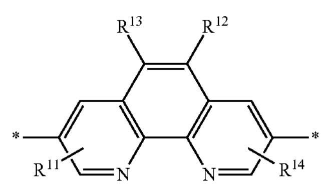
(D136)
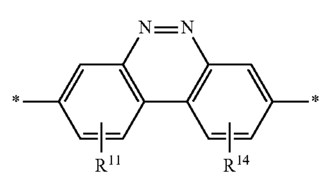
(D137)
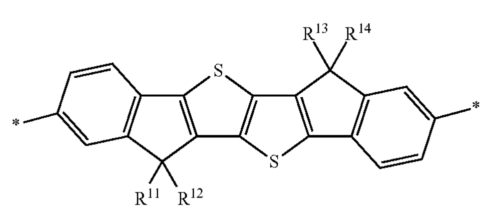
(D138)
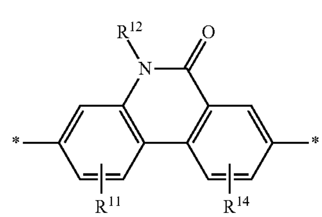

-continued

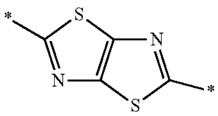

(D139)

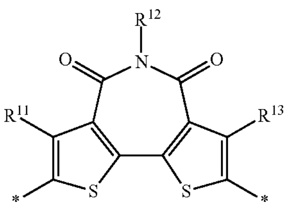

(D140)

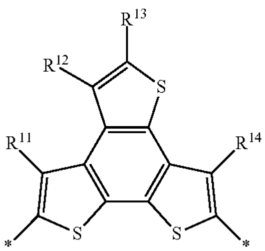

(D141)

wherein $R^{11}$, $R^{12}$, $R^{13}$, $R^{14}$, $R^{15}$, $R^{16}$, $R^{17}$ and $R^{18}$ independently of each other denote H or have one of the meanings of $R^S$ wherein $R^S$ is on each occurrence identically or differently F, Br, Cl, —CN, —NC, —NCO, —NCS, —OCN, —SCN, —C(O)$NR^0R^{00}$, —C(O)$X^0$, —C(O)$R^0$, —C(O)O$R^0$, —$NH_2$, —$NR^0R^{00}$, —SH, —S$R^0$, —$SO_3H$, —$SO_2R^0$, —OH, —$NO_2$, —$CF_3$, —$SF_5$, optionally substituted silyl, carbyl or hydrocarbyl with 1 to 40 C atoms that is optionally substituted and optionally comprises one or more hetero atoms, and

* each means a chemical linkage to an adjacent unit or to a terminal group in the polymer.

3. The process according to claim 1, wherein the acceptor units have the following formulae

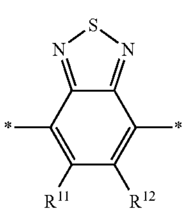

(A1)

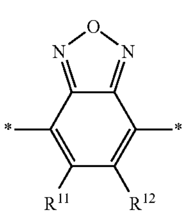

(A2)

-continued

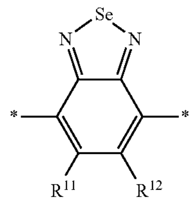

(A3)

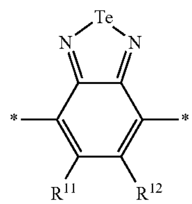

(A4)

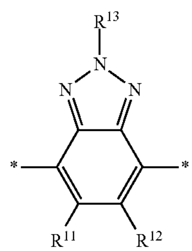

(A5)

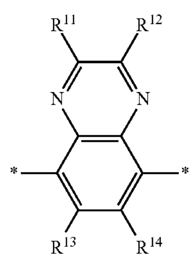

(A6)

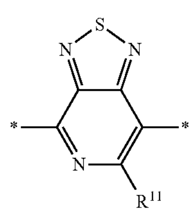

(A7)

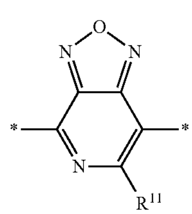

(A8)

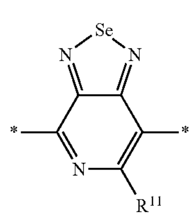

(A9)

-continued
(A10)
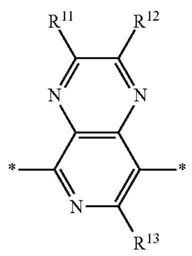
(A11)
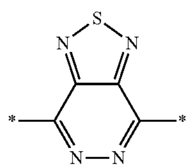
(A12)
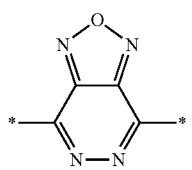
(A13)
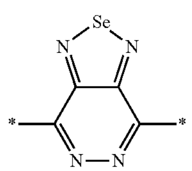
(A14)
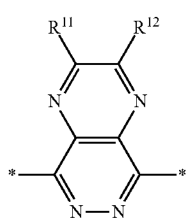
(A15)
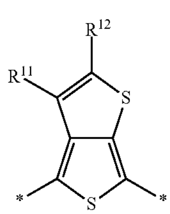
(A16)
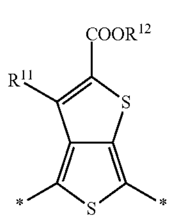
(A17)
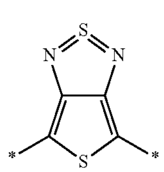
-continued
(A18)
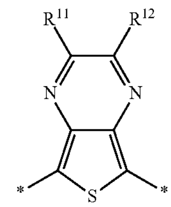
(A19)
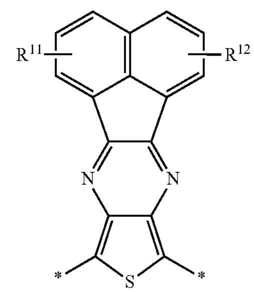
(A20)
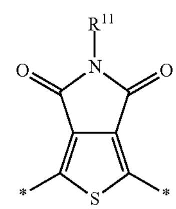
(A21)
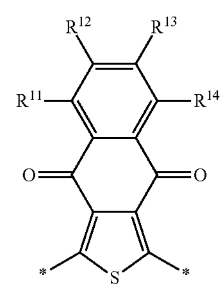
(A22)
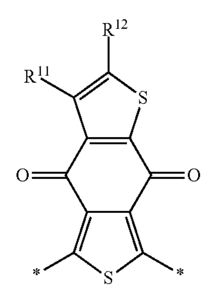
(A23)
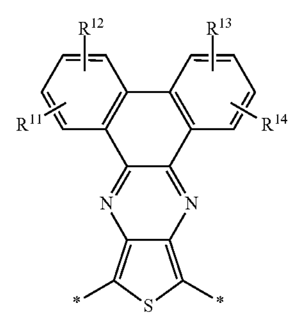

-continued
(A24)
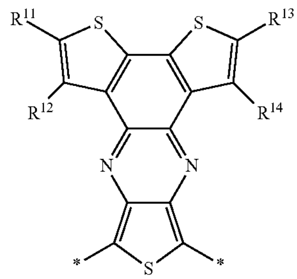
(A25)
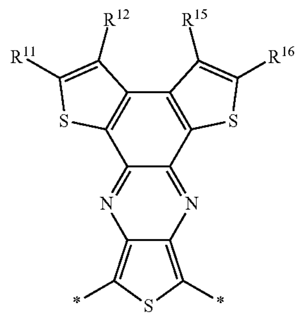
(A26)
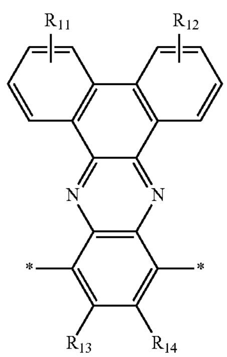
(A27)
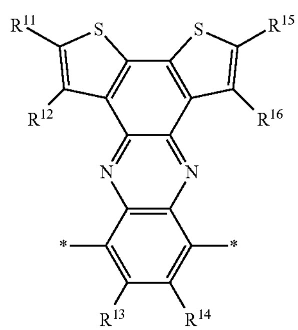
(A28)
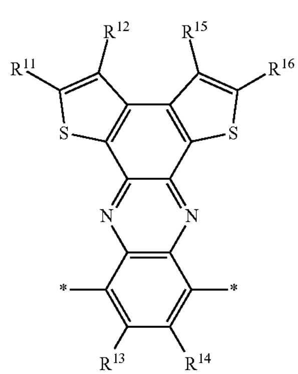
-continued
(A29)
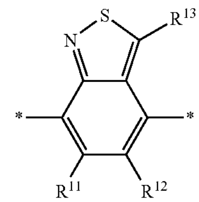
(A30)
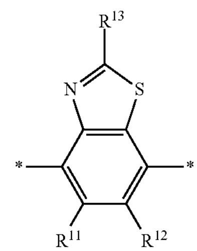
(A31)
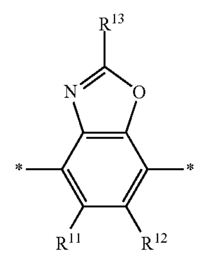
(A32)
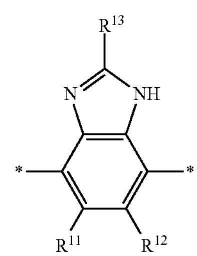
(A33)
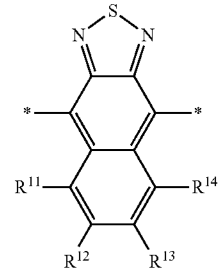
(A34)
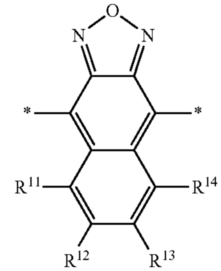

-continued
(A35)
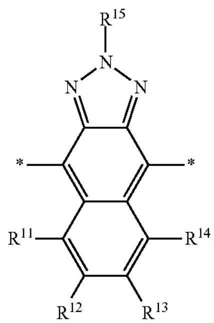
(A36)
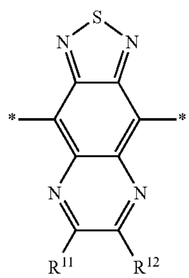
(A37)
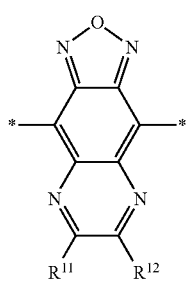
(A38)
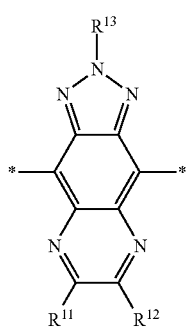
(A39)
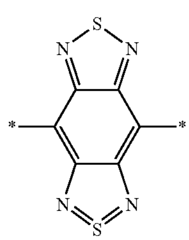
-continued
(A40)
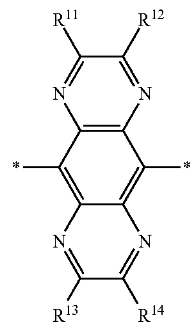
(A41)
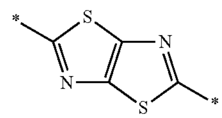
(A42)
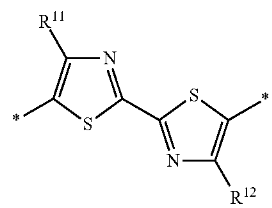
(A43)
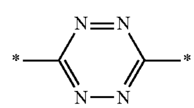
(A44)
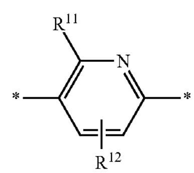
(A45)
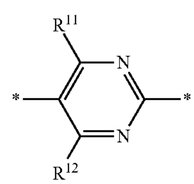
(A46)
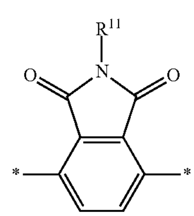
(A47)
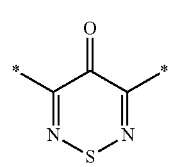

-continued
(A48)
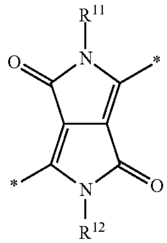
(A49)
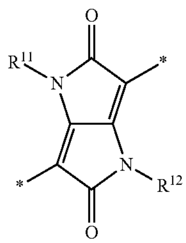
(A50)
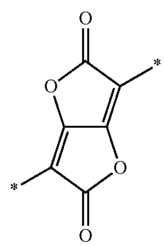
(A51)
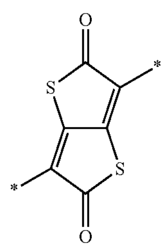
(A52)
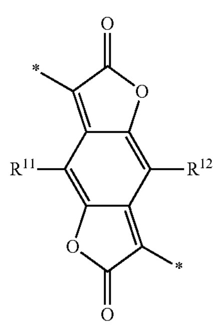
(A53)
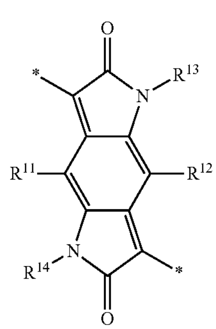
-continued
(A54)
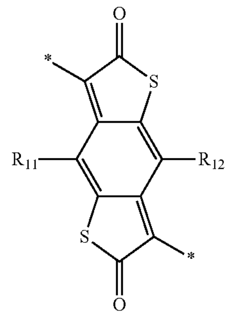
(A55)
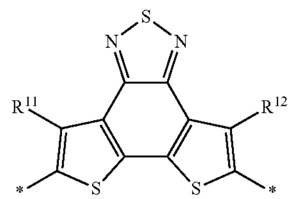
(A56)
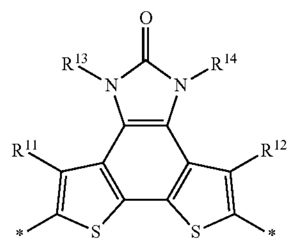
(A57)
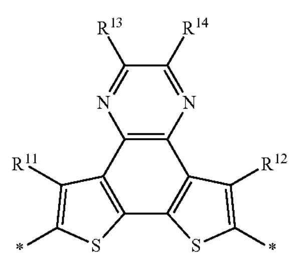
(A58)
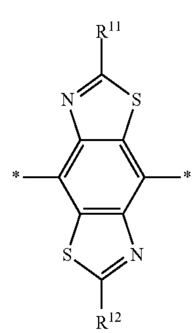

(A59)
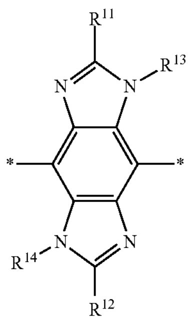
(A60)
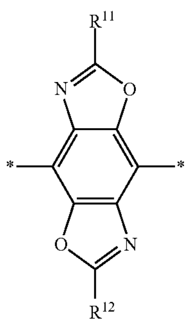
(A61)
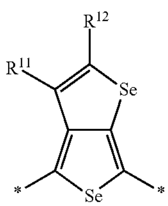
(A62)
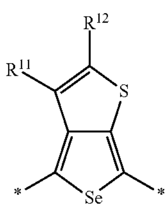
(A63)
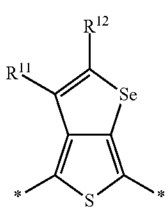
(A64)
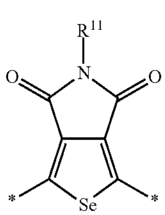
(A65)
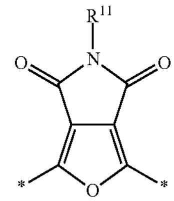
(A66)
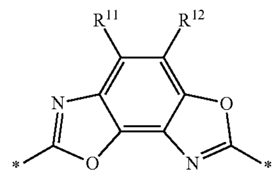
(A67)
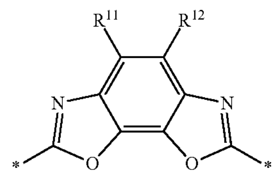
(A68)
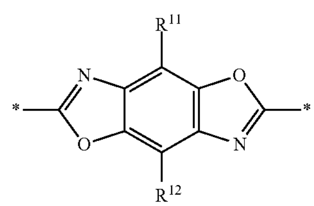
(A69)
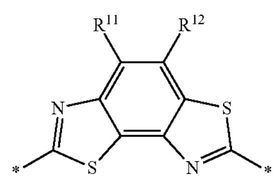
(A70)
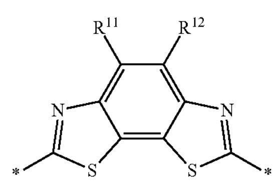
(A71)
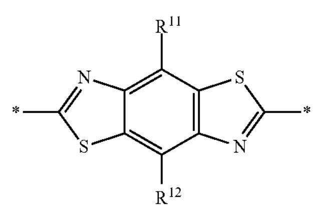
(A72)
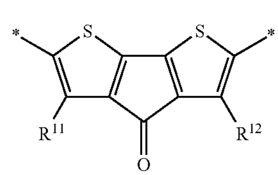

-continued
(A73)
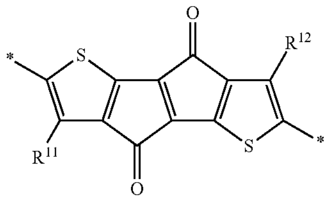
(A74)
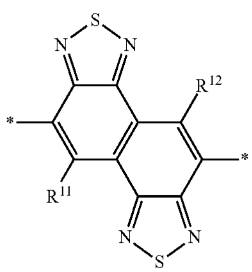
(A75)
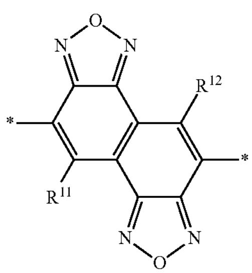
(A76)
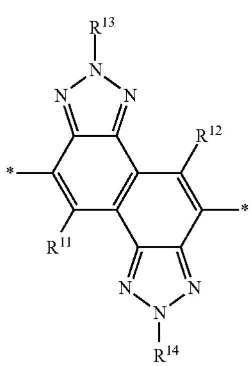
(A77)
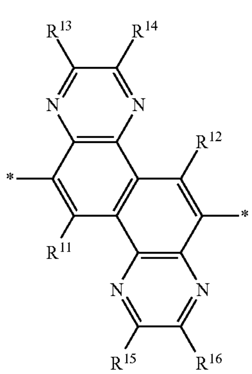
-continued
(A78)
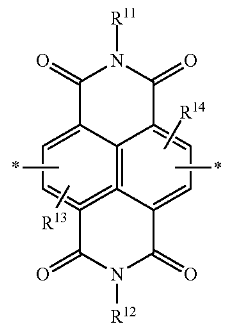
(A79)
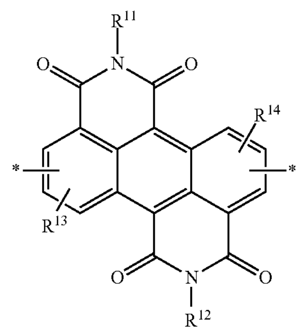
(A80)
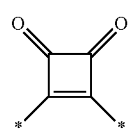
(A81)
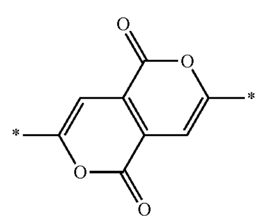
(A82)
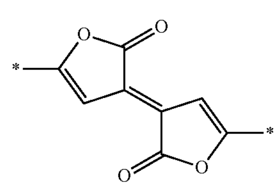
(A83)
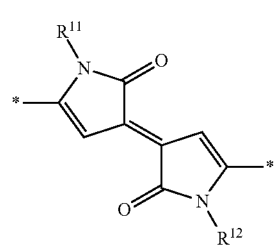

-continued
(A84)
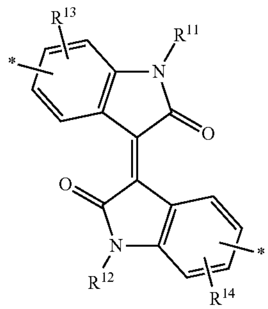
(A85)
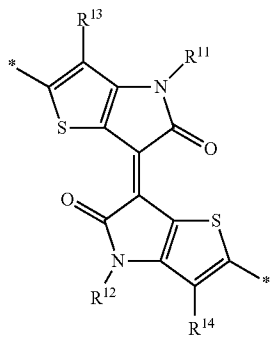
(A86)
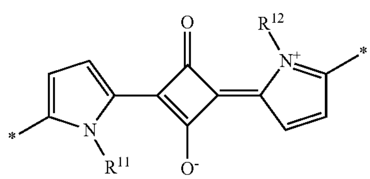
(A87)
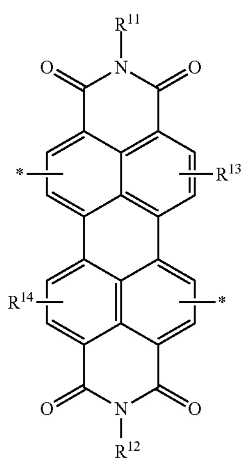
(A88)
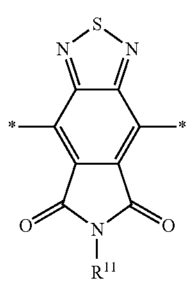
-continued
(A89)
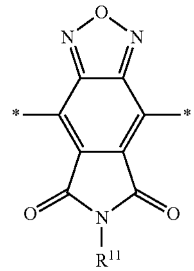
(A90)
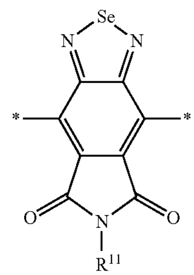
(A91)
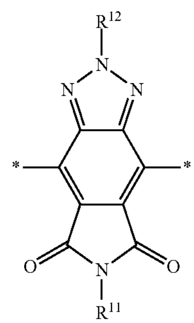
(A92)
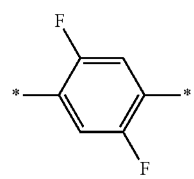
(A93)
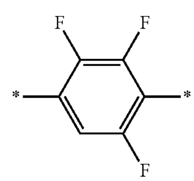
(A94)
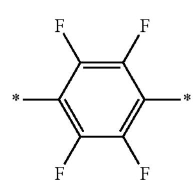
(A95)
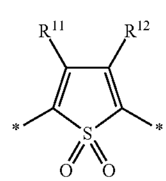

-continued

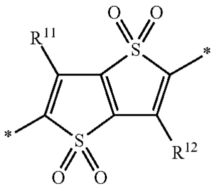

(A96)

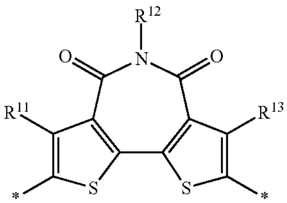

(A97)

wherein $R^{11}$, $R^{12}$, $R^{13}$, $R^{14}$, $R^{15}$ and $R^{16}$ independently of each other denote H or have one of the meanings of $R^S$ wherein $R^S$ is on each occurrence identically or differently F, Br, Cl, —CN, —NC, —NCO, —NCS, —OCN, —SCN, —C(O)NR$^0$R$^{00}$, —C(O)X$^0$, —C(O)R$^0$, —C(O)OR$^0$, —NH$_2$, —NR$^0$R$^{00}$, —SH, —SR$^0$, —SO$_3$H, —SO$_2$R$^0$, —OH, —NO$_2$, —CF$_3$, —SF$_5$, optionally substituted silyl, carbyl or hydrocarbyl with 1 to 40 C atoms that is optionally substituted and optionally comprises one or more hetero atoms, and

* each means a chemical linkage to an adjacent unit or to a terminal group in the polymer.

4. The process according to claim 1, wherein the polymer produced has the following formulae

I

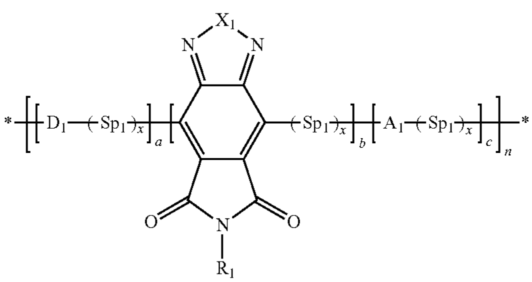

II

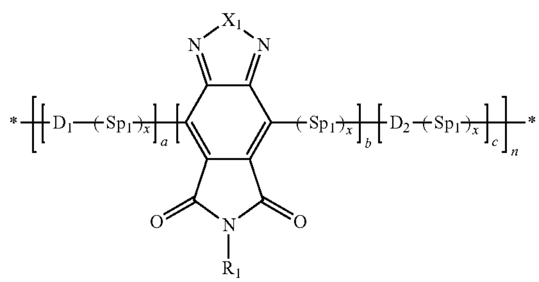

III

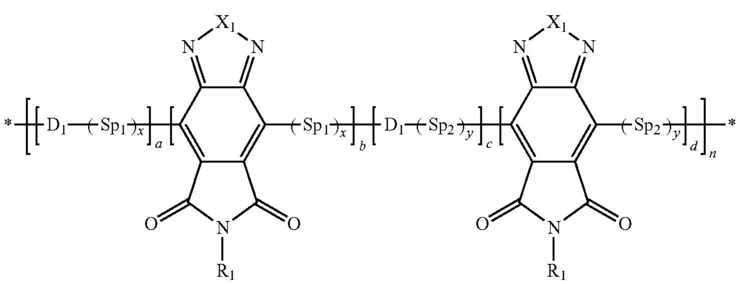

IV

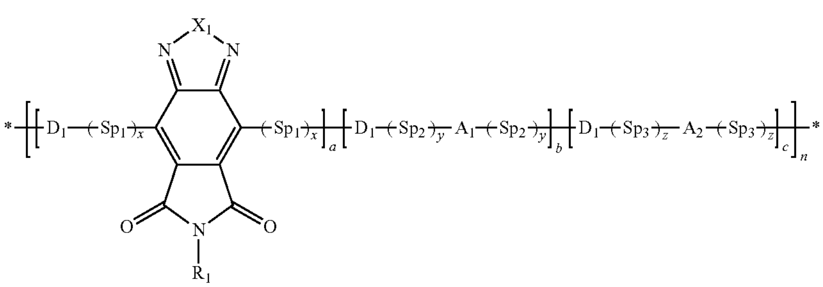

V

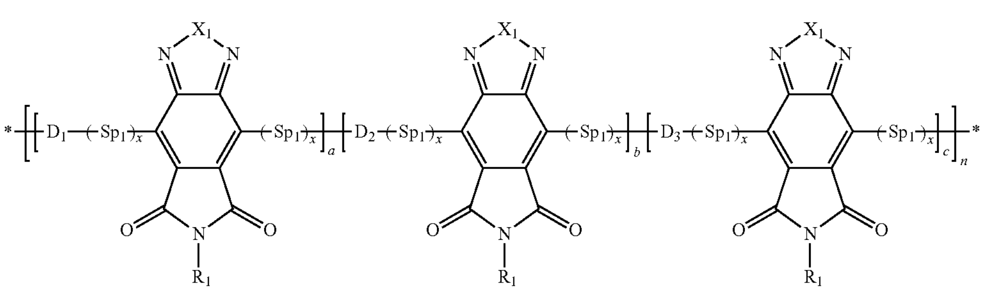

-continued
VI
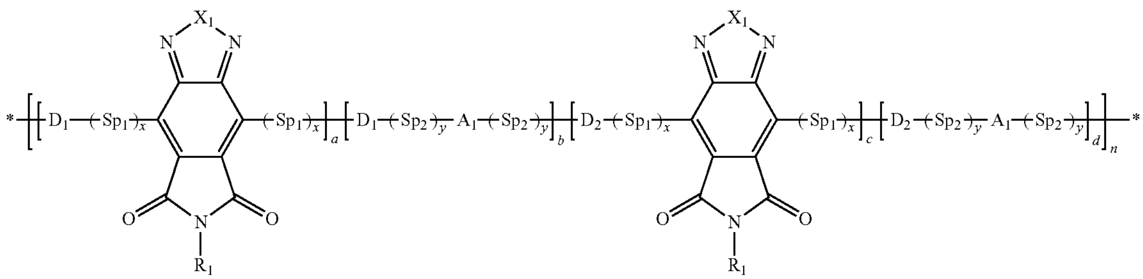
VII
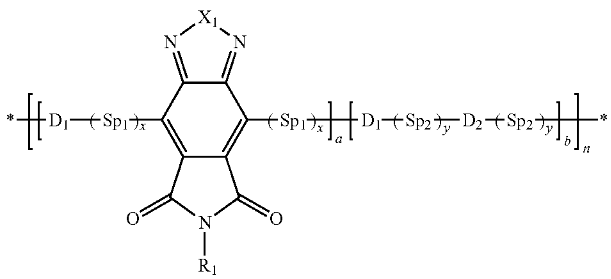
VIII
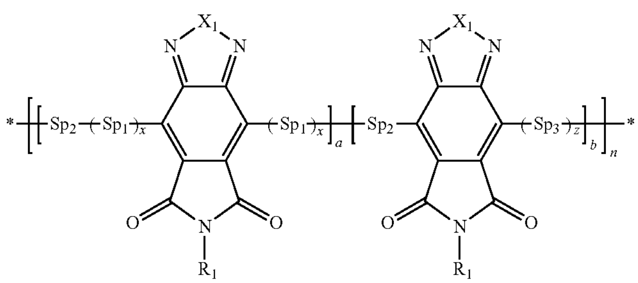
wherein
$D^1$ and $D^2$ independently of each other denote a donor unit defined as
(D1)
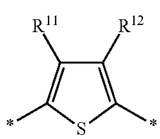
(D2)
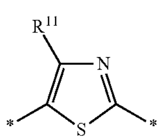
$A^1$ and $A^2$ independently of each other denote an acceptor unit defined as
(A1)
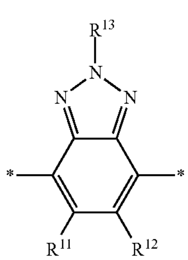
-continued
(A2)
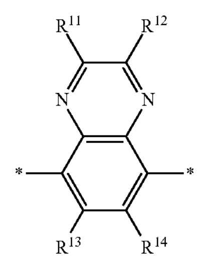
$Sp^1$, $Sp^2$, $Sp^3$ independently of each other denote a spacer unit defined as
Sp1
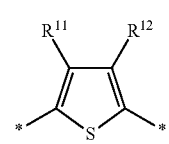
Sp2
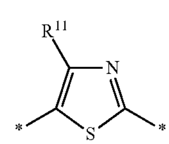

-continued

Sp3

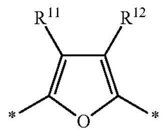

wherein $R^{11}$, $R^{12}$, $R^{13}$, $R^{14}$, $R^{15}$, $R^{16}$, $R^{17}$ and $R^{18}$ independently of each other denote H or have one of the meanings of $R^S$ wherein $R^S$ is on each occurrence identically or differently F, Br, Cl, —CN, —NC, —NCO, —NCS, —OCN, —SCN, —C(O)$NR^0R^{00}$, —C(O)$X^0$, —C(O)$R^0$, —C(O)$OR^0$, —$NH_2$, —$NR^0R^{00}$, —SH, —$SR^0$, —$SO_3H$, —$SO_2R^0$, —OH, —$NO_2$, —$CF_3$, —$SF_5$, optionally substituted silyl, carbyl or hydrocarbyl with 1 to 40 C atoms that is optionally substituted and optionally comprises one or more hetero atoms $X^1$ has one of the meanings of X given in claim 1, x, y and z are independently of each other 0, 1 or 2, a, b, d and d denote the molar fractions of the respective unit in the polymer, and are each, independently of one another, ≥0 and <1, with at least two of a, b, c and d being >0, and a+b+c+d=1, n is an integer >1, and

* each means a chemical linkage to an adjacent unit or to a terminal group in the polymer.

5. The process according to claim 4, wherein the polymer produced has the following subformulae Ia

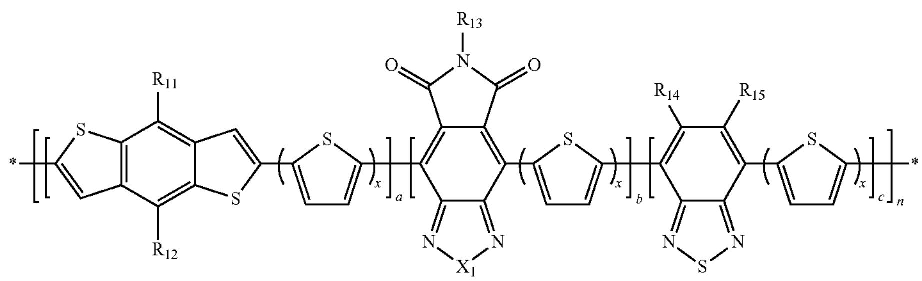

Ib

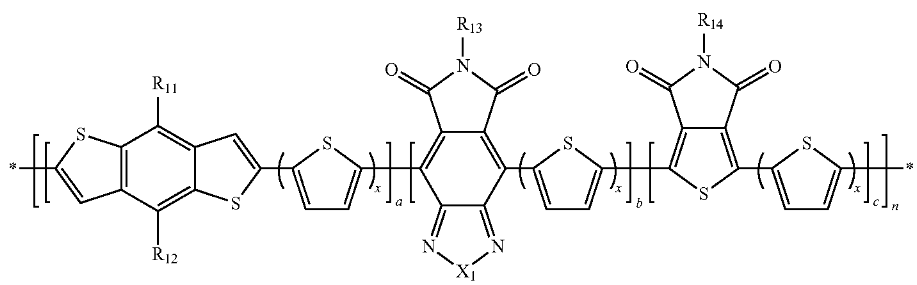

Ic

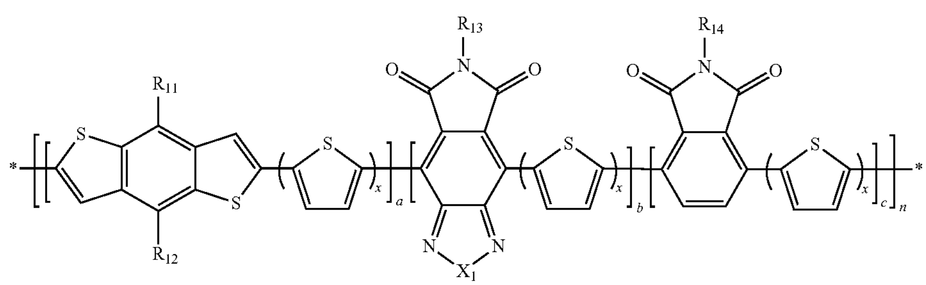

Id

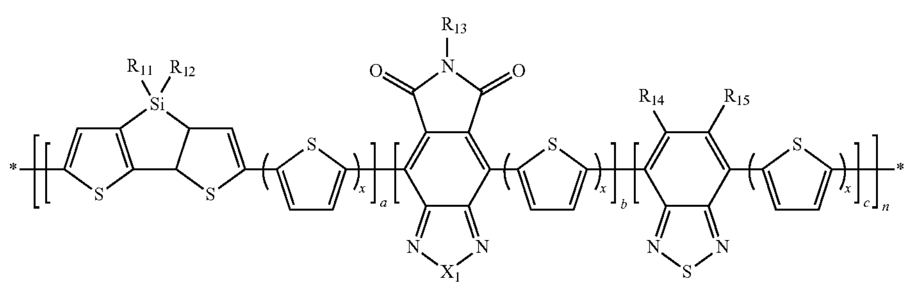

-continued
Ie
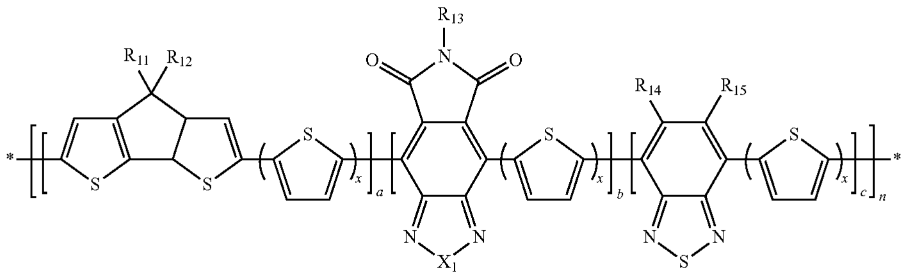
If
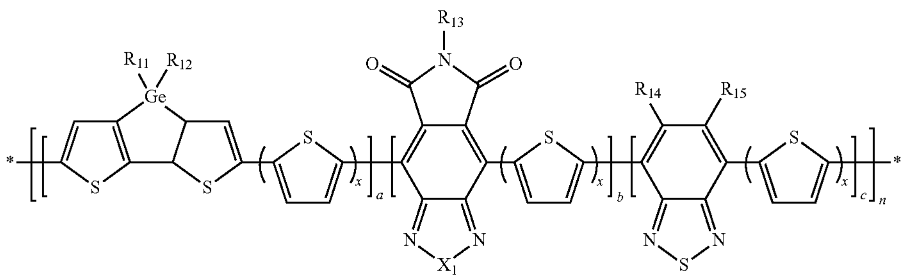
Ig
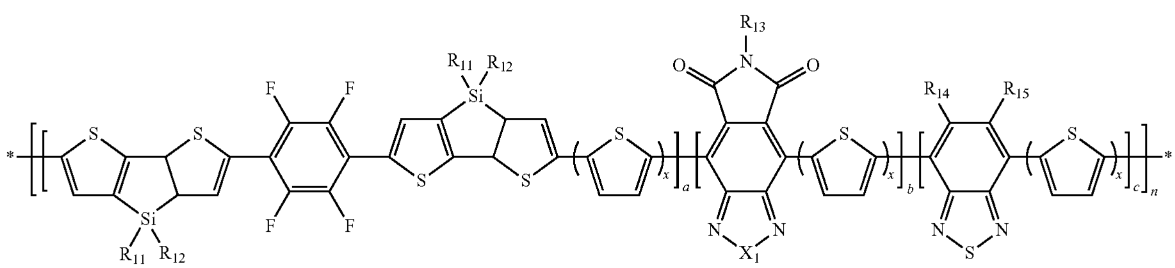
Ih
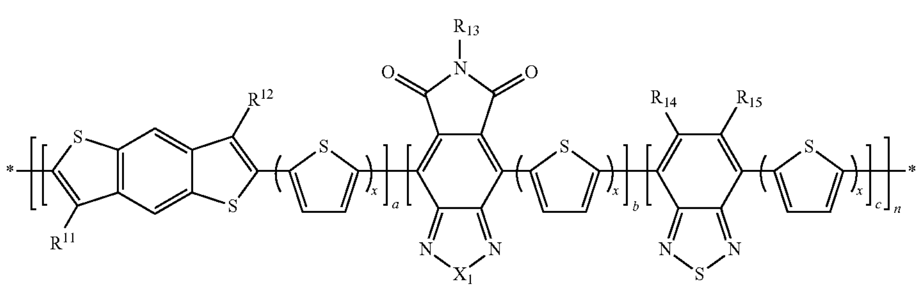
Ii
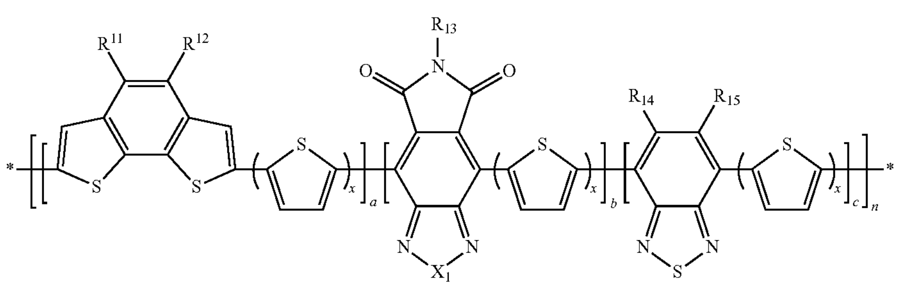

-continued
Ij
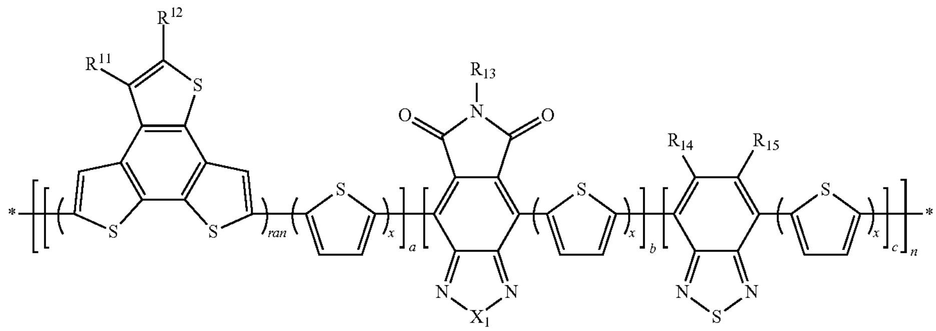
Ik
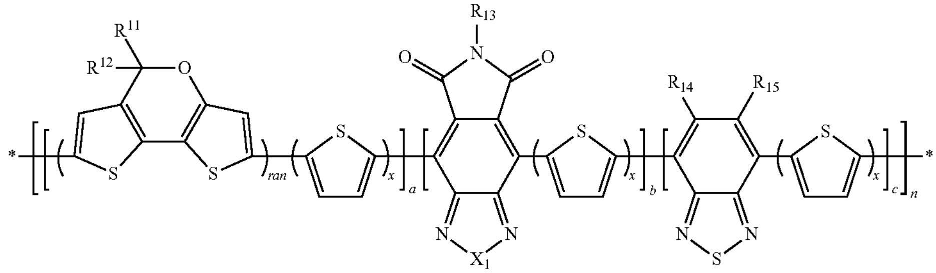
IIa
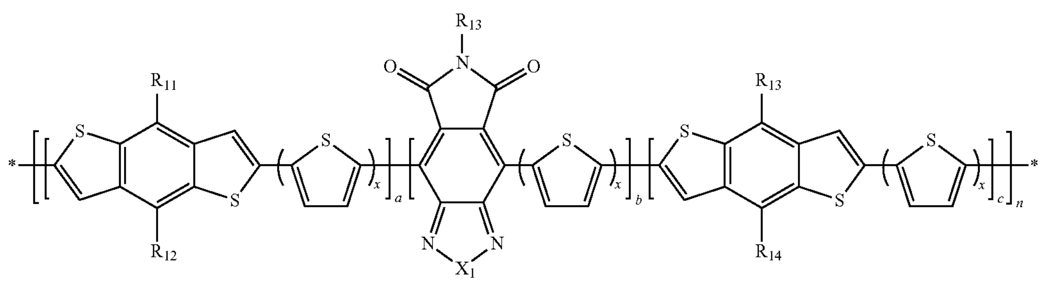
IIb
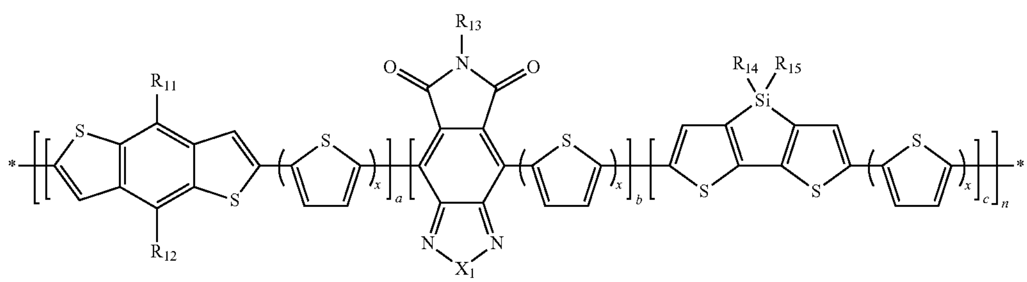
IIc
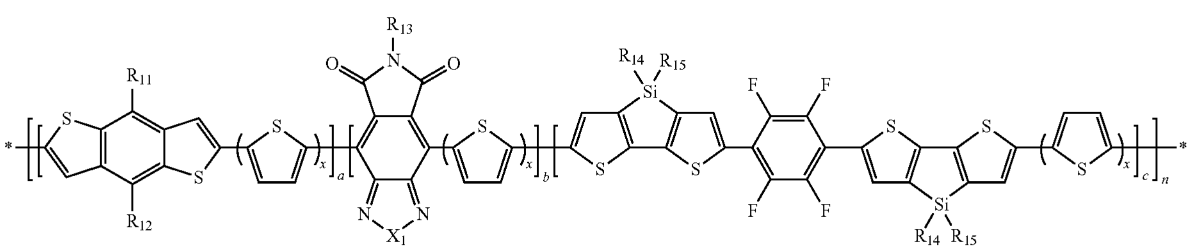

-continued
IId
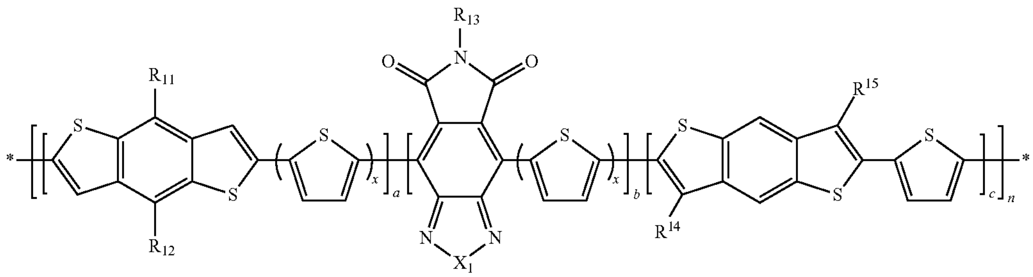
IIe
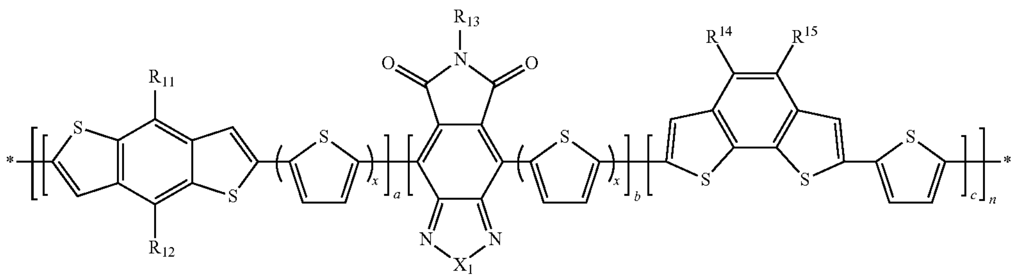
IIf
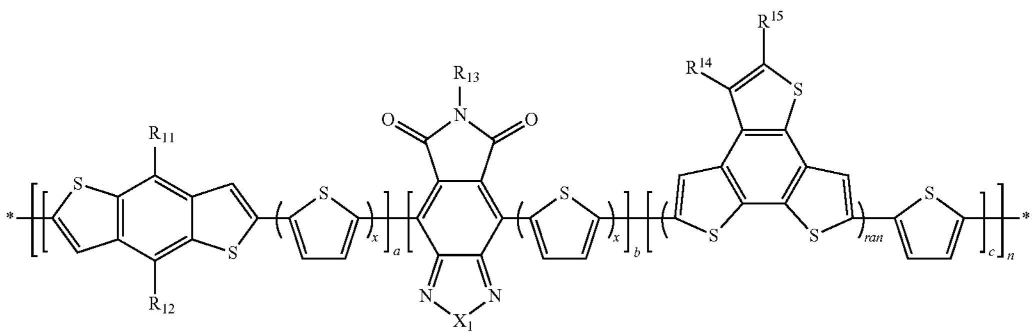
IIg
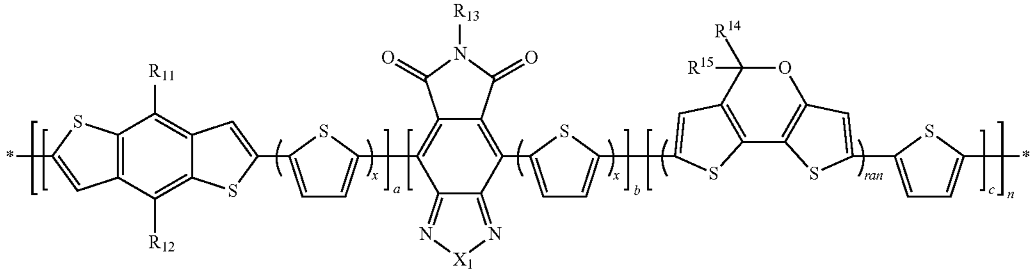
IIh
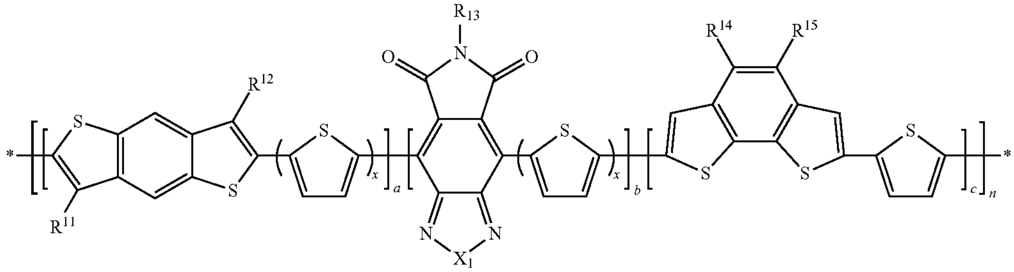

-continued
IIi
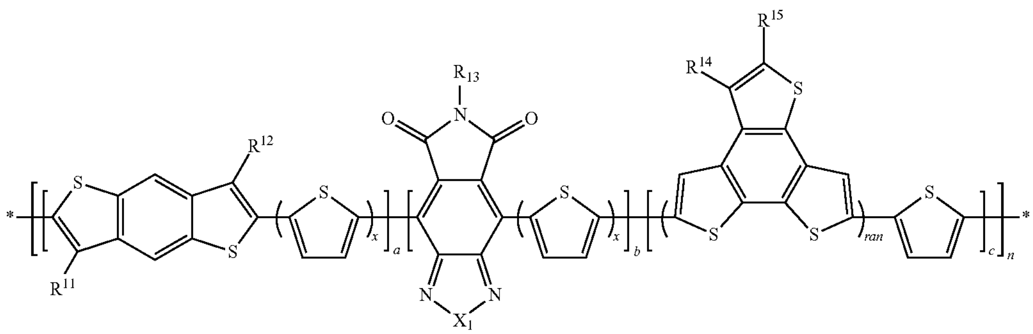
IIj
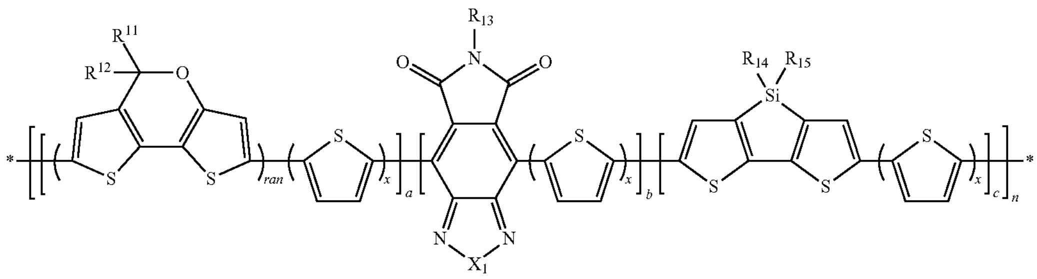
IIIa
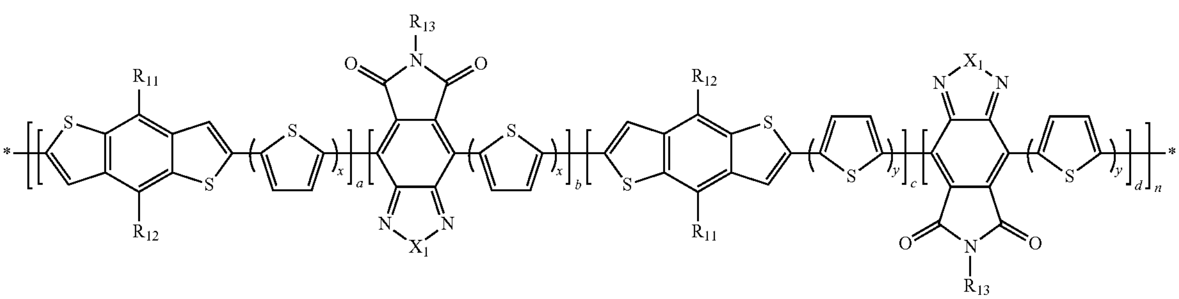
IIIb
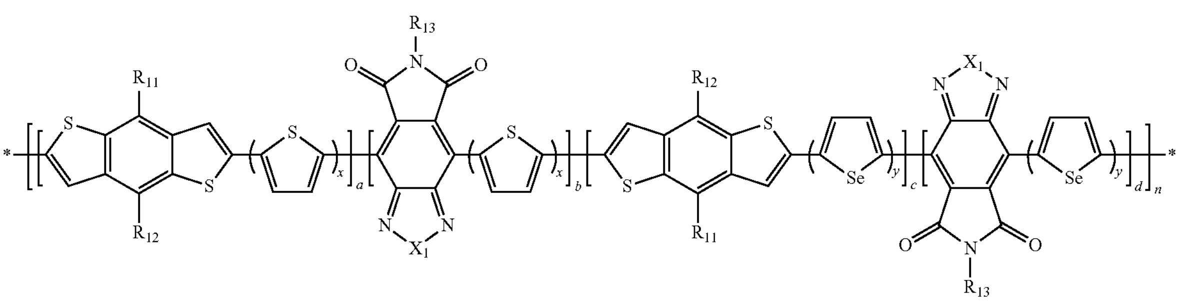
IIIc
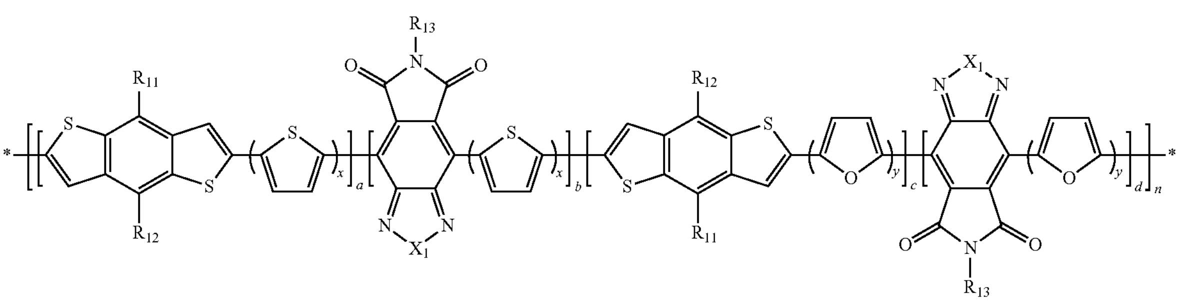

-continued
IIId
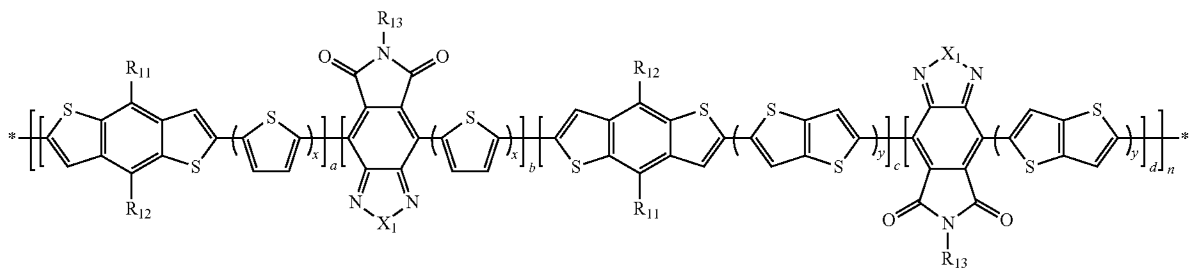
IIIe
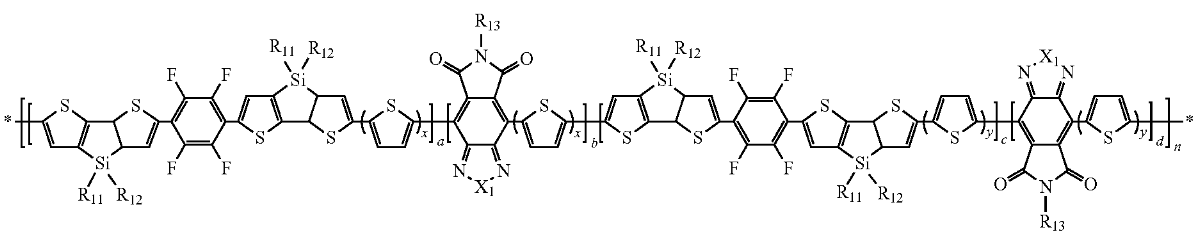
IIIf
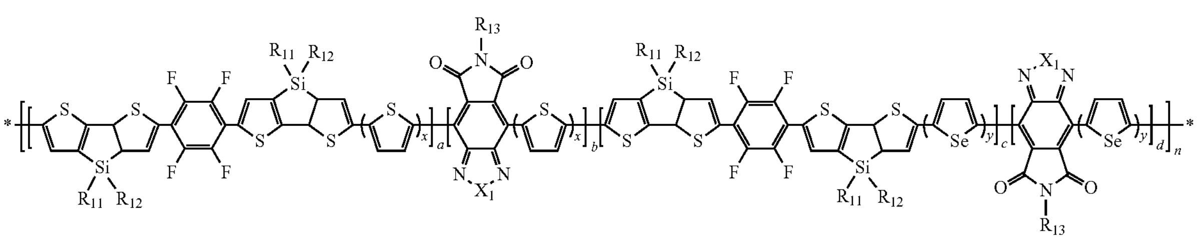
IVa
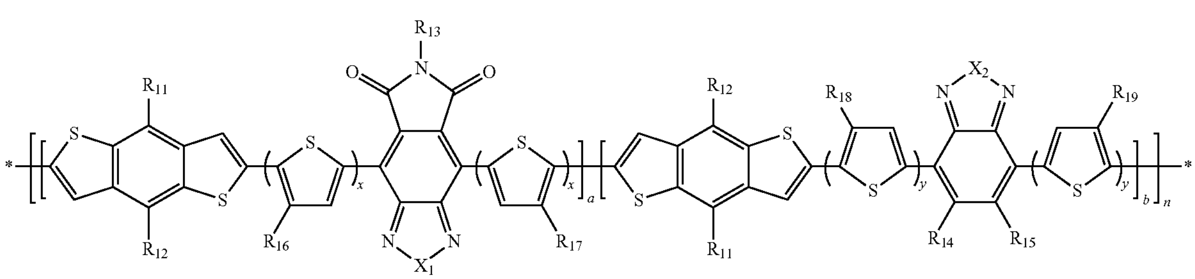
IVb
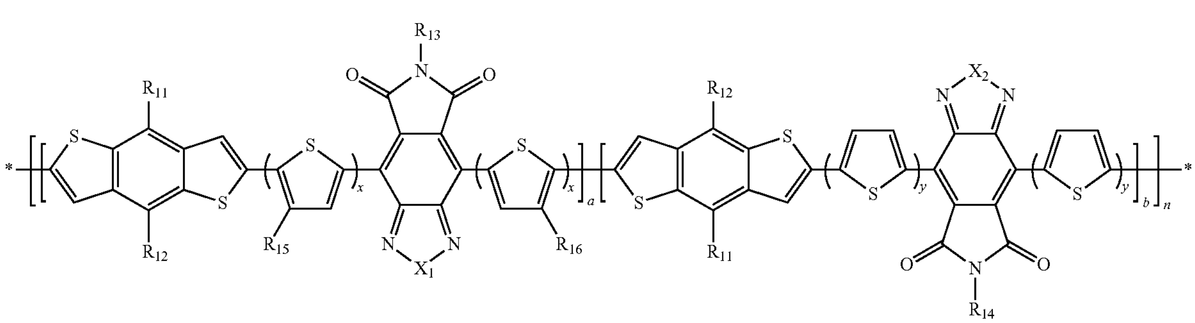

-continued
IVc
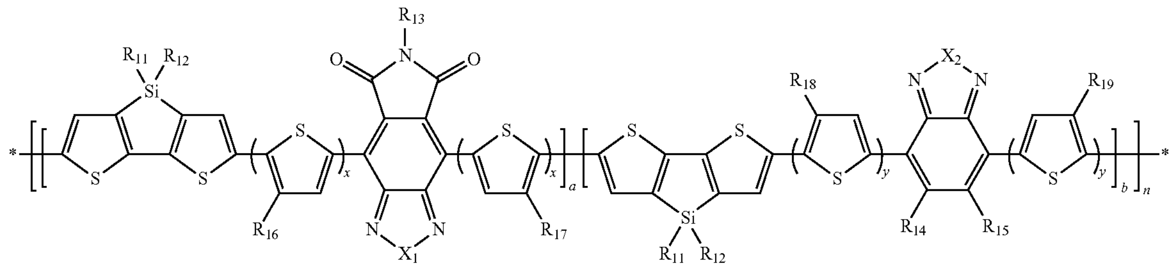
IVd
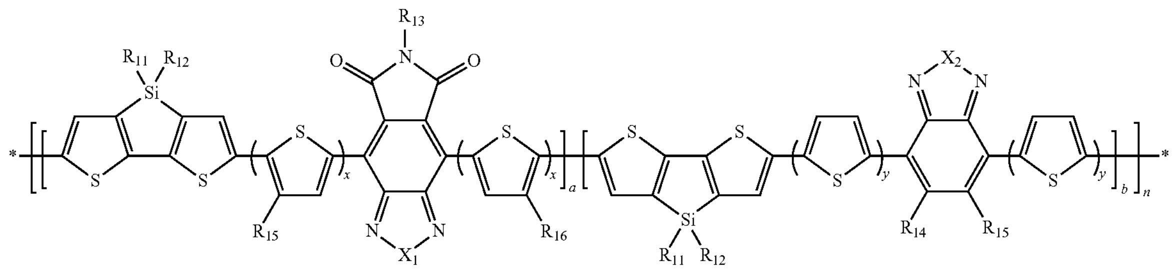
IVe
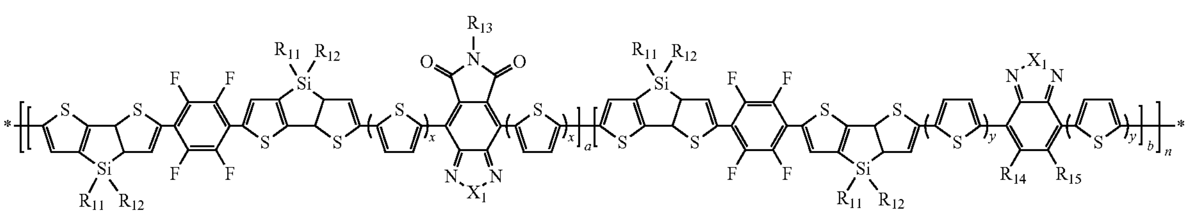
IVf
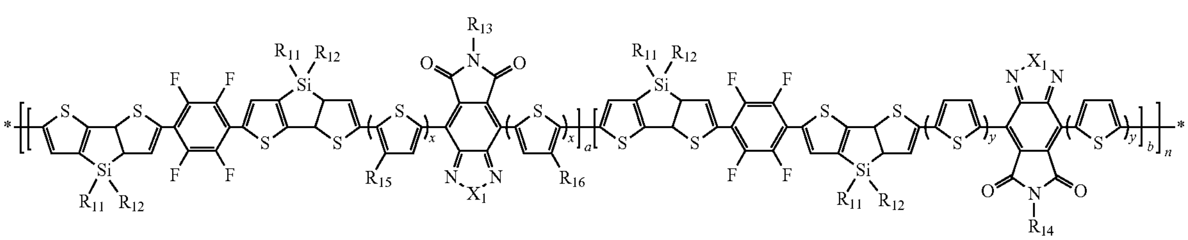
IVg
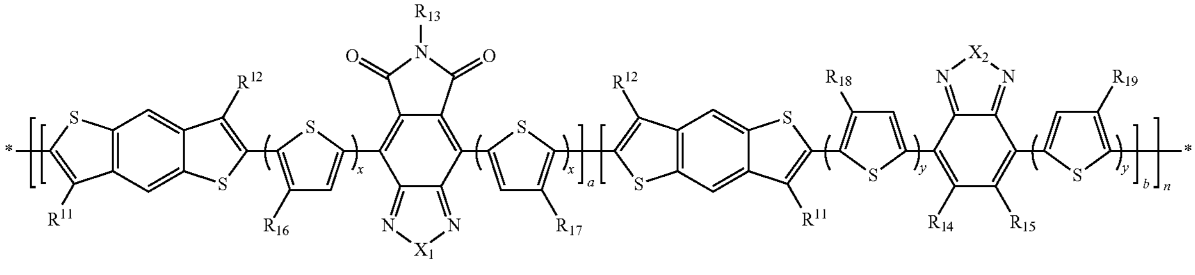

-continued
IVh
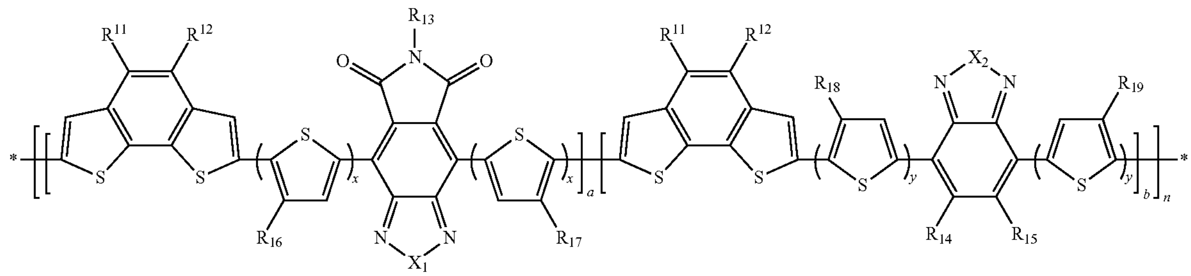
IVi
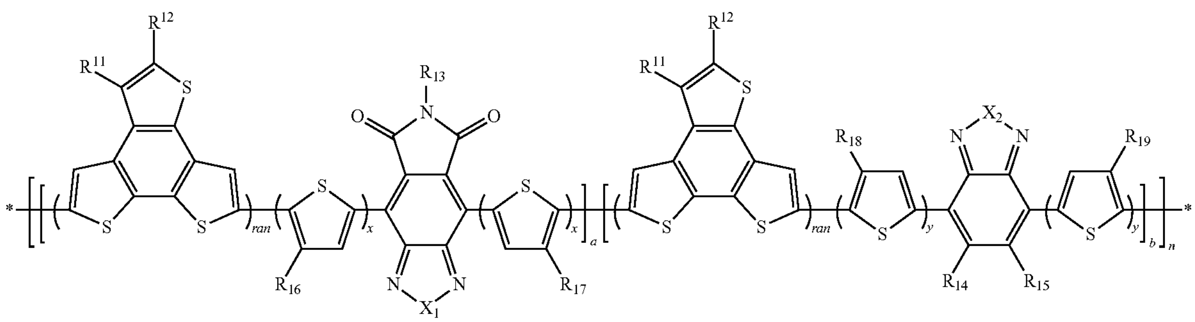
IVj
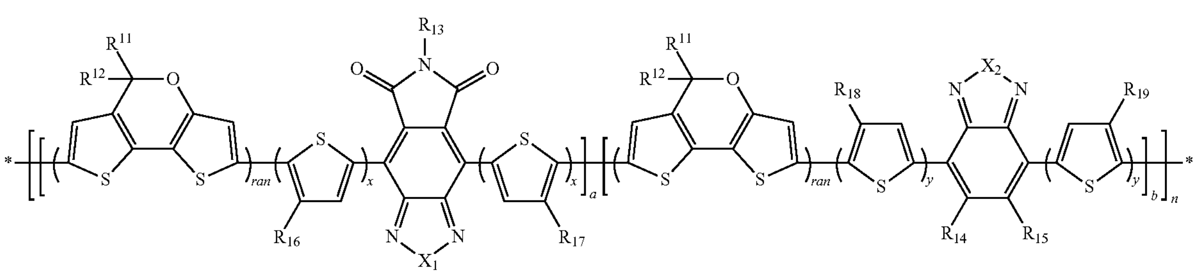
IVk
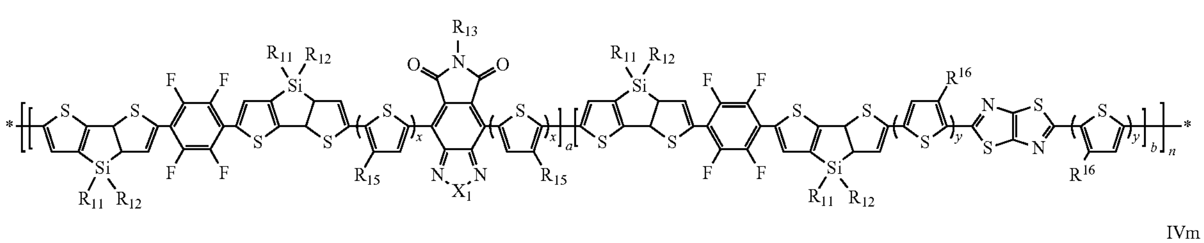
IVm
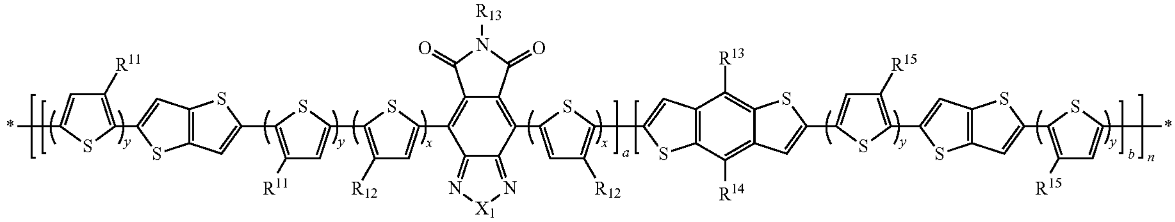

-continued
IVn
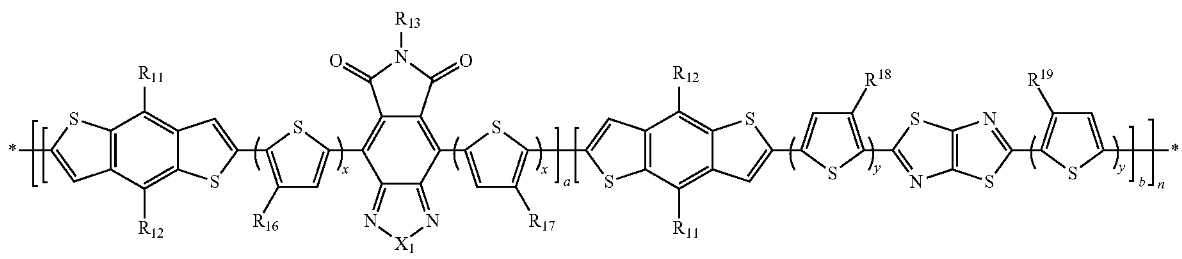
IVo
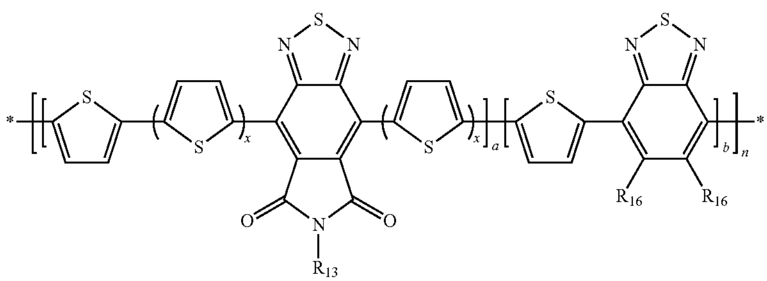
Va
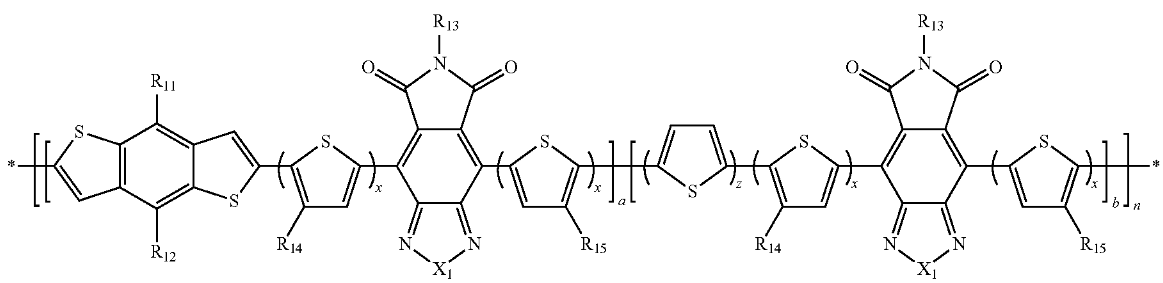
Vb
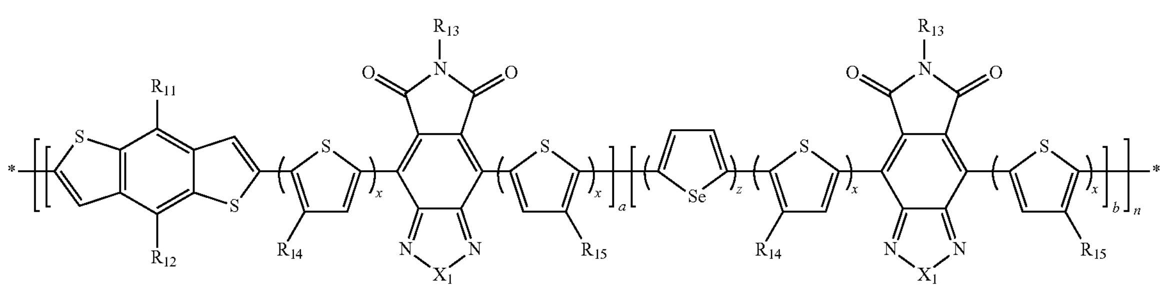
Vc
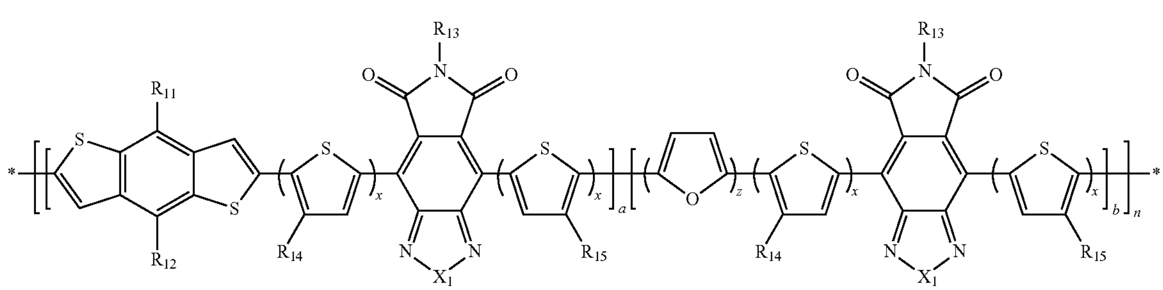

-continued
Vd
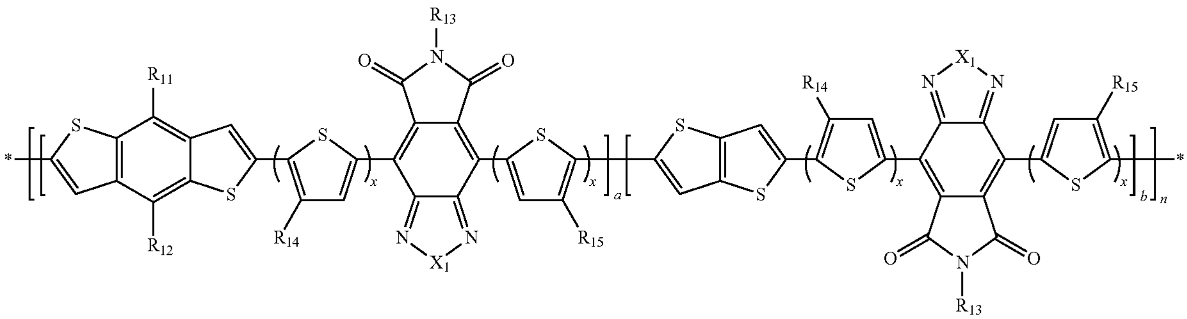
Ve
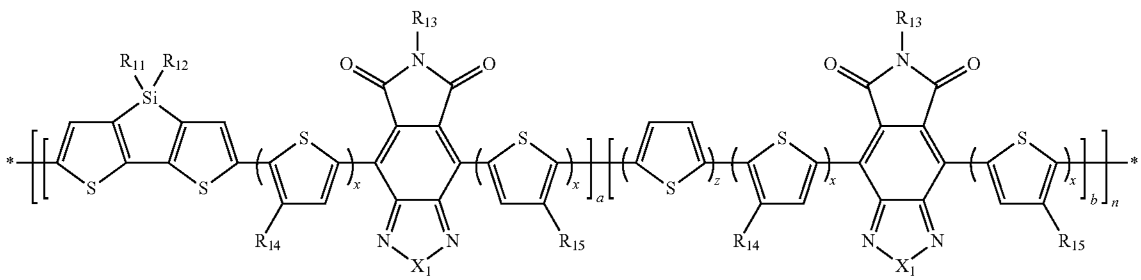
Vf
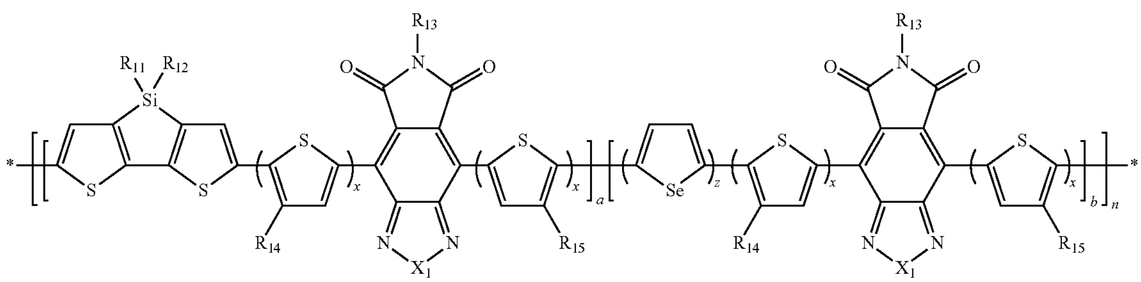
Vg
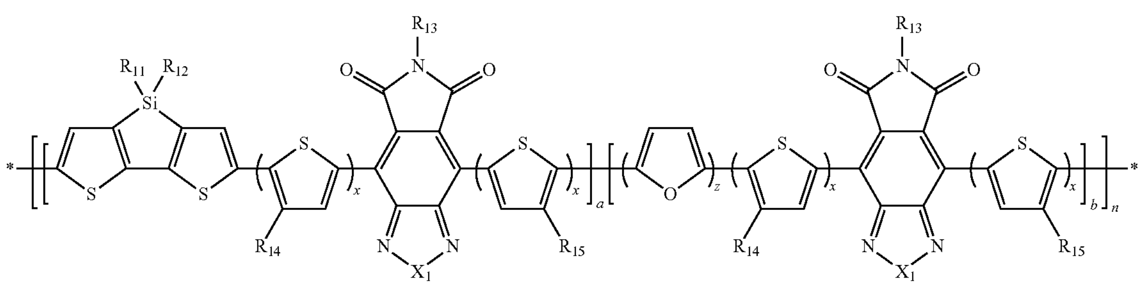
Vh
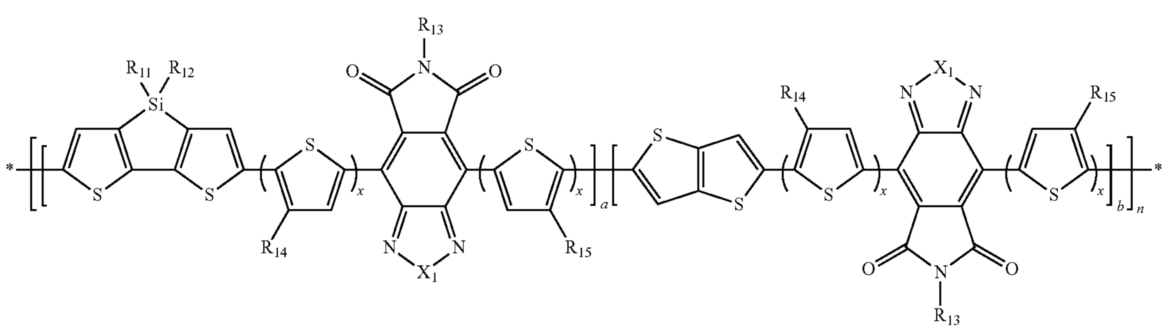

-continued
Vi
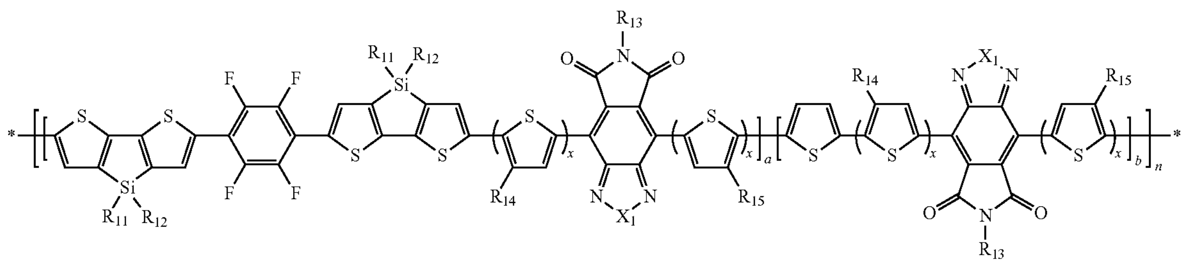
Vk
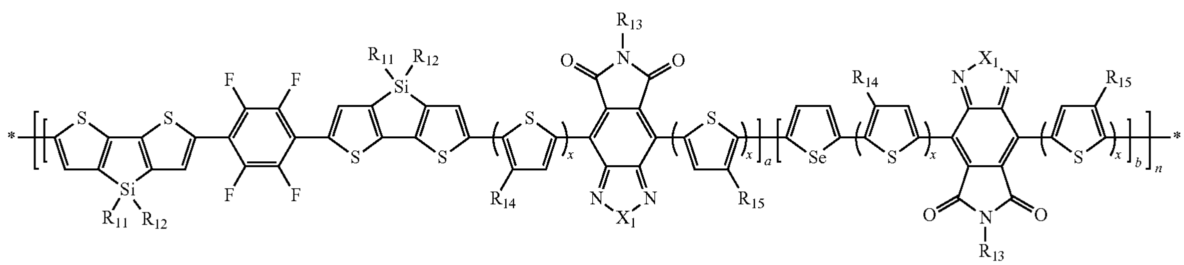
Vm
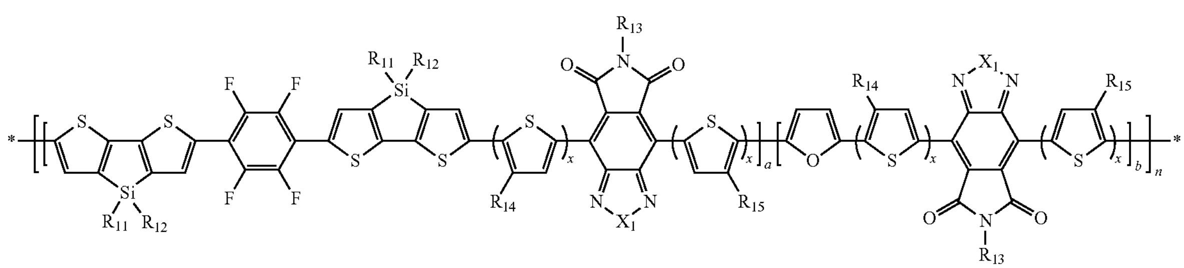
Vn
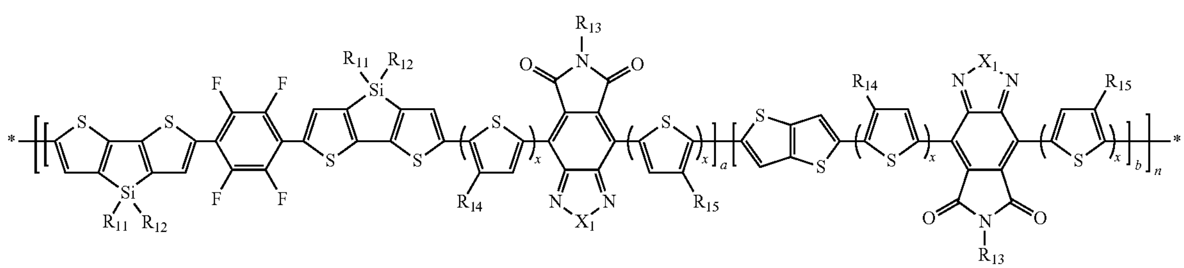
Vo
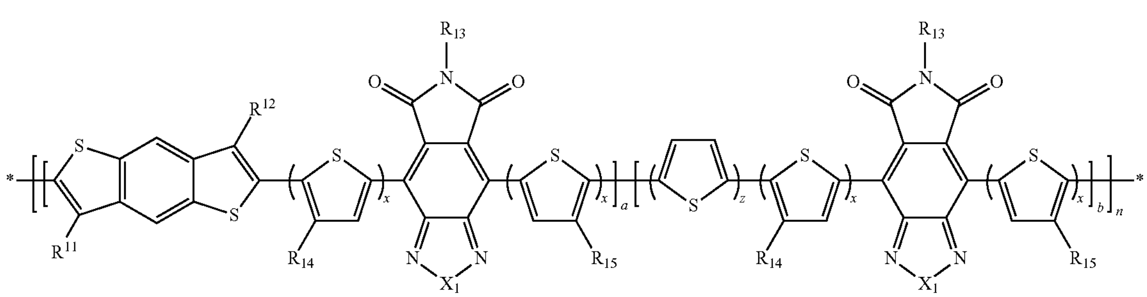

-continued
Vp
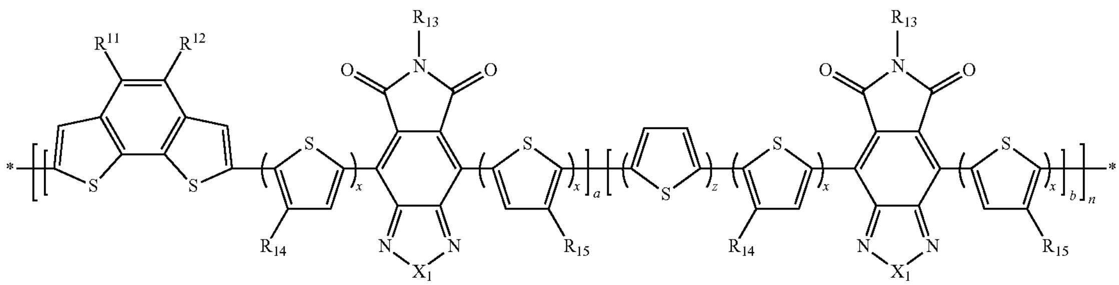
Vq
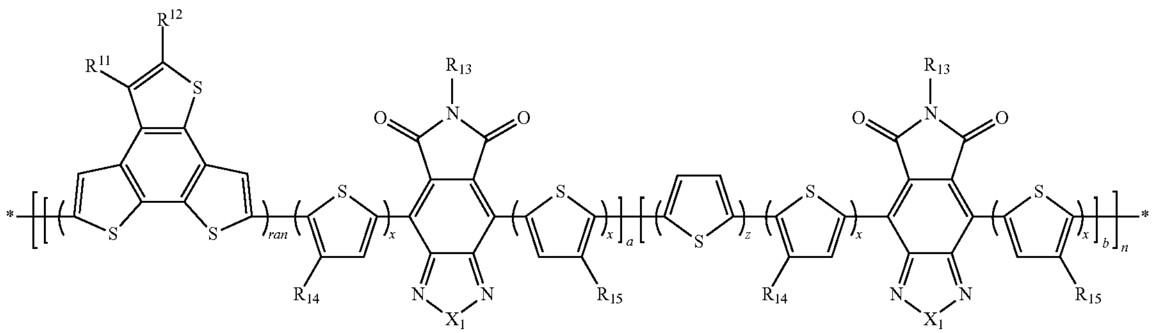
Vr
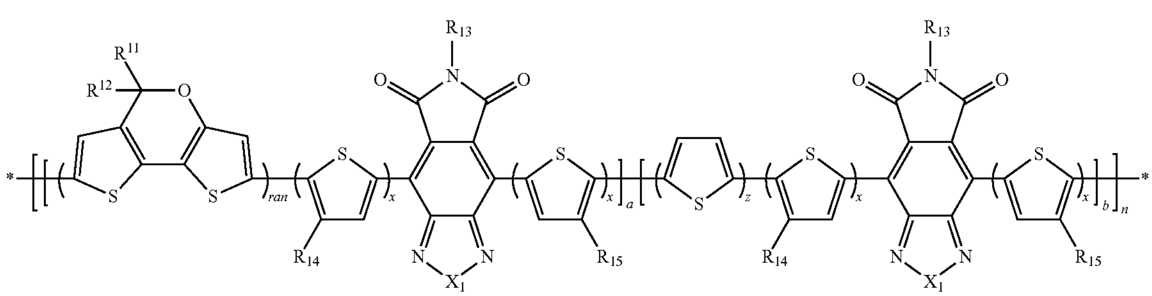
Vs
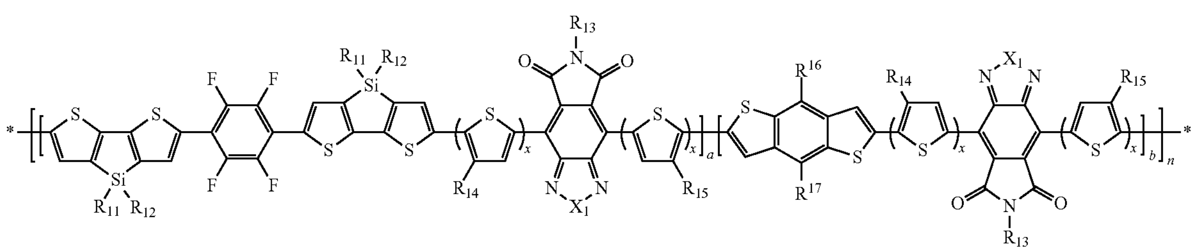
Vv
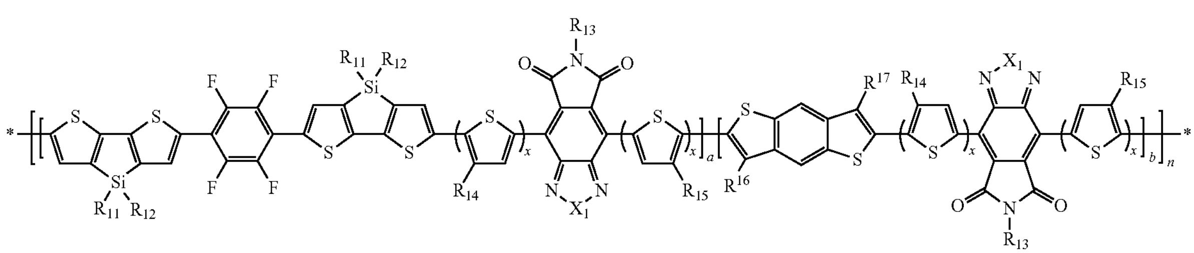

-continued
VIa
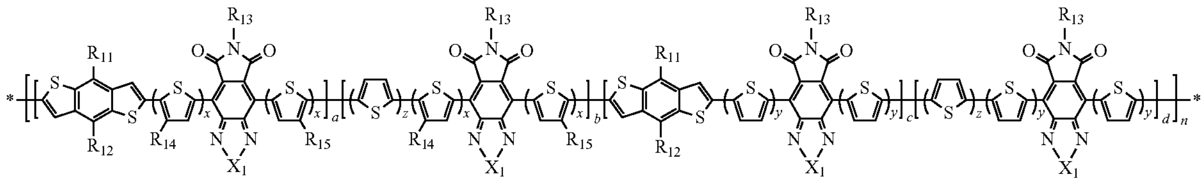
VIb
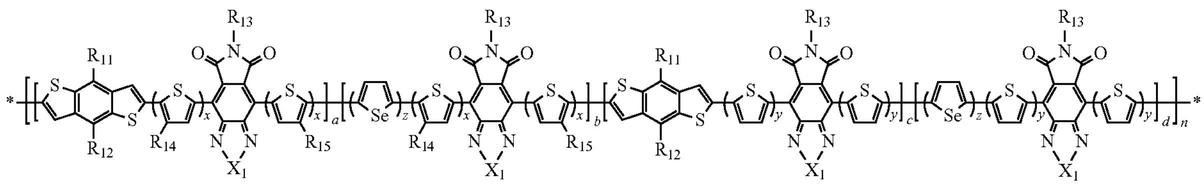
VIc
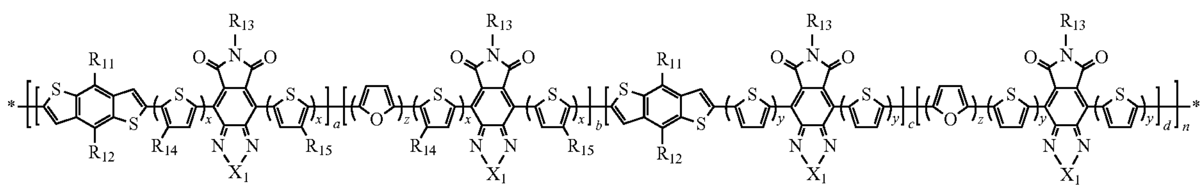
VId
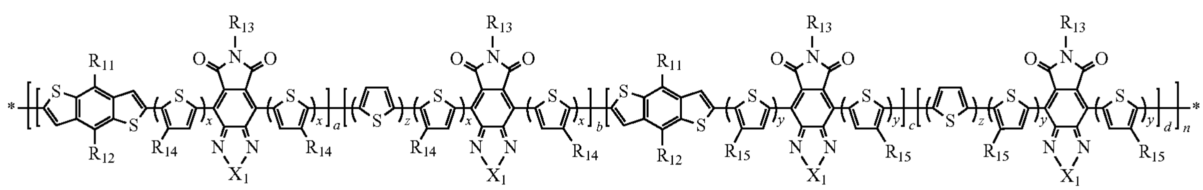
VIIa
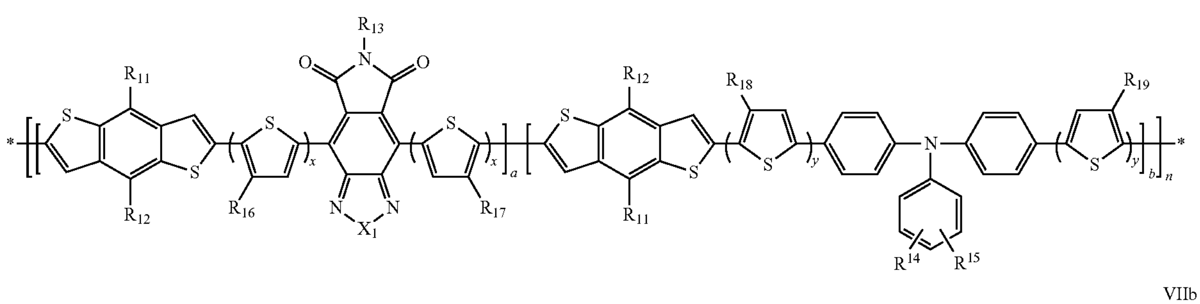
VIIb
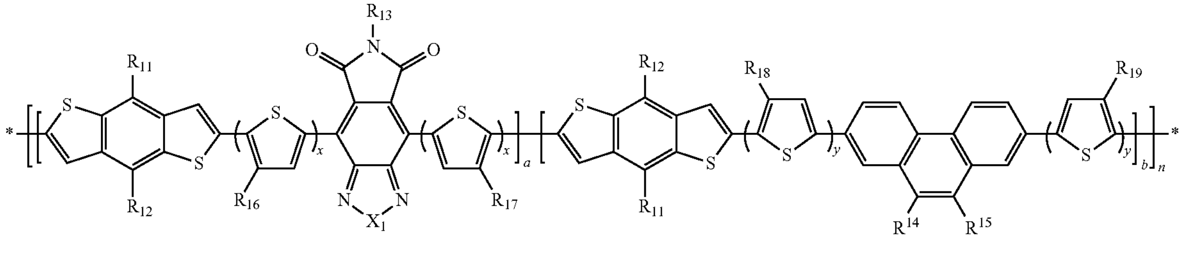

-continued

VIIc

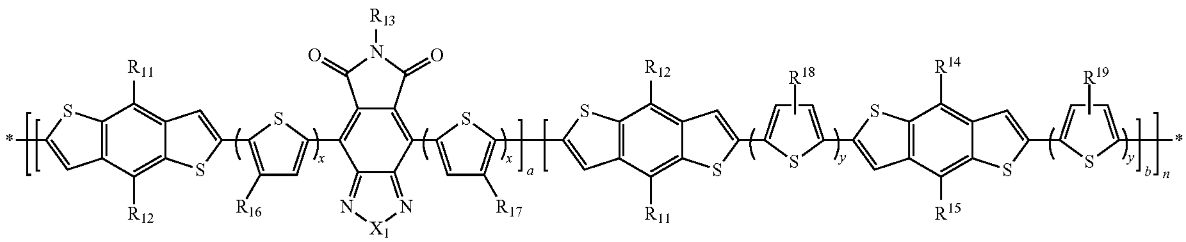

VIId

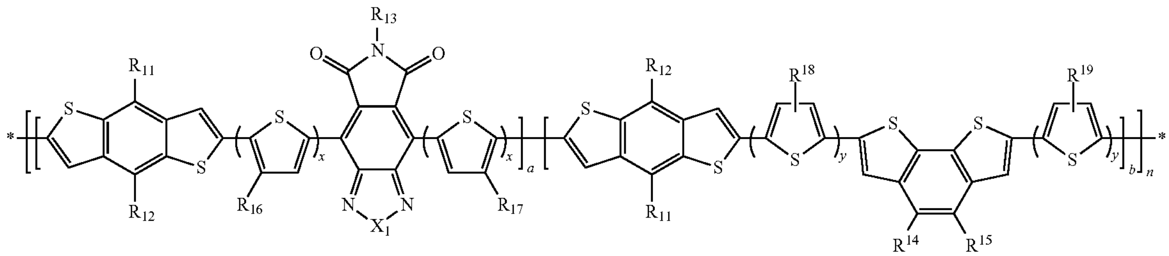

or

VIIIa

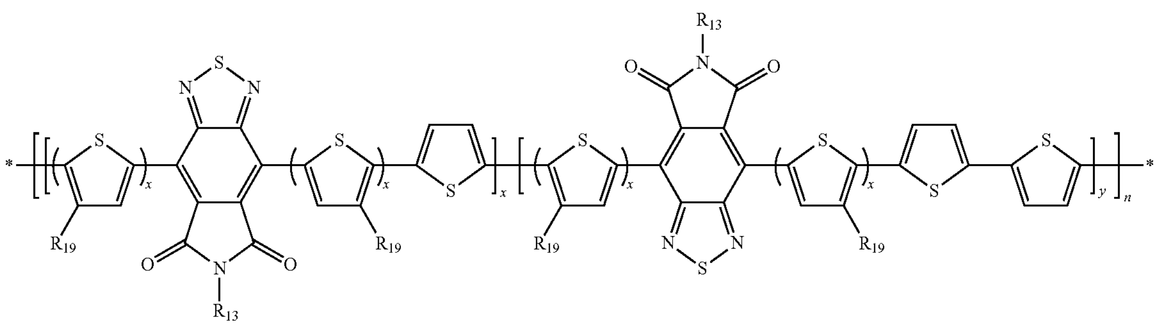

wherein $A^1$, $A^2$, $D^1$, $D^2$, $Sp^1$, $Sp^2$, $Sp^3$ $X^1$, a, b, c, d, x, y and n are as defined, and R, $R^{12}$, $R^{13}$, $R^{14}$, $R^{15}$, $R^{16}$, $R^{17}$, $R^{18}$ and $R^{19}$ independently of each other denote H or have one of the meanings of $R^S$ wherein $R^S$ is on each occurrence identically or differently F, Br, Cl, —CN, —NC, —NCO, —NCS, —OCN, —SCN, —C(O)NR$^0$R$^{00}$, —C(O)X$^0$, —C(O)R$^0$, —C(O)OR$^0$, —NH$_2$, —NR$^0$R$^{00}$, —SH, —SR$^0$, —SO$_3$H, —SO$_2$R$^0$, —OH, —NO$_2$, —CF$_3$, —SF$_5$, optionally substituted silyl, carbyl or hydrocarbyl with 1 to 40 C atoms that is optionally substituted and optionally comprises one or more hetero atoms, and

* each means a chemical linkage to an adjacent unit or to a terminal group in the polymer.

6. The process of claim 1, by coupling at least one monomer of formula MIIIa $R^7$-Sp-T-Sp-$R^8$ MIIIa with at least two monomers MIb and/or MIc $R^7$-$D^1$-$R^8$ MIb $R^7$-$A^1$-$R^8$ MIc wherein T is a unit of formula T or T1 as defined in claim 1, Sp is a spacer unit as defined in claim 1, $D^1$ is a donor unit as defined in claim 1, $A^1$ is an acceptor unit as defined in claim 1, and $R^7$ and $R^8$ are as defined in claim 1, in an aryl-aryl coupling reaction.

* * * * *